US011765965B2

(12) United States Patent
Fleetham et al.

(10) Patent No.: US 11,765,965 B2
(45) Date of Patent: Sep. 19, 2023

(54) ORGANIC ELECTROLUMINESCENT MATERIALS AND DEVICES

(71) Applicant: UNIVERSAL DISPLAY CORPORATION, Ewing, NJ (US)

(72) Inventors: Tyler Fleetham, Newtown, PA (US); Hsiao-Fan Chen, Lawrence Township, NJ (US)

(73) Assignee: UNIVERSAL DISPLAY CORPORATION, Ewing, NJ (US)

(*) Notice: Subject to any disclaimer, the term of this patent is extended or adjusted under 35 U.S.C. 154(b) by 510 days.

(21) Appl. No.: 17/075,969

(22) Filed: Oct. 21, 2020

(65) Prior Publication Data

US 2021/0135111 A1 May 6, 2021

Related U.S. Application Data

(60) Provisional application No. 62/927,879, filed on Oct. 30, 2019.

(51) Int. Cl.
*H01L 51/00* (2006.01)
*H10K 85/30* (2023.01)
(Continued)

(52) U.S. Cl.
CPC ........... *H10K 85/322* (2023.02); *C07F 5/027* (2013.01); *C09K 11/06* (2013.01);
(Continued)

(58) Field of Classification Search
CPC ............ C07F 5/027; C09K 2211/1022; H10K 85/322
See application file for complete search history.

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

EP 0650955 5/1995
EP 1725079 11/2006
(Continued)

OTHER PUBLICATIONS

Yu et al, Highly Fluorescent BF2 Complexes of Hydrazine-Schiff Base Linked Bispyrrole, Organic Letters, vol. 16, Issue 11, pp. 3048-3051, May 21, 2014.*
(Continued)

*Primary Examiner* — Alexander C Kollias
(74) *Attorney, Agent, or Firm* — DUANE MORRIS LLP

(57) ABSTRACT

Provided are boron-containing compounds having a structure of Formula I

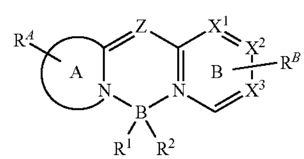

wherein ring A, Z, $X^1$-$X^3$, $R^A$, $R^B$, $R^1$, and $R^2$ are defined herein.

20 Claims, 2 Drawing Sheets

(51) Int. Cl.
*C07F 5/02* (2006.01)
*C09K 11/06* (2006.01)
*H10K 50/11* (2023.01)
*H10K 101/10* (2023.01)

(52) U.S. Cl.
CPC ...... *C09K 2211/1022* (2013.01); *H10K 50/11* (2023.02); *H10K 2101/10* (2023.02)

(56) References Cited

U.S. PATENT DOCUMENTS 5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada
6,661,023 B2 12/2003 Hoag et al.
6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
2002/0034656 A1 3/2002 Thompson et al.
2002/0134984 A1 9/2002 Igarashi
2002/0158242 A1 10/2002 Son et al.
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Prakash et al.
2009/0108737 A1 4/2009 Kwong et al.
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.
2016/0272657 A1* 9/2016 Ziegler .................. C09B 57/00
2018/0366648 A1* 12/2018 Barr .................... H10K 85/322

FOREIGN PATENT DOCUMENTS

EP 2034538 3/2009
JP 200511610 1/2005
JP 2007123392 5/2007
JP 2007254297 10/2007
JP 2008074939 4/2008
WO 01/39234 5/2001
WO 02/02714 1/2002
WO 02015654 2/2002
WO 03040257 5/2003
WO 03060956 7/2003
WO 2004093207 10/2004
WO 2004107822 12/2004
WO 2005014551 2/2005
WO 2005019373 3/2005
WO 2005030900 4/2005
WO 2005089025 9/2005
WO 2005123873 12/2005
WO 2006009024 1/2006
WO 2006056418 6/2006
WO 2006072002 7/2006
WO 2006082742 8/2006
WO 2006098120 9/2006
WO 2006100298 9/2006
WO 2006103874 10/2006
WO 2006114966 11/2006
WO 2006132173 12/2006
WO 2007002683 1/2007
WO 2007004380 1/2007
WO 2007063754 6/2007
WO 2007063796 6/2007
WO 2008056746 5/2008
WO 2008101842 8/2008
WO 2008132085 11/2008
WO 2009000673 12/2008
WO 2009003898 1/2009
WO 2009008311 1/2009
WO 2009018009 2/2009
WO 2009021126 2/2009
WO 2009050290 4/2009
WO 2009062578 5/2009
WO 2009063833 5/2009
WO 2009066778 5/2009
WO 2009066779 5/2009
WO 2009086028 7/2009
WO 2009100991 8/2009

OTHER PUBLICATIONS

Mula et al, Synthesis of Indolo[3,2-b]carbazole-Based Boron Complexes with Tunable Photophysical and Electrochemical Properties, The Journal of Organic Chemistry, vol. 83, Issue 23, pp. 14406-14418, Nov. 2, 2018.*
Zhu et al, Low Band Gap Coplanar Conjugated Molecules Featuring Dynamic Intramolecular Lewis Acid-Base Coordination, The Journal of Organic Chemistry, vol. 81, Issue 10, pp. 4347-4352, Apr. 10, 2016.*
Chibani et al, Excited States of Ladder-Type π-Conjugated Dyes with a Joint SOS-CIS(D) and PCM-TD-DFT Approach, The Journal of Physical Chemistry, vol. 119, Issue 21, pp. 5417-5425, Dec. 18, 2014.*

(56) References Cited

OTHER PUBLICATIONS

Adachi, Chihaya et al., "Organic Electroluminescent Device Having a Hole Conductor as an Emitting Layer," Appl. Phys. Lett., 55(15): 1489-1491 (1989).
Adachi, Chihaya et al., "Nearly 100% Internal Phosphorescence Efficiency in an Organic Light Emitting Device," J. Appl. Phys., 90(10): 5048-5051 (2001).
Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Baldo et al., Highly Efficient Phosphorescent Emission from Organic Electroluminescent Devices, Nature, vol. 395, 151-154, (1998).
Baldo et al., Very high-efficiency green organic light-emitting devices based on electro phosphorescence, Appl. Phys. Lett., vol. 75, No. 1, 4-6 (1999).
Gao, Zhiqiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 1: 15-20 (2000).
Hamada, Yuji et al., "High Luminance in Organic Electroluminescent Devices with Bis(10-hydroxybenzo[h]quinolinato) beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18(21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based On Silole Derivatives And Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N∧C∧N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes Of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

(56) References Cited

OTHER PUBLICATIONS

Kim, Jung-Hwan et al., "Synthesis of New Bichromophore Compounds," Journal of the Korean Chemical Society, 2008, vol. 52, No. 5, pp. 515-522.
Hao, Qingshan et al., "Locked Planarity: A Strategy for Tailoring Ladder-Type π-Conjugated Anilido-Pyridine Boron Difluorides,"J. Org. Chem. 2014, 79, 459-464.

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 62/927,879, filed on Oct. 30, 2019, the entire contents of which are incorporated herein by reference.

FIELD

The present disclosure generally relates to boron-containing compounds and formulations and their various uses including as emitters in devices such as organic light emitting diodes and related electronic devices.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as flat panel displays, illumination, and backlighting.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

In one aspect, the present disclosure provides a compound of Formula I

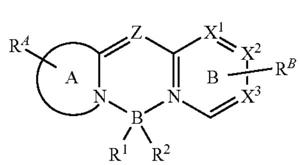

wherein Z is CR' or N; $X^1$-$X^3$ are each independently C or N, with at least one of $X^1$-$X^3$ being N and bonded to boron; $R^A$ and $R^B$ each represents zero, mono, or up to the maximum allowed number of substitutions to its associate ring; R', $R^A$, and $R^B$ are each independently a hydrogen or a substituent selected from the group consisting of the general substituents defined herein; $R^1$ and $R^2$ are each independently a hydrogen or a substituent selected from the group consisting of deuterium, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfanyl, sulfonyl, phosphino, boryl, borate, and combinations thereof; ring A is a 5-membered or 6-membered ring; and two substituents within Formula I can be joined or fused together to form a ring, with a proviso that two adjacent $R^B$ substituents are joined to form a fused heterocyclic ring.

In another aspect, the present disclosure provides a formulation of a compound of Formula I as described herein.

In yet another aspect, the present disclosure provides an OLED having an organic layer comprising a compound of Formula I as described herein.

In yet another aspect, the present disclosure provides a consumer product comprising an OLED with an organic layer comprising a compound of Formula I as described herein.

DETAILED DESCRIPTION

A. Terminology

Figure 1:
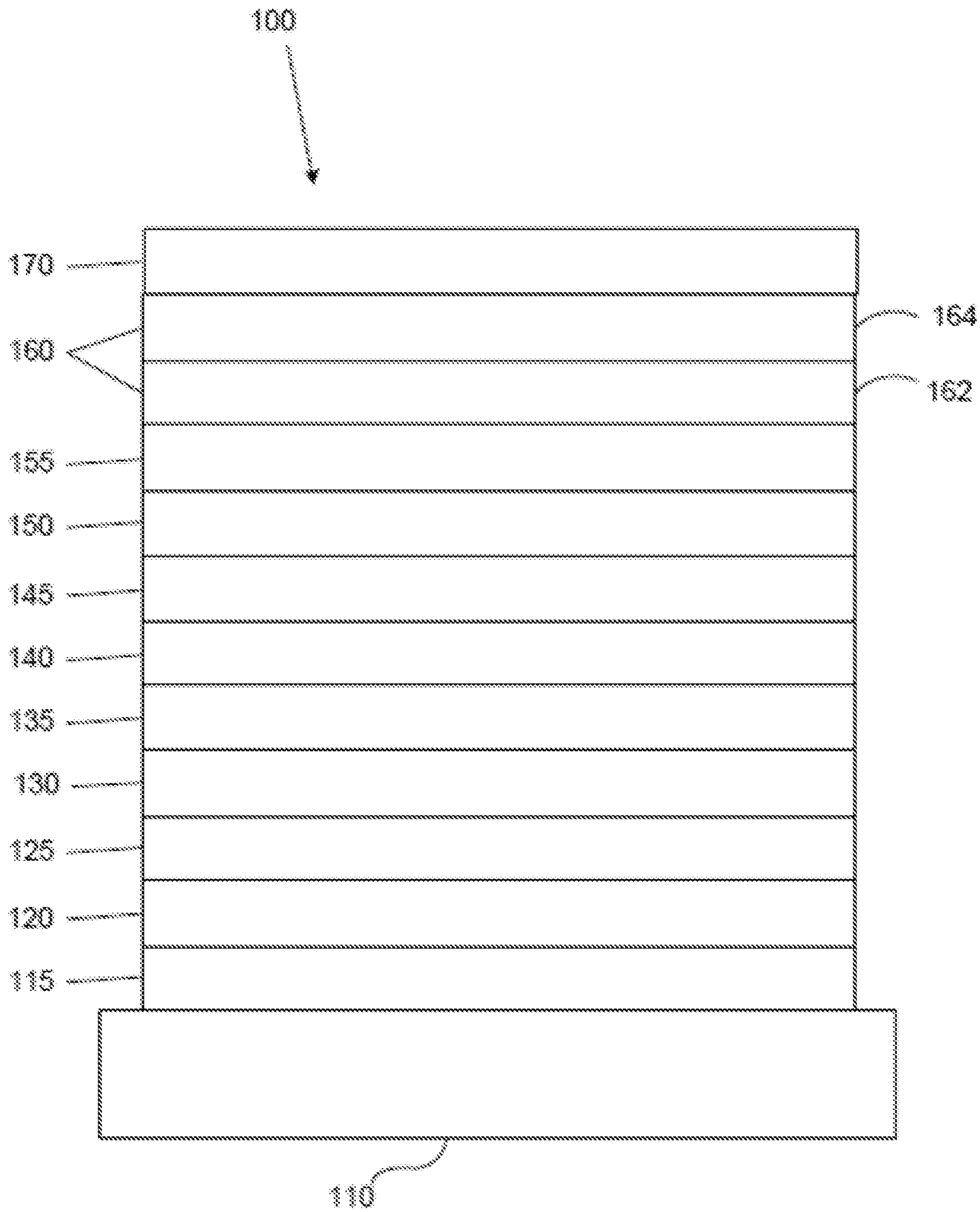
FIG. 1 shows an organic light emitting device.

Unless otherwise specified, the below terms used herein are defined as follows:

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The terms "halo," "halogen," and "halide" are used interchangeably and refer to fluorine, chlorine, bromine, and iodine.

The term "acyl" refers to a substituted carbonyl radical ($C(O)—R_s$).

The term "ester" refers to a substituted oxycarbonyl ($—O—C(O)—R_s$ or $—C(O)—O—R_s$) radical.

The term "ether" refers to an $—OR_s$ radical.

The terms "sulfanyl" or "thio-ether" are used interchangeably and refer to a $—SR_s$ radical.

The term "sulfinyl" refers to a $—S(O)—R_s$ radical.

The term "sulfonyl" refers to a $—SO_2—R_s$ radical.

The term "phosphino" refers to a $—P(R_s)_3$ radical, wherein each R can be same or different.

The term "silyl" refers to a $—Si(R_s)_3$ radical, wherein each R can be same or different.

The term "boryl" refers to a $—B(R_s)_2$ radical or its Lewis adduct $—B(R_s)_3$ radical, wherein R can be same or different.

In each of the above, R can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred R is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group may be optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group may be optionally substituted.

The term "alkynyl" refers to and includes both straight and branched chain alkyne radicals. Alkynyl groups are essentially alkyl groups that include at least one carbon-carbon triple bond in the alkyl chain. Preferred alkynyl groups are those containing two to fifteen carbon atoms. Additionally, the alkynyl group may be optionally substituted.

The terms "aralkyl" or "arylalkyl" are used interchangeably and refer to an alkyl group that is substituted with an aryl group. Additionally, the aralkyl group may be optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, boryl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents zero or no substitution, R', for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., Tetrahedron 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

B. The Compounds of the Present Disclosure

In one aspect, the present disclosure provides a compound of Formula I

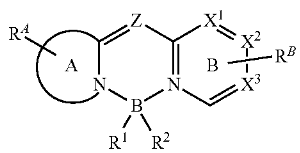

wherein:

Z is CR' or N;

$X^1$-$X^3$ are each independently C or N, with at least one of $X^1$-$X^3$ being N and bonded to boron; $R^A$ and $R^B$ each represents zero, mono, or up to the maximum allowed number of substitutions to its associate ring; R', $R^A$, and $R^B$ are each independently a hydrogen or a substituent selected from the group consisting of the general substituents defined herein; $R^1$ and $R^2$ are each independently a hydrogen or a substituent selected from the group consisting of deuterium, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfanyl, sulfonyl, phosphino, boryl, borate, and combinations thereof; ring A is a 5-membered or 6-membered ring; and two substituents within Formula I can be joined or fused together to form a ring, with a proviso that two adjacent $R^B$ substituents are joined to form a fused heterocyclic ring.

In some embodiments, R', $R^2$, $R^A$, and $R^B$ can each be independently a hydrogen or a substituent selected from the group consisting of deuterium, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, borate, and combinations thereof.

In some embodiments, ring A can be a 6-membered ring.

In some embodiments, two $R^A$ substituents can be joined to form a fused ring to ring A. In some embodiments, the fused ring can be a 6-membered aryl group. In some embodiments, ring A or the fused ring can be further substituted with a carbazole group. In some embodiments, the carbazole group can be attached to ring A or the fused ring through its N atom.

In some embodiments, $X^1$ can be N which is bonded with boron to form a boryl or borate group. In some embodiments, the boryl or borate group can be joined with one $R^B$ substituent to form a ring fused to ring B.

In some embodiments, $X^3$ can be N which is bonded with boron to form a boryl or borate group. In some embodiments, the boryl or borate group can be joined with one $R^B$ substituent to form a ring fused to ring B.

In some embodiments, $X^2$ can be C. In some embodiments, $X^2$ can be N which is bonded with boron to form a boryl or borate group. In some embodiments, the boryl or borate group can be joined with one $R^B$ substituent to form a ring fused to ring B. In some embodiments, $X^1$ and $X^3$ can both be C.

In some embodiments, each of the fused ring can be a 6-membered ring. In some embodiments, each of the fused ring can be further fused to form an extended bi- or tricyclic system from the fused ring.

In some embodiments, the extended bi- or tricyclic system can be further substituted with a carbazole group. In some embodiments, the carbazole group can be attached to the extended bi- or tricyclic system through its N atom.

In some embodiments, $R^A$ can be an aryl group. In some embodiments, $R^A$ can be phenyl.

In some embodiments, $R^1$ can be an aryl group. In some embodiments, $R^2$ can be an aryl group. In some embodiments, $R^1$ can be phenyl. In some embodiments, $R^2$ can be phenyl.

In some embodiments, Z can be N. In some embodiments, Z can be CR'. In some embodiments, R' can be selected from the group consisting of H, D, alkyl, cycloalkyl, aryl, and combinations thereof.

In some embodiments, the compound can comprise a structure selected from the group consisting of:

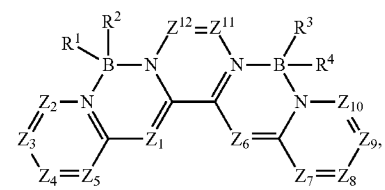

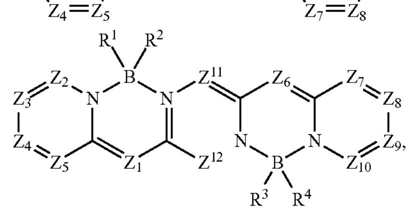

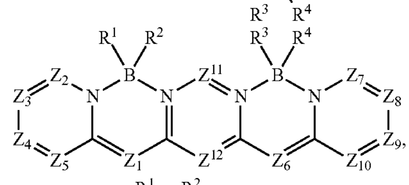

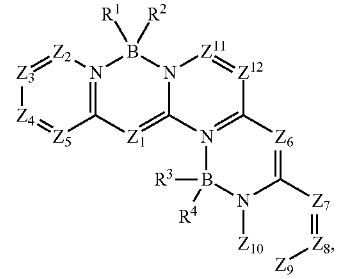

-continued
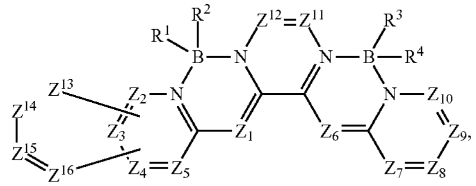
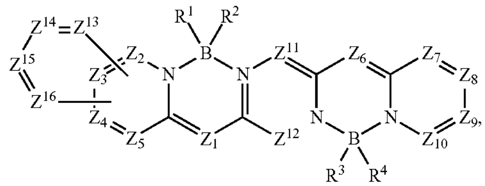
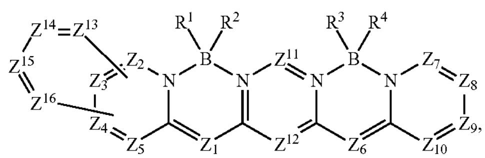
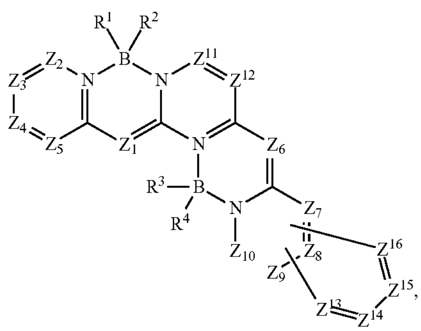
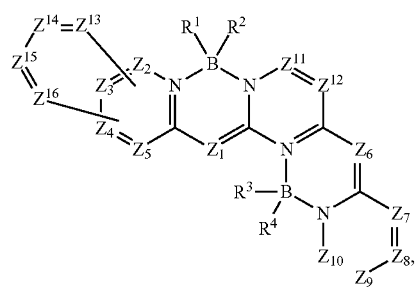
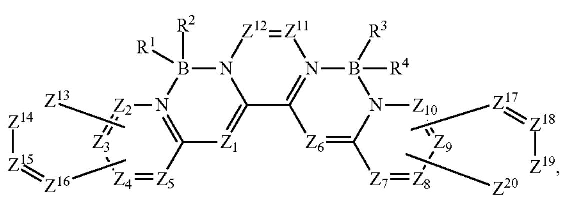
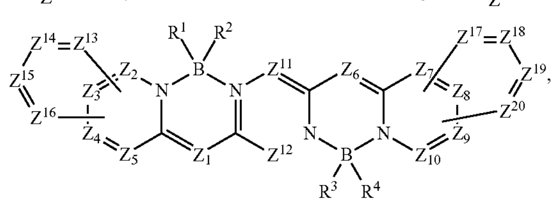
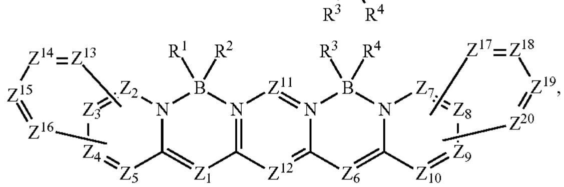
-continued
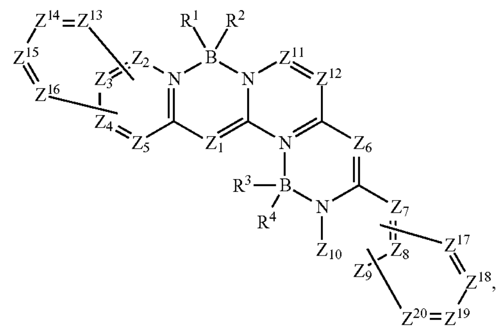
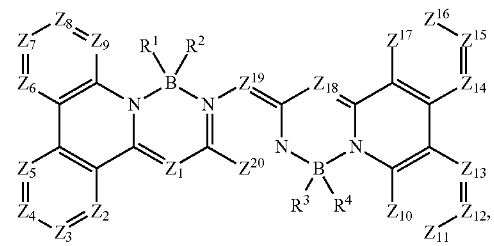
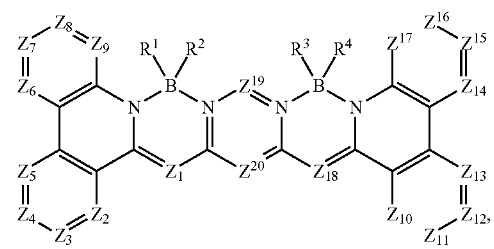
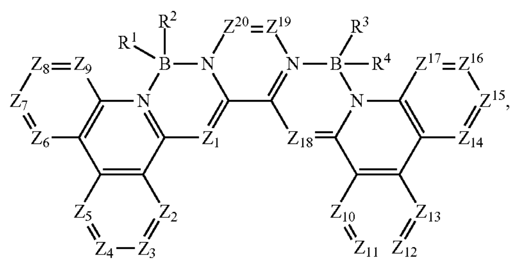
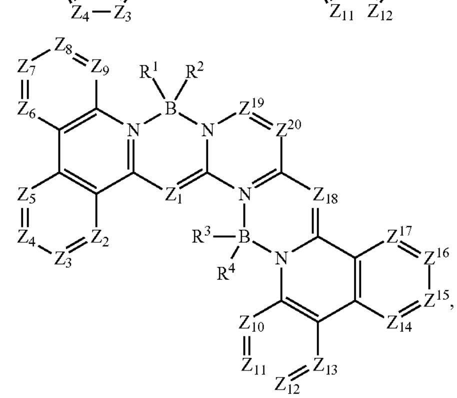
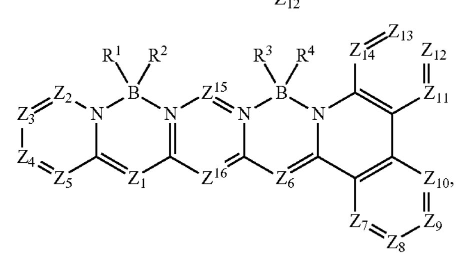

-continued
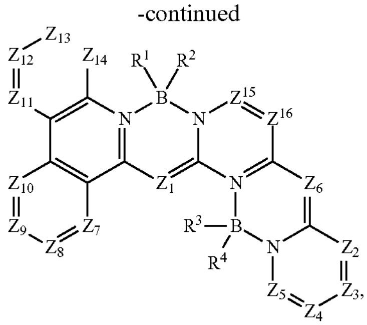
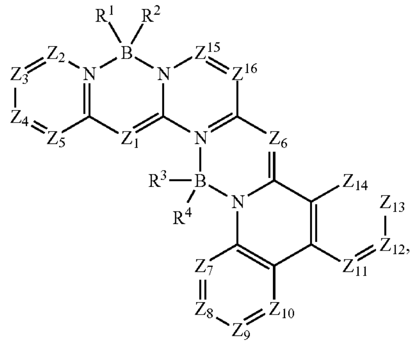
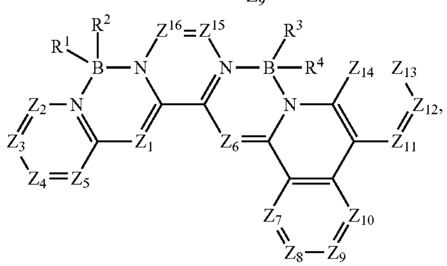
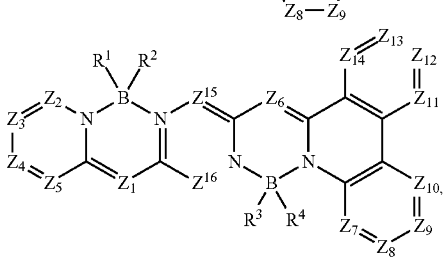
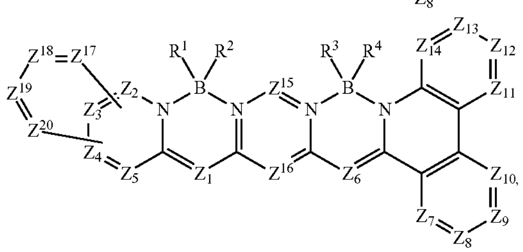
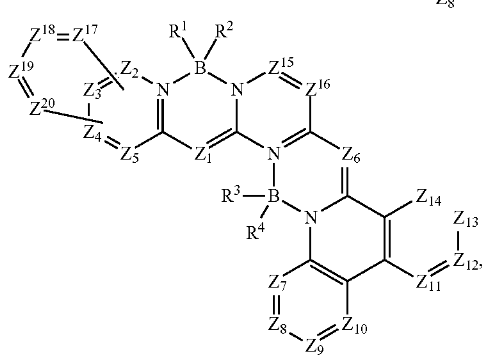
-continued
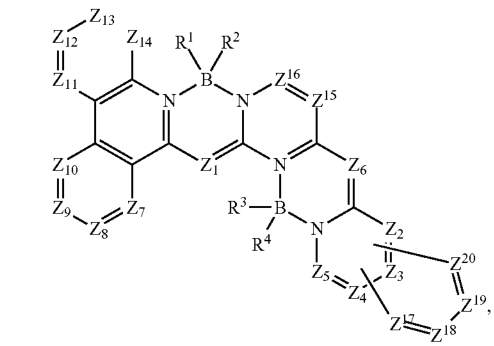
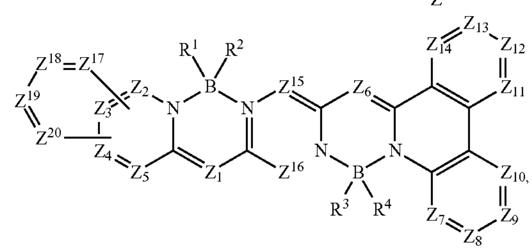
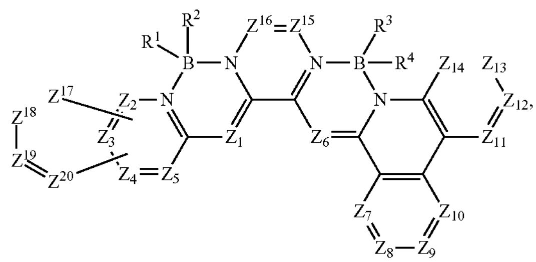
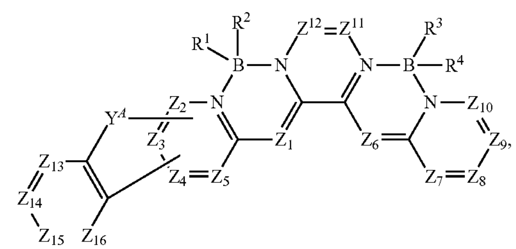
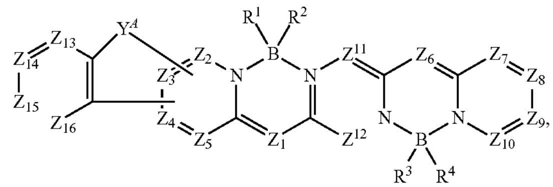
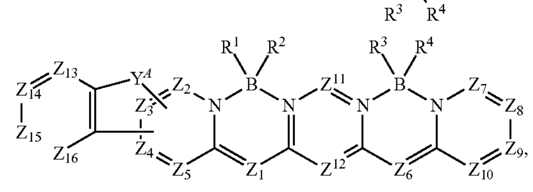
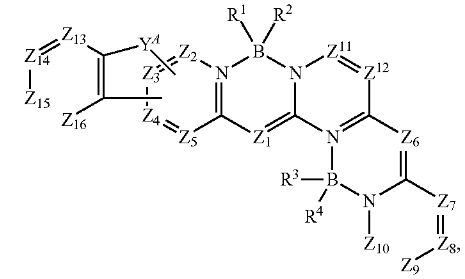

-continued
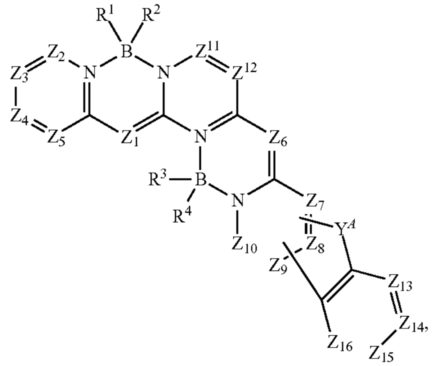
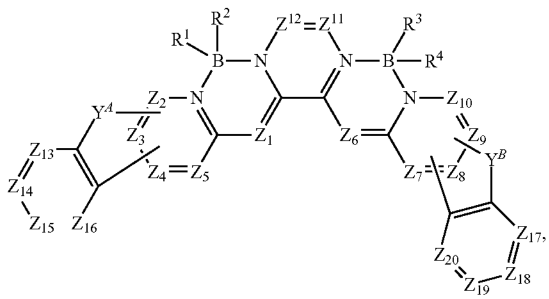
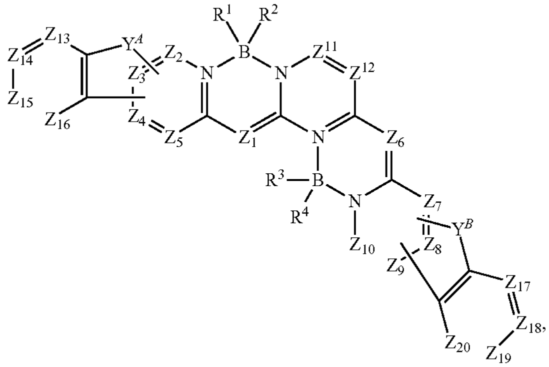
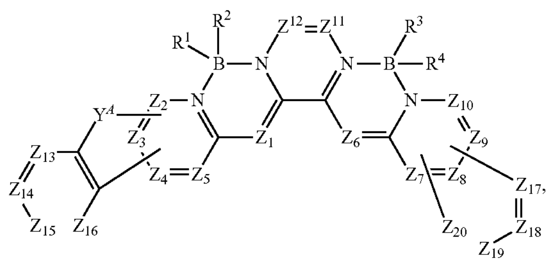
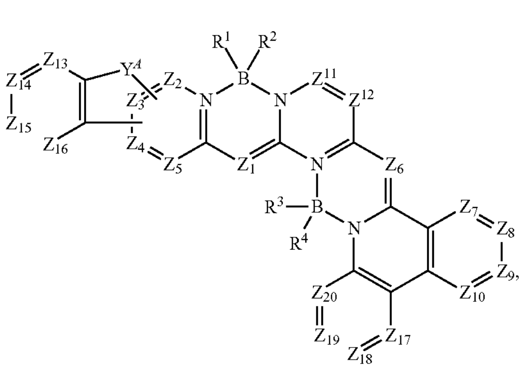
-continued
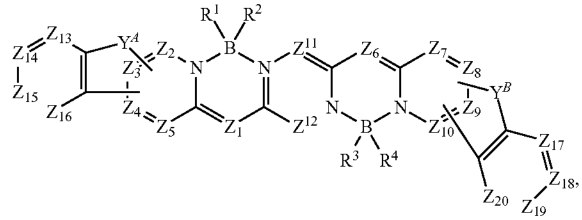
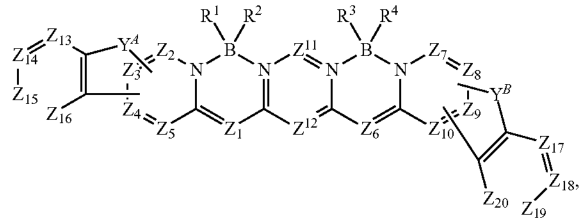
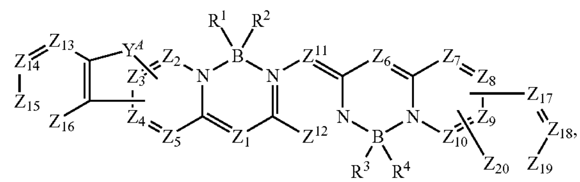
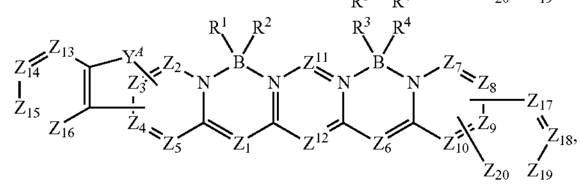
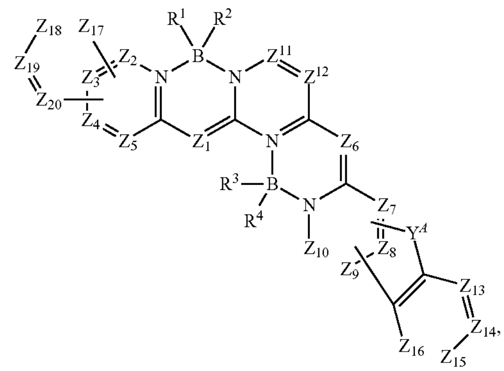
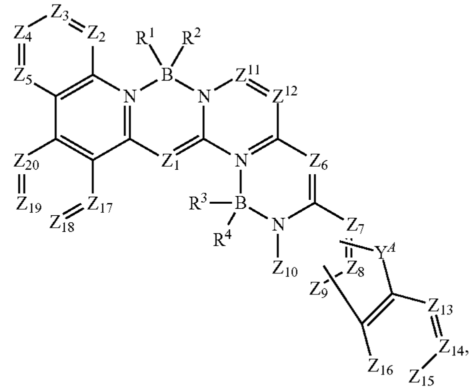

-continued
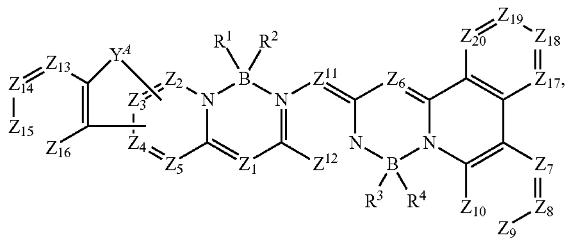
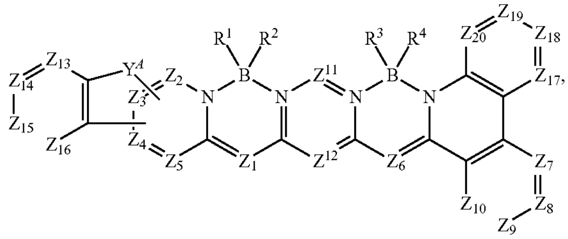
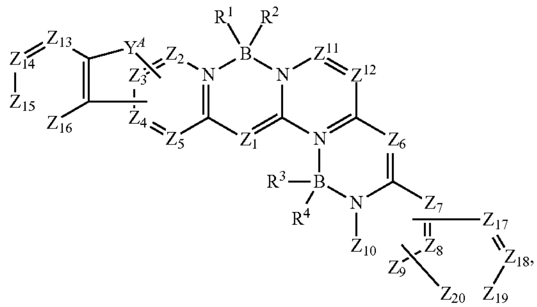
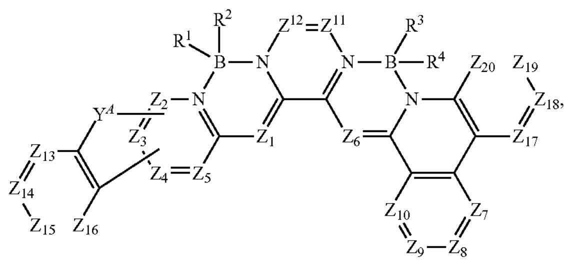
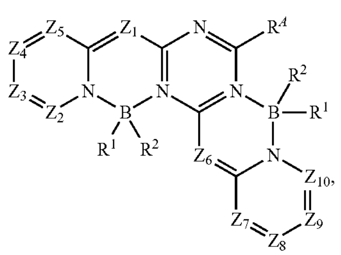
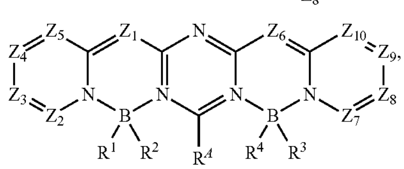
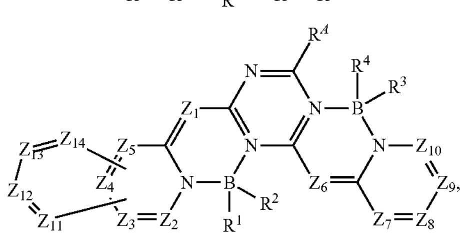
-continued
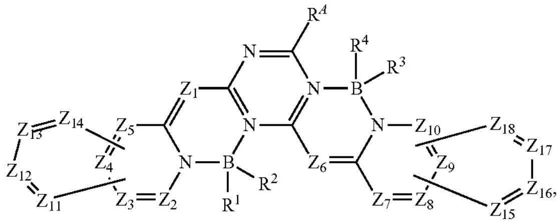
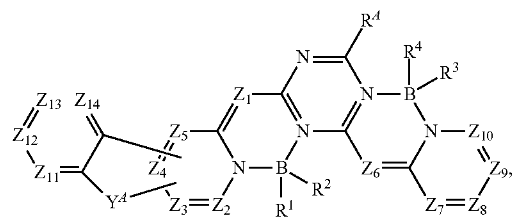
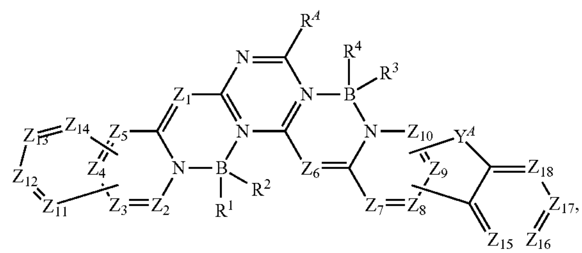
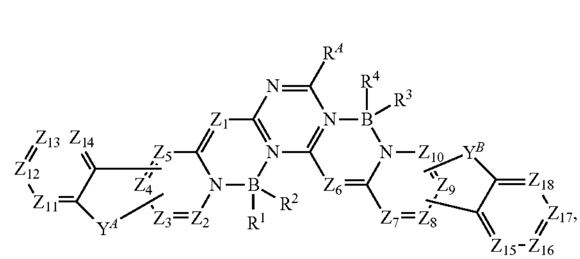
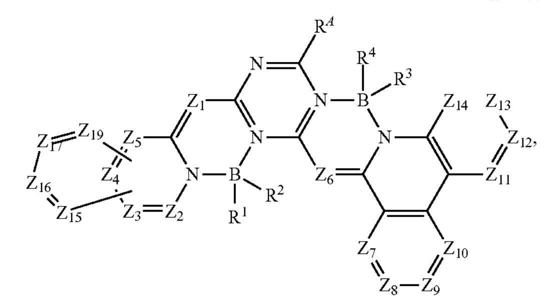
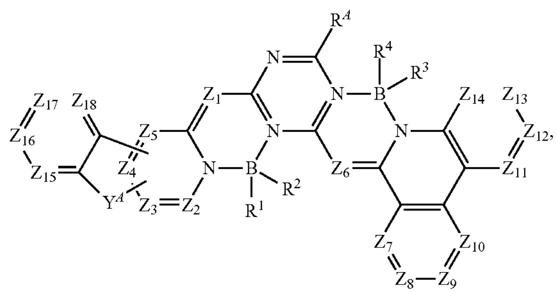

-continued
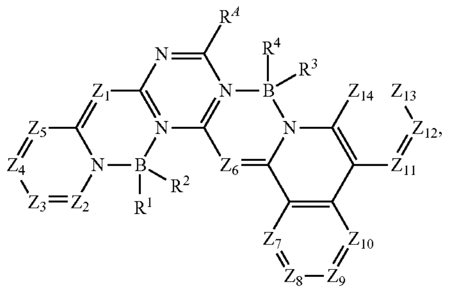
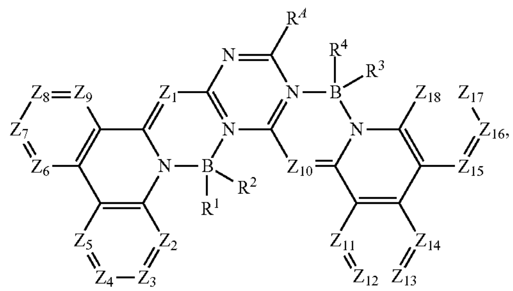
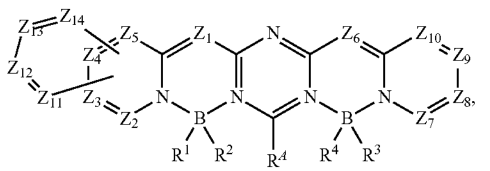
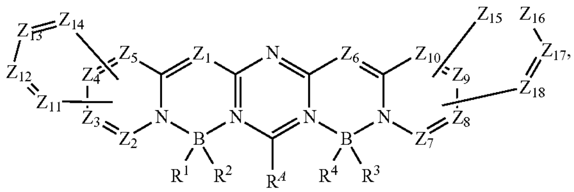
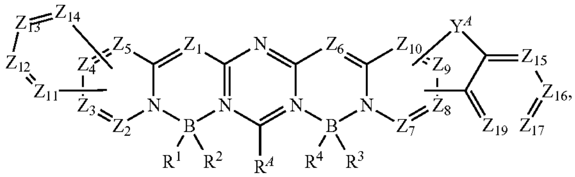
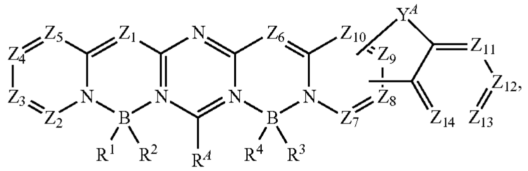
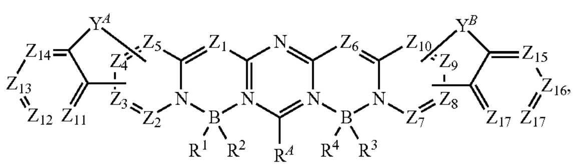
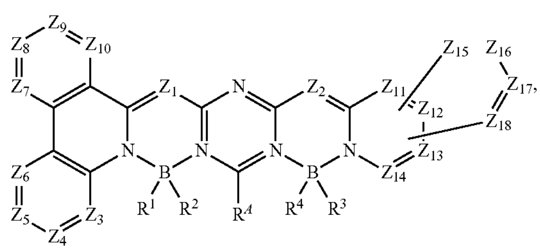
-continued
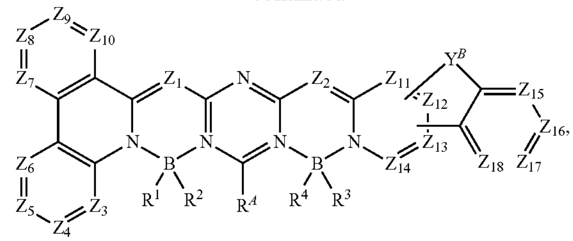
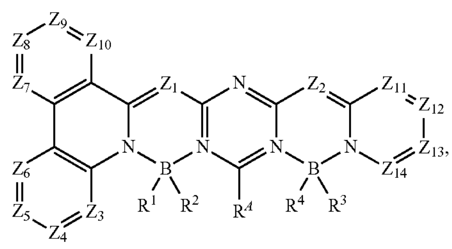
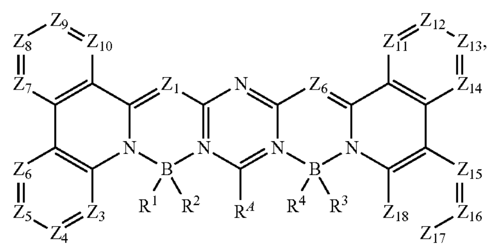
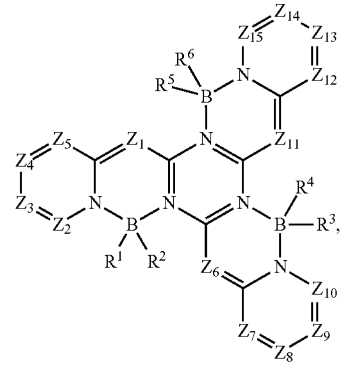
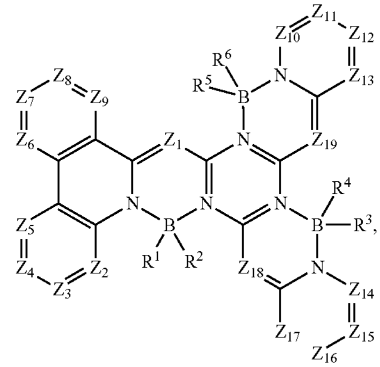

-continued
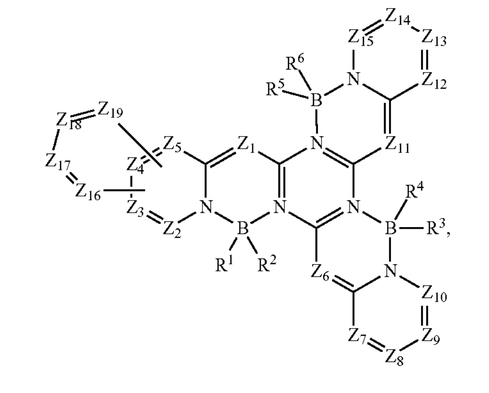
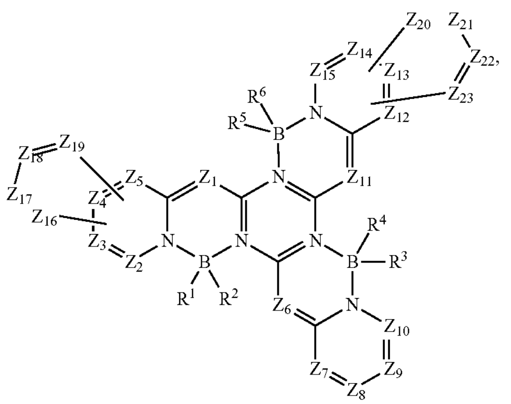
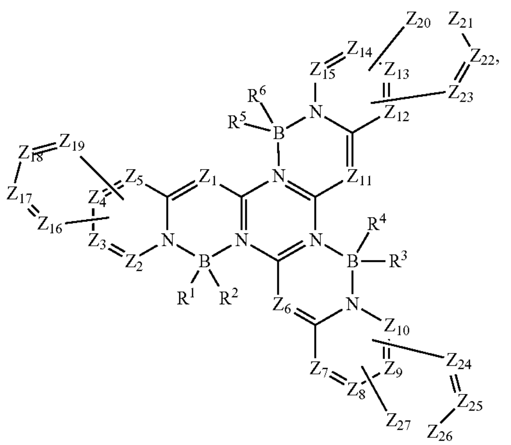
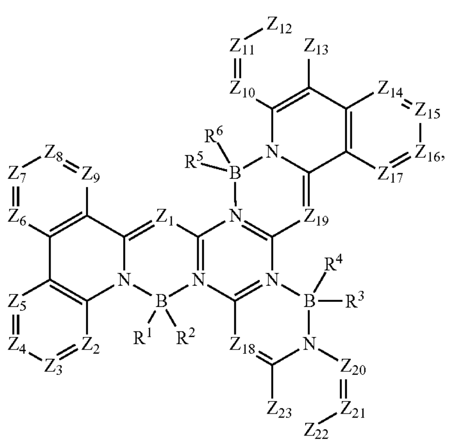
-continued
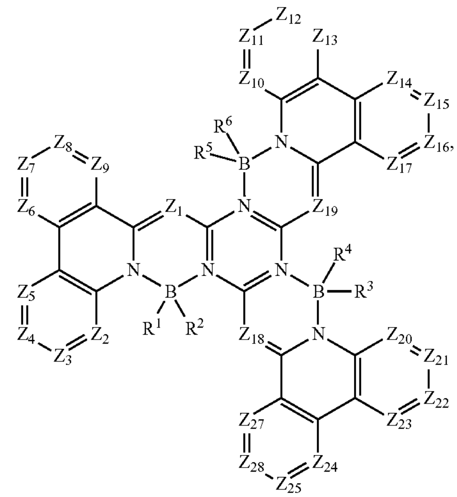
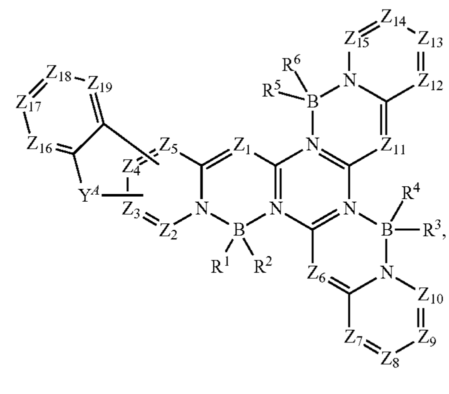
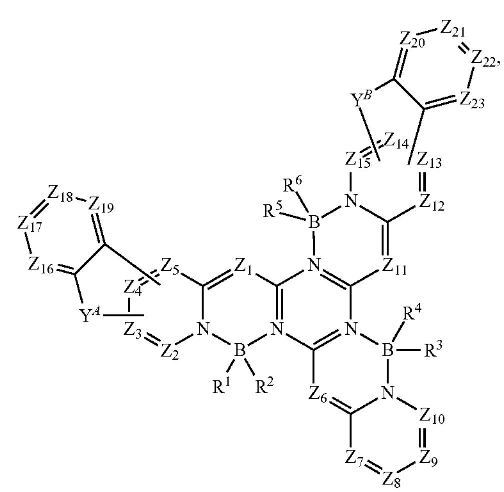

-continued
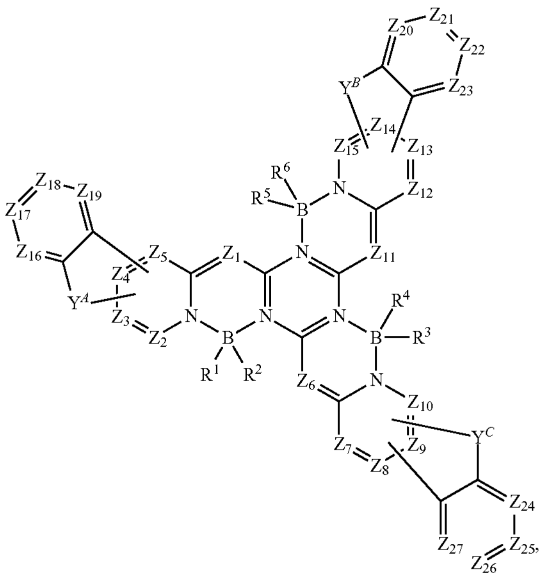
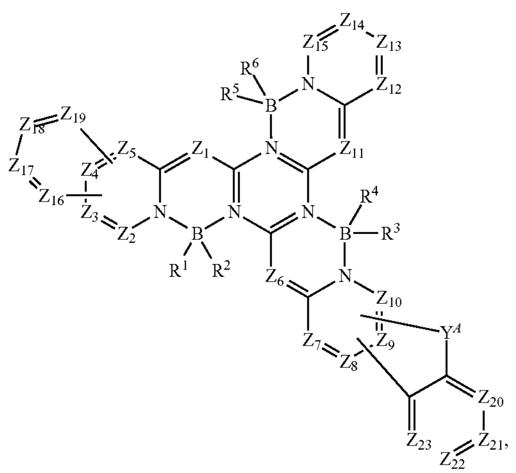
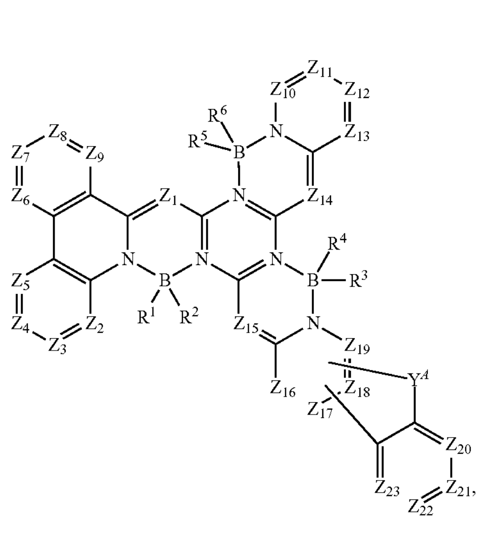
-continued
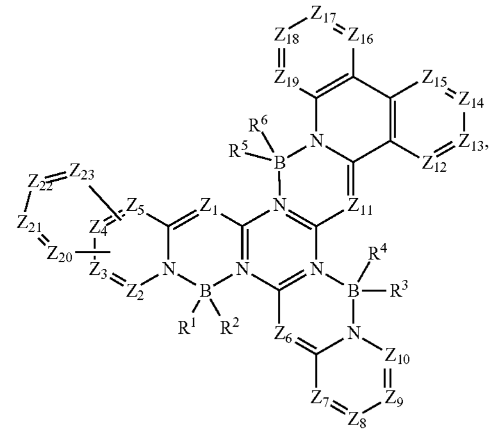
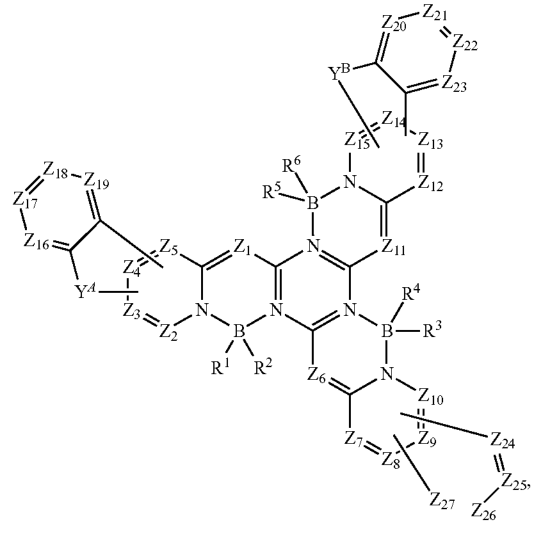
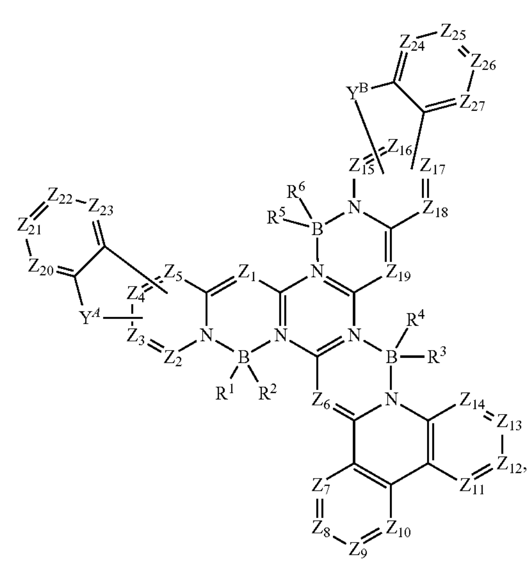

-continued

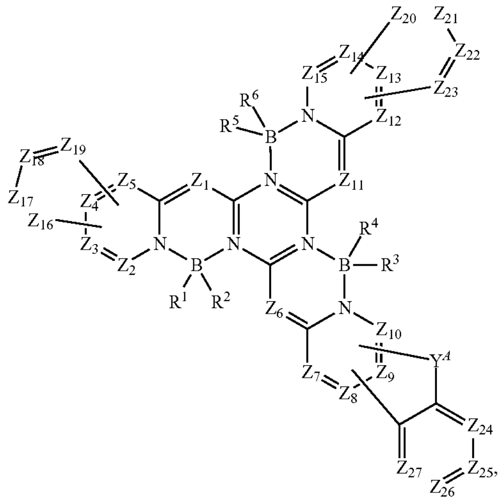

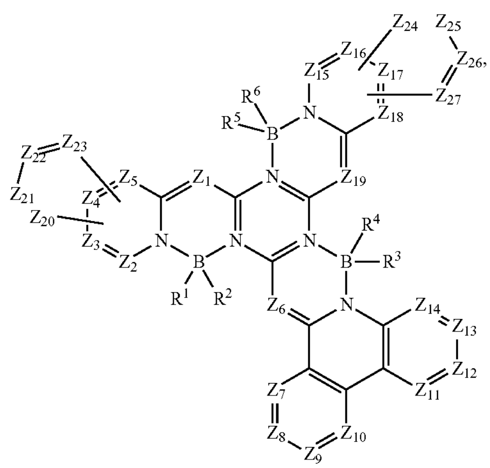

-continued

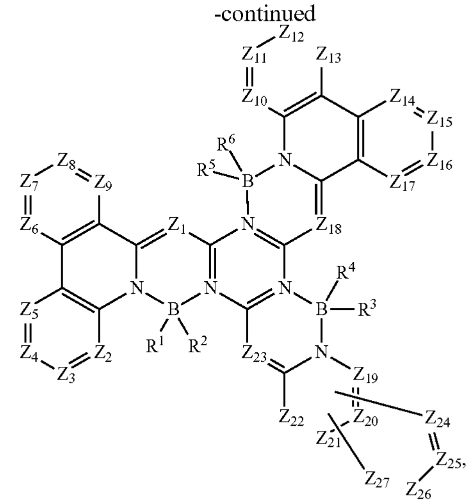

and

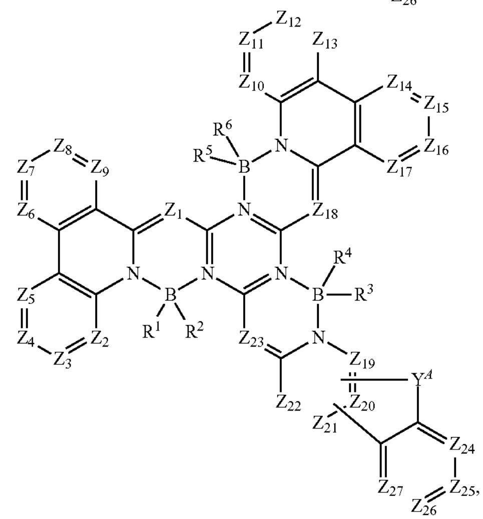

wherein $Z_1$ to $Z_{27}$ are each independently N or CR"; R" and $R^3$ to $R^6$ are each independently a hydrogen or a substituent selected from the group consisting of the general substituents defined herein; and $Y^A$, $Y^B$ and $Y^C$ are each independently $BR_e$, $NR_e$, $PR_e$, O, S, Se, C═O, S═O, $SO_2$, $CR_eR_f$, $SiR_eR_f$, and $GeR_eR_f$, $R_e$ and $R_f$ can be fused or joined to form a ring; and $R_e$ and $R_f$ are each independently a hydrogen or a substituent selected from the group consisting of the general substituents defined herein.

In some embodiments, the compound can each be independently selected from the group consisting of the structures shown in LIST 1 below:

| Compound name | Structure | *i*, *j*, *k*, *l*, *m*, *n* |
|---|---|---|
| Compound I-[(A*i*)(A*j*)(Y*k*)(R*l*)], wherein Compound I-[(A*l*)(A*l*)(Y*l*)(R*l*)] to Compound I-[(A840)(A840)(Y20)(R60)] having the structure | 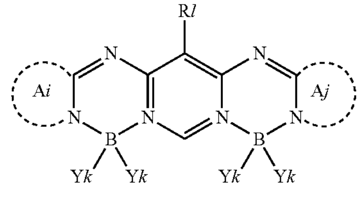 | wherein *i* and *j* are independently an integer from 1 to 840, *k* is an integer from 1 to 20, and *l* is an integer from 1 to 60, |

-continued

| Compound name | Structure | i, j, k, l, m, n |
|---|---|---|
| Compound II-[(Ai)(Aj)(Yk)(Rl)], wherein Compound II-[(A1)(A1)(Y1)(R1)] to Compound II-[(A840)(A840)(Y20)(R60)] having the structure | 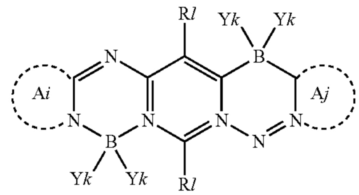 | wherein i and j are independently an integer from 1 to 840, k is an integer from 1 to 20, and l is an integer from 1 to 60, |
| Compound III-[(Ai)(Aj)(Yk)(Rl)], wherein Compound III-[(A1)(A1)(Y1)(R1)] to Compound III-[(A840)(A840)(Y20)(R60)] having the structure | 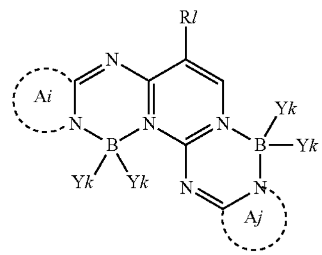 | wherein i and j are independently an integer from 1 to 840, k is an integer from 1 to 20, and l is an integer from 1 to 60, |
| Compound IV-[(Ai)(Aj)(Yk)(Rl)], wherein Compound IV-[(A1)(A1)(Y1)(R1)] to Compound IV-[(A840)(A840)(Y20)(R60)] having the structure | 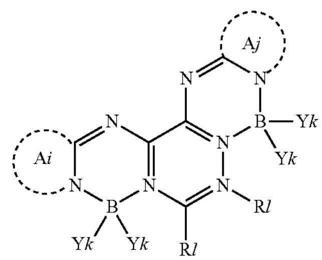 | wherein i and j are independently an integer from 1 to 840, k is an integer from 1 to 20, and l is an integer from 1 to 60, |
| Compound V-[(Ai)(Aj)(Yk)(Rl)], wherein Compound V-[(A1)(A1)(Y1)(R1)] to Compound V-[(A840)(A840)(Y20)(R60)] having the structure | 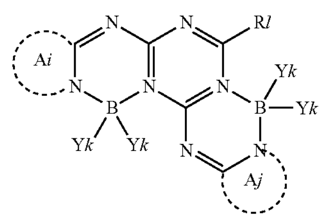 | wherein i and j are independently an integer from 1 to 840, k is an integer from 1 to 20, and l is an integer from 1 to 60, |
| Compound VI-[(Ai)(Aj)(Rl)(Rn)], wherein Compound VI-[(A1)(A1)(R1)(R1)] to Compound VI-[(A840)(A840)(R60)(R60)] having the structure | 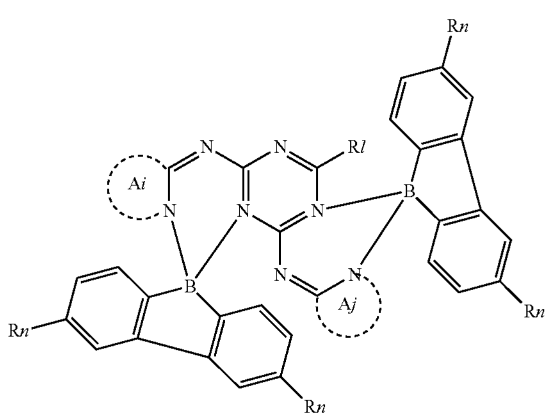 | wherein i and j are independently an integer from 1 to 840, and l and n are independently an integer from 1 to 60, |

-continued

| Compound name | Structure | *i*, *j*, *k*, *l*, *m*, *n* |
|---|---|---|
| Compound VII-[(A*i*)(A*j*)(R*l*)(R*n*)], wherein Compound VII-[(A*l*)(A*l*)(R*l*)(R*l*)] to Compound VII-[(A840)(A840)(R60)(R60)] having the structure | 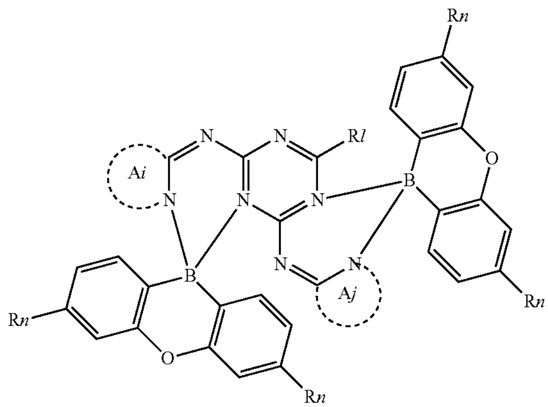 | wherein *i* and *j* are independently an integer from 1 to 840, and *l* and *n* are independently an integer from 1 to 60, |
| Compound VIII-[(A*i*)(A*j*)(R*l*)(R*n*)(R*o*)], wherein Compound VIII-[(A*l*)(A*l*)(R*l*)(R*l*)(R*l*)] to Compound VIII-[(A840)(A840)(R60)(R60)(R60)] having the structure | 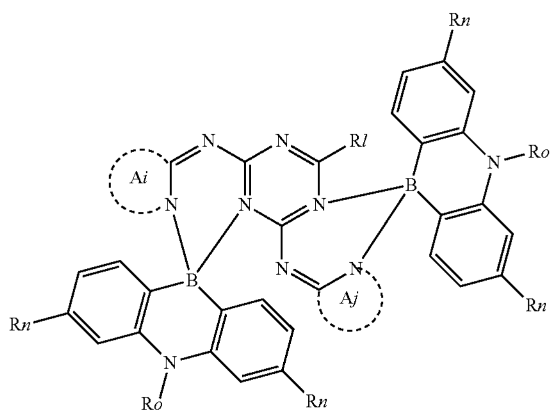 | wherein *i* and *j* are independently an integer from 1 to 840, and *l*, *n*, and *o* are independently an integer from 1 to 60, |
| Compound IX-[(A*i*)(A*j*)(Y*k*)(R*l*)], wherein Compound V-[(A*l*)(A*l*)(Y*l*)(R*l*)] to Compound V-[(A840)(A840)(Y20)(R60)] having the structure | 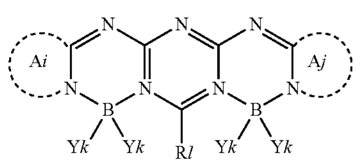 | wherein *i* and *j* are independently an integer from 1 to 840, *k* is an integer from 1 to 20, and *l* is an integer from 1 to 60, |
| Compound X-[(A*i*)(A*j*)(R*l*)(R*n*)], wherein Compound X-[(A*l*)(A*l*)(R*l*)(R*l*)] to Compound X-[(A840)(A840)(R60)(R60)] having the structure | 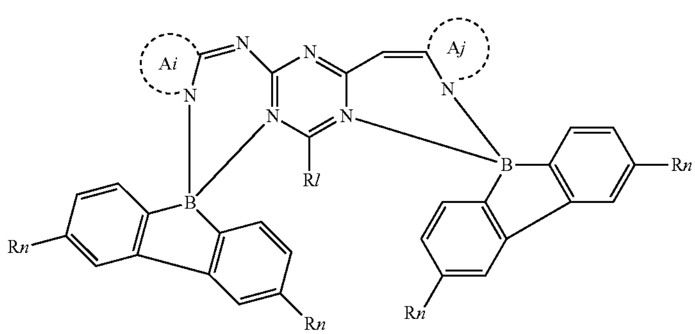 | wherein *i* and *j* are independently an integer from 1 to 840 and *l* and *n* are independently an integer from 1 to 60, |

-continued

| Compound name | Structure | i, j, k, l, m, n |
|---|---|---|
| Compound XI-[(Ai)(Aj)(Rl)(Rn)], wherein Compound XI-[(A1)(A1)(R1)(R1)] to Compound XI-[(A840)(A840)(R60)(R60)] having the structure | 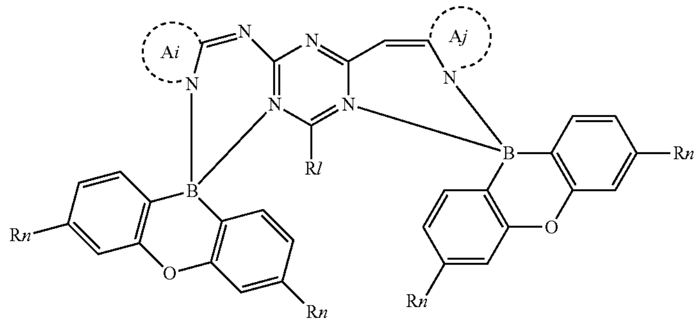 | wherein i and j are independently an integer from 1 to 840 and l and n are independently an integer from 1 to 60, |
| Compound XII-[(Ai)(Aj)(Rl)(Rn)(Ro)], wherein Compound XII-[(A1)(A1)(R1)(R1)(R1)] to CompoundXII-[(A840)(A840)(R60)(R60)(R60)] having the structure | 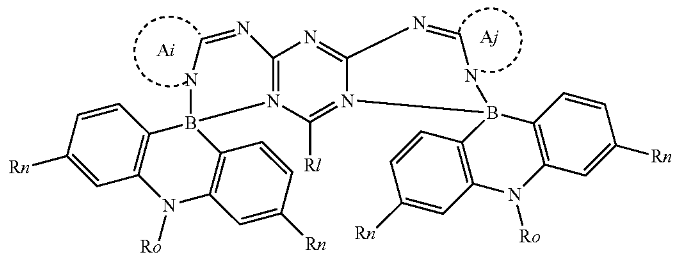 | wherein i and j are independently an integer from 1 to 840, and l, n, and o are independently an integer from 1 to 60, |
| Compound XIII-[(Ai)(Aj)(Ah)(Yk)], wherein Compound XIII-[(A1)(A1)(A1)(Y1)] to Compound XIII-[(A840)(A840)(A840)(Y20)] having the structure | 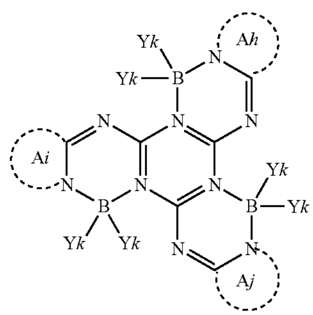 | wherein i, j, and h are independently an integer from 1 to 840, and k is an integer from 1 to 20, |
| Compound XIV-[(Ai)(Aj)(Ah)(Rl)], wherein Compound XIV-[(A1)(A1)(A1)(R1)] to Compound XIV-[(A840)(A840)(A840)(R60)] having the structure | 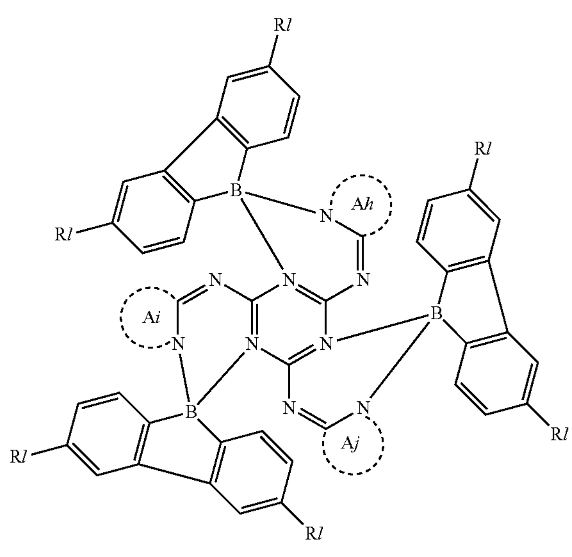 | wherein i, j, and h are independently an integer from 1 to 840, and l is an integer from 1 to 60, |

-continued

| Compound name | Structure | *i*, *j*, *k*, *l*, *m*, *n* |
|---|---|---|
| Compound XV-[(A*i*)(A*j*)(A*h*)(R*l*)], wherein Compound XV-[(A*l*)(A*l*)(A*l*)(R*l*)] to Compound XV-[(A840)(A840)(A840)(R60)] having the structure | 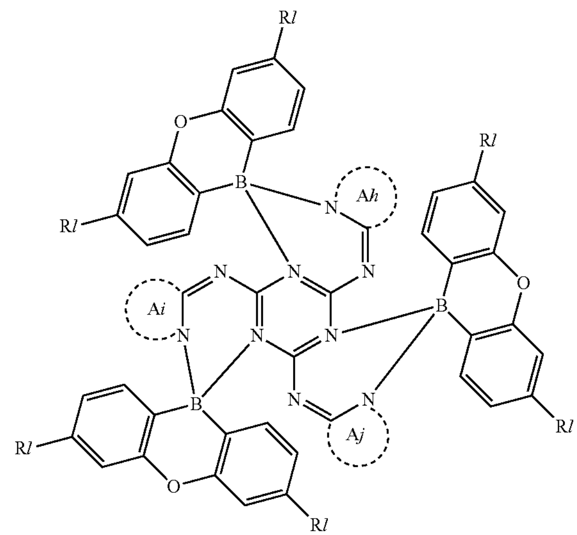 | wherein *i*, *j*, and *h* independently are an integer from 1 to 840, and *l* is an integer from 1 to 60, |
| Compound XVI-[(A*i*)(A*j*)(A*h*)(R*l*)(R*n*)], wherein Compound XVI-[(A*l*)(A*l*)(A*l*)(R*l*)(R*l*)] to Compound XVI-[(A840)(A840)(A840)(R60)(R60)] having the structure | 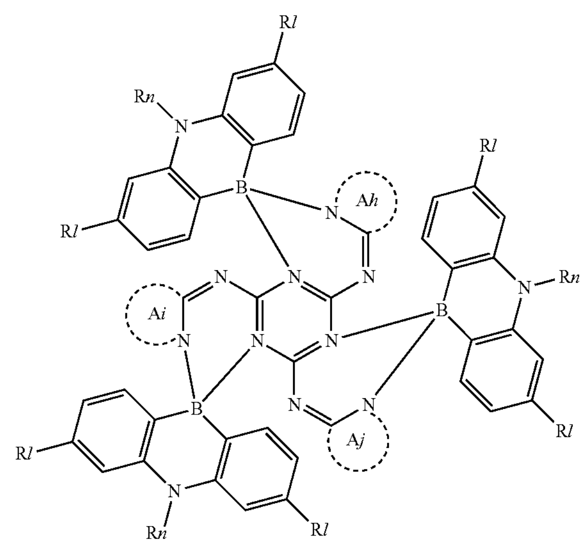 | wherein *i*, *j*, and *h* are independently an integer from 1 to 840, and *l* and *n* are independently an integer from 1 to 60, |
| Compound XVII-[(A*i*)(A*j*)(R*l*)(R*n*)], wherein Compound XVII-[(A*l*)(A*l*)(R*l*)(R*l*)] to Compound XVII-[(A840)(A840)(R60)(R60)] having the structure | 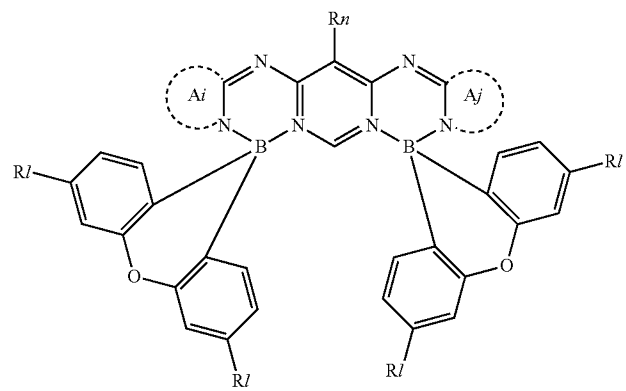 | wherein *i* and *j* are independently an integer from 1 to 840, and *l* and *n* are independently an integer from 1 to 60, |

-continued

| Compound name | Structure | i, j, k, l, m, n |
|---|---|---|
| Compound XVIII-[(Ai)(Aj)(Rl)(Rn)], wherein Compound XVIII-[(A1)(A1)(R1)(R1)] to Compound XVIII-[(A840)(A840)(R60)(R60)] having the structure | 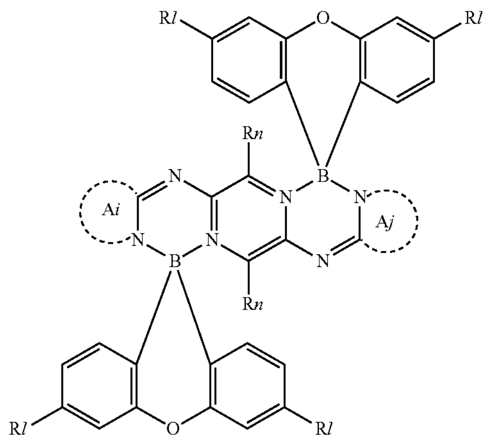 | wherein *i* and *j* are independently an integer from 1 to 840, and *l* and *n* are independently an integer from 1 to 60, |
| Compound XIX-[(Ai)(Aj)(Rl)(Rn)], wherein Compound XIX-[(A1)(A1)(R1)(R1)] to Compound XIX-[(A840)(A840)(R60)(R60)] having the structure | 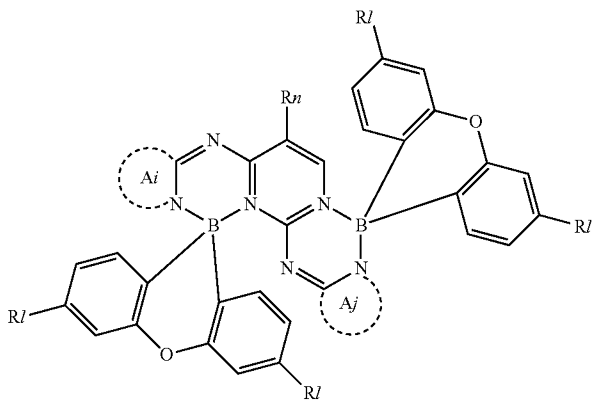 | wherein *i* and *j* are independently an integer from 1 to 840, and *l* and *n* are independently an integer from 1 to 60, |
| Compound XX-[(Ai)(Aj)(Rl)(Rn)], wherein Compound XX-[(A1)(A1)(R1)(R1)] to Compound XX-[(A840)(A840)(R60)(R60)] having the structure | 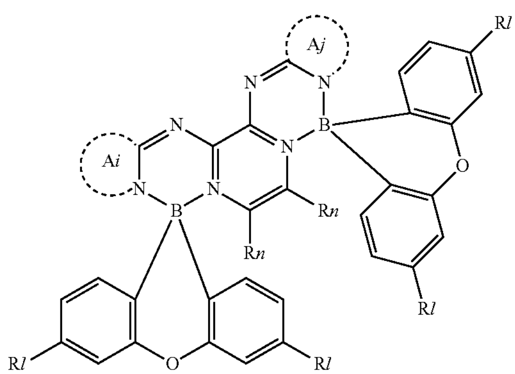 | wherein *i* and *j* are independently an integer from 1 to 840, and *l* and *n* are independently an integer from 1 to 60, |
| Compound XXI-[(Ai)(Aj)(Rk)(Rl)], wherein Compound XXI-[(A1)(A1)(R1)(R1)] to Compound XXI-[(A840)(A840)(R60)(R60)] having the structure | 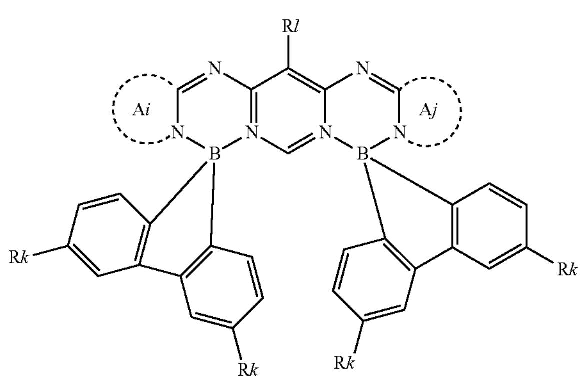 | wherein *i* and *j* are independently an integer from 1 to 840, and *k* and *l* are independently an integer from 1 to 60, |

-continued

| Compound name | Structure | *i*, *j*, *k*, *l*, *m*, *n* |
|---|---|---|
| Compound XXII-[(A*i*)(A*j*)(R*l*)(R*n*)], wherein Compound XXII-[(A*l*)(A*l*)(R*l*)(R*l*)] to Compound XXII-[(A840)(A840)(R60)(R60)] having the structure | 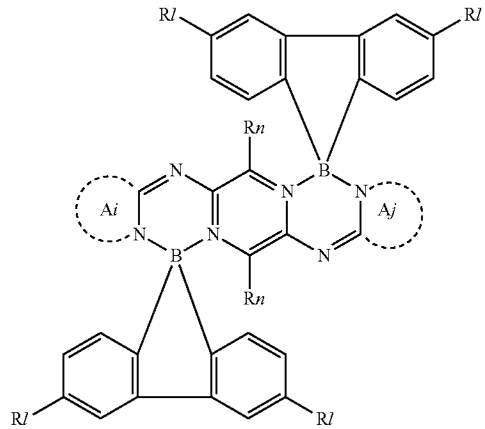 | wherein *i* and *j* are independently an integer from 1 to 840, and *l* and *n* are independently an integer from 1 to 60, |
| Compound XXIII-[(A*i*)(A*j*)(R*l*)(R*n*)], wherein Compound XXIII-[(A*l*)(A*l*)(R*l*)(R*l*)] to Compound XXIII-[(A840)(A840)(R60)(R60)] having the structure | 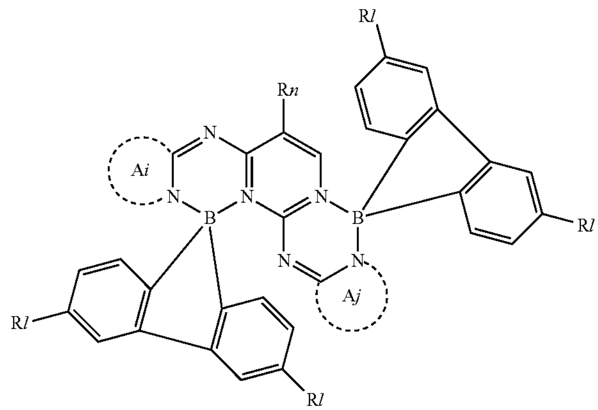 | wherein *i* and *j* are independently an integer from 1 to 840, and *l* and *n* are independently an integer from 1 to 60, |
| Compound XXIV-[(A*i*)(A*j*)(R*l*)(R*n*)], wherein Compound XXIV-[(A*l*)(A*l*)(R*l*)(R*l*)] to Compound XXIV-[(A840)(A840)(R60)(R60)] having the structure | 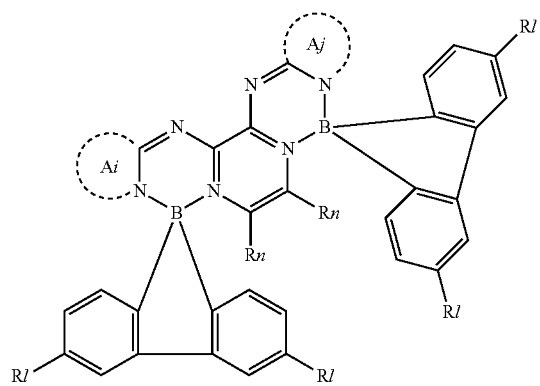 | wherein *i* and *j* are independently an integer from 1 to 840, and *l* and *n* are independently an integer from 1 to 60, |
| Compound XXV-[(A*i*)(A*j*)(R*l*)(R*n*)(R*o*)], wherein Compound XXV-[(A*l*)(A*l*)(R*l*)(R*l*)(R*l*)] to Compound XXV-[(A840)(A840)(R60)(R60)(R60)] having the structure | 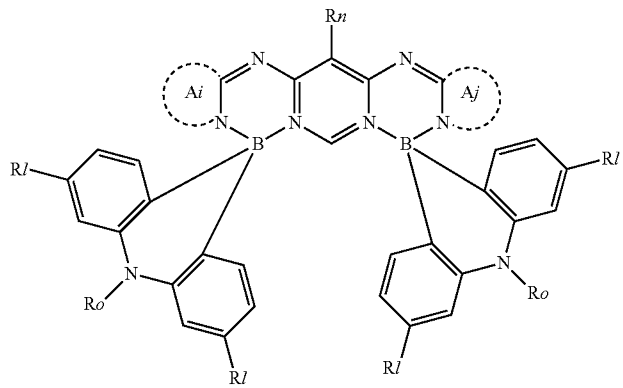 | wherein *i* and *j* are independently an integer from 1 to 840, and *l*, *n*, and *o* are independently an integer from 1 to 60, |

-continued

| Compound name | Structure | i, j, k, l, m, n |
|---|---|---|
| Compound XXVI-[(A*i*)(A*j*)(R*l*)(R*n*)(R*o*)], wherein Compound XXVI-[(A*l*)(A*l*)(R*l*)(R*l*)(R*l*)] to Compound XXVI-[(A840)(A840)(R60)(R60)(R60)] having the structure | 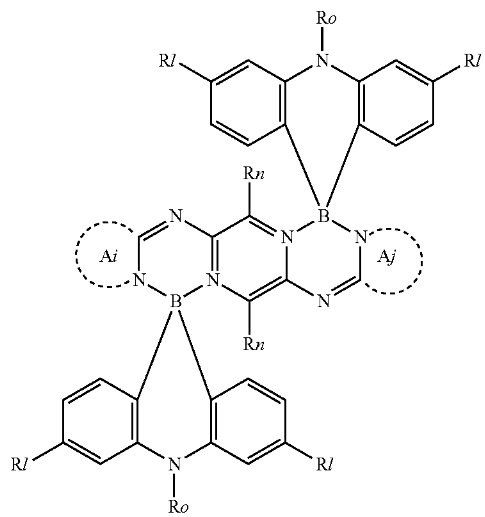 | wherein *i* and *j* are independently an integer from 1 to 840, and *l*, *n*, and *o* are independently an integer from 1 to 60, |
| Compound XXVI-[(A*i*)(A*j*)(R*l*)(R*n*)(R*o*)], wherein Compound XXVI-[(A*l*)(A*l*)(R*l*)(R*l*)(R*l*)] to Compound XXVI-[(A840)(A840)(R60)(R60)(R60)] having the structure | 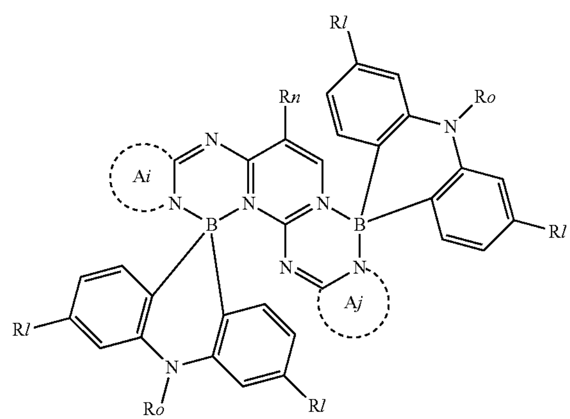 | wherein *i* and *j* are independently an integer from 1 to 840, and *l*, *n*, and *o* are independently an integer from 1 to 60, and |
| Compound XXVII-[(A*i*)(A*j*)(R*l*)(R*n*)(R*o*)], wherein Compound XXVII-[(A*l*)(A*l*)(R*l*)(R*l*)(R*l*)] to Compound XXVII-[(A840)(A840)(R60)(R60)(R60)] having the structure | 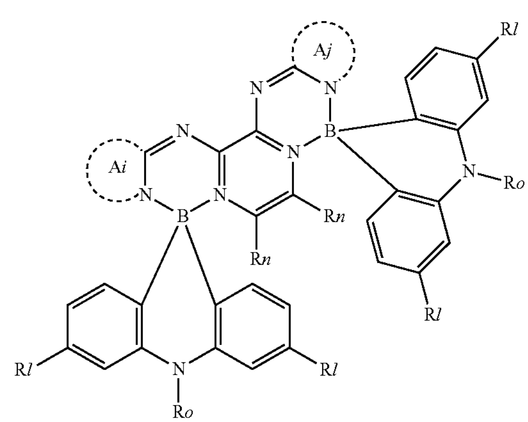 | wherein *i* and *j* are independently an integer from 1 to 840, and *l*, *n*, and *o* are independently an integer from 1 to 60, |

wherein A1 to A840 have the following structures:

| A*i*, A*j*, A*h*, | Structure of A*i*, A*j* and A*h* | R |
|---|---|---|
| wherein when *i*, *j*, and *h* are an integer from 1 to 60, A*i*, A*j*, and A*h* have the structure | 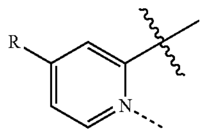 | wherein R = R*x*, wherein *x* is the corresponiding number *i*, *j*, or *h*, and |
| wherein when *i*, *j*, and *h* are an integer from 61 to 120, A*i*, A*j*, and A*h* have the structure | 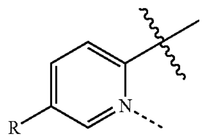 | wherein R = R*x*, wherein *x* is the corresponding number *i* − 60, *j* − 60, or *h* − 60, and |
| wherein when *i*, *j*, and *h* are an integer from 121 to 180, A*i*, A*j*, and A*h* have the structure | 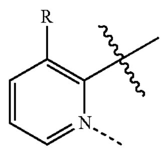 | wherein R = R*x*, wherein *x* is the corresponding number *i* − 120, *j* − 120, or *h* − 120, and |
| wherein when *i*, *j*, and *h* are an integer from 181 to 240, A*i*, A*j*, and A*h* have the structure | 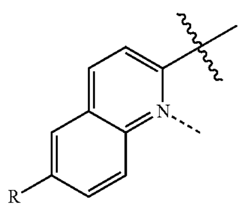 | wherein R = R*x*, wherein *x* is the corresponding number *i* − 180, *j* − 180, or *h* − 180, and |
| wherein when *i*, *j*, and *h* are an integer from 241 to 300, A*i*, A*j*, and A*h* have the structure | 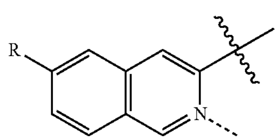 | wherein R = R*x*, wherein *x* is the corresponding number *i* − 240, *j* − 240, or *h* − 240, and |
| wherein when *i*, *j*, and *h* are an integer from 301 to 360, A*i*, A*j*, and A*h* have the structure | 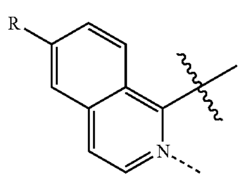 | wherein R = R*x*, wherein *x* is the corresponding number *i* − 300, *j* − 300, or *h* − 300, and |
| wherein when *i*, *j*, and *h* are an integer from 361 to 420, A*i*, A*j*, and A*h* have the structure | 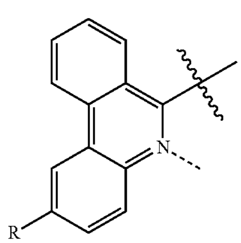 | wherein R = R*x*, wherein *x* is the corresponding number *i* − 360, *j* − 360, or *h* − 360, and |
| wherein when *i*, *j*, and *h* are an integer from 421 to 470, A*i*, A*j*, and A*h* have the structure | 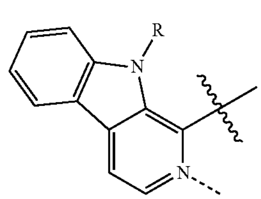 | wherein R = R*x*, wherein *x* is the corresponding number *i* − 420, *j* − 420, or *h* − 420, and |

-continued

| Ai, Aj, Ah, | Structure of Ai, Aj and Ah | R |
|---|---|---|
| wherein when *i*, *j*, and *h* are an integer from 471 to 450, Ai, Aj, and Ah have the structure | 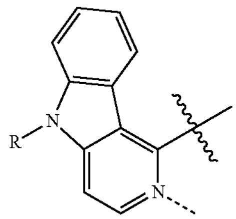 | wherein R = Rx, wherein *x* is the corresponding number *i* − 470, *j* − 470, or *h* − 470, and |
| wherein when *i*, *j*, and *h* are an integer from 521 to 570, Ai, Aj, and Ah have the structure | 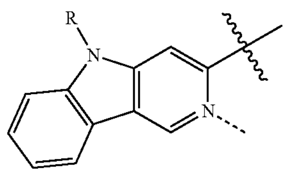 | wherein R = Rx, wherein *x* is the corresponding number *i* − 520, *j* − 520, or *h* − 520, and |
| wherein when *i*, *j*, and *h* are an integer from 571 to 620, Ai, Aj, and Ah have the structure | 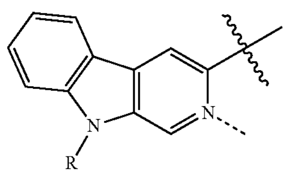 | wherein R = Rx, wherein *x* is the corresponding number *i* − 570, *j* − 570, or *h* − 570, and |
| wherein when *i*, *j*, and *h* are an integer from 621 to 670, Ai, Aj, and Ah have the structure | 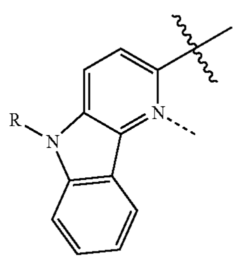 | wherein R = Rx, wherein *x* is the corresponding number *i* − 620, *j* − 620, or *h* − 620, and |
| wherein when *i*, *j*, and *h* are an integer from 671 to 720, Ai, Aj, and Ah have the structure | 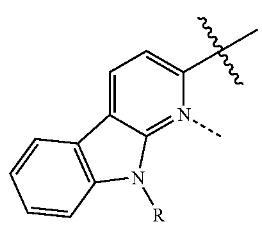 | wherein R = Rx, wherein *x* is the corresponding number *i* − 670, *j* − 670, or *h* − 670, and |
| wherein when *i*, *j*, and *h* are an integer from 721 to 780, Ai, Aj, and Ah have the structure | 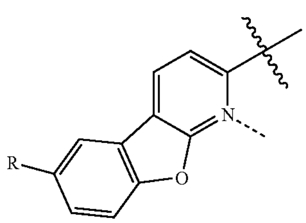 | wherein R = Rx, wherein *x* is the corresponding number *i* − 720, *j* − 720, or *h* − 720, and |
| wherein when *i*, *j*, and *h* are an integer from 781 to 840, Ai, Aj, and Ah have the structure | 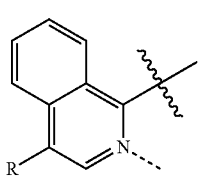 | wherein R = Rx, wherein *x* is the corresponding number *i* − 780, *j* − 780, or *h* − 780, |

wherein R1 to R60 have the following structures:
R1
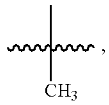
R2
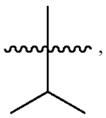
R3
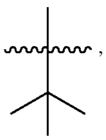
R4
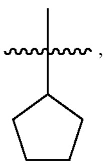
R5
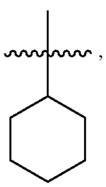
R6
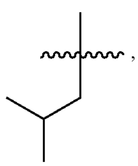
R7
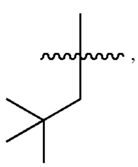
R8
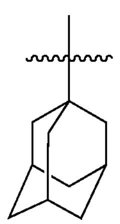
R9
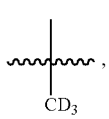
-continued
R10
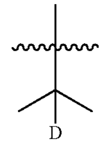
R11
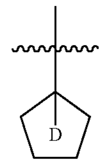
R12
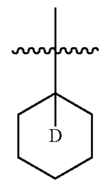
R13
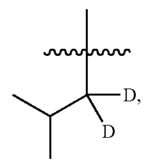
R14
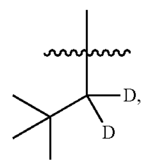
R15
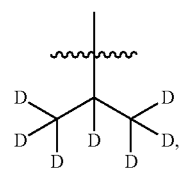
R16
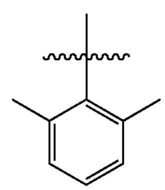
R17
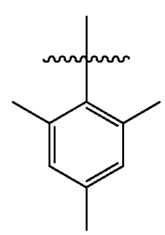
R18
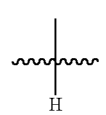

-continued
R19
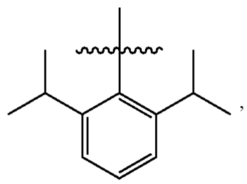
R20
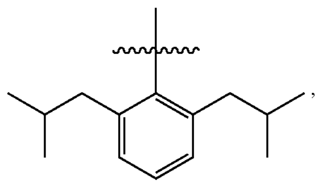
R21
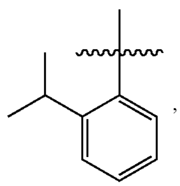
R22
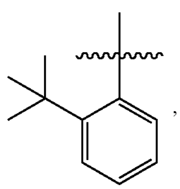
R23
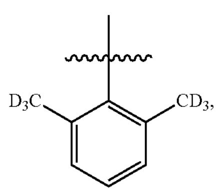
R24
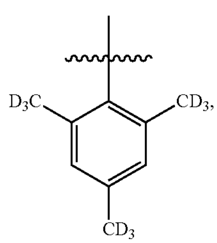
R25
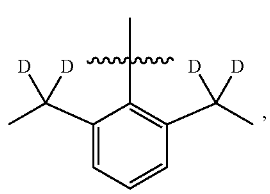
R26
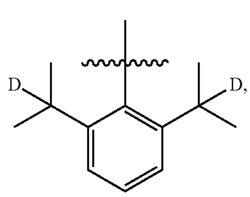
-continued
R27
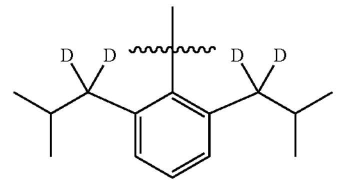
R28
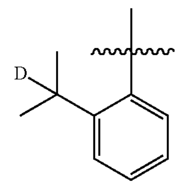
R29
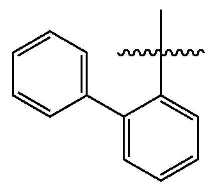
R30
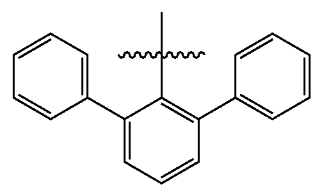
R31
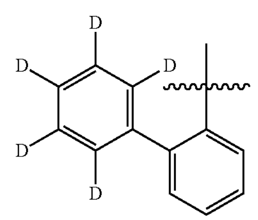
R32
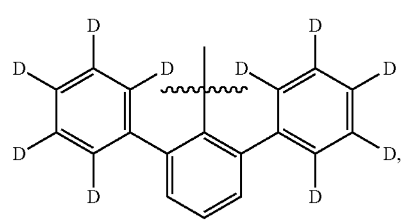
R33
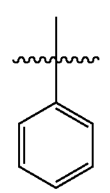
R34
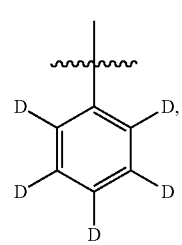

-continued
R35
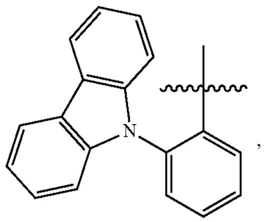
R36
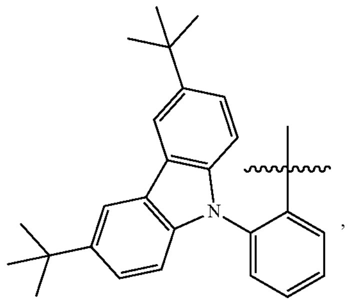
R37
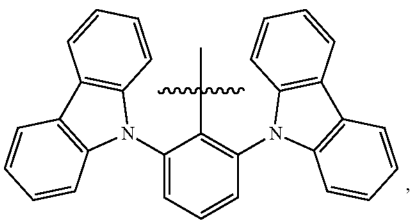
R38
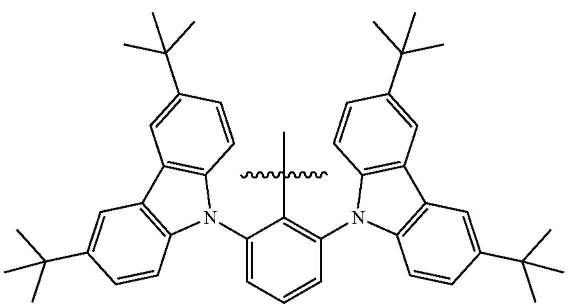
R39
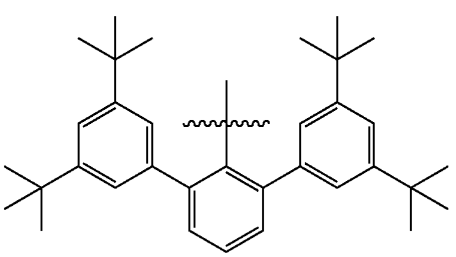
R40
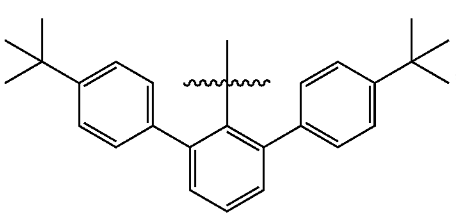
-continued
R41
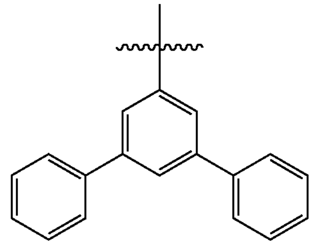
R42
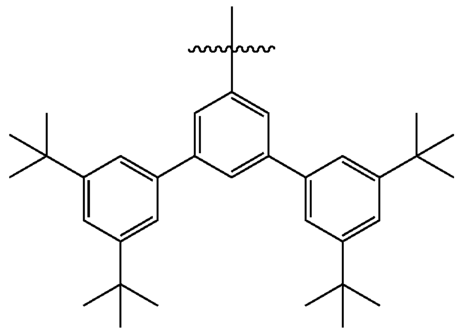
R43
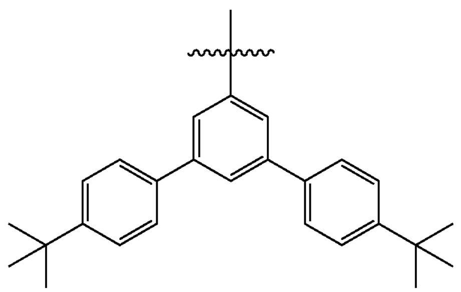
R44
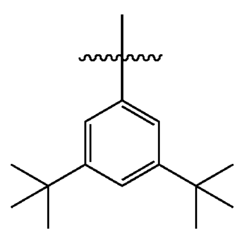
R45
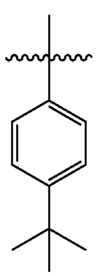

-continued
R46
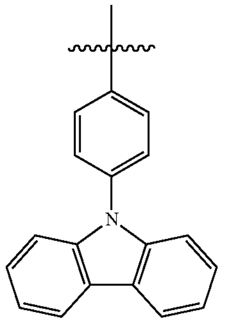
R47
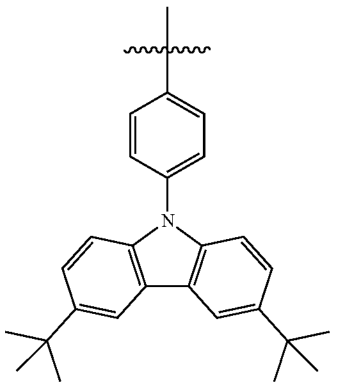
R48
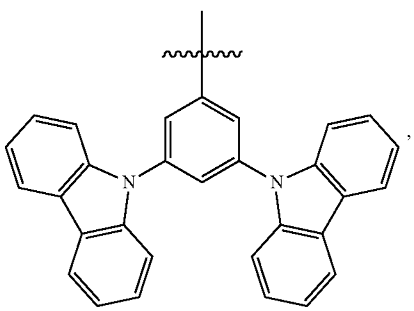
R49
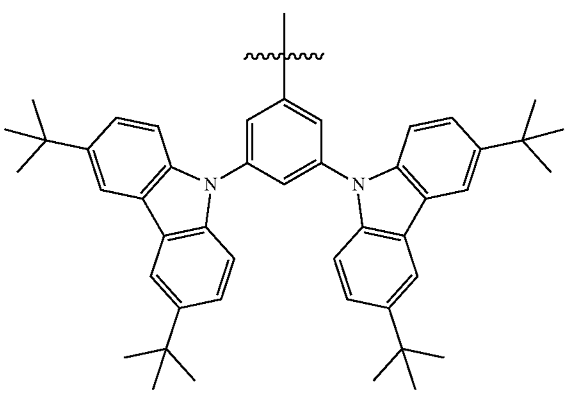
R50
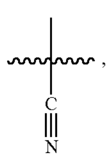
-continued
R51
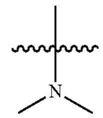
R52
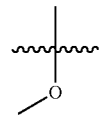
R53
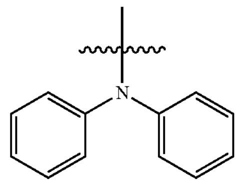
R54
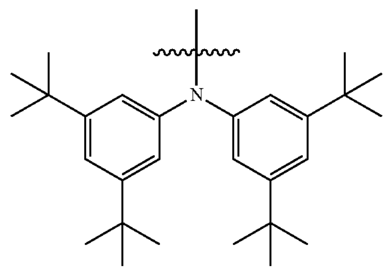
R55
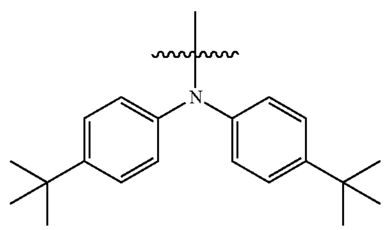
R56
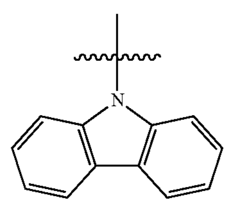
R57
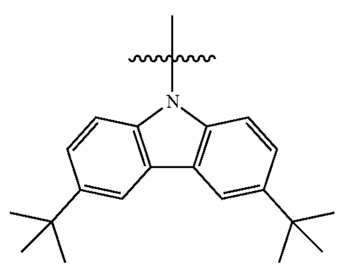

-continued
R58
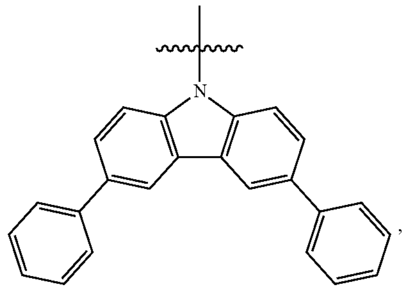
R59
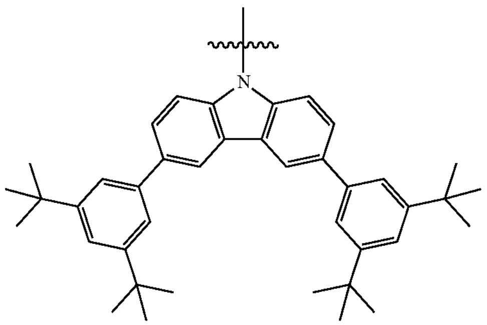
and
R60
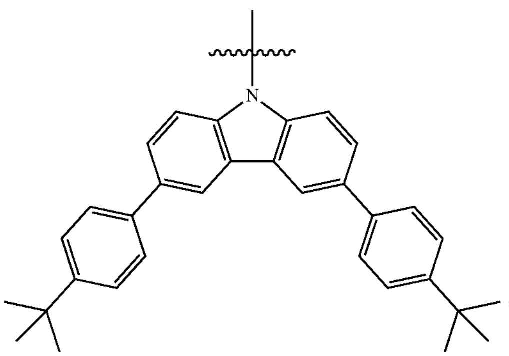
wherein Y1 to Y20 have the following structures:
Y1
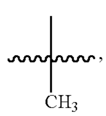
Y2
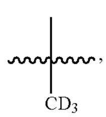
Y3
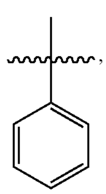
-continued
Y4
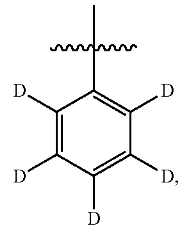
Y5
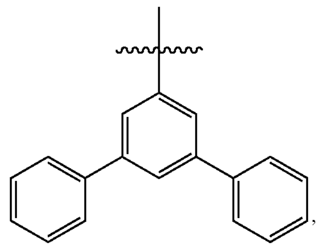
Y6
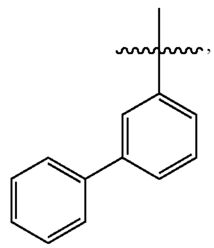
Y7
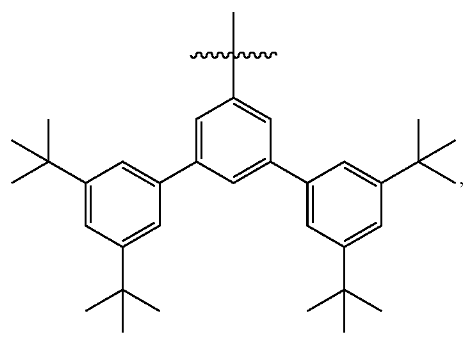
Y8
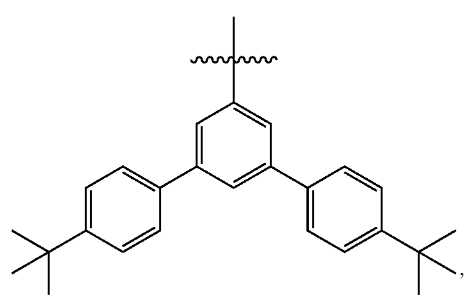

-continued
Y9
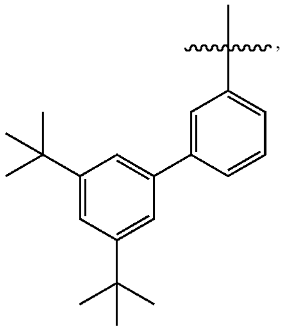
Y10
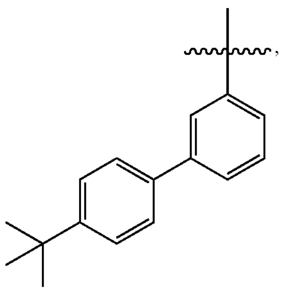
Y11
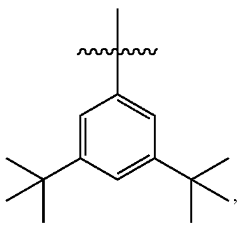
Y12
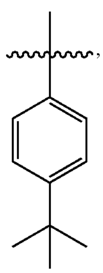
Y13
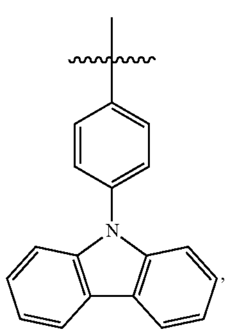
-continued
Y14
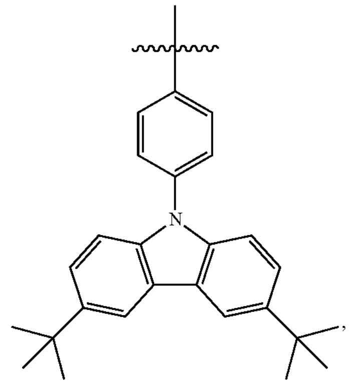
Y15
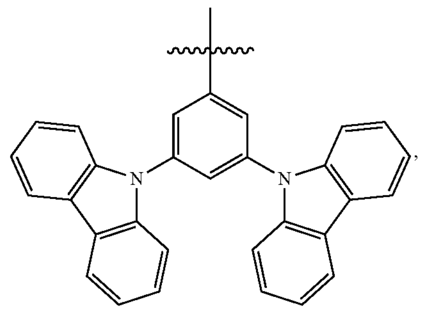
Y16
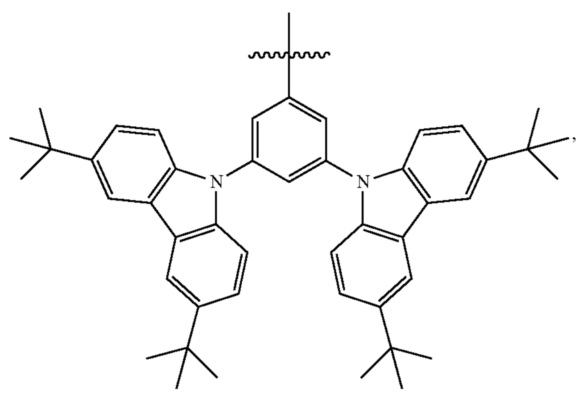
Y17
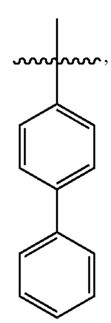

-continued
Y18
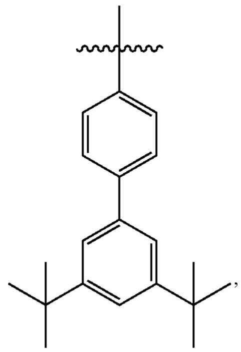
Y19
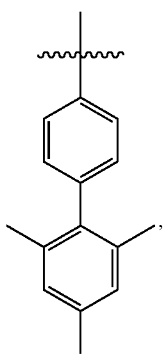
and
Y20
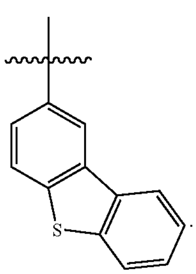
In some embodiments, the compound can be selected from the group consisting of only those compounds having Ai, Aj, and Ah that correspond to A1, A3, A8, A18, A19, A30, A39, A56, A57, A176, A177, A241, A243, A248, A258, A259, A270, A279, A296, A297, A301, A303, A308, A318, A319, A330, A339, A356, or A357.
In some embodiments, the compound can each be independently selected from the group consisting of:
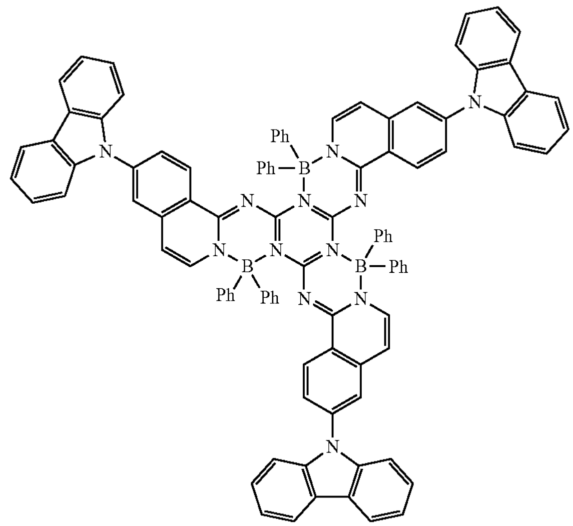
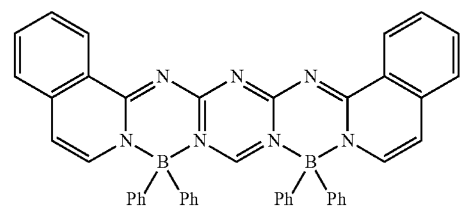
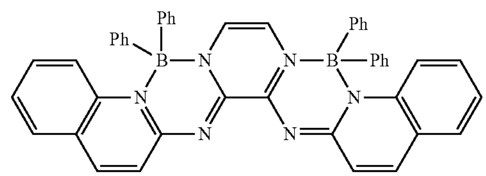
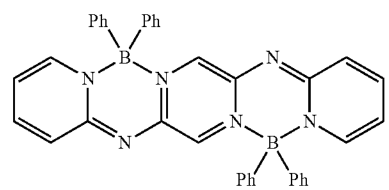
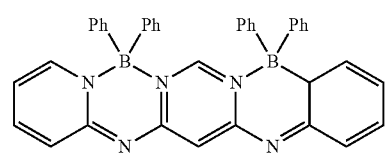
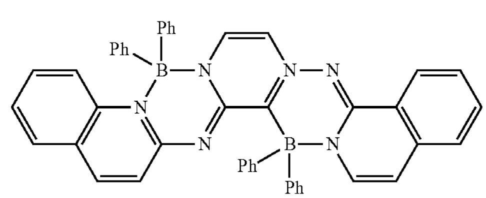

-continued
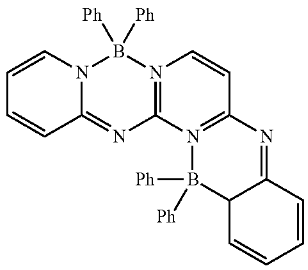
,
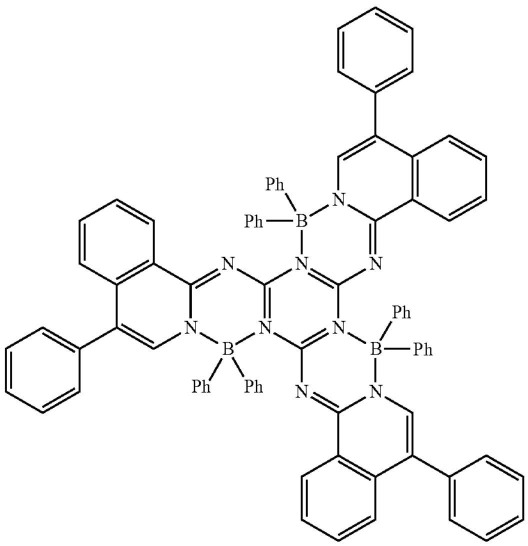
,
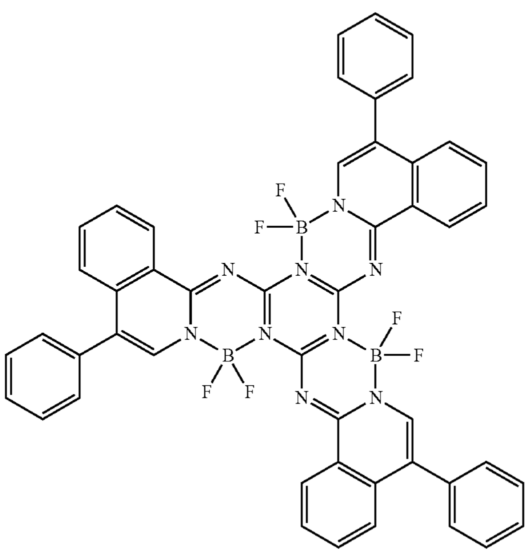
,
-continued
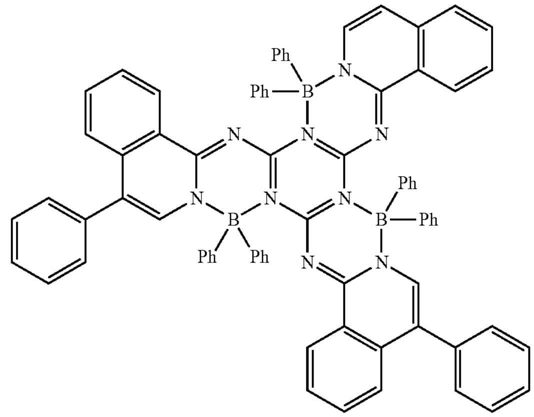
,
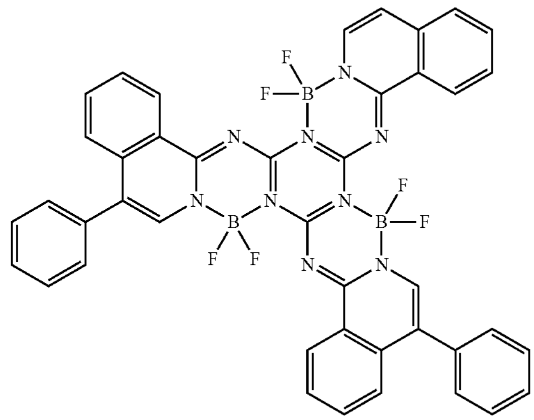
,
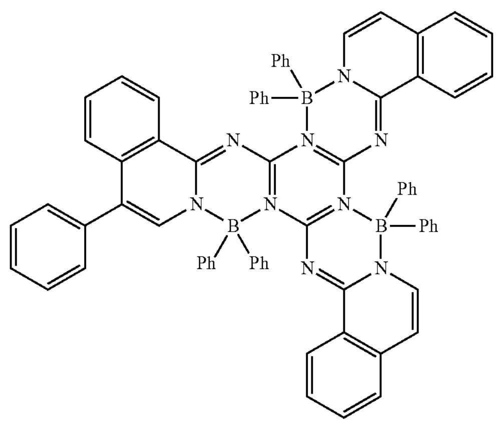
,
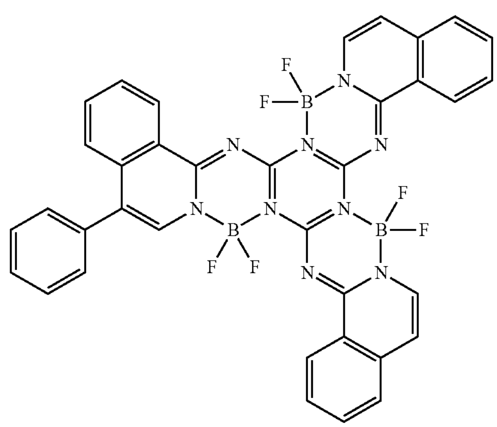
, -continued
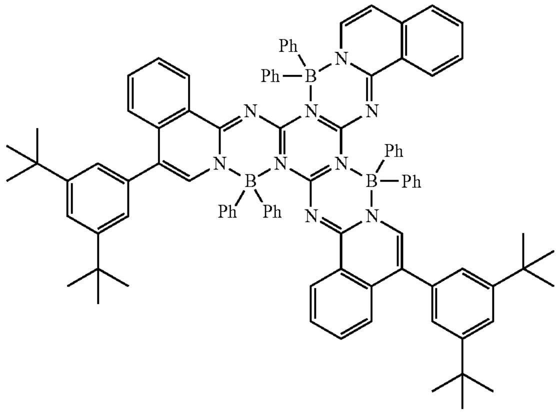
,
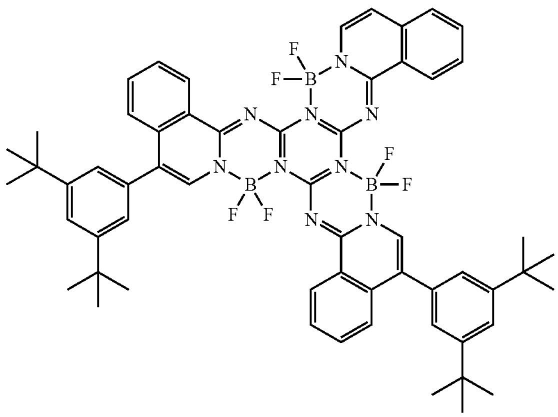
,
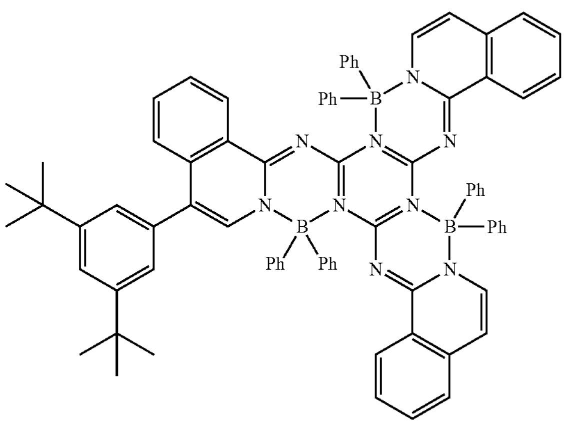
,
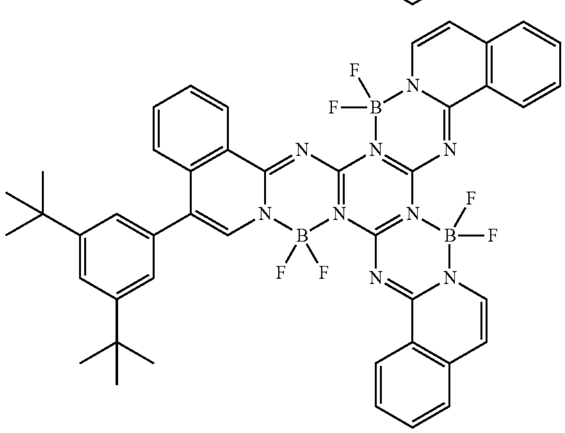
,
-continued
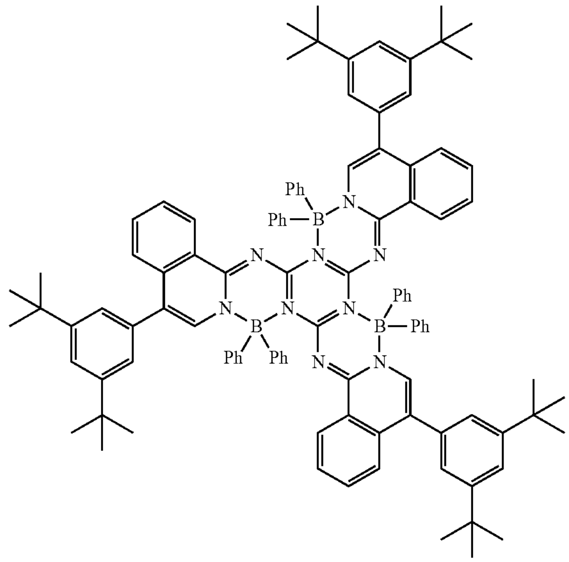
,
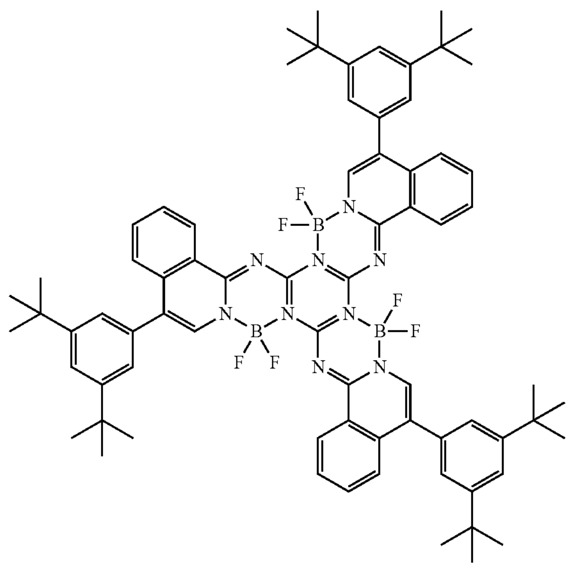
,
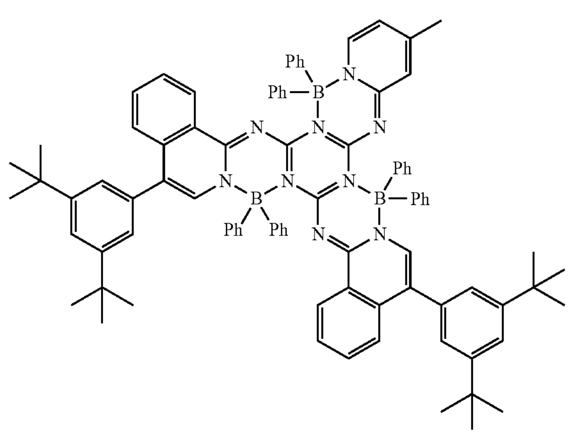
,

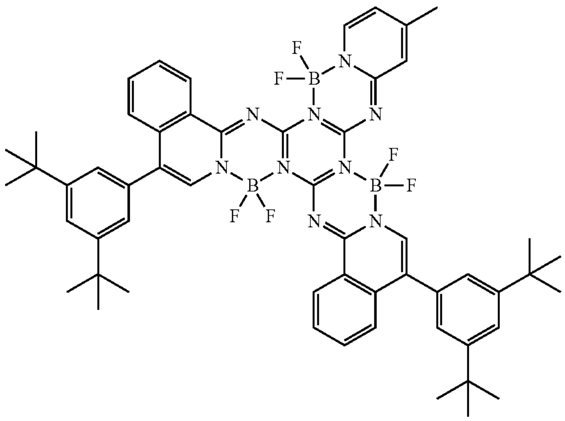
,
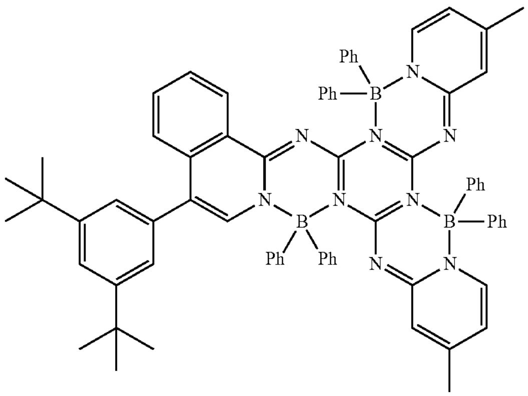
,
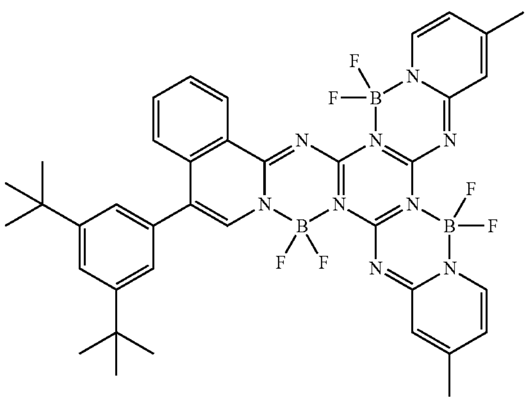
,
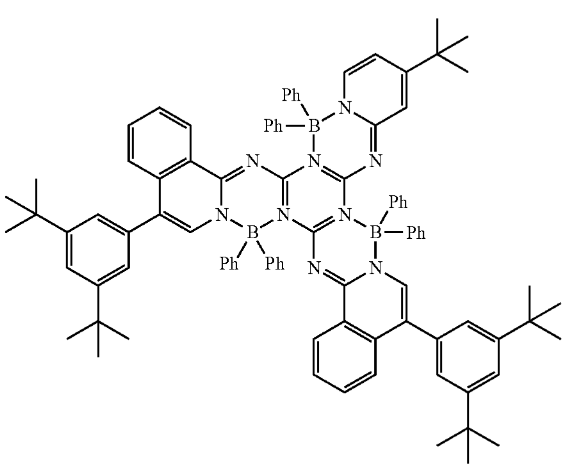
,
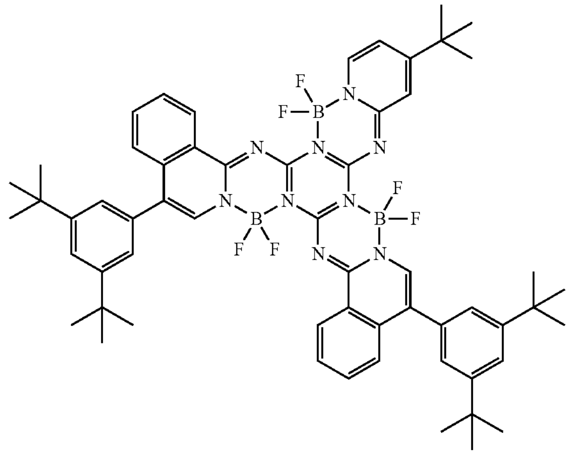
,
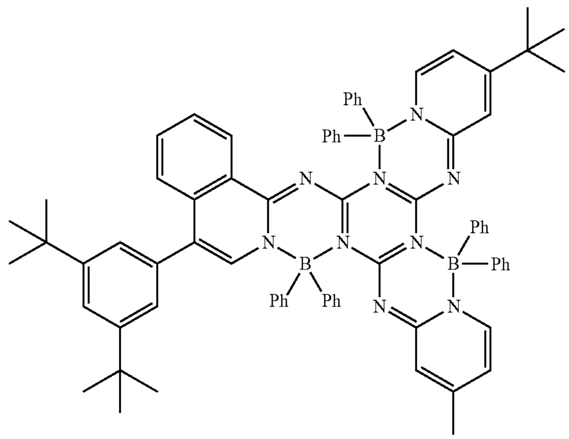
,
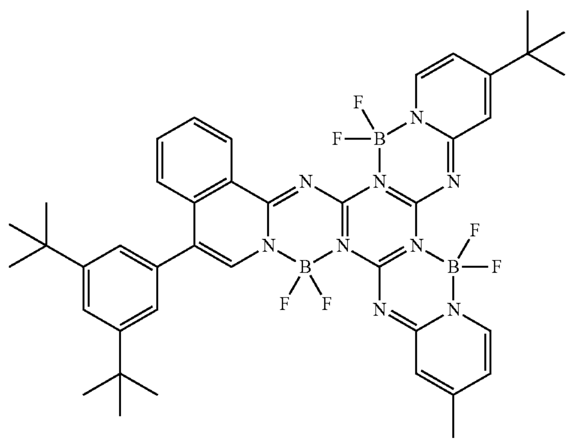
,
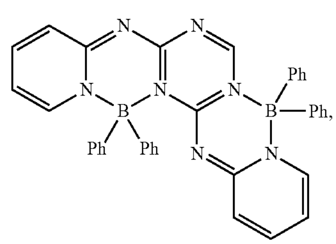

-continued
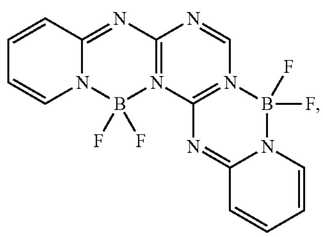
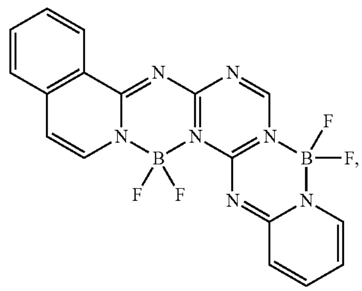
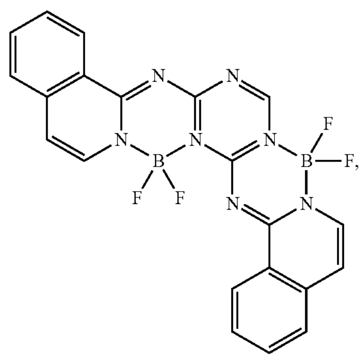
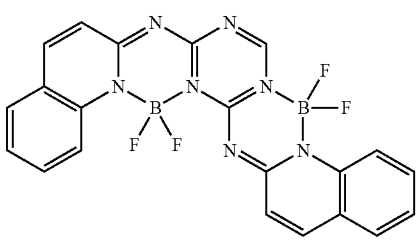
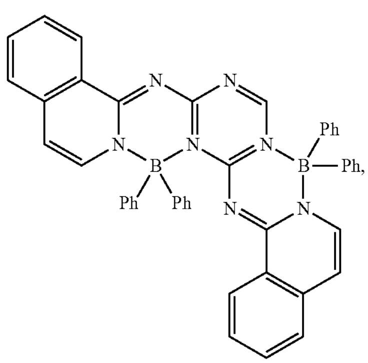
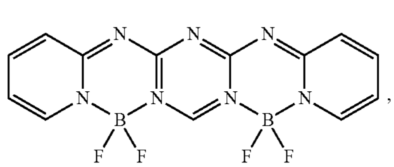
-continued
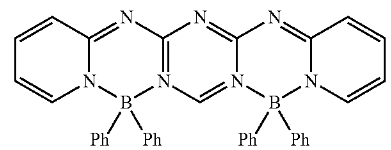
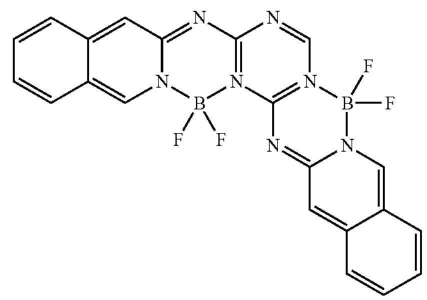
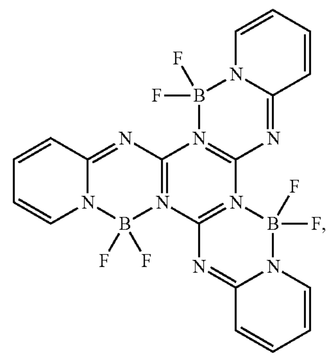
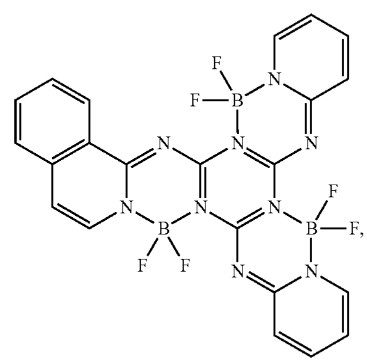
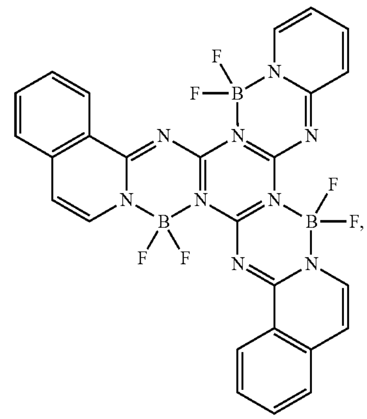

-continued
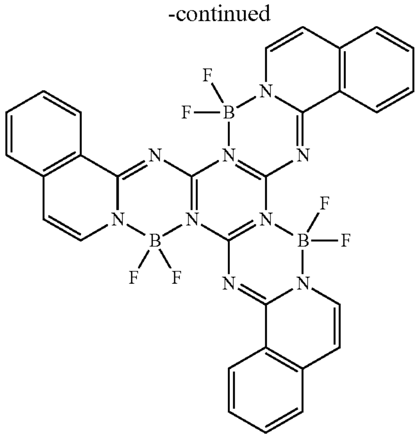
,
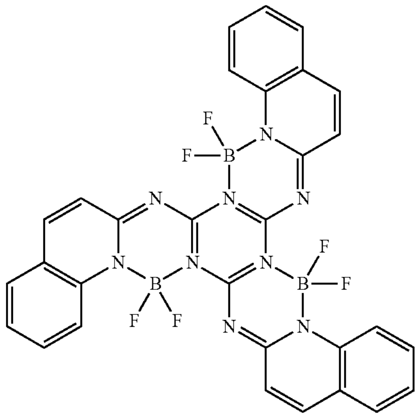
,
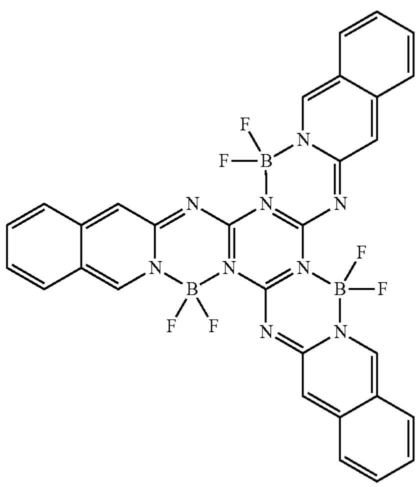
,
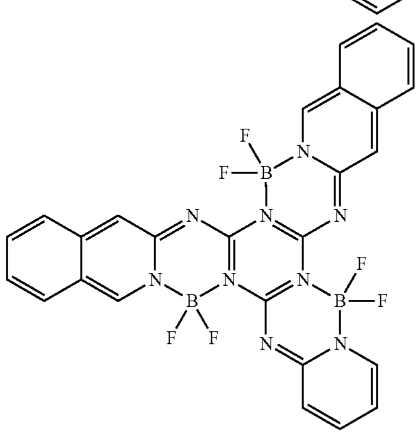
,
-continued
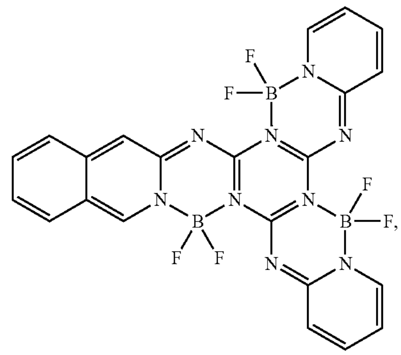
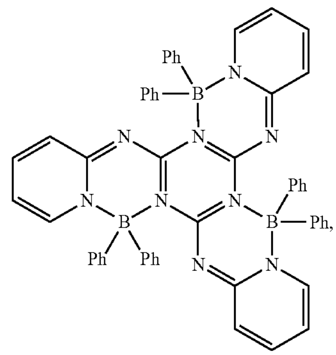
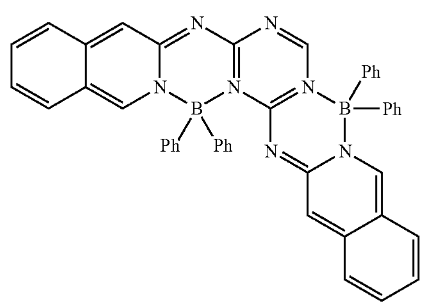
,
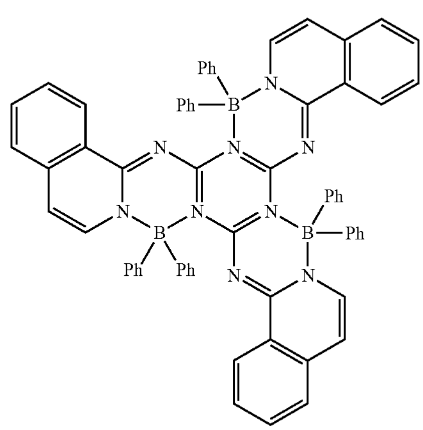
, -continued
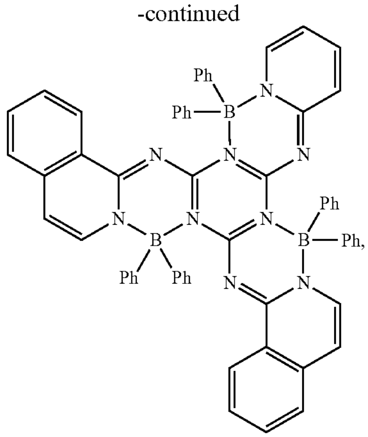
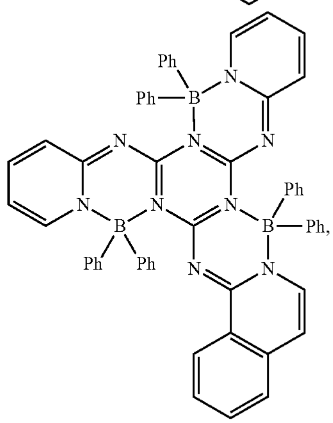
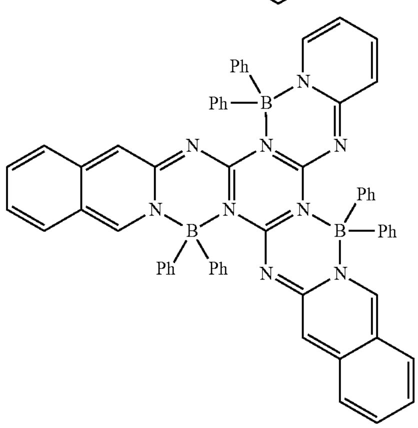
,
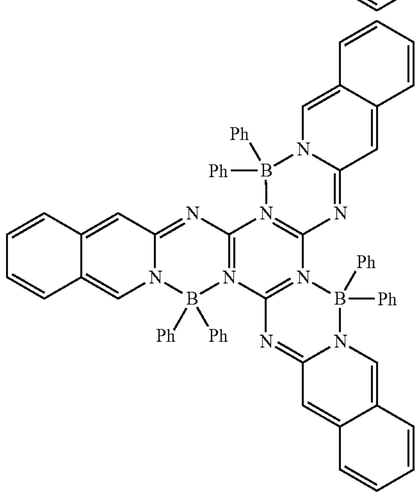
,
-continued
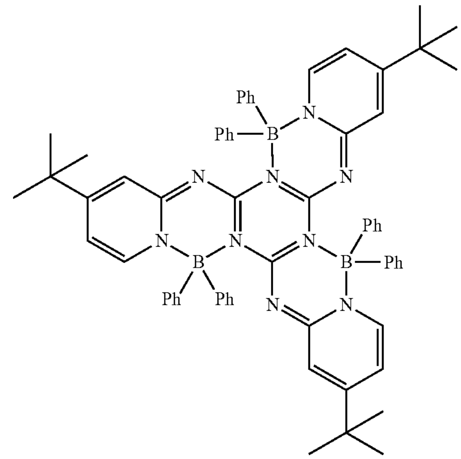
,
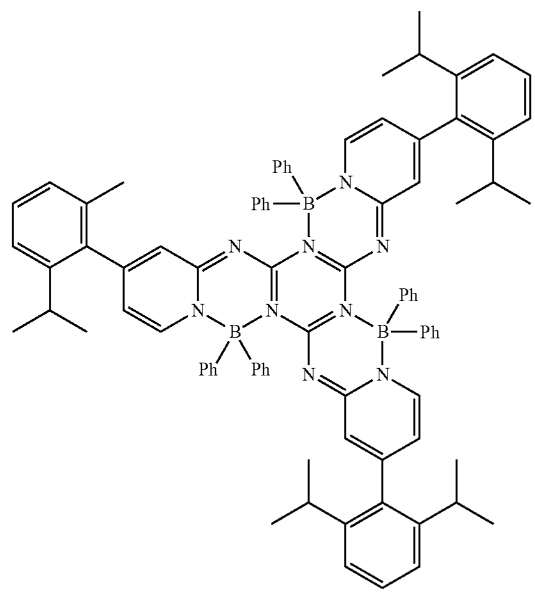
,
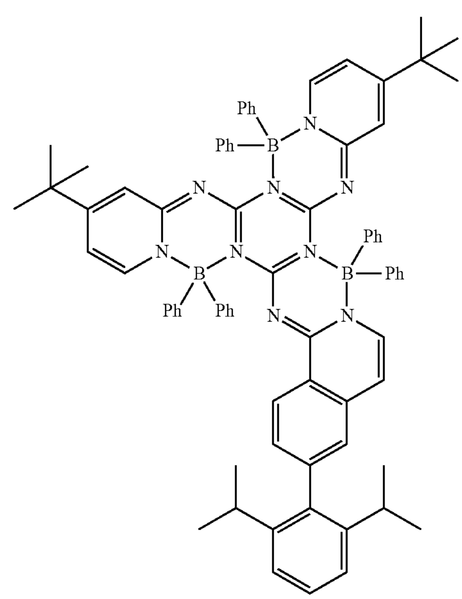
, -continued
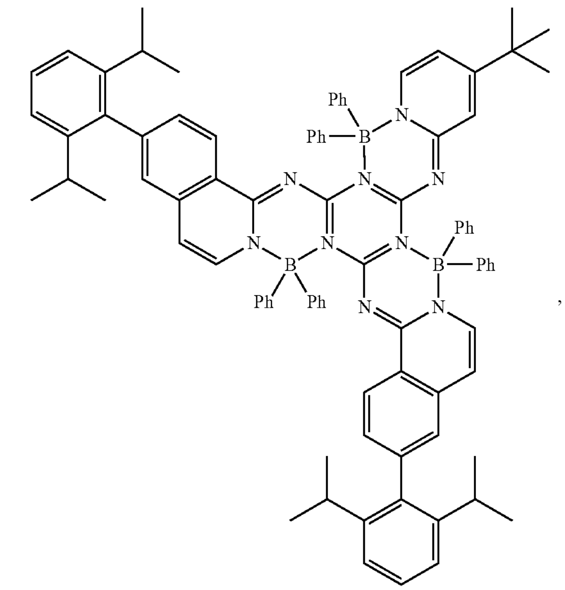
,
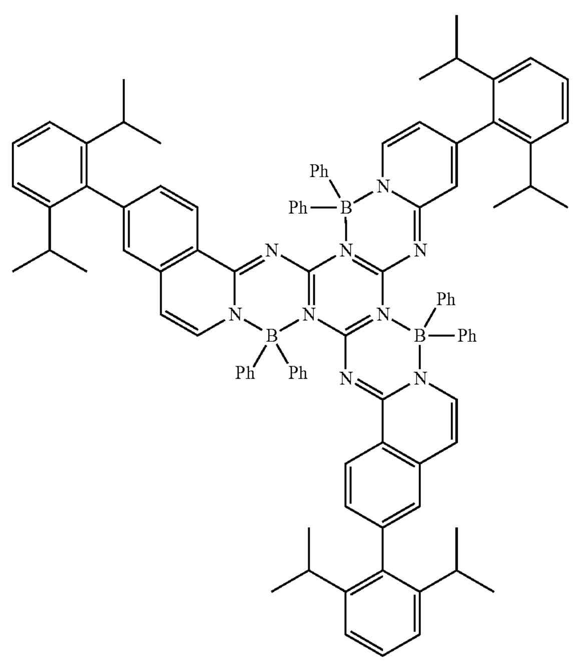
,
-continued
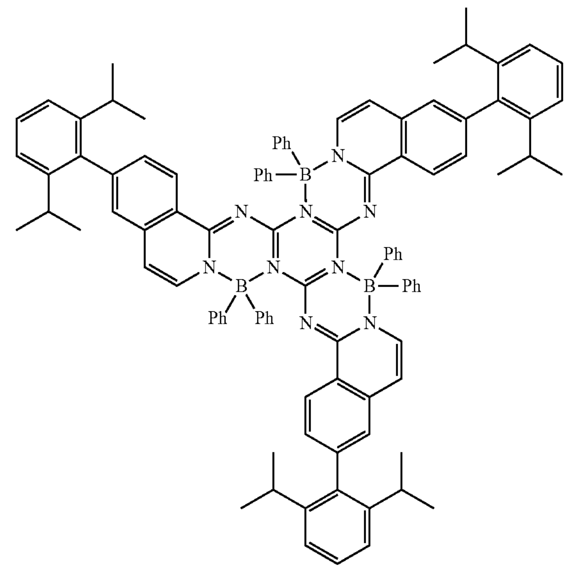
,
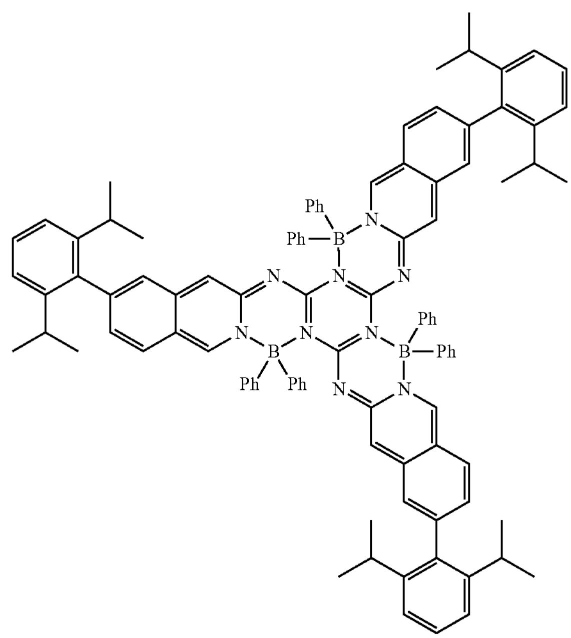
,
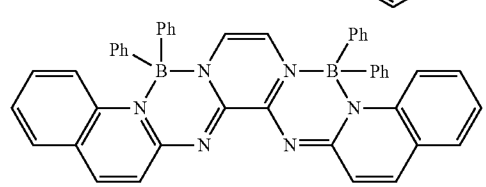
,
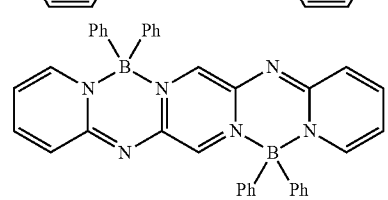
,
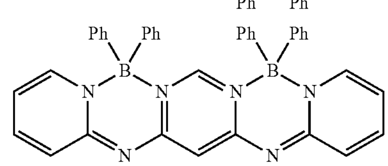
, -continued

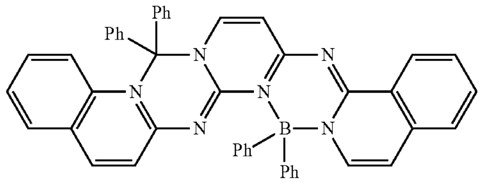

,

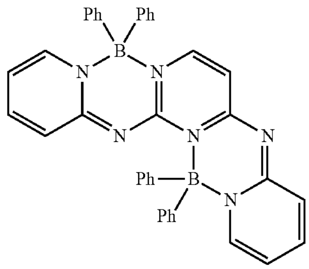

,

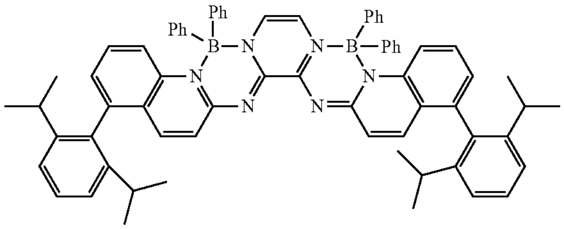

,

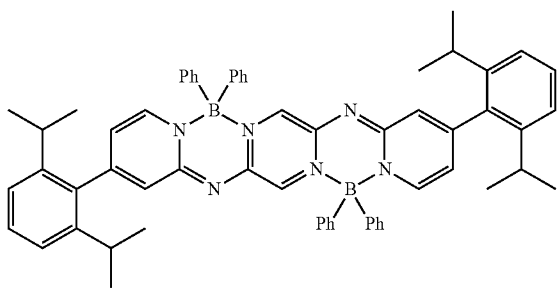

,

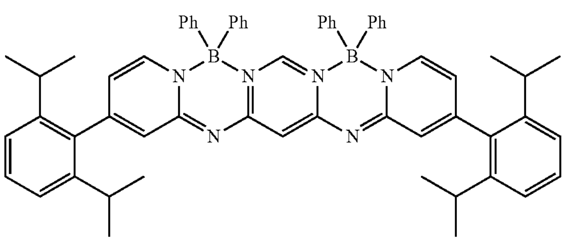

,

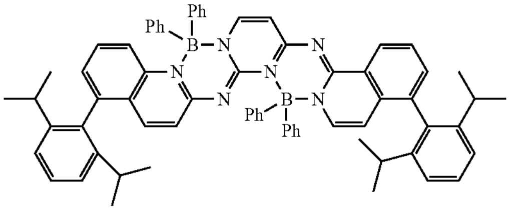

, and

-continued

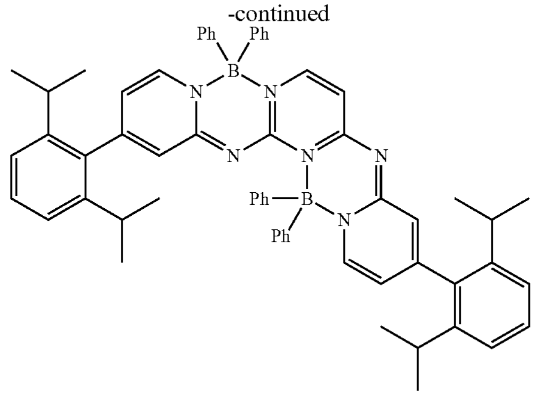

.

C. The OLEDs and the Devices of the Present Disclosure

In another aspect, the present disclosure also provides an OLED device comprising an anode, a cathode, a first organic layer disposed between the anode and the cathode while the first organic layer contains a compound as disclosed in the above compounds section of the present disclosure.

In some embodiments, the first organic layer may comprise a compound of Formula I:

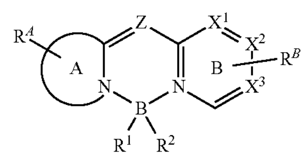

wherein Z is CR' or N; $X^1$-$X^3$ are each independently C or N, with at least one of $X^1$-$X^3$ being N and bonded to boron; $R^A$ and $R^B$ each represents zero, mono, or up to the maximum allowed number of substitutions to its associate ring; R', $R^A$, and $R^B$ are each independently a hydrogen or a substituent selected from the group consisting of the general substituents defined herein; $R^1$ and $R^2$ are each independently a hydrogen or a substituent selected from the group consisting of deuterium, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfanyl, sulfonyl, phosphino, boryl, borate, and combinations thereof; ring A is a 5-membered or 6-membered ring; and two substituents within Formula I can be joined or fused together to form a ring, with a proviso that two adjacent $R^B$ substituents are joined to form a fused heterocyclic ring.

In some embodiments, the first organic layer may be an emissive layer and the compound as described herein may be an emissive dopant or a non-emissive dopant.

In some embodiments, the compound as described herein may be a fluorescent emitter.

In some embodiments, the first organic layer may further comprise a phosphorescent sensitizer, and the compound is a fluorescent acceptor.

In some embodiments, the OLED may comprise a second organic layer disposed between the anode and the cathode, wherein the second organic layer comprises a phosphorescent sensitizer, and the compound is a fluorescent acceptor.

In some embodiments, the phosphorescent sensitizer may be a transition metal complex having at least one ligand or part of the ligand if the ligand is more than bidentate selected from the group consisting of:

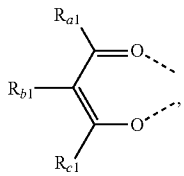

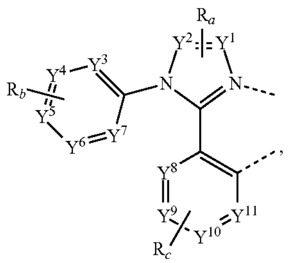

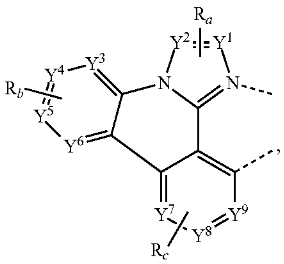

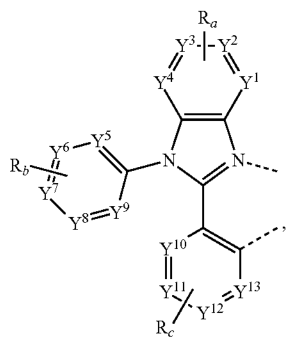

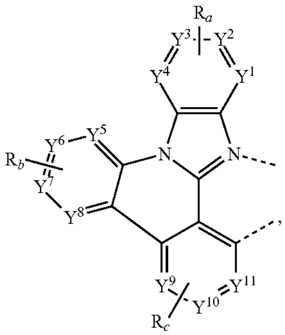

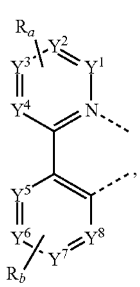

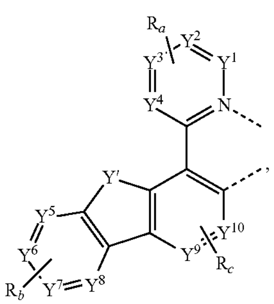

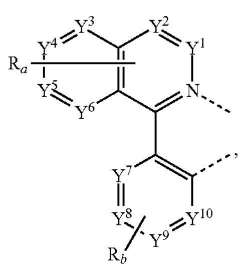

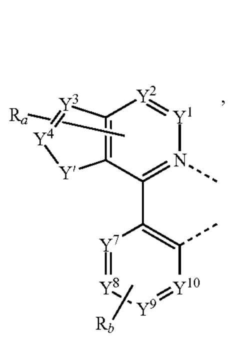

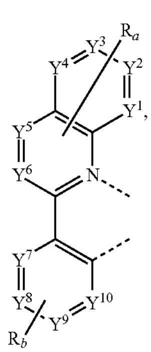

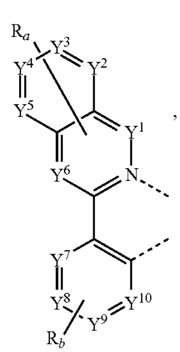

-continued

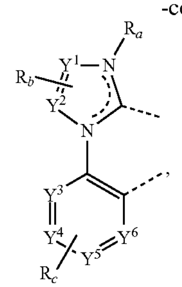

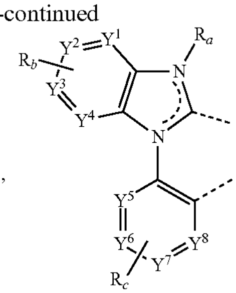

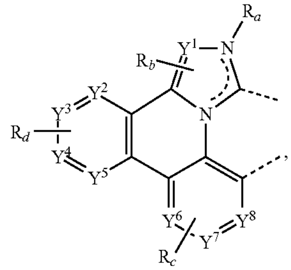

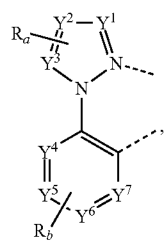

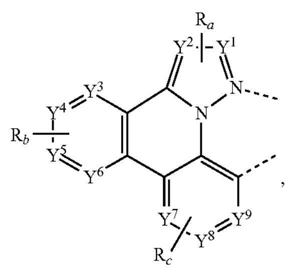

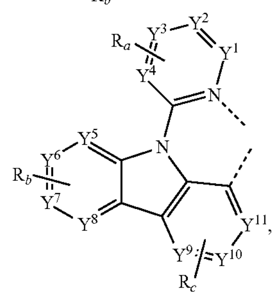

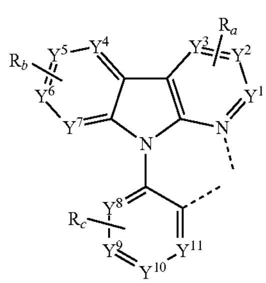

and

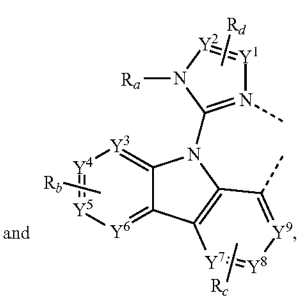

wherein each $Y^1$ to $Y^{13}$ are independently selected from the group consisting of carbon and nitrogen; Y' is selected from the group consisting of $BR_e$, $NR_e$, $PR_e$, O, S, Se, C═O, S═O, $SO_2$, $CR_eR_f$, $SiR_eR_f$, and $GeR_eR_f$; $R_e$ and $R_f$ can be fused or joined to form a ring; each $R_a$, $R_b$, $R_c$, and $R_d$ may independently represent from zero, mono, or up to the maximum allowed number of substitutions to its associated ring; $R_{a1}$, $R_{b1}$, $R_{c1}$, $R_a$, $R_b$, $R_c$, $R_d$, $R_e$ and $R_f$ are each independently a hydrogen or a substituent selected from the group consisting of the general substituents defined herein; and two adjacent substituents of $R_a$, $R_b$, $R_c$, and $R_d$ can be fused or joined to form a ring or form a multidentate ligand.

In some embodiments, one or more organic layers disposed between the anode and cathode, may comprise a host, wherein the host comprises at least one chemical moiety selected from the group consisting of triphenylene, carbazole, indolocarbazole, dibenzothiphene, dibenzofuran, dibenzoselenophene, 5,9-dioxa-13b-boranaphtho[3,2,1-de]anthracene, aza-triphenylene, aza-carbazole, aza-indolocarbazole, aza-dibenzothiophene, aza-dibenzofuran, aza-dibenzoselenophene, and aza-(5,9-dioxa-13b-boranaphtho[3,2,1-de]anthracene).

In some embodiments, the host may be selected from the group consisting of:
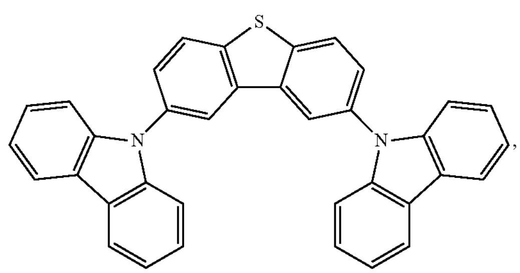
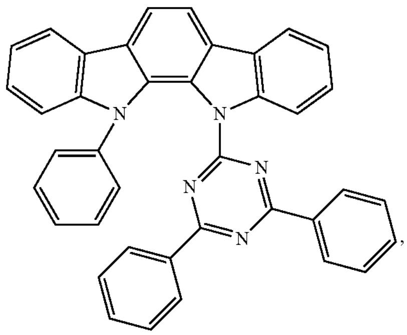
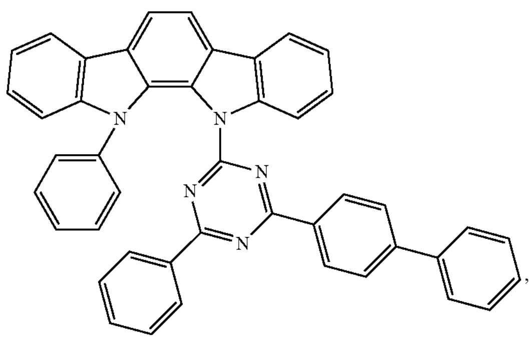
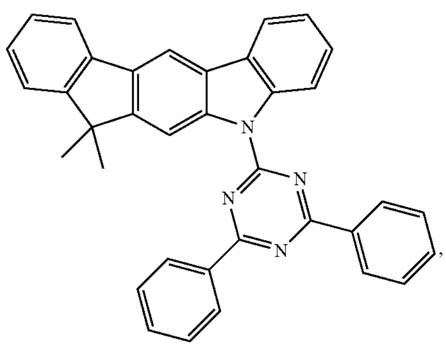
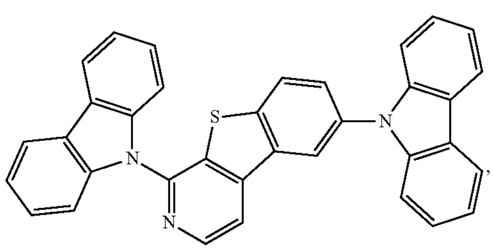
-continued
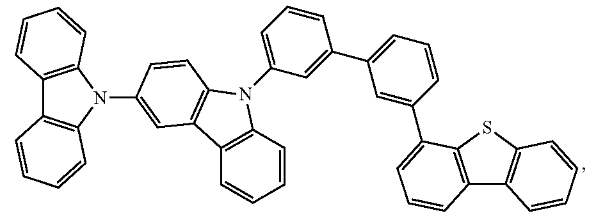
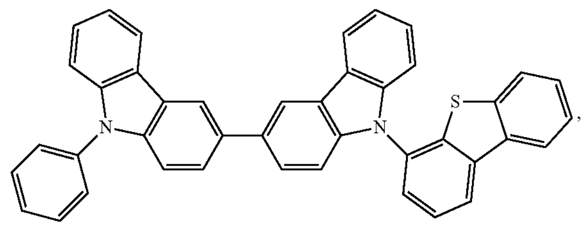
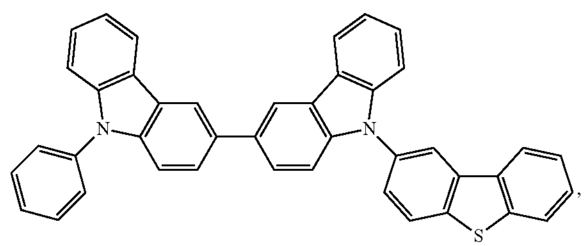
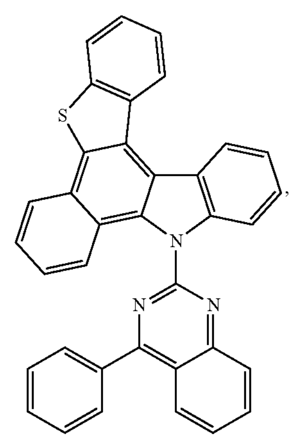
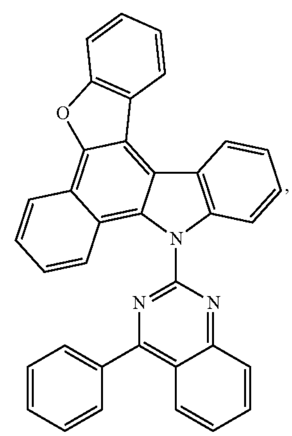

-continued
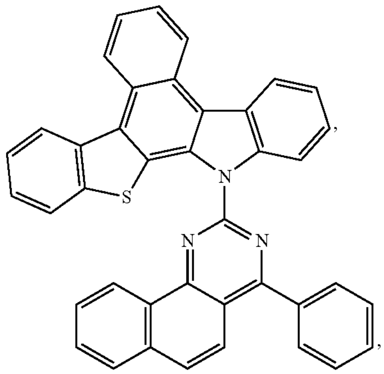
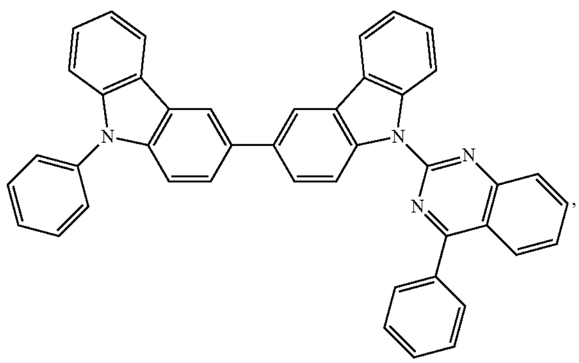
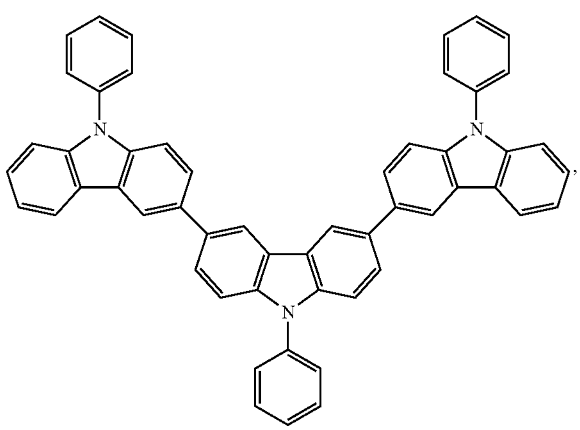
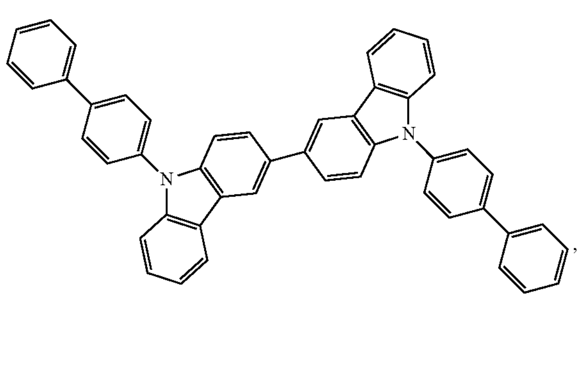
-continued
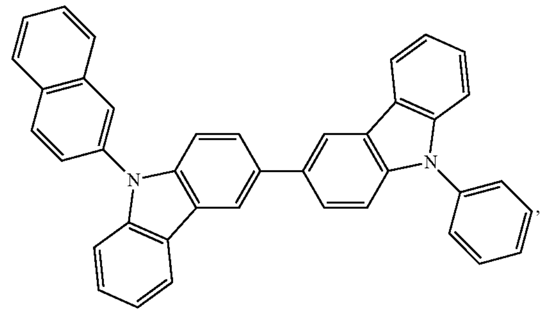
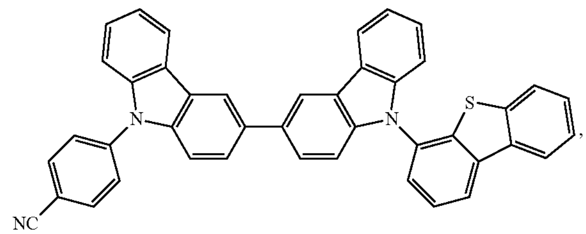
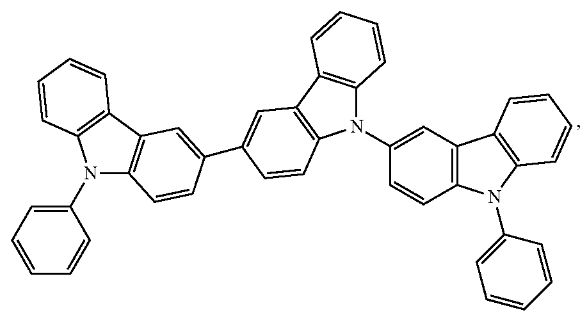
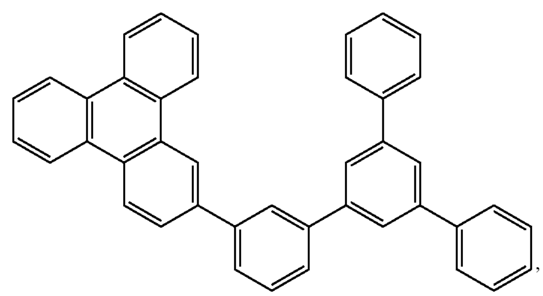
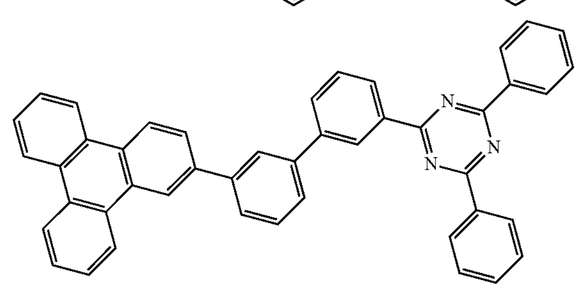
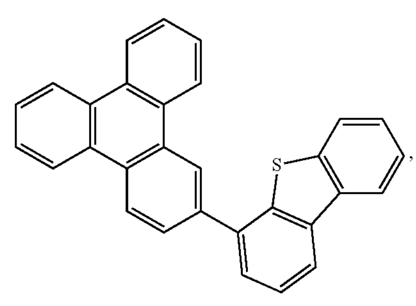

-continued
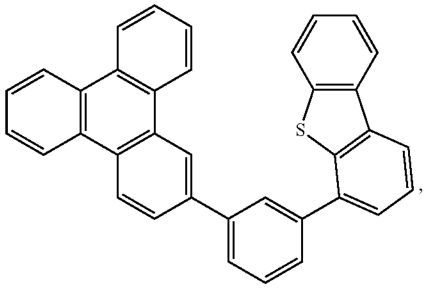
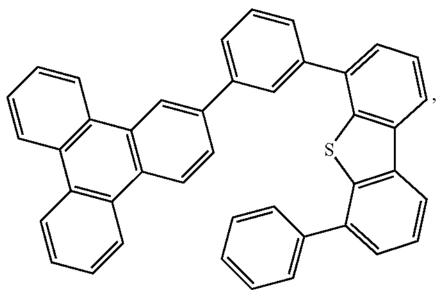
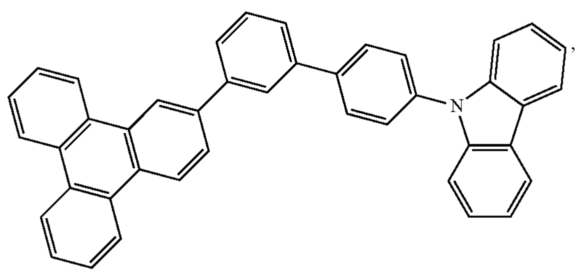
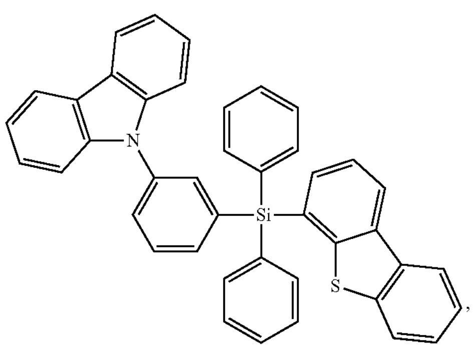
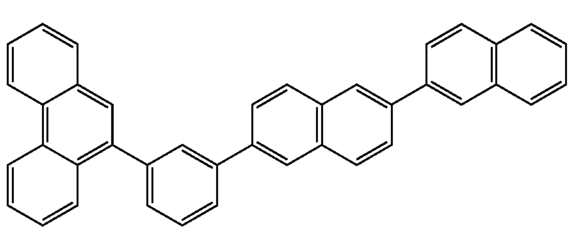
-continued
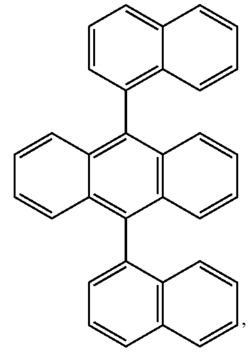
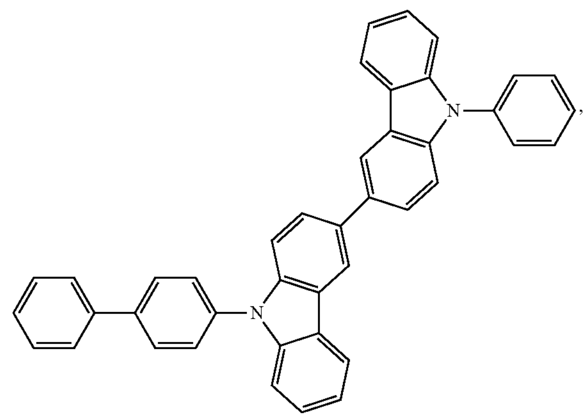
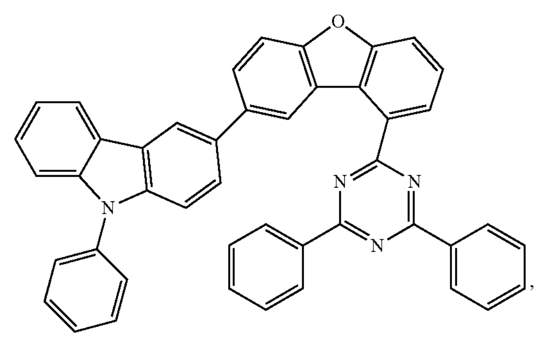
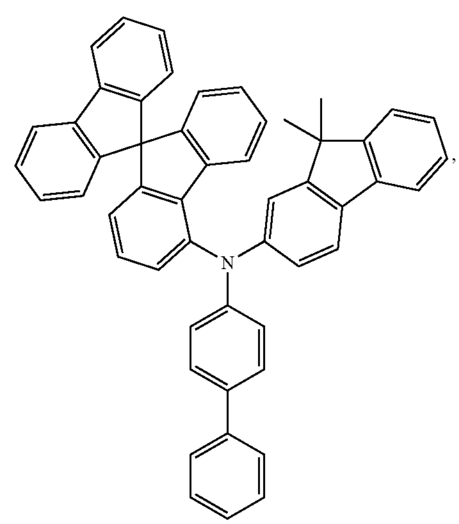

-continued

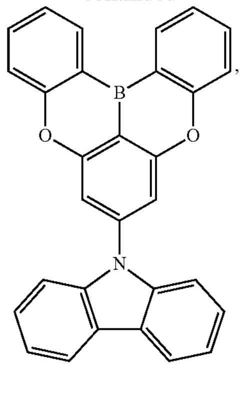 [SMILES: c1ccc2c(c1)Oc1cc(-n3c4ccccc4c4ccccc43)cc3c1B2c1ccccc1O3]

and combinations thereof.

In some embodiments, the consumer product comprises an organic light-emitting device (OLED) having an anode; a cathode; and an organic layer disposed between the anode and the cathode, wherein the organic layer may comprise a compound of Formula I

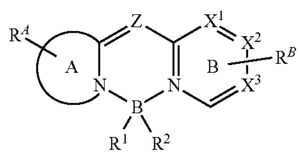

wherein Z is CR' or N; $X^1$-$X^3$ are each independently C or N, with at least one of $X^1$-$X^3$ being N and bonded to boron; $R^A$ and $R^B$ each represents zero, mono, or up to the maximum allowed number of substitutions to its associate ring; R', $R^A$, and $R^B$ are each independently a hydrogen or a substituent selected from the group consisting of the general substituents defined herein; $R^1$ and $R^2$ are each independently a hydrogen or a substituent selected from the group consisting of deuterium, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfanyl, sulfonyl, phosphino, boryl, borate, and combinations thereof; ring A is a 5-membered or 6-membered ring; and two substituents within Formula I can be joined or fused together to form a ring, with a proviso that two adjacent $R^B$ substituents are joined to form a fused heterocyclic ring.

In some embodiments, the consumer product can be one of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

In yet another aspect, the OLED of the present disclosure may also comprise an emissive region containing a compound as disclosed in the above compounds section of the present disclosure.

In some embodiments, the emissive region may comprise a compound of Formula I

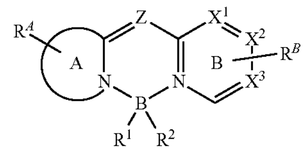

wherein Z is CR' or N; $X^1$-$X^3$ are each independently C or N, with at least one of $X^1$-$X^3$ being N and bonded to boron; $R^A$ and $R^B$ each represents zero, mono, or up to the maximum allowed number of substitutions to its associate ring; R', $R^A$, and $R^B$ are each independently a hydrogen or a substituent selected from the group consisting of the general substituents defined herein; $R^1$ and $R^2$ are each independently a hydrogen or a substituent selected from the group consisting of deuterium, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, borate, and combinations thereof; ring A is a 5-membered or 6-membered ring; and two substituents within Formula I can be joined or fused together to form a ring, with a proviso that two adjacent $R^B$ substituents are joined to form a fused heterocyclic ring.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Several OLED materials and configurations are described in U.S. Pat. Nos. 5,844,363, 6,303,238, and 5,707,745, which are incorporated herein by reference in their entirety.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
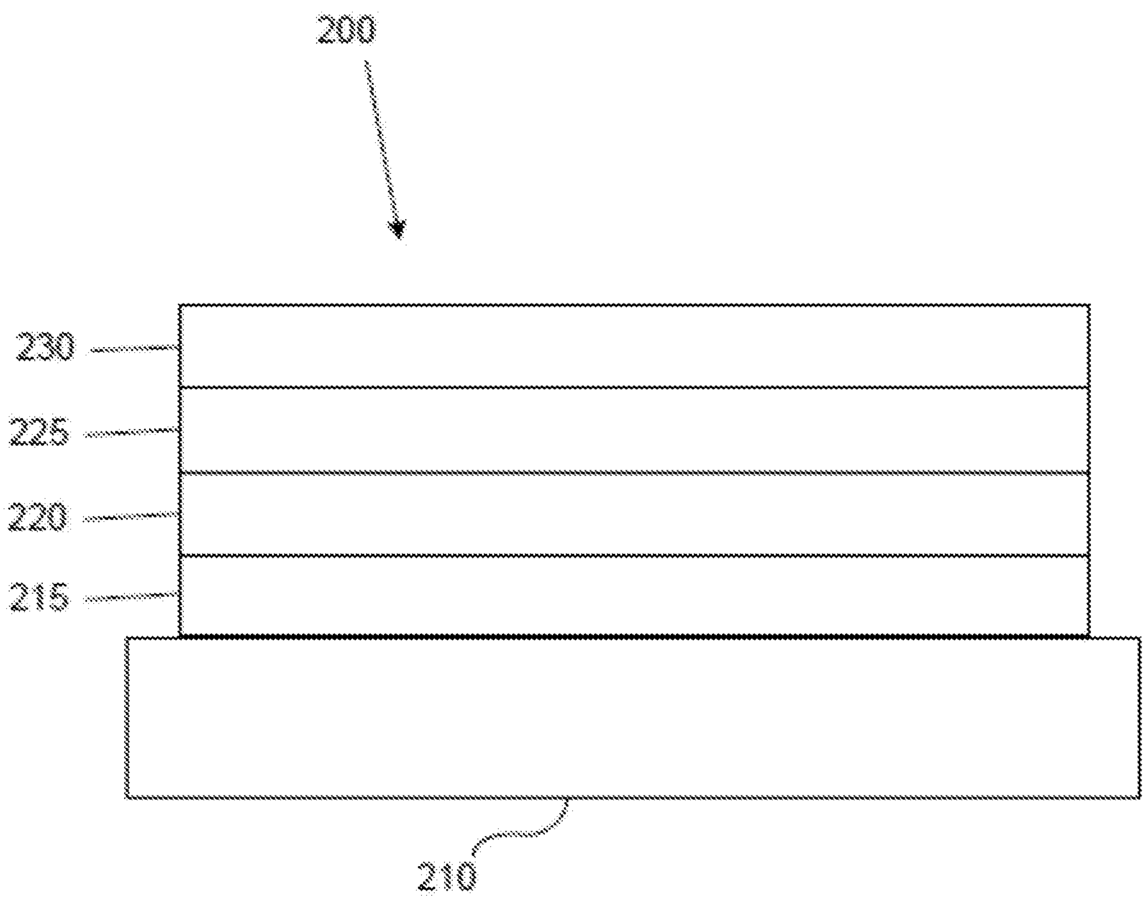
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the present disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the present disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 degrees C. to 30 degrees C., and more preferably at room temperature (20-25° C.), but could be used outside this temperature range, for example, from −40 degree C. to +80° C.

More details on OLEDs, and the definitions described above, can be found in U.S. Pat. No. 7,279,704, which is incorporated herein by reference in its entirety.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

D. Combination of the Compounds of the Present Disclosure with Other Materials The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

a) Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

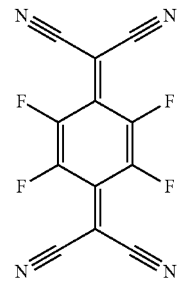

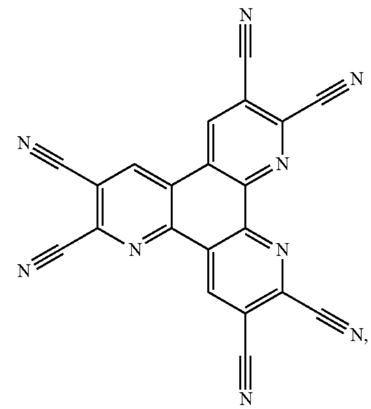

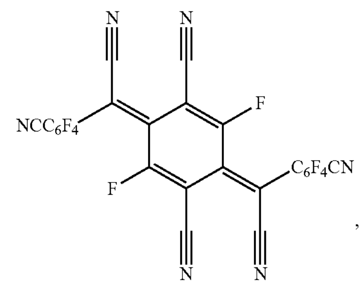

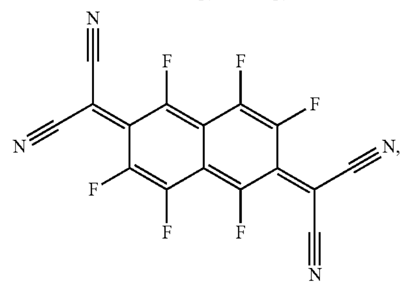

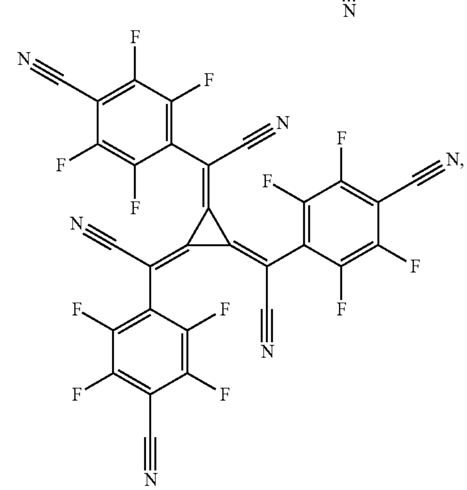

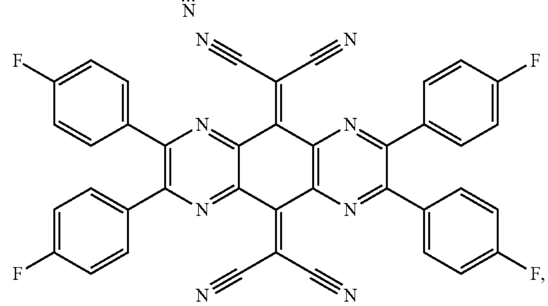

-continued

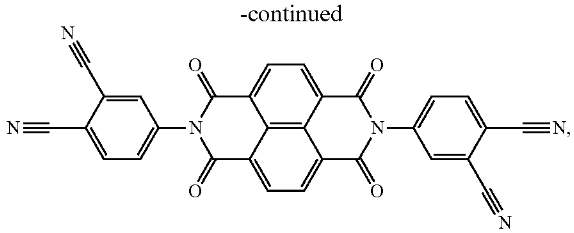

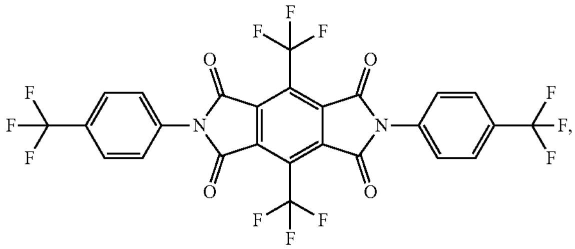

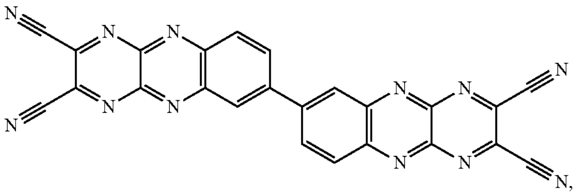

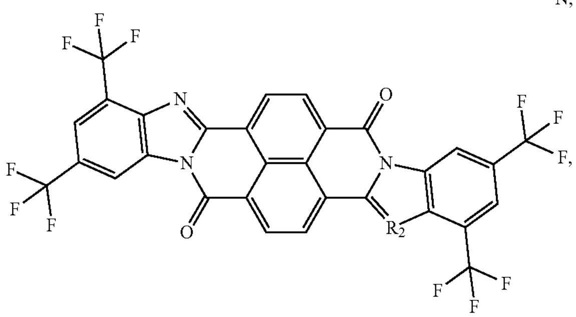

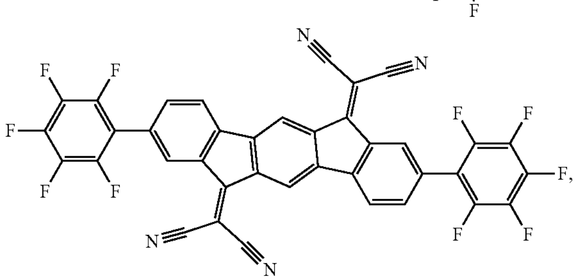

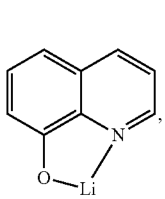

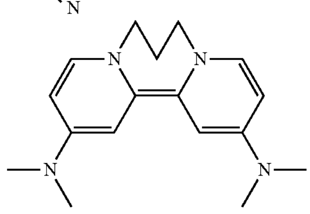

and

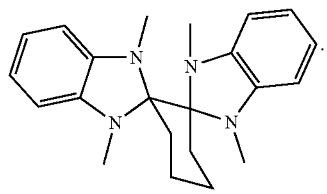

b) HIL/HTL:

A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures.

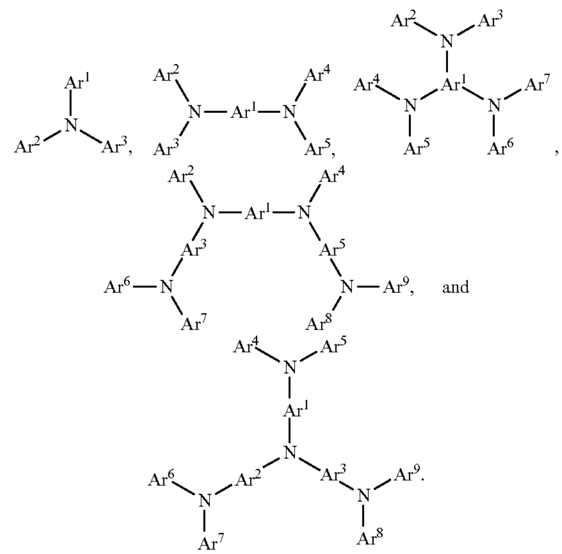

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

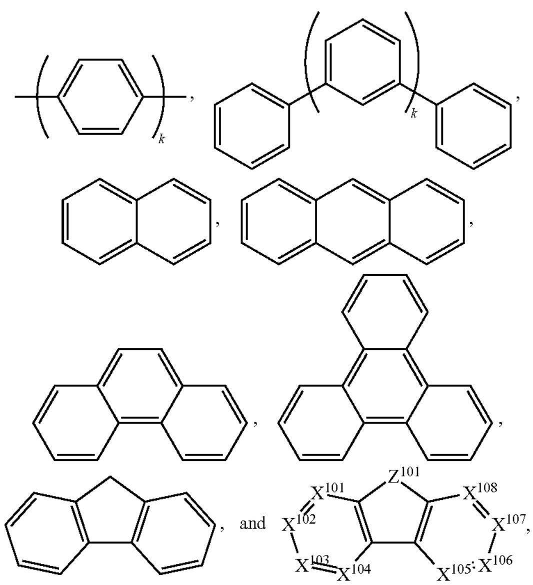

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

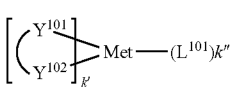

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$, is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

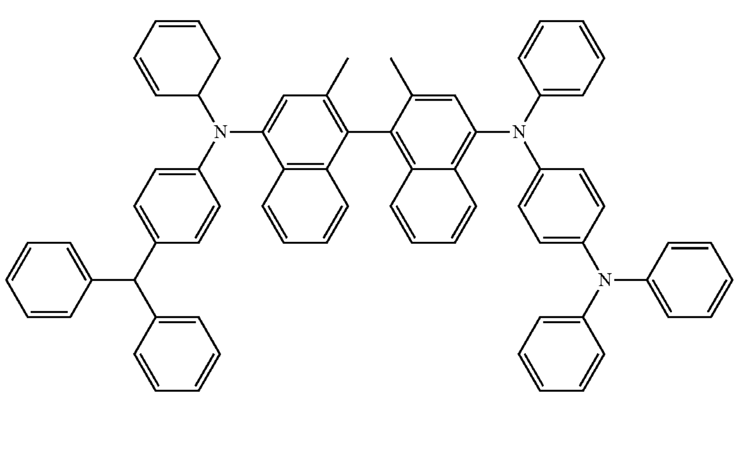
,

-continued
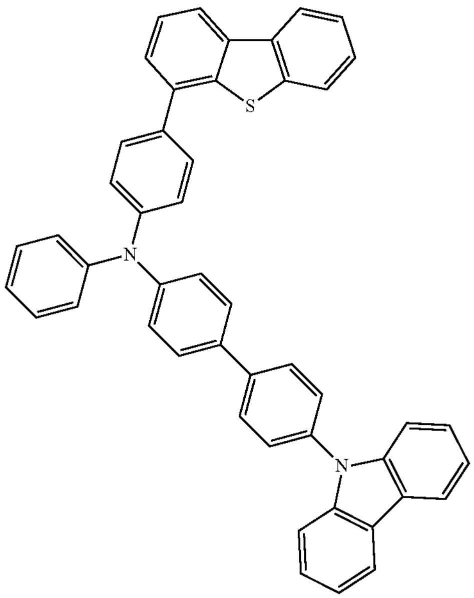
,
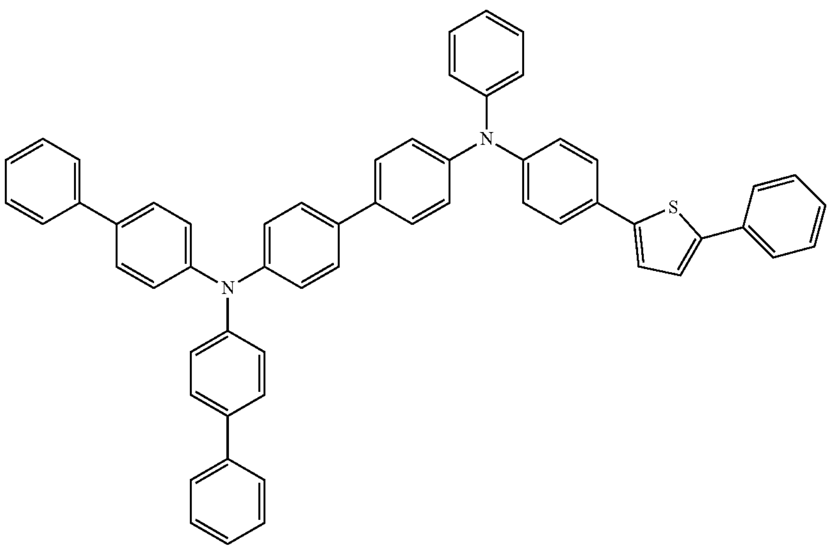
,
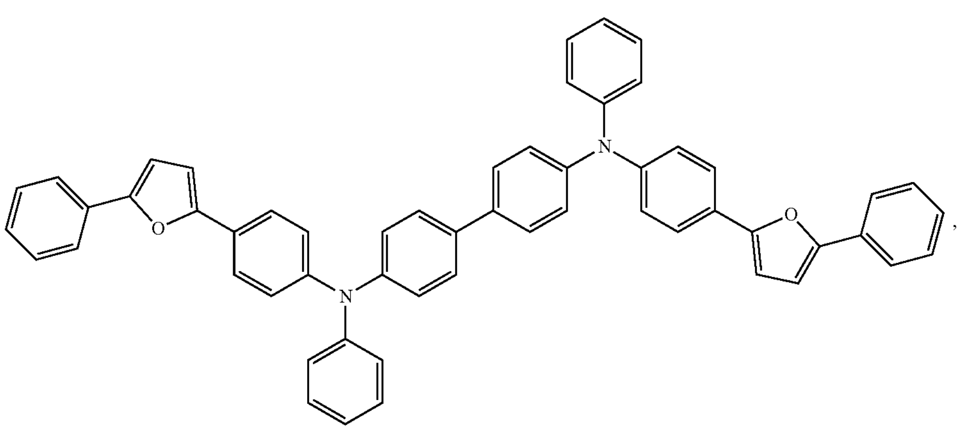
,

-continued
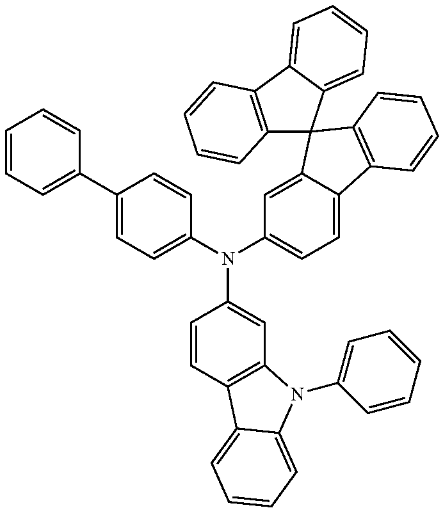
,
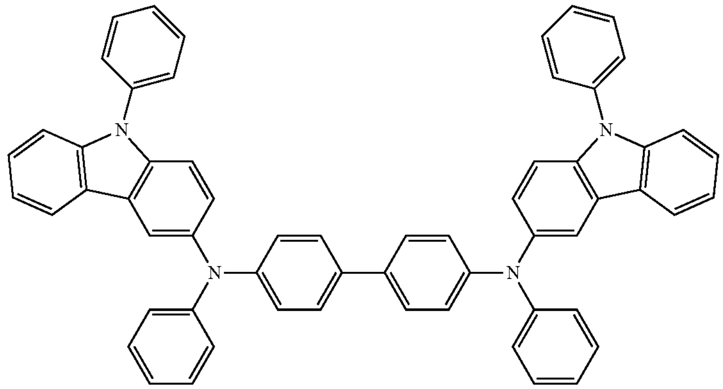
,
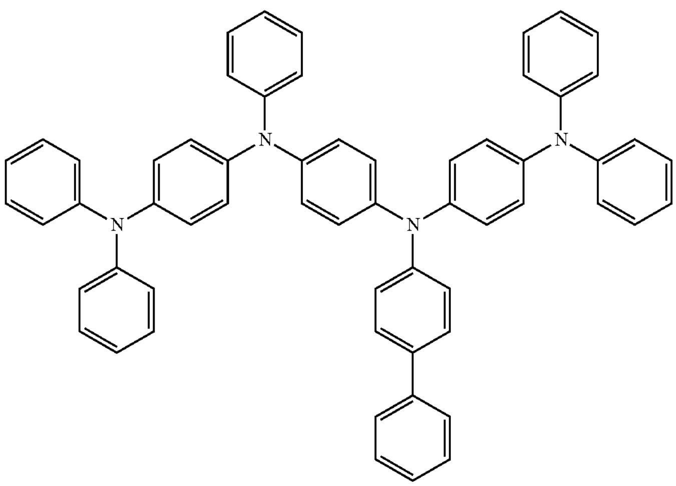
,
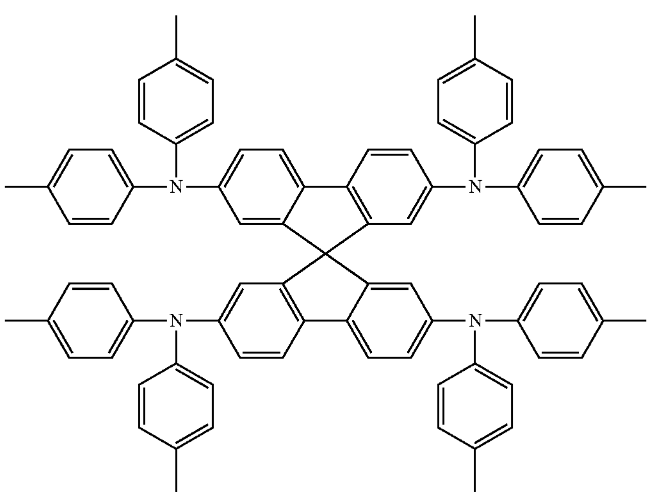
,

-continued
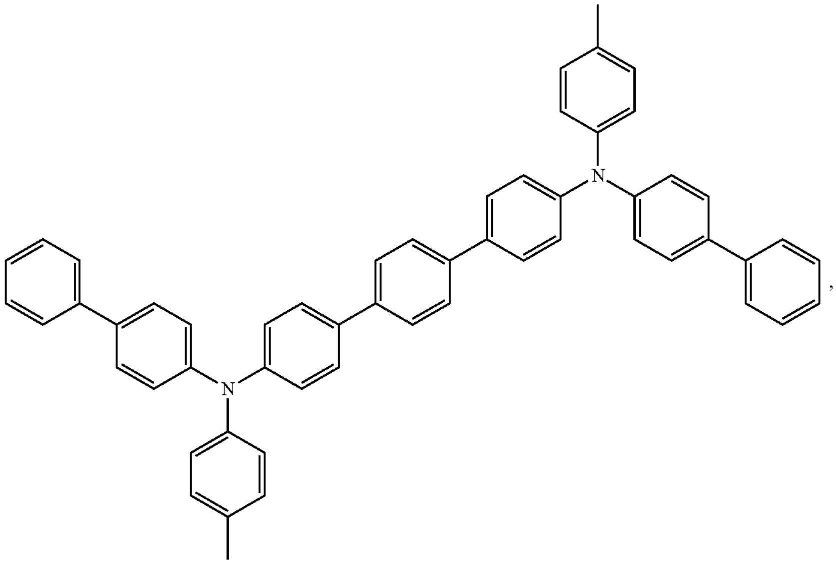
,
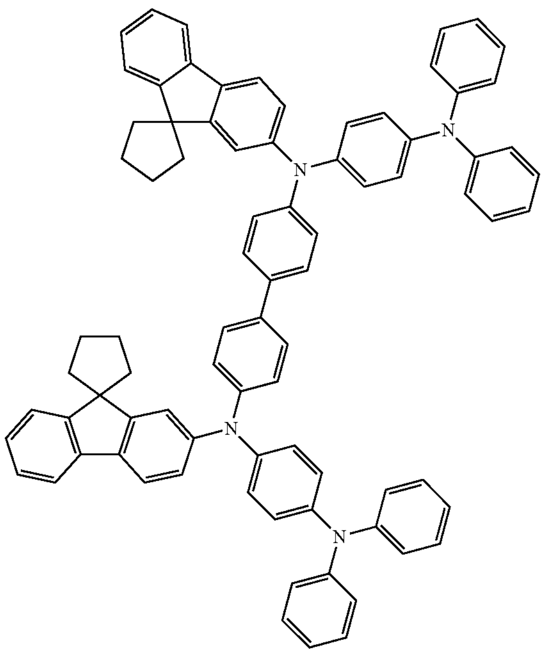
,
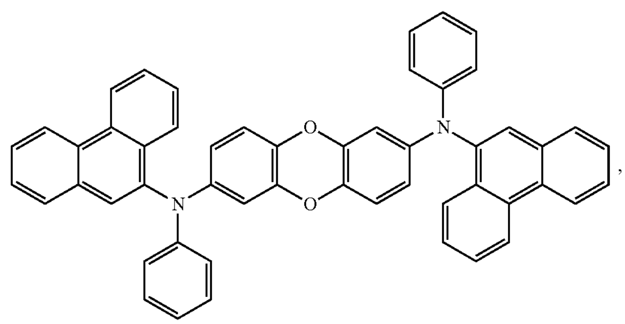
,
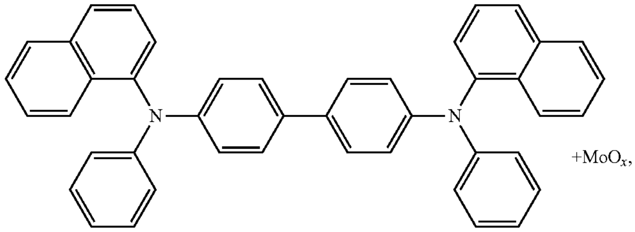
$+MoO_x$,

-continued
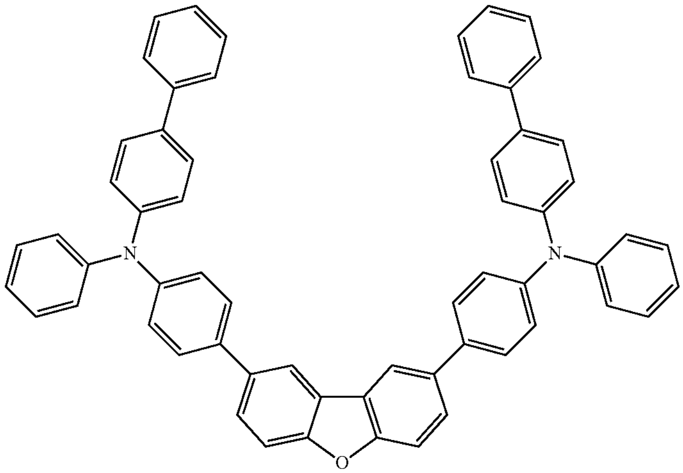
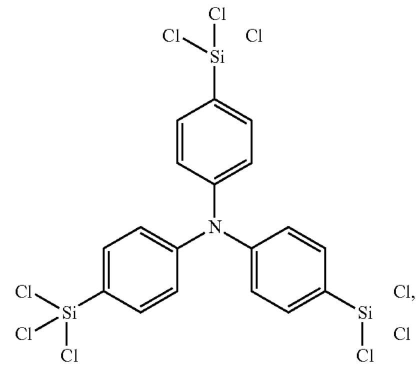
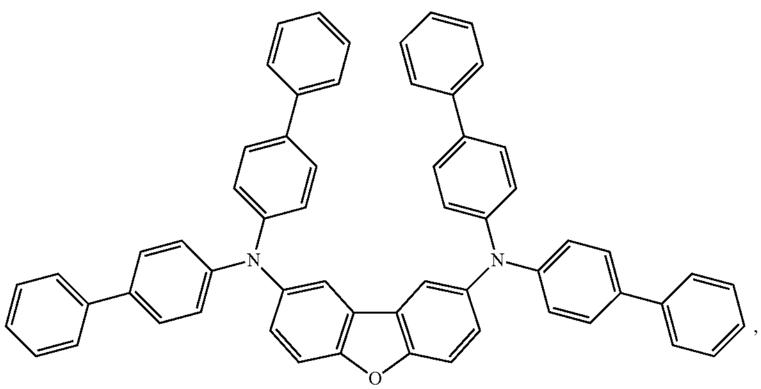
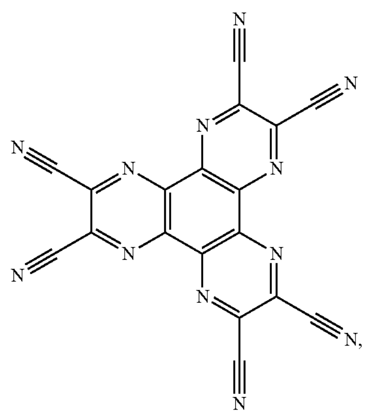
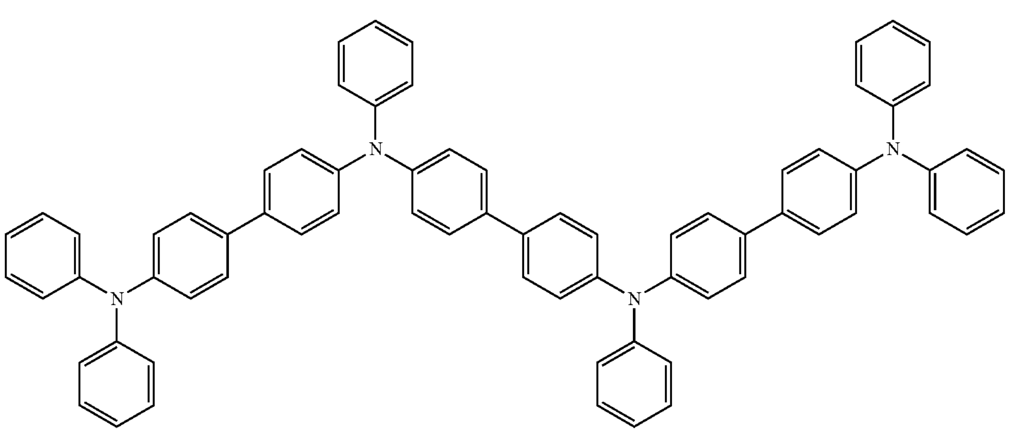

-continued
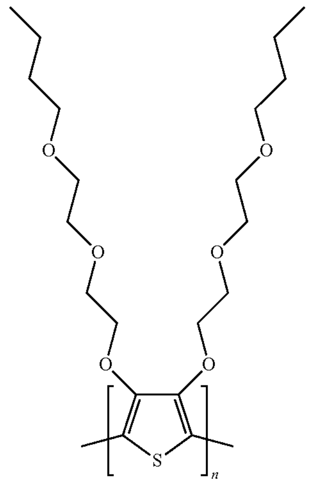
,
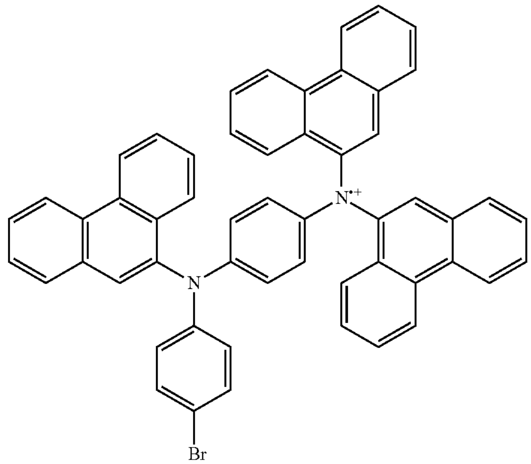
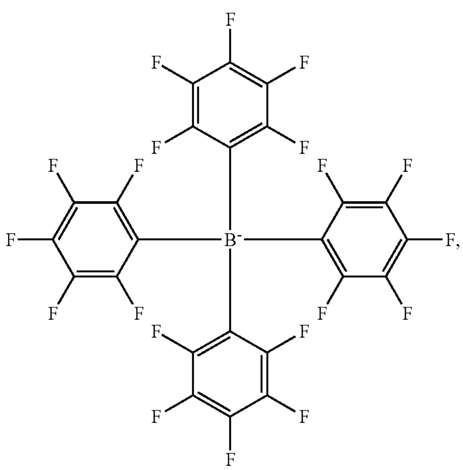
F,
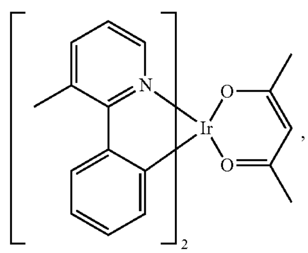
,
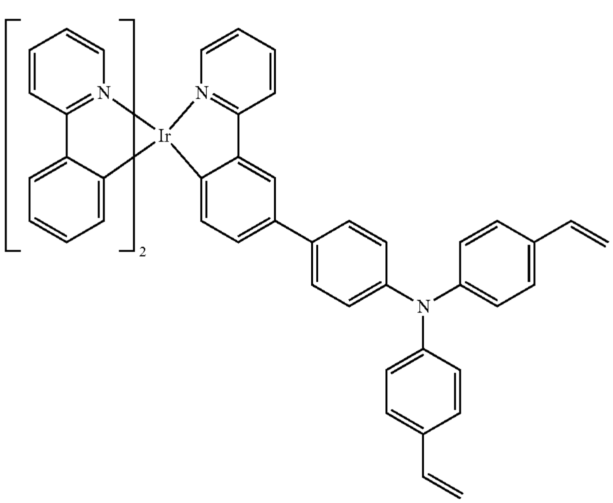
,

-continued
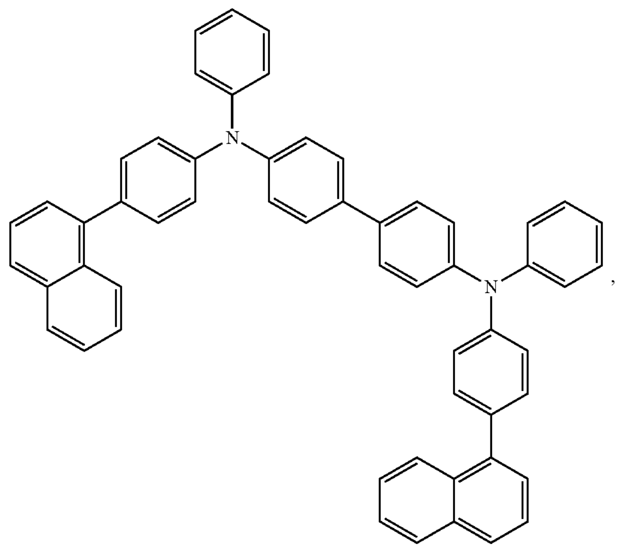
,
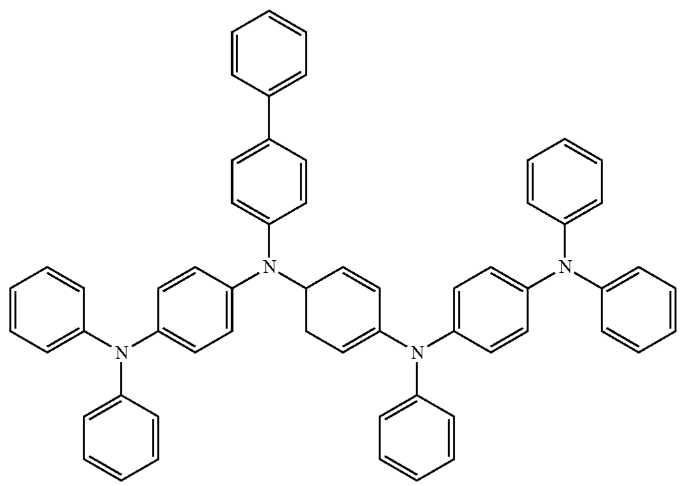
,
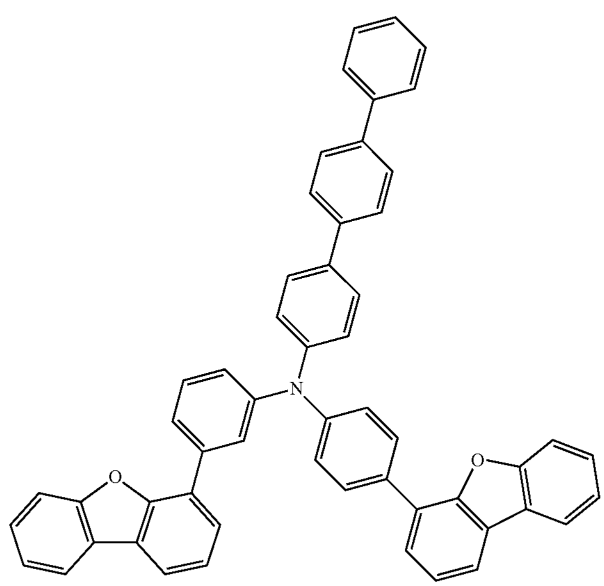
,

-continued
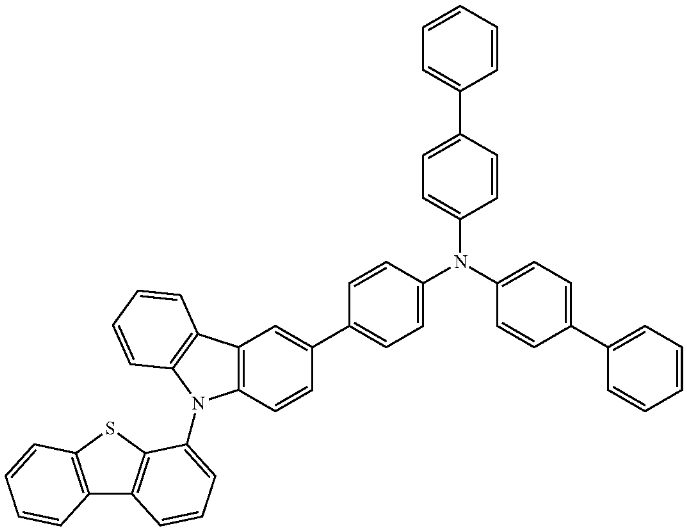
,
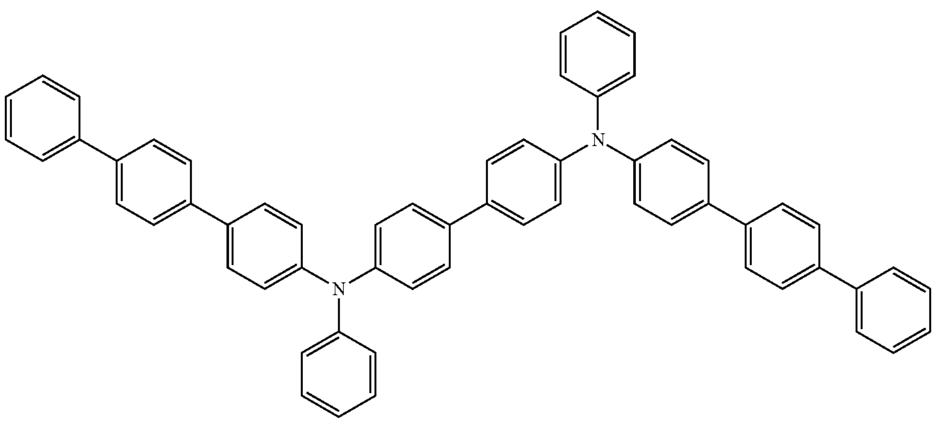
,
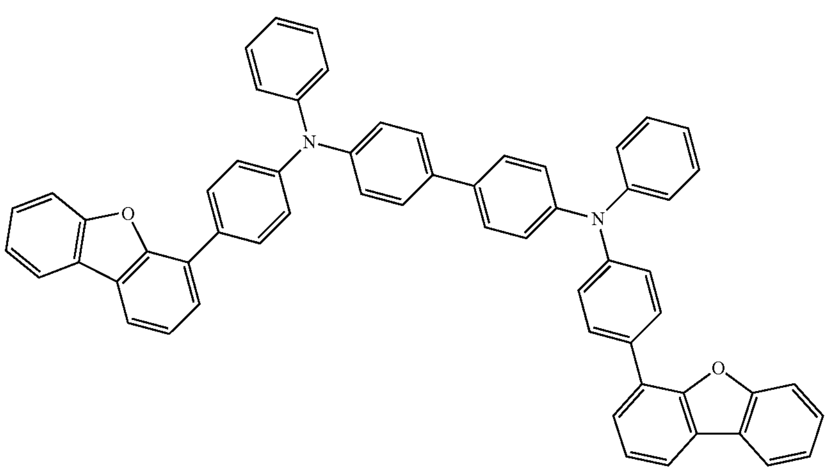
,

-continued
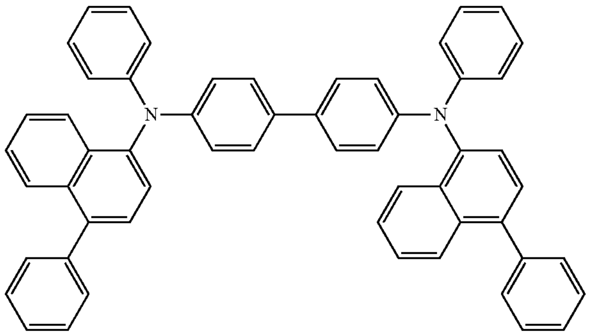
,
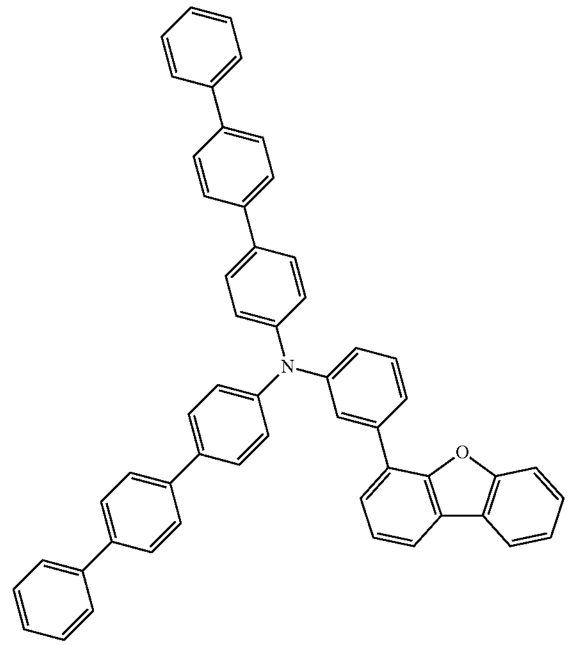
,
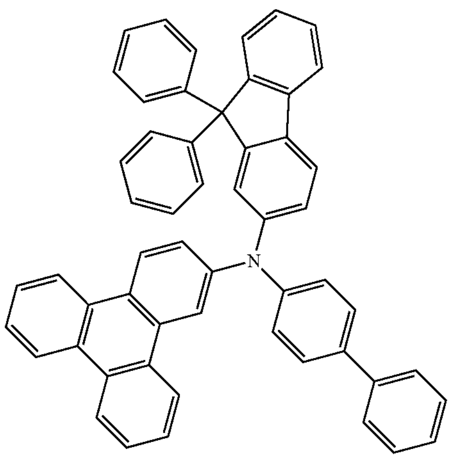
,
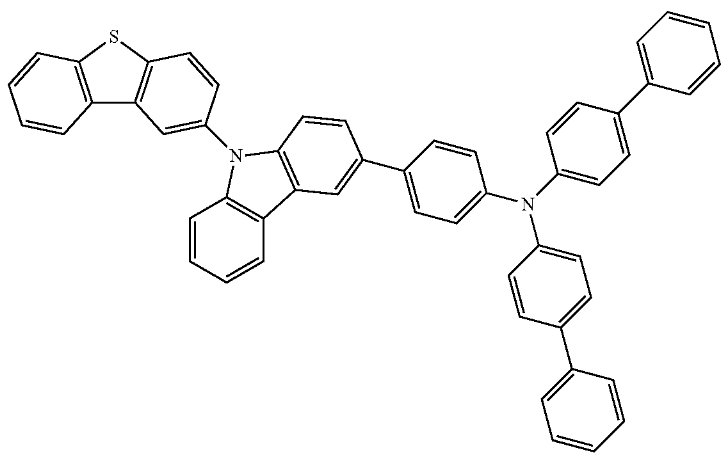
,
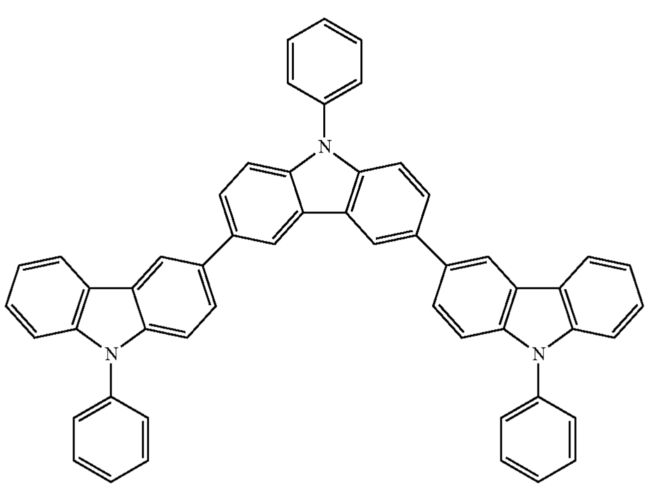
,
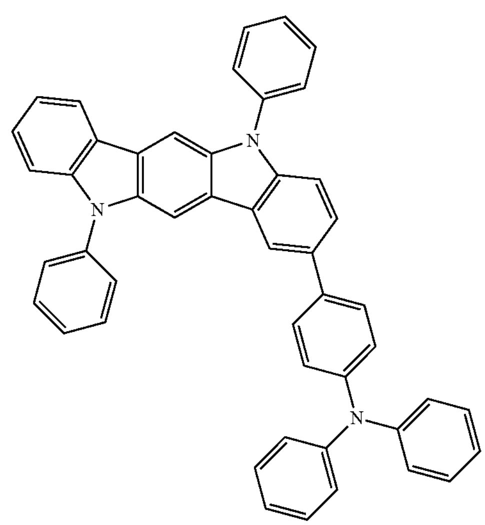
, -continued
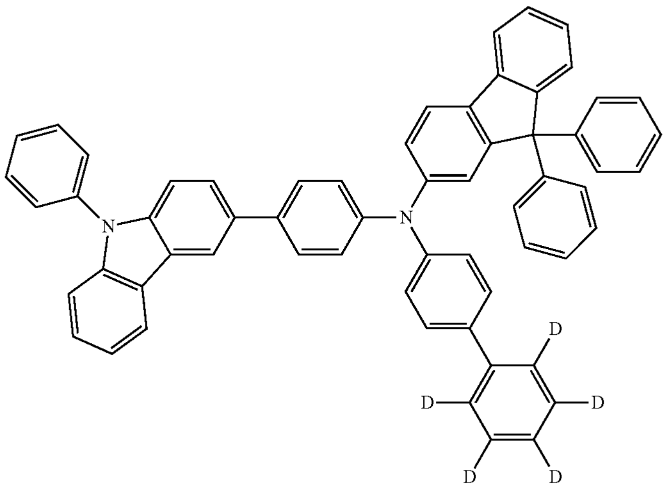
,
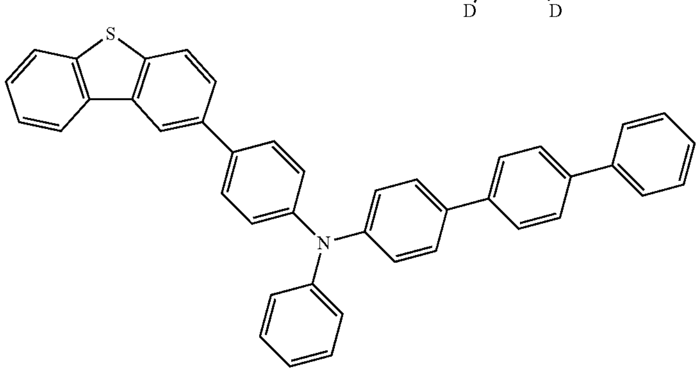
,
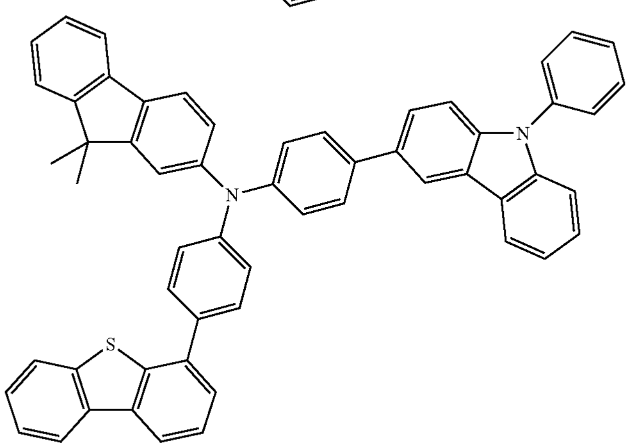
,
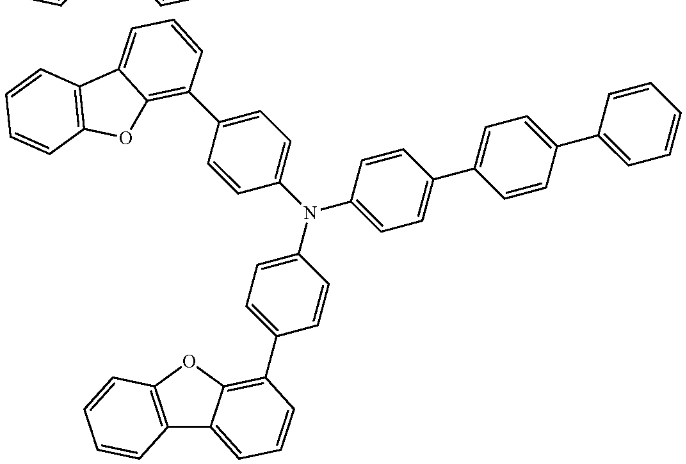
, -continued
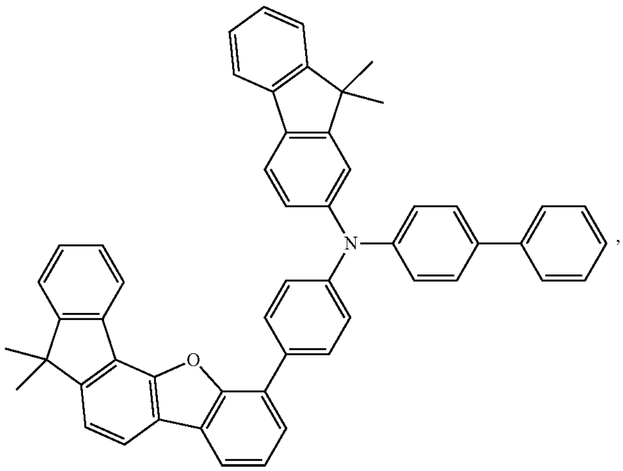
,
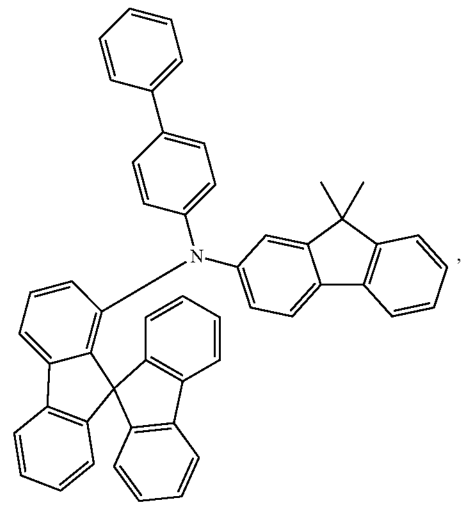
,
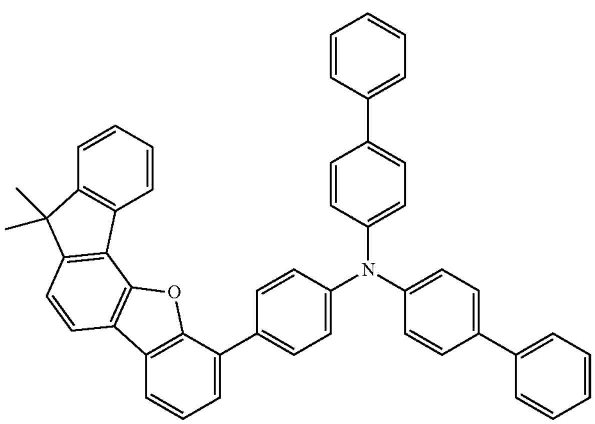
,
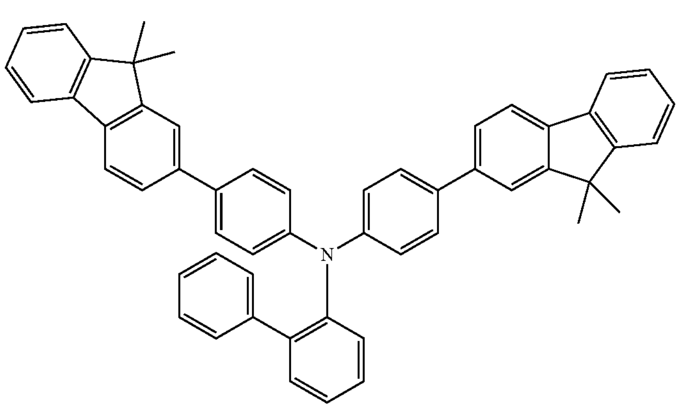
, -continued
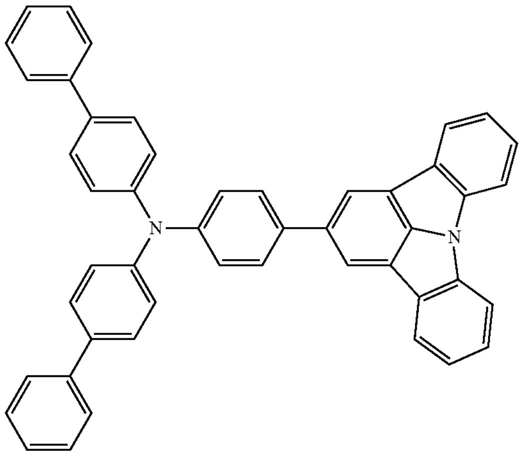
,
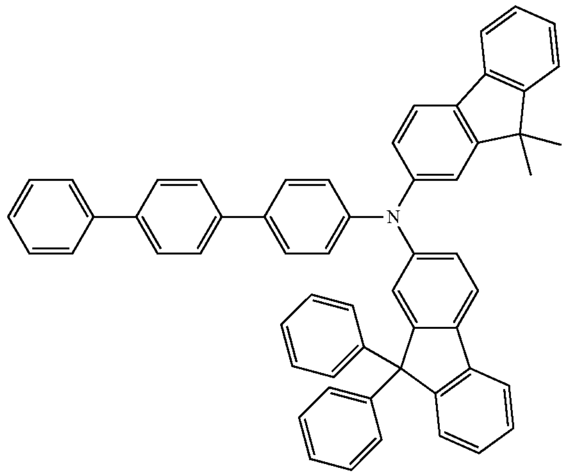
,
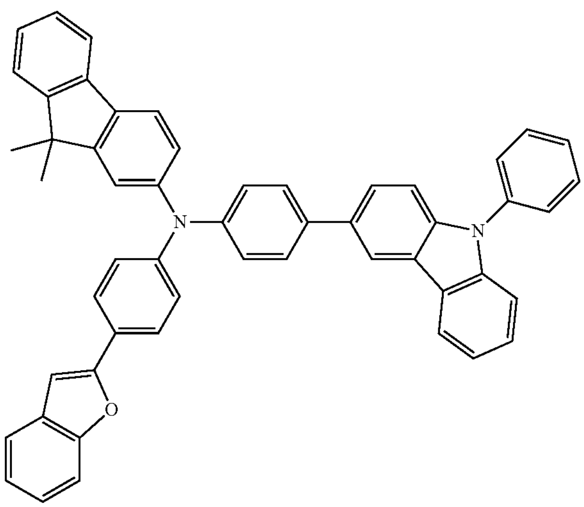
,
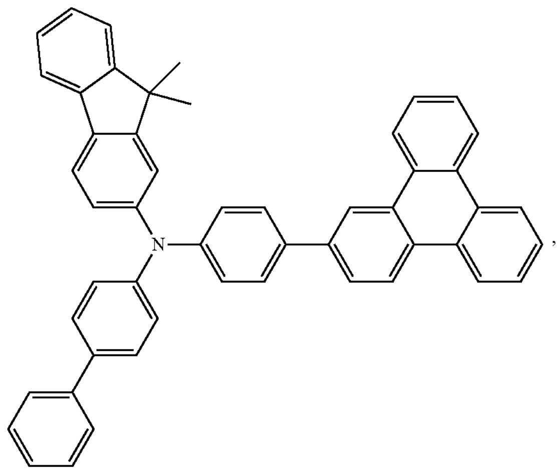
,
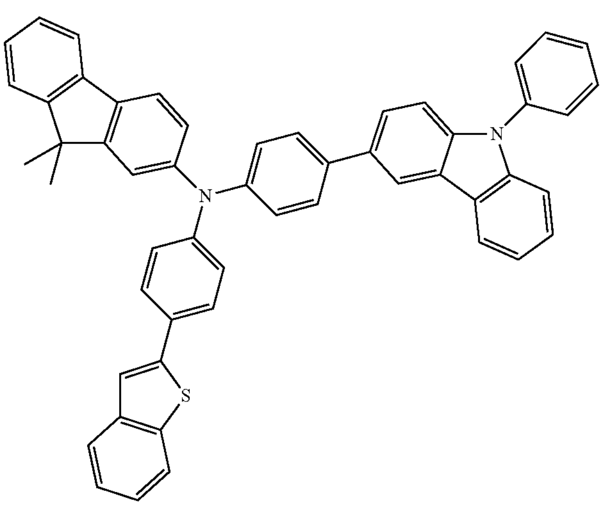
, -continued
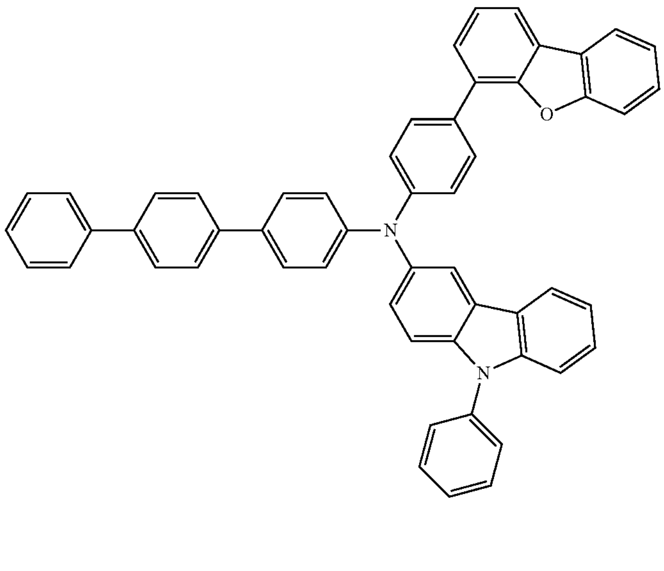
,
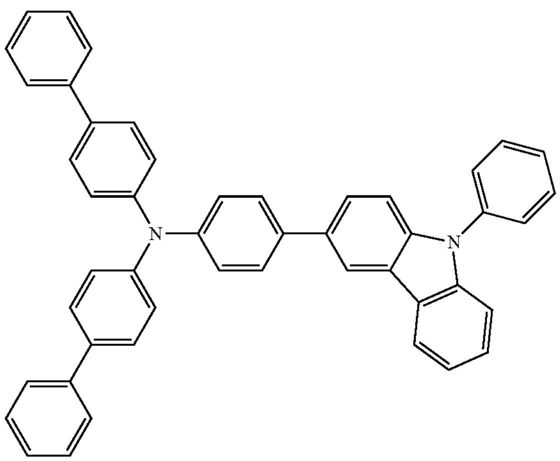
,
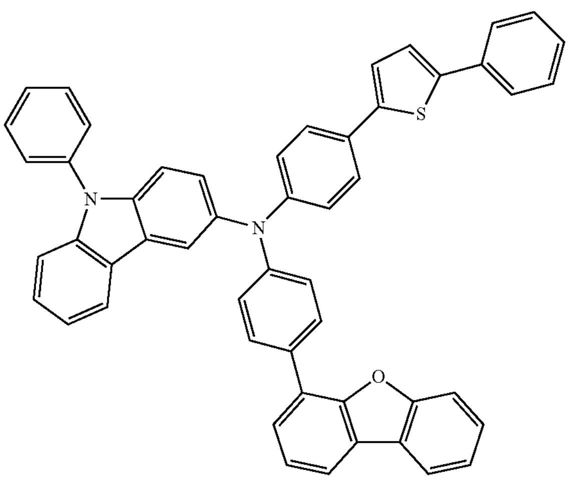
,
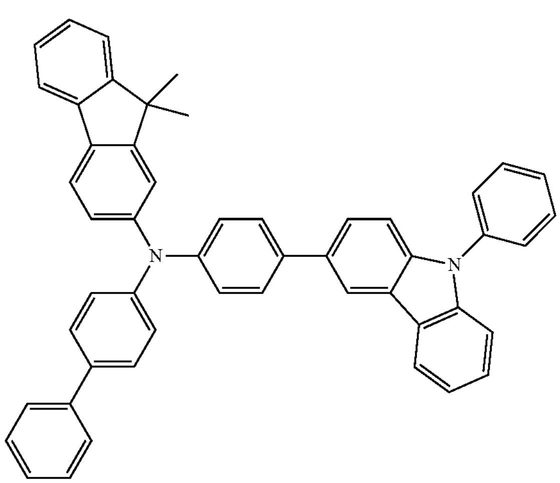
,
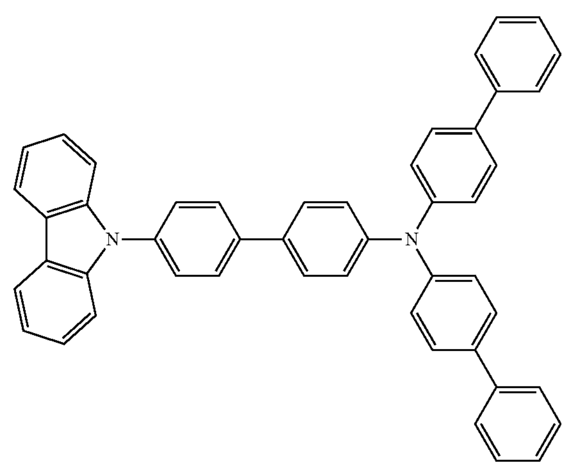
, -continued
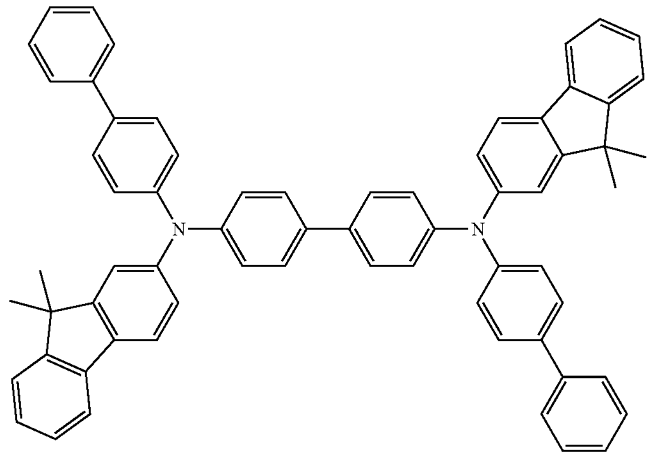
,
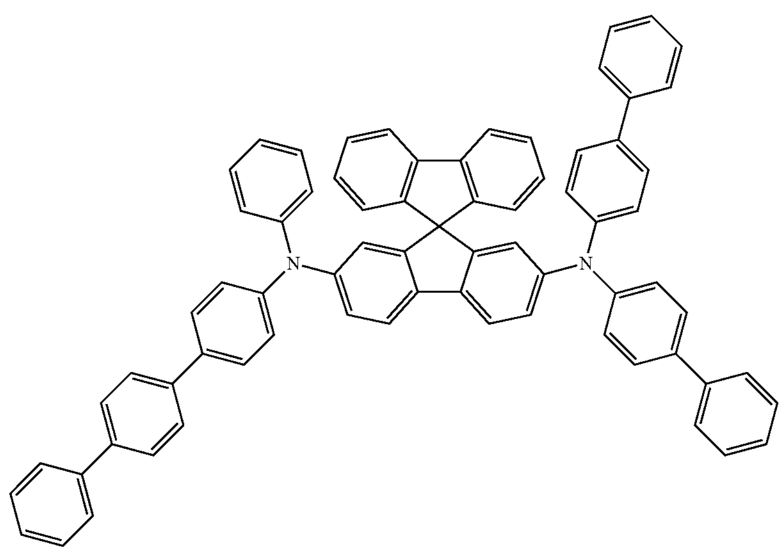
,
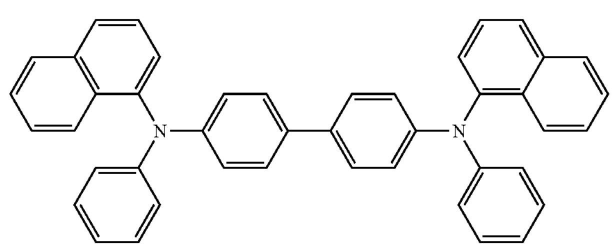
,
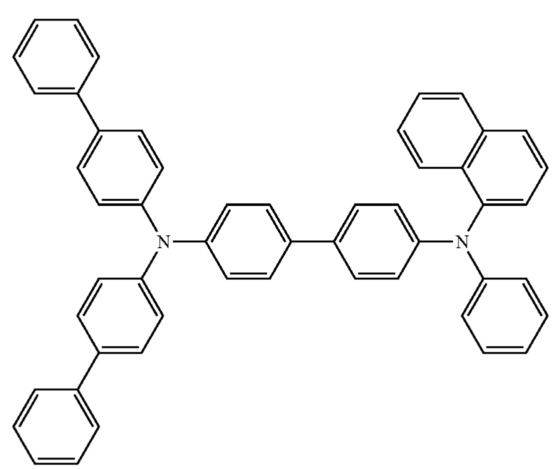
, -continued
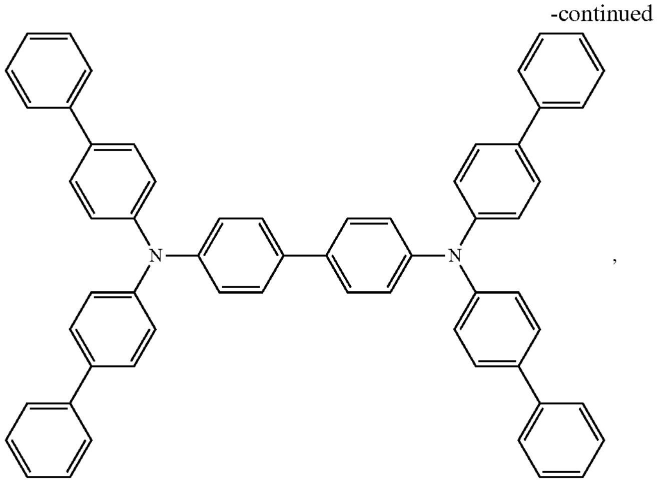
,
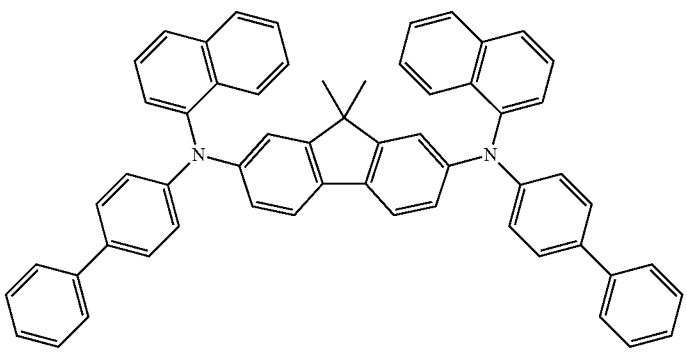
,
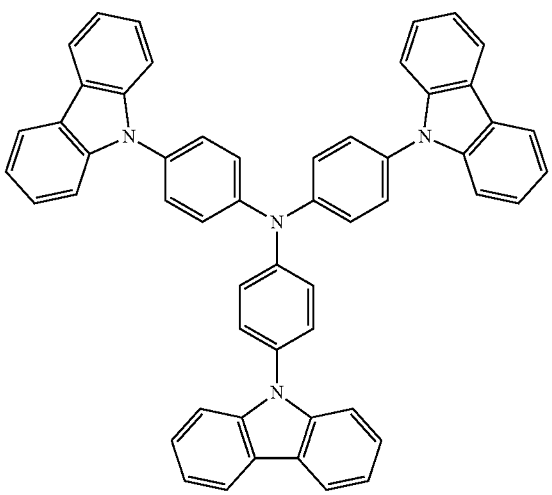
,
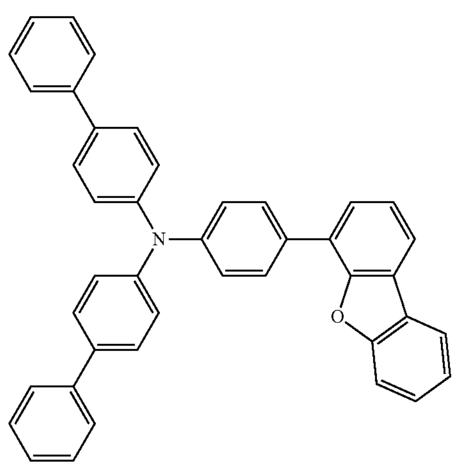
, -continued

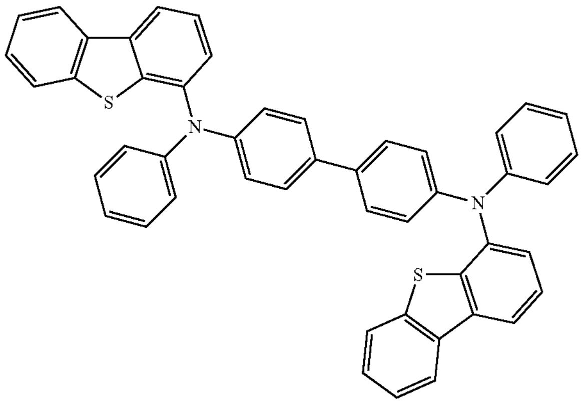

,

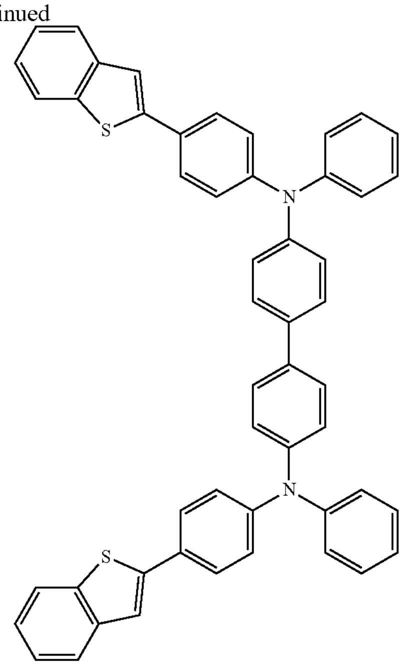

, and

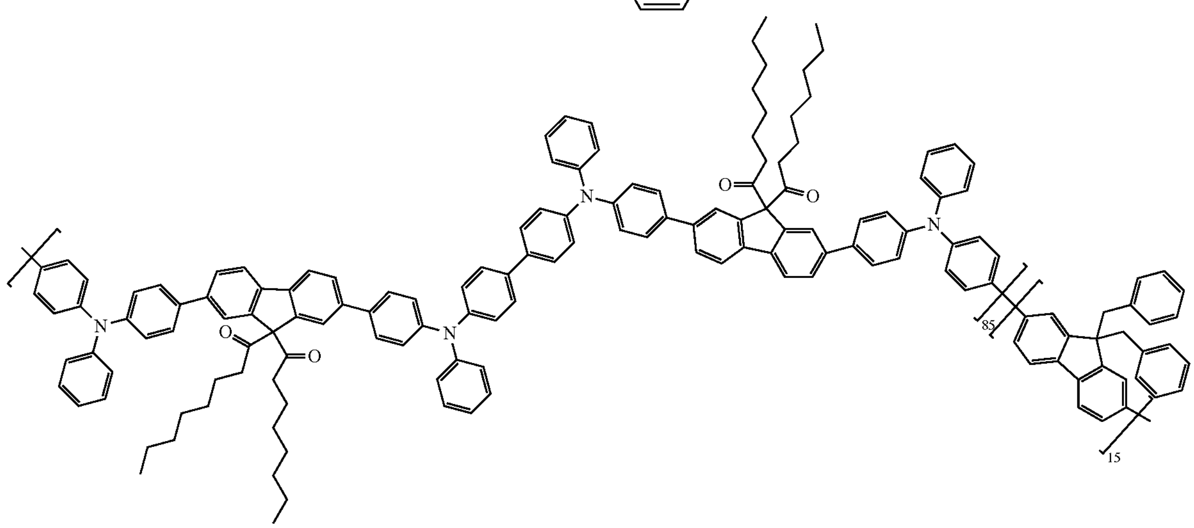

.

c) EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

d) Hosts:

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

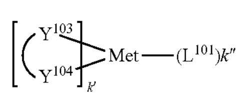

wherein Met is a metal; ($Y^{103}$-$Y^{104}$) is a bidentate ligand, $Y^{103}$-$Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

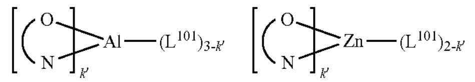

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

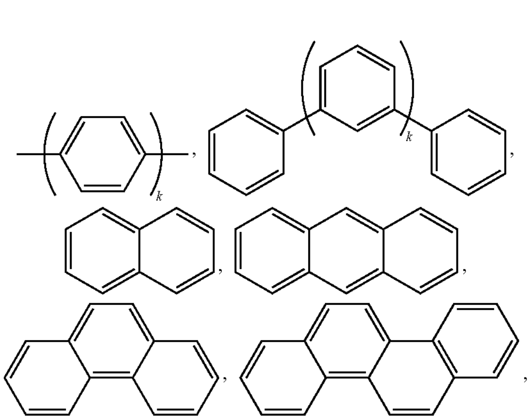

-continued

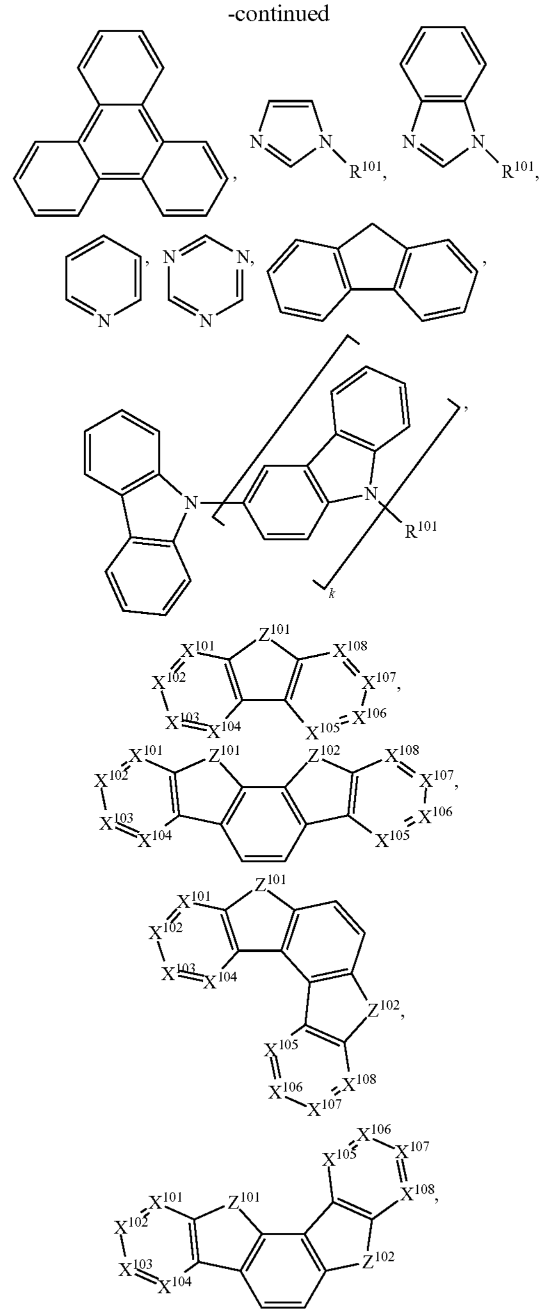

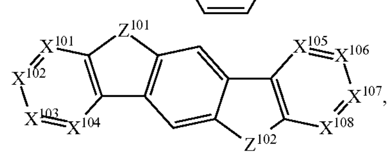

and

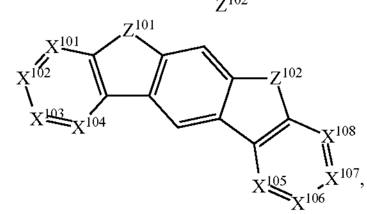

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

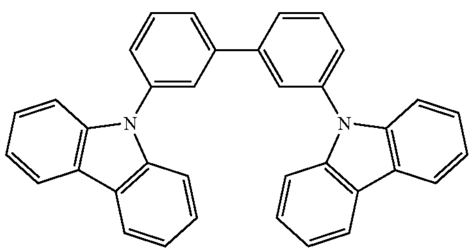

,

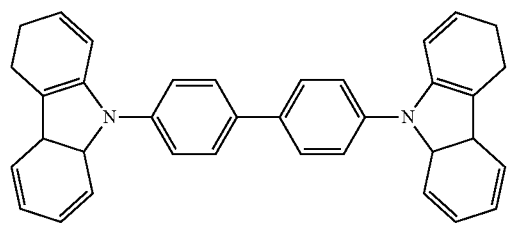

,

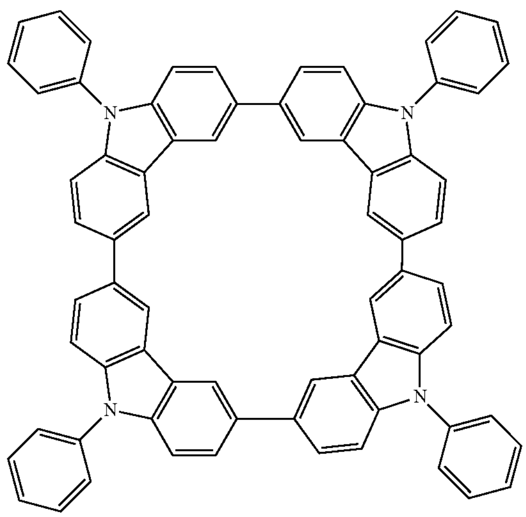

,

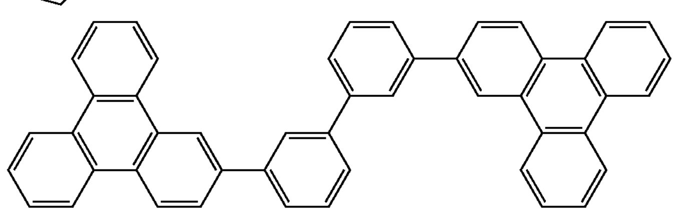

,

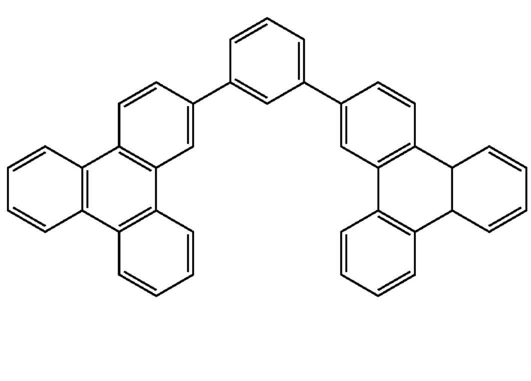

,

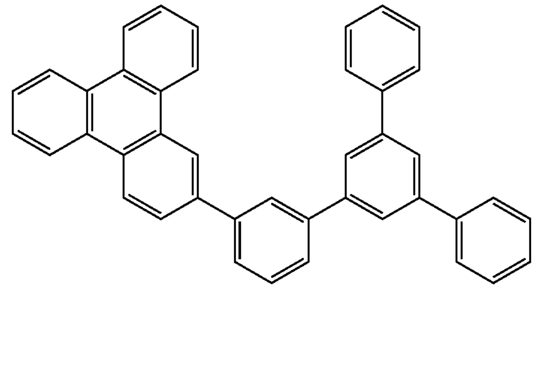

,

-continued
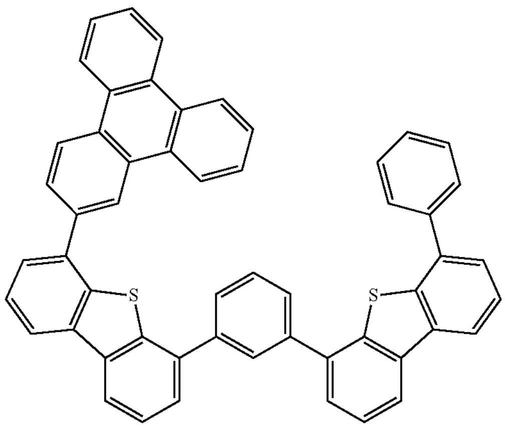
,
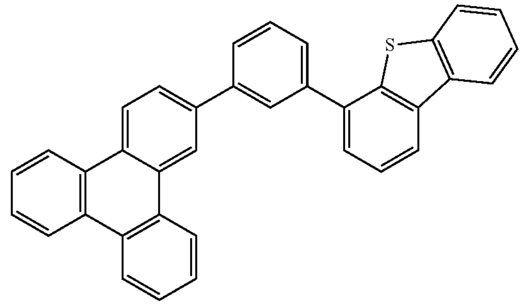
,
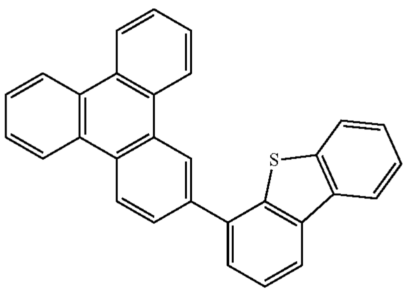
,
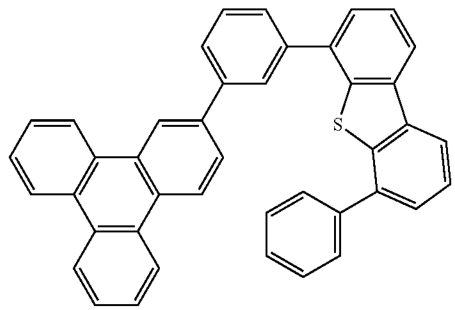
,
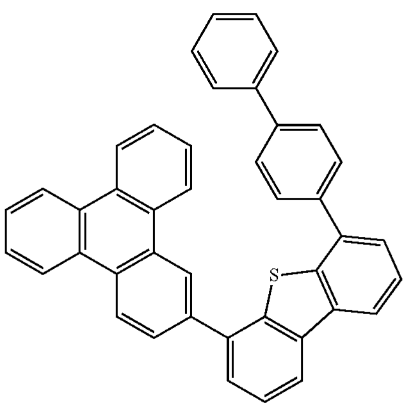
,
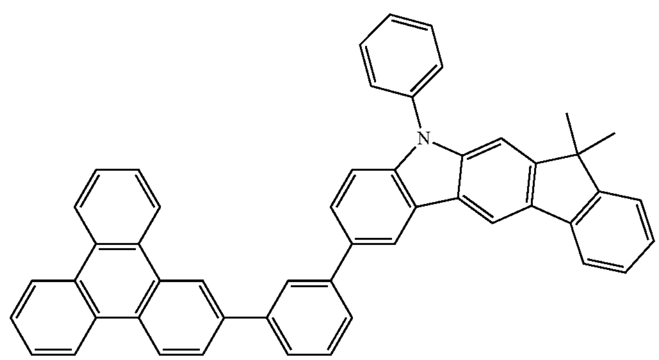
,
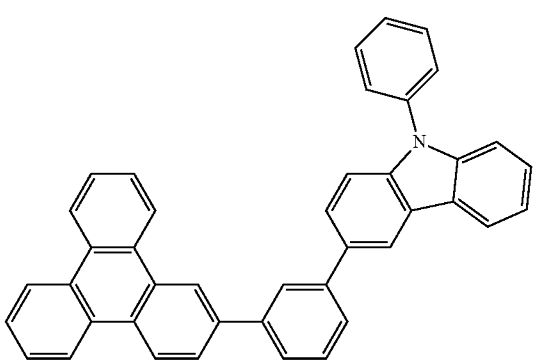
,
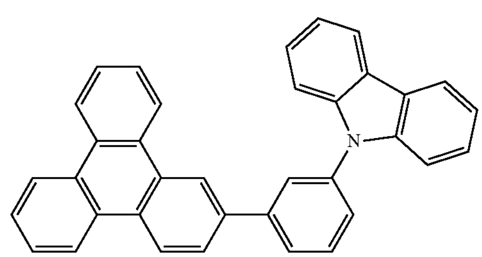
, -continued
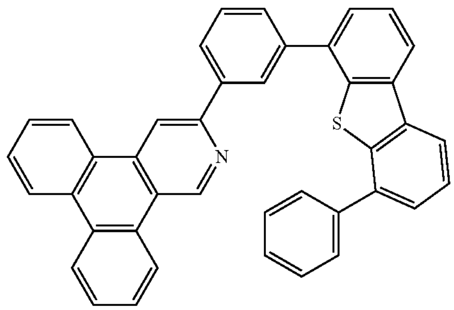
,
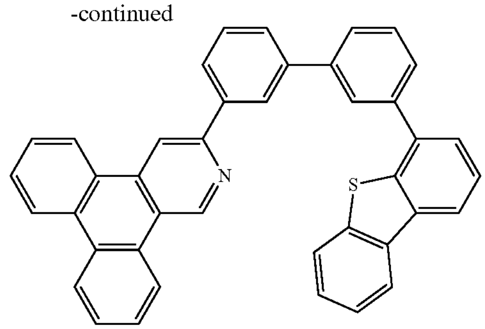
,
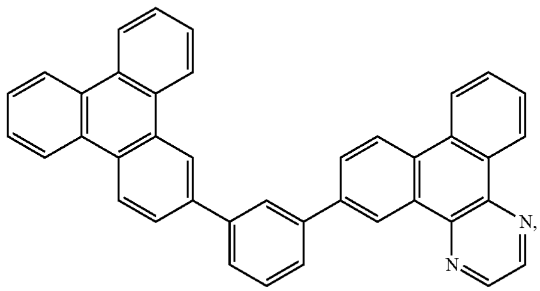
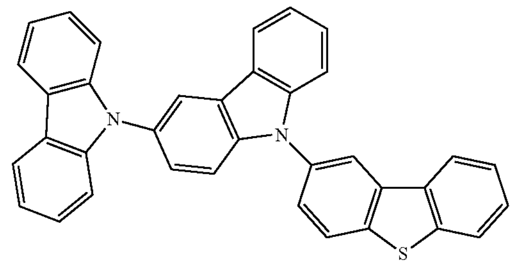
,
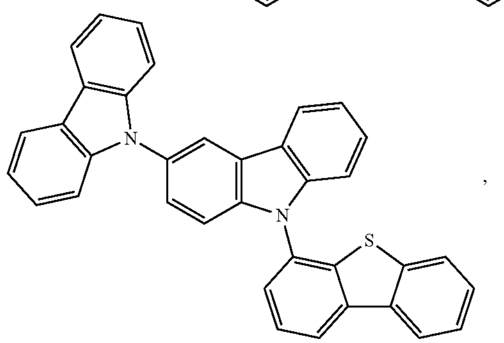
,
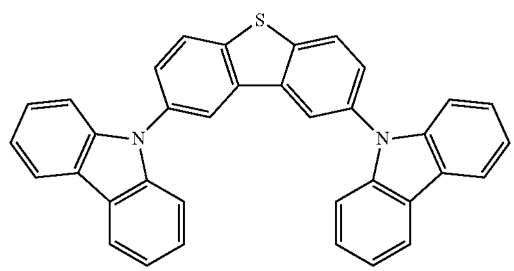
,
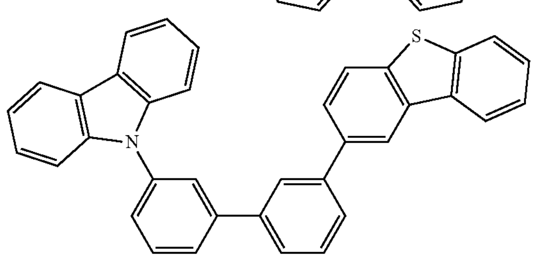
,
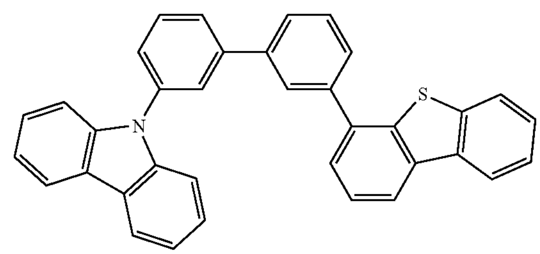
,
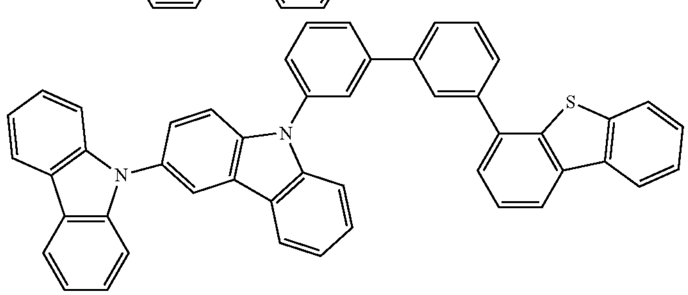
,
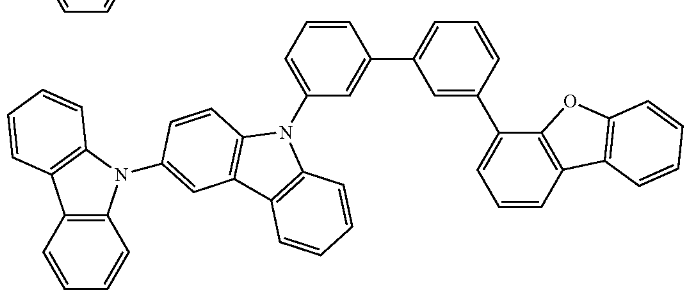
, -continued
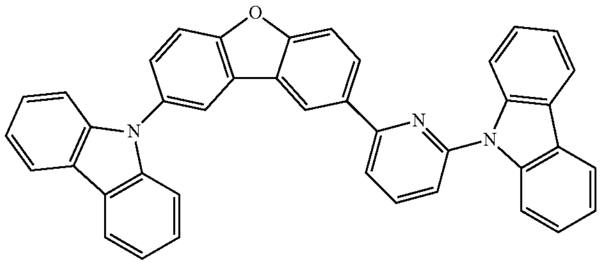
,
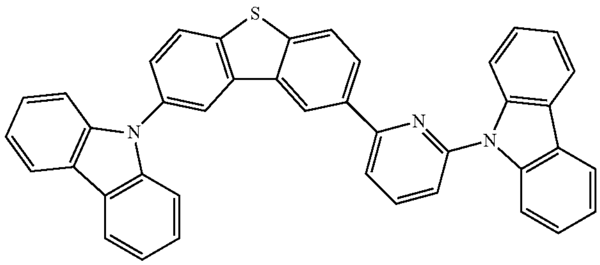
,
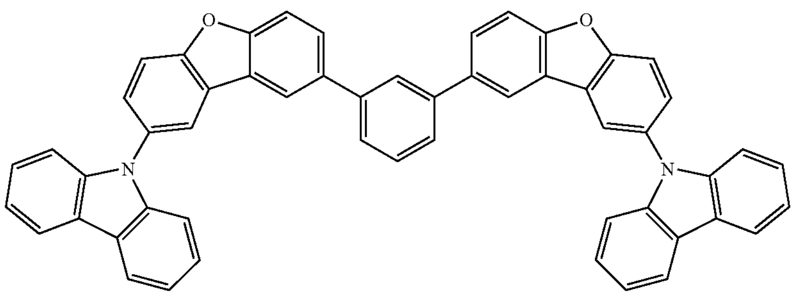
,
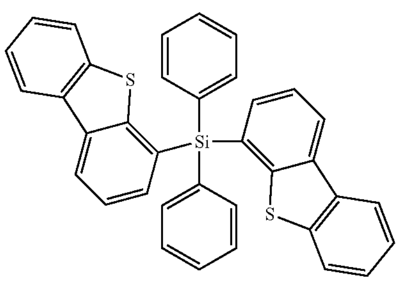
,
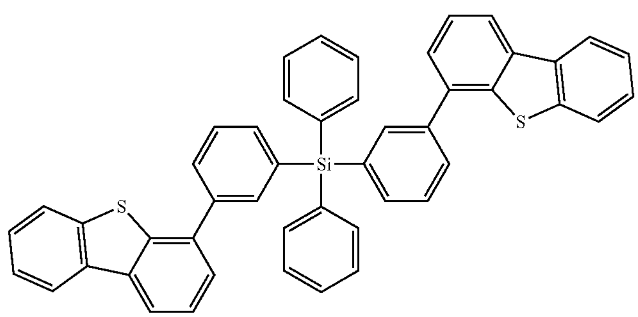
,
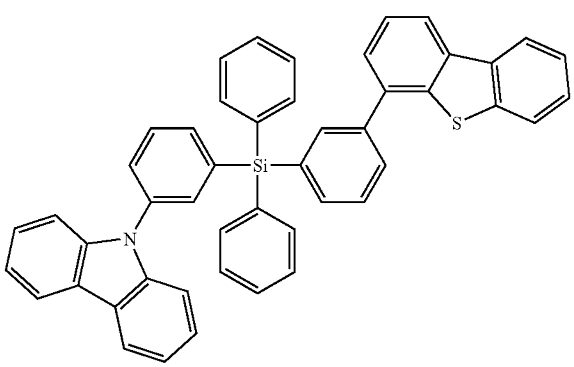
, -continued
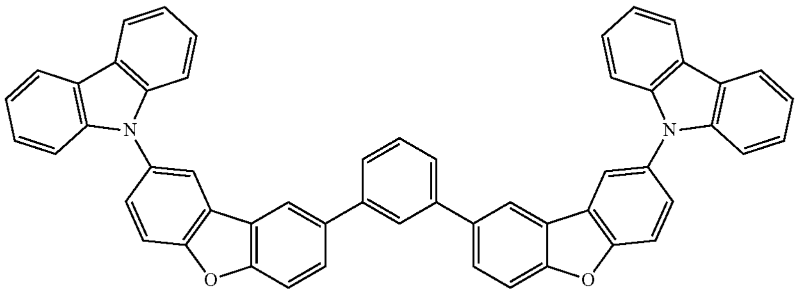
,
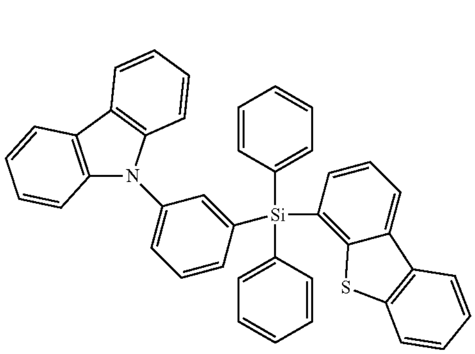
,
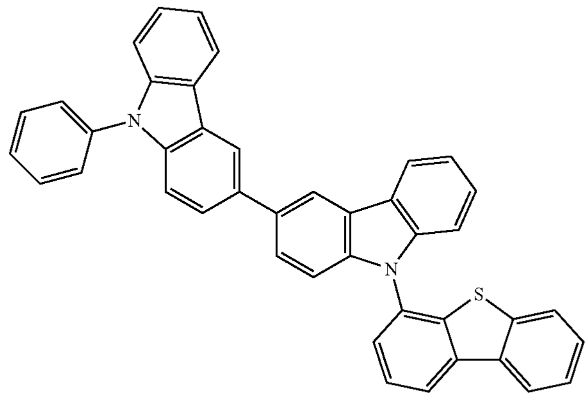
,
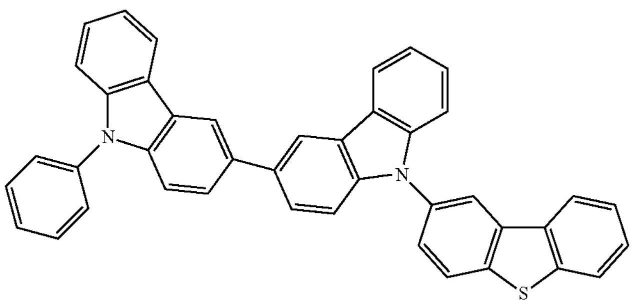
,
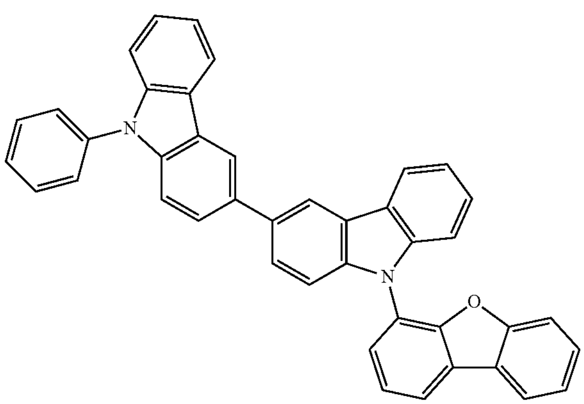
, -continued
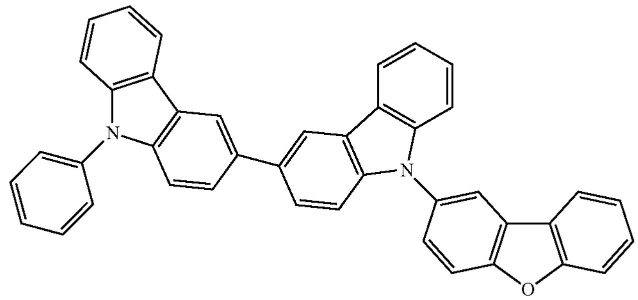
,
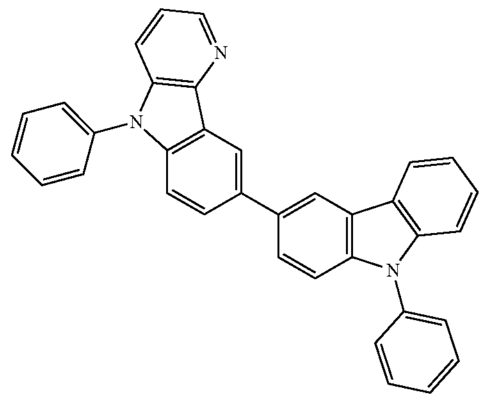
,
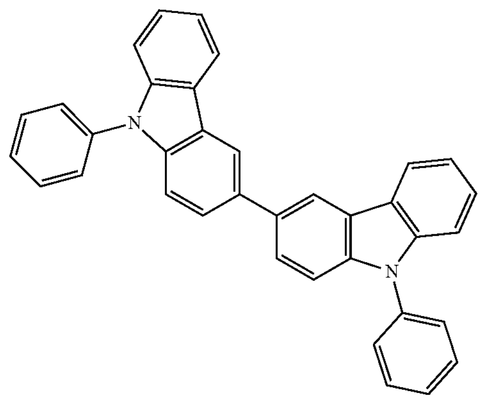
,
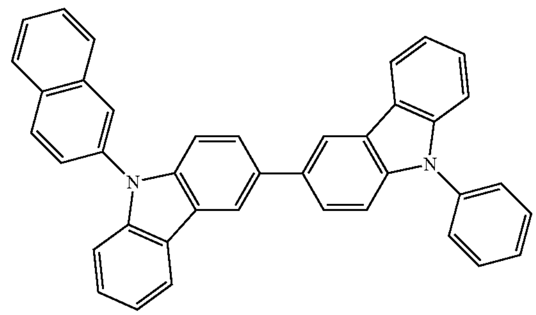
,
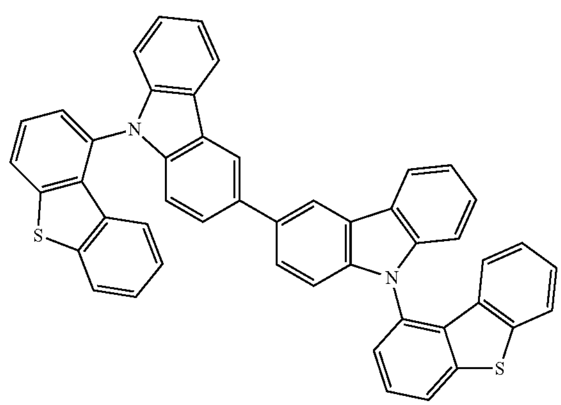
,
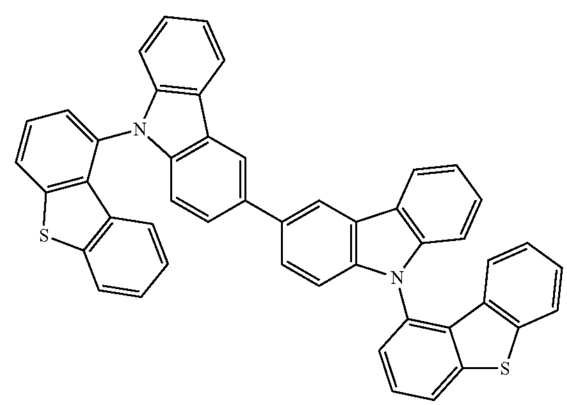
,
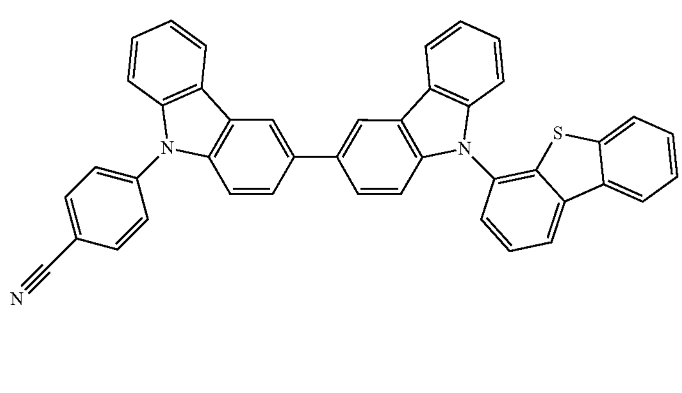
, -continued
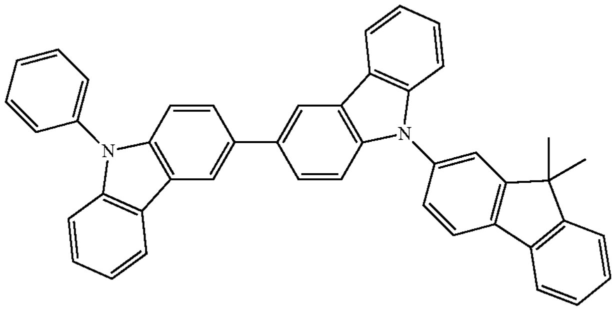
,
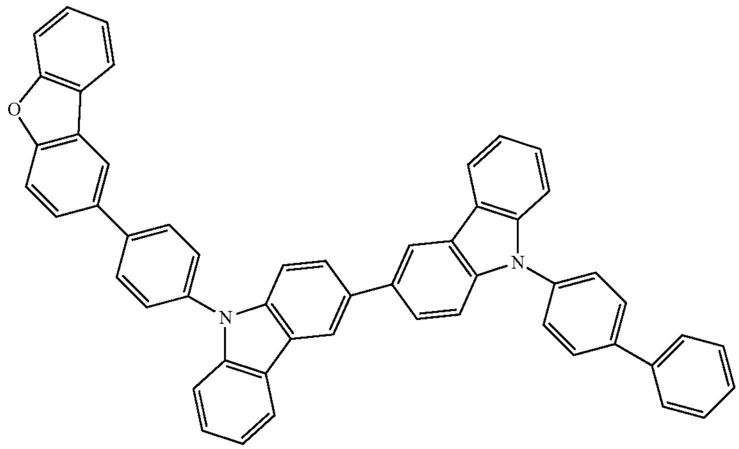
,
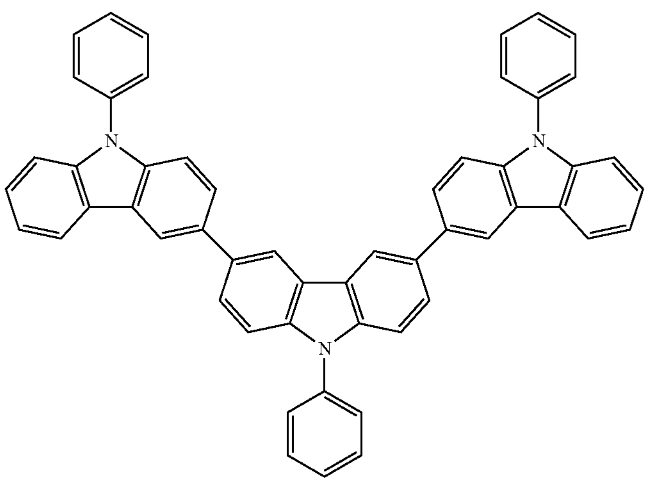
,
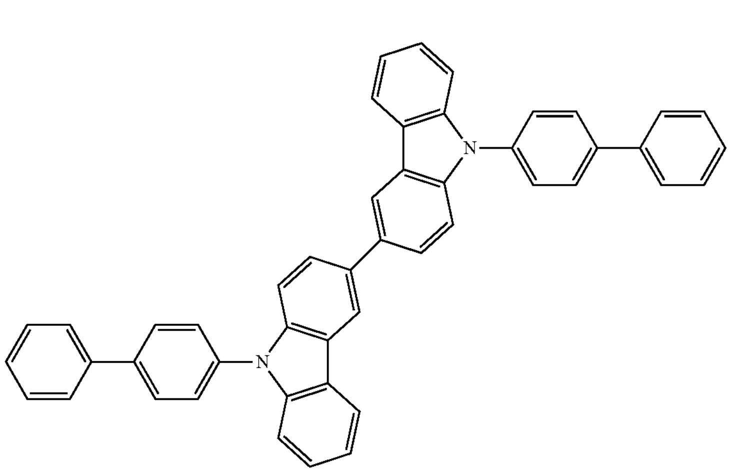
, -continued
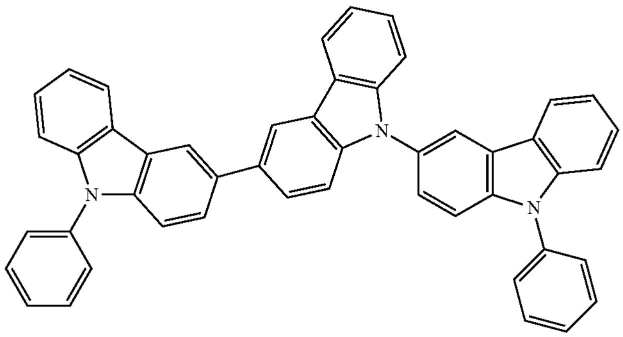
,
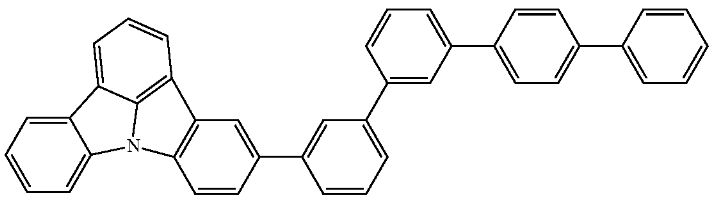
,
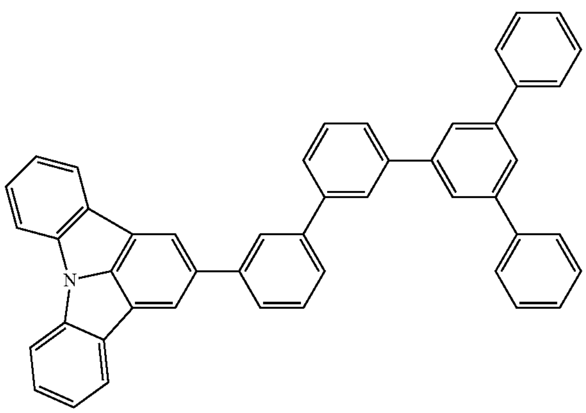
,
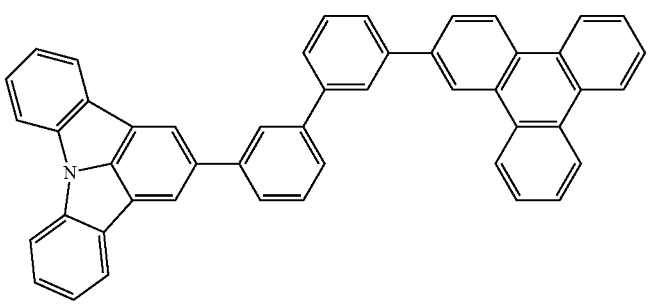
,
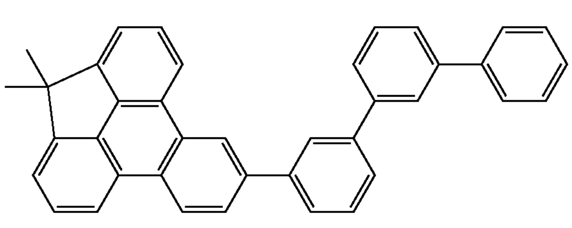
,
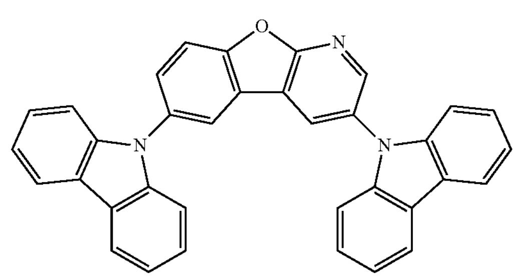
, -continued
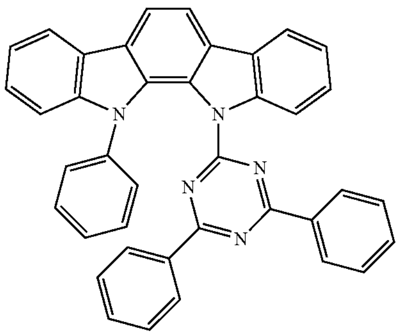
,
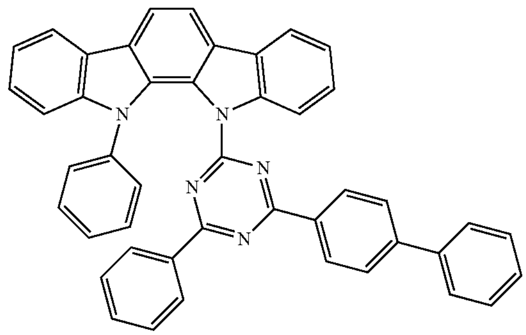
,
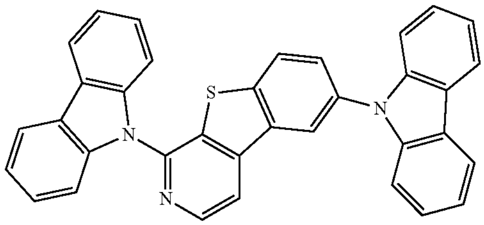
,
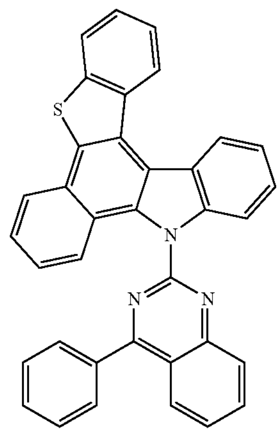
,
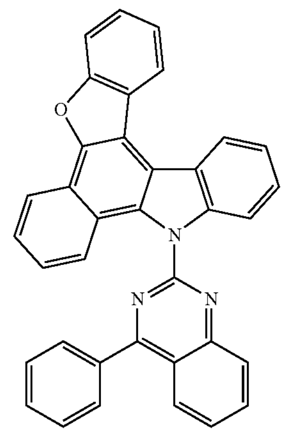
,
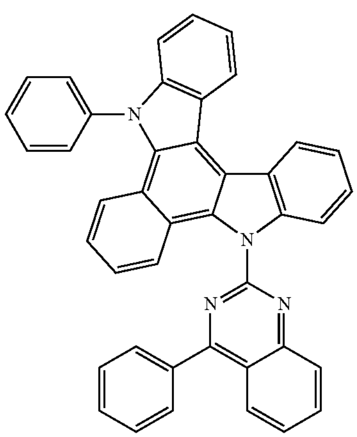
,
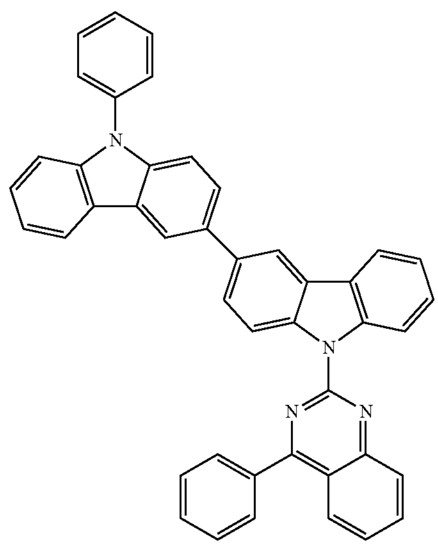
,
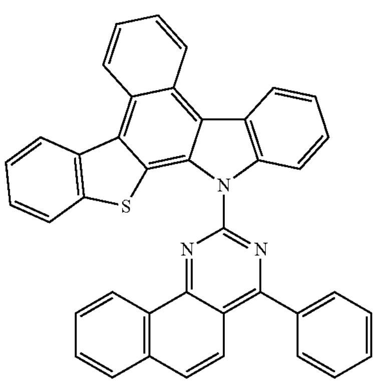
,
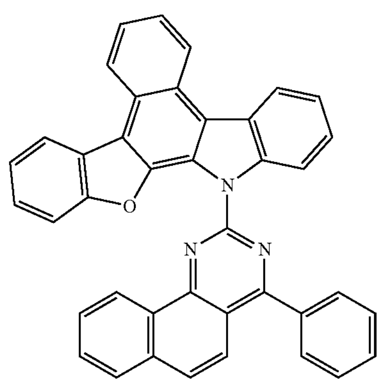
, -continued
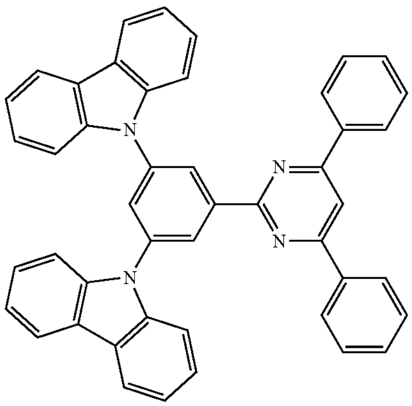
,
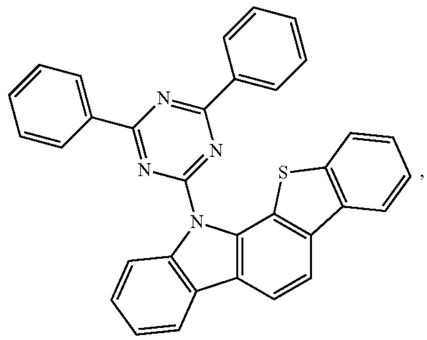
,
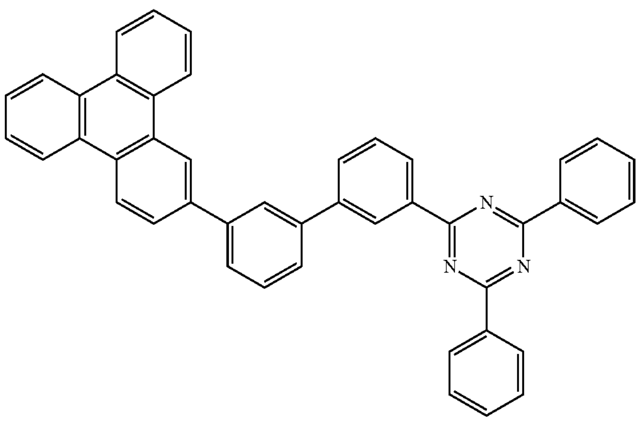
,
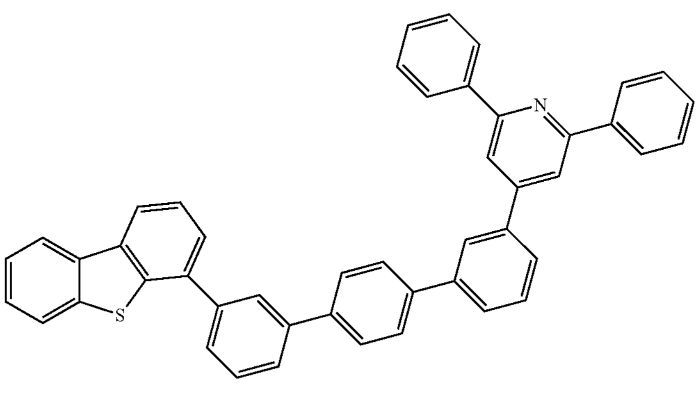
,
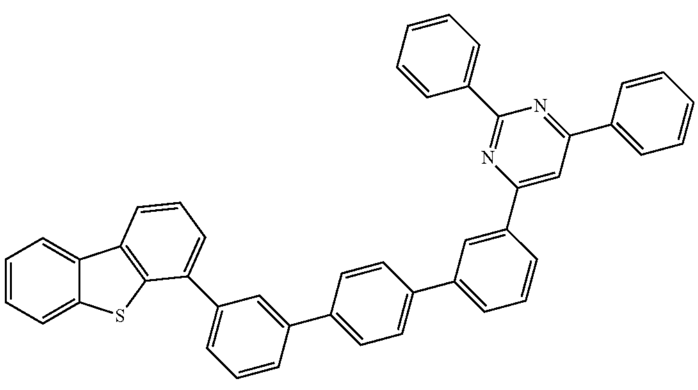
, -continued
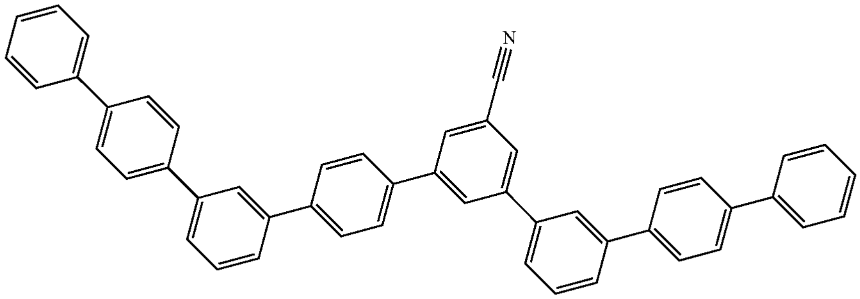
,
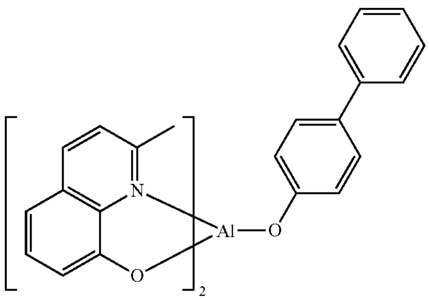
,
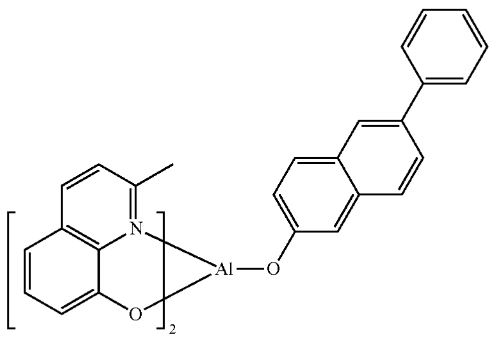
,
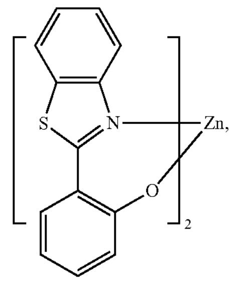
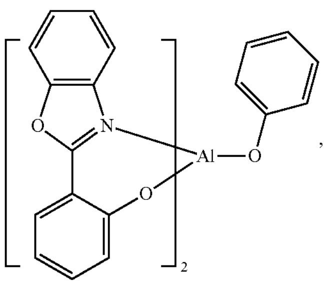
,
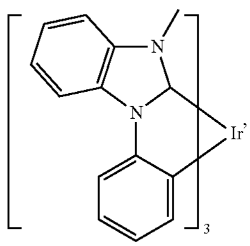
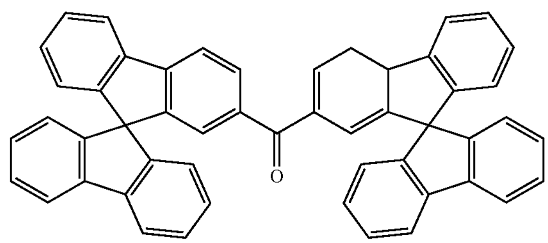
,
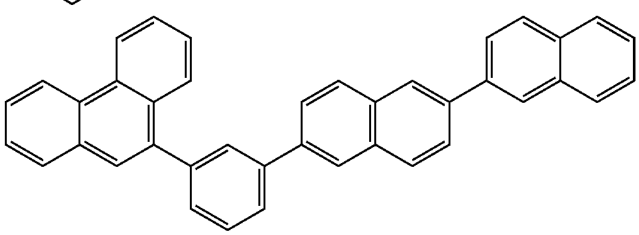
,
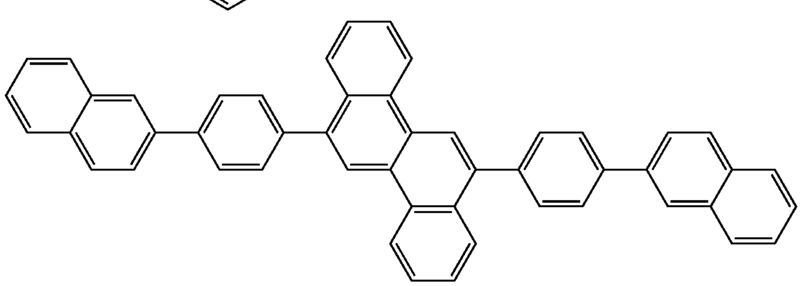
, and
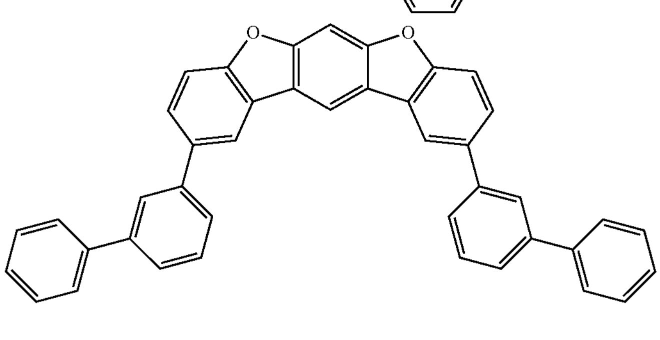
.

e) Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

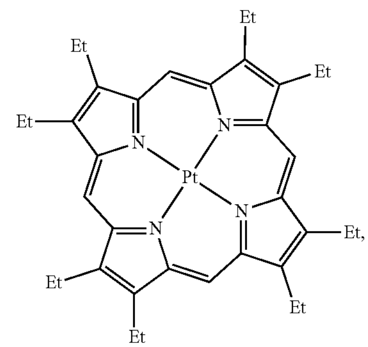

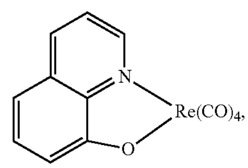

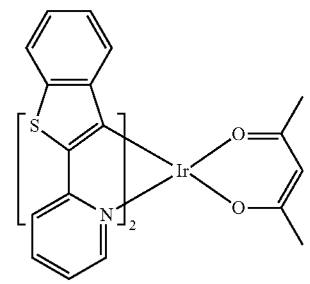

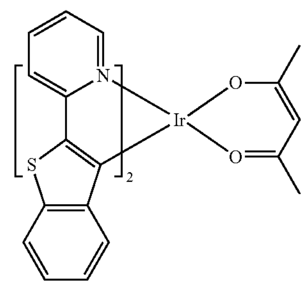

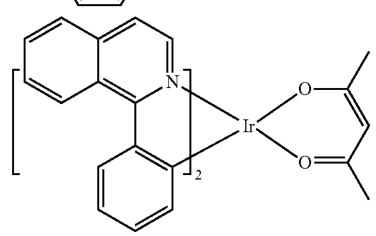

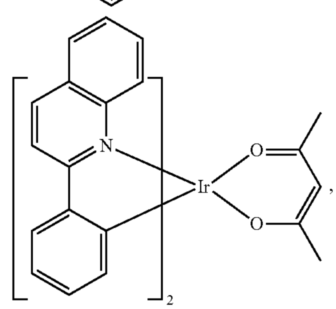

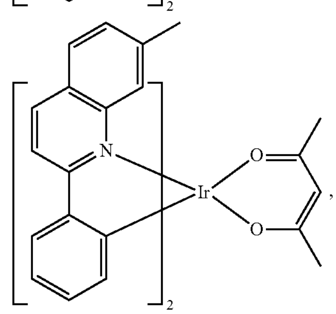

-continued
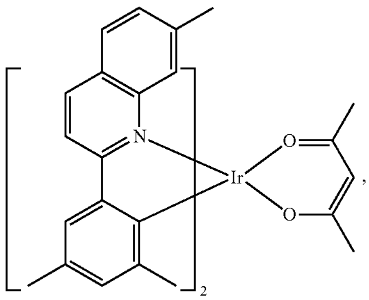
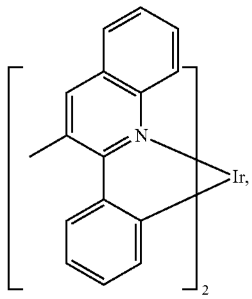
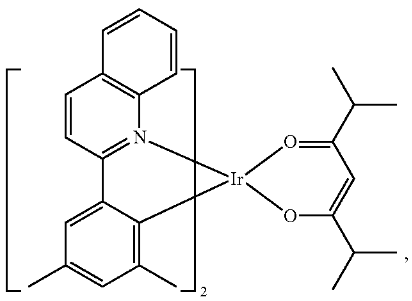
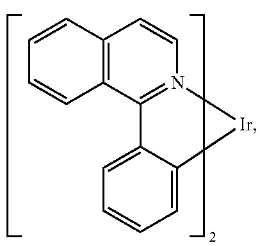
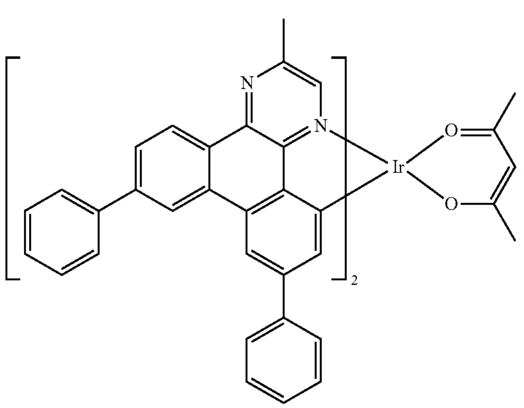
-continued
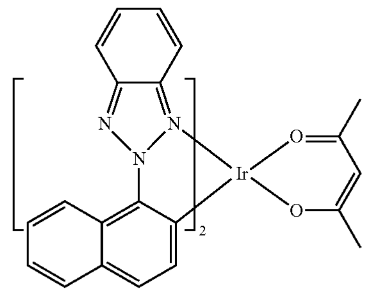
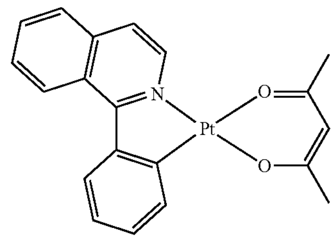
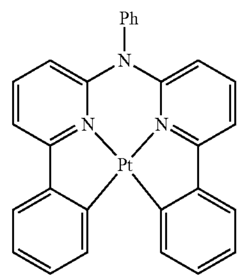
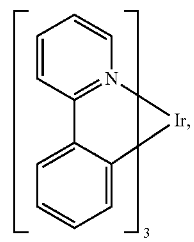
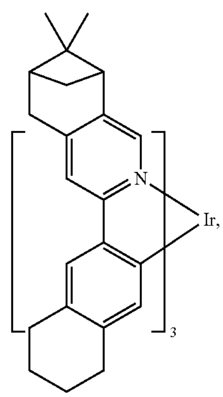
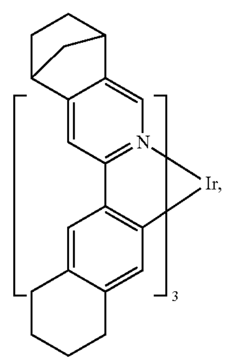
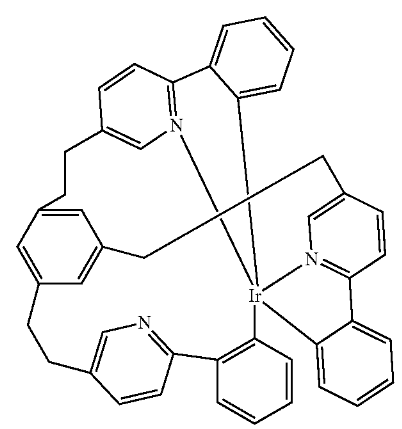

-continued
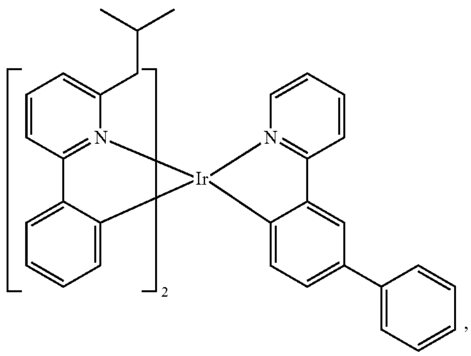
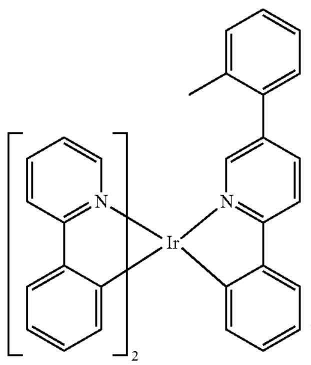
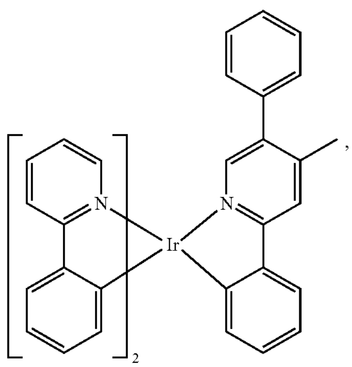
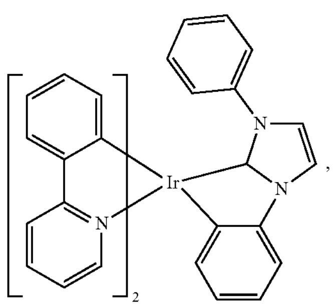
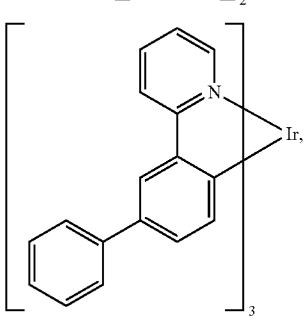
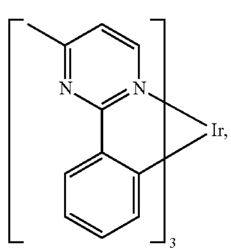
-continued
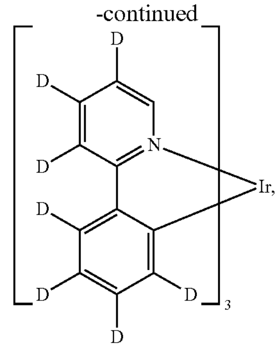
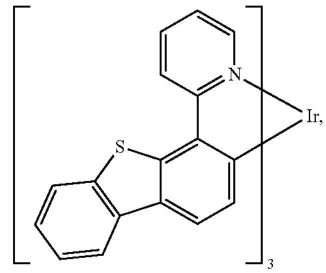
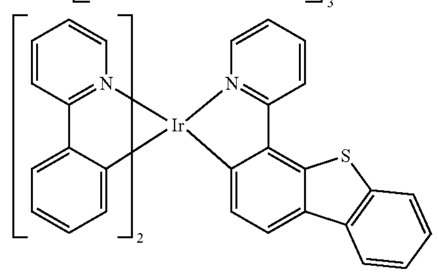
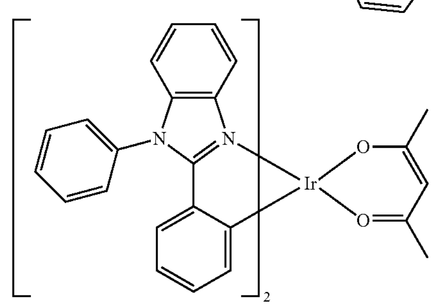
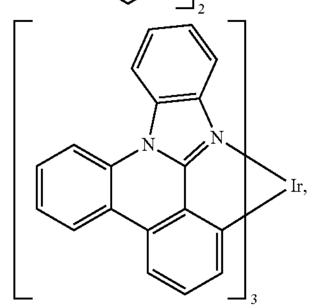
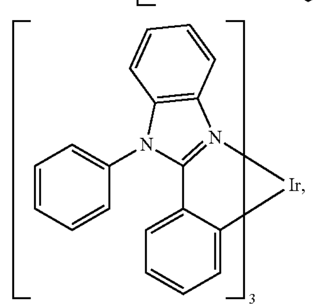
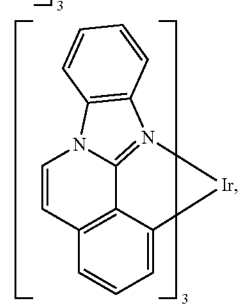

-continued
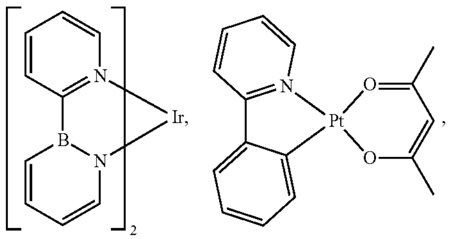
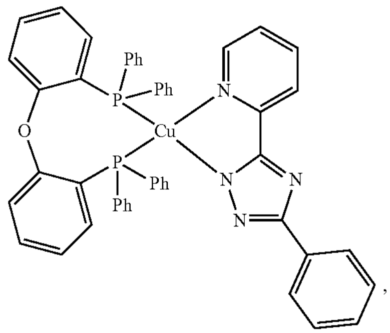
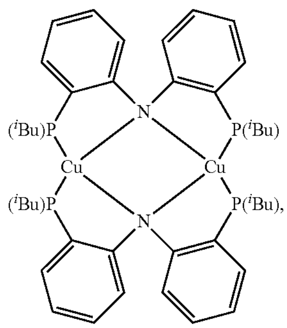
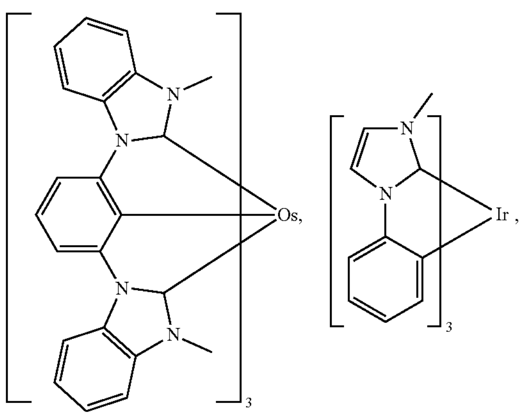
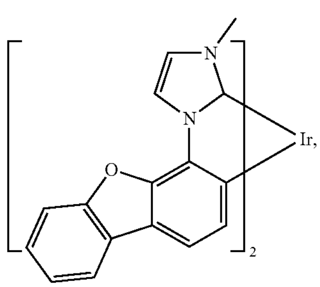
-continued
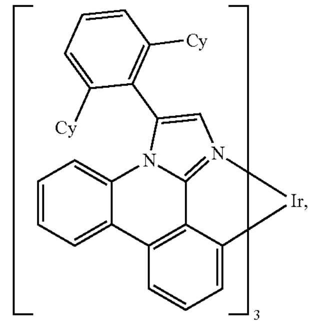
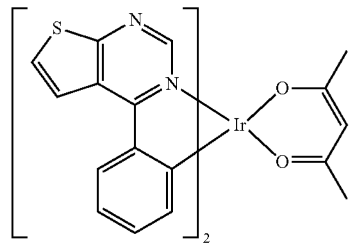
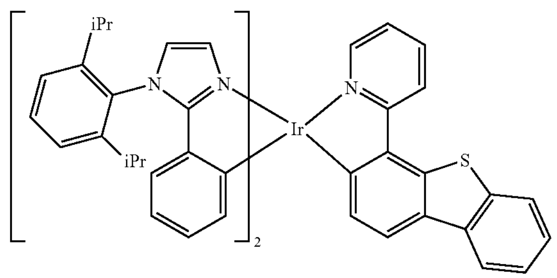
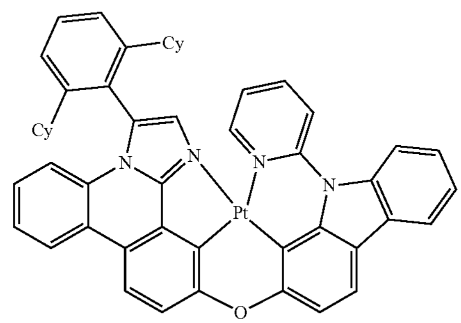
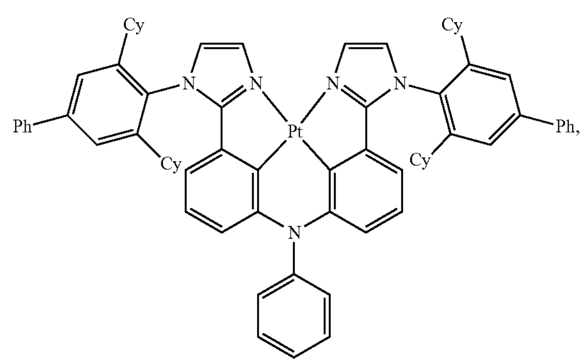

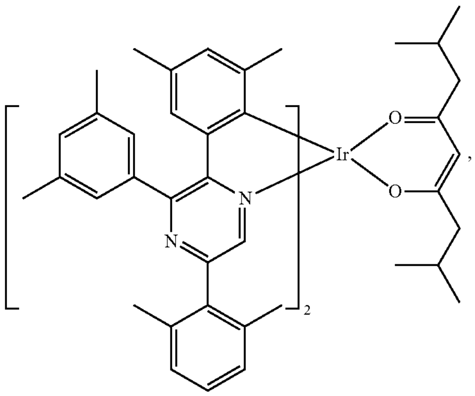
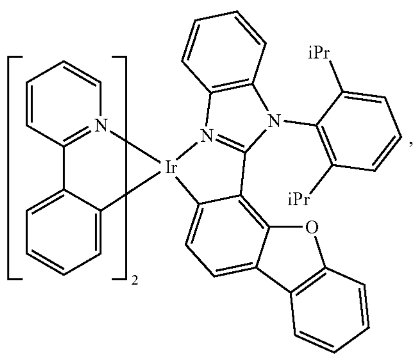
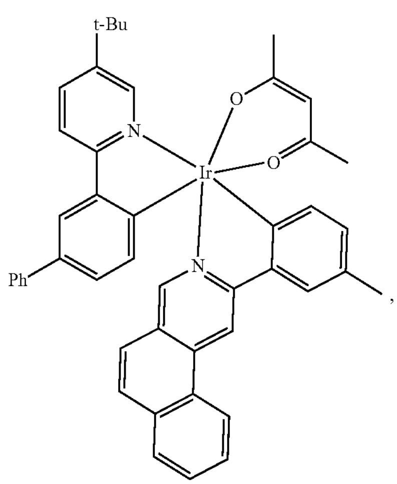
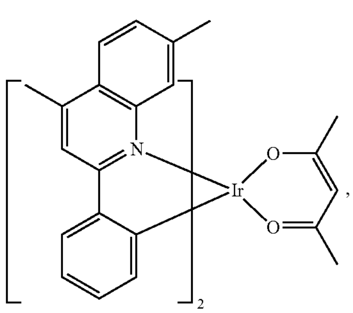
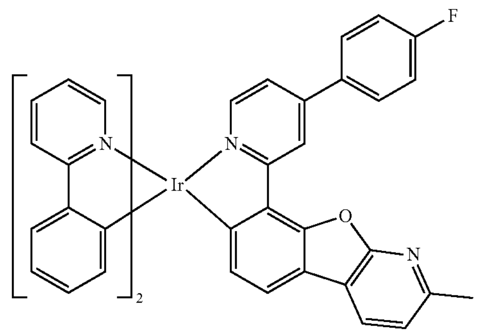
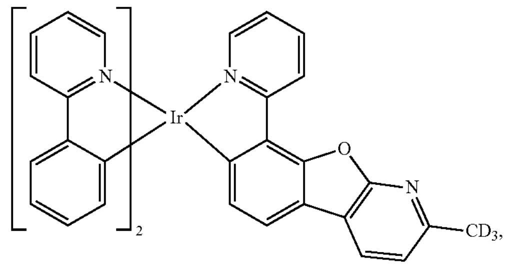
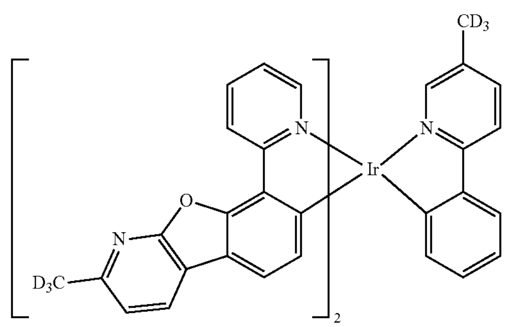
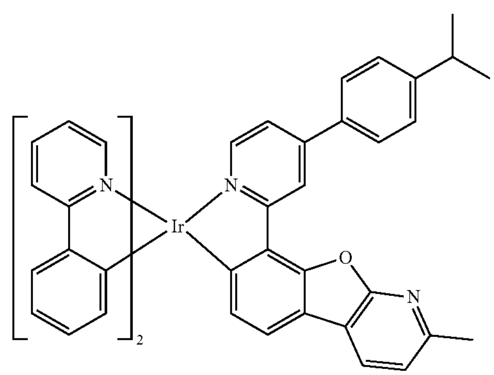
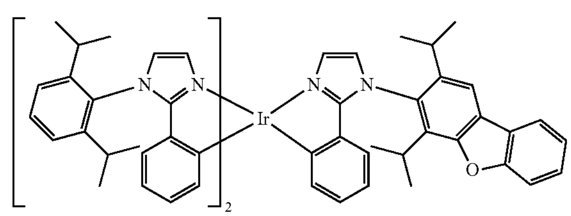

-continued
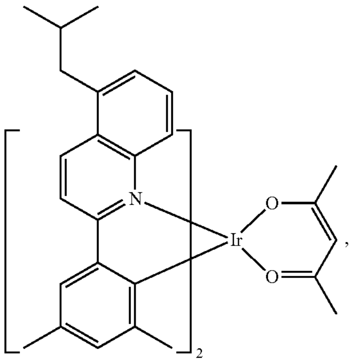
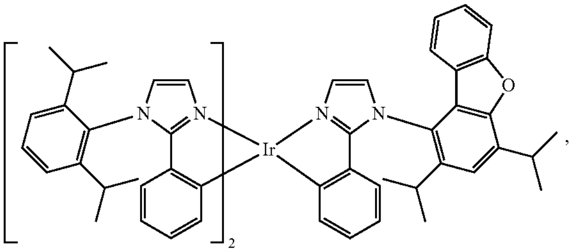
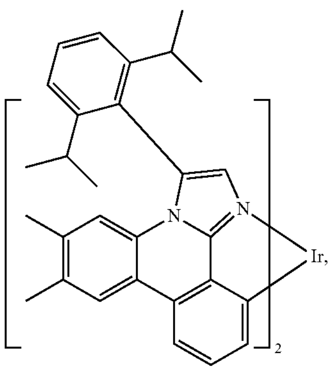
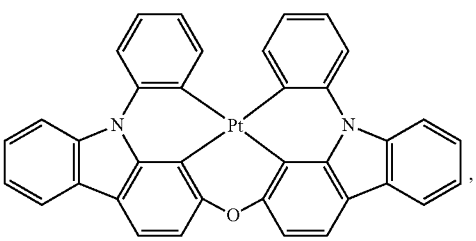
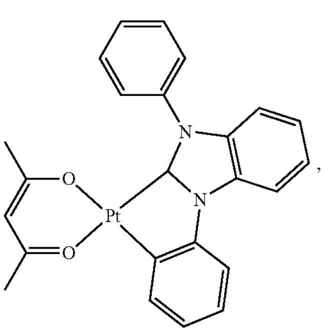
-continued
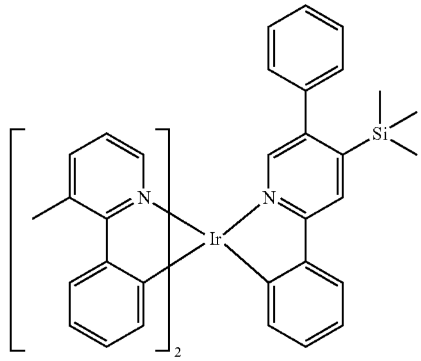
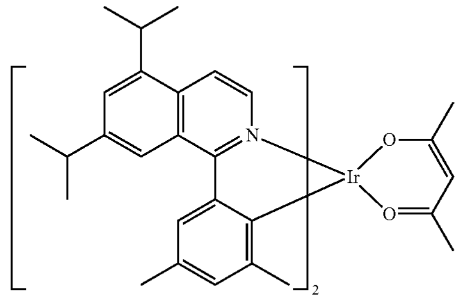
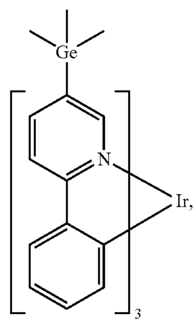
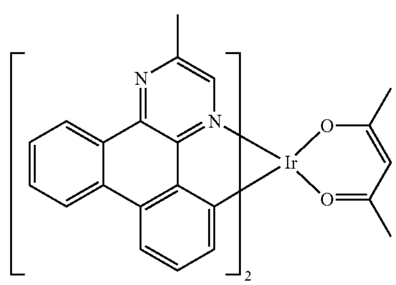
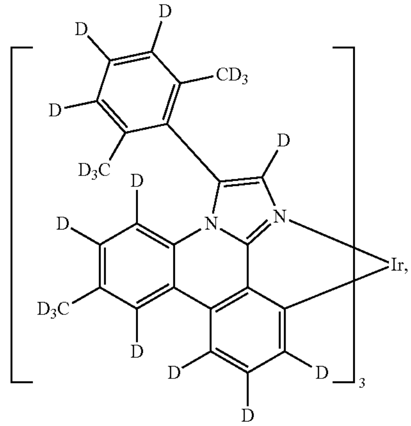

-continued
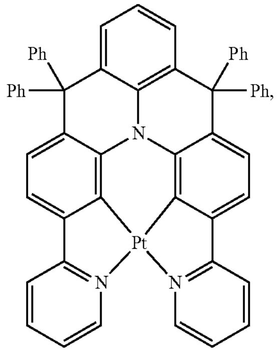
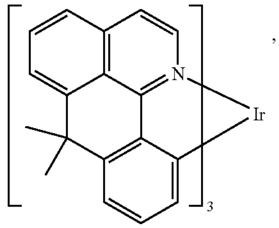
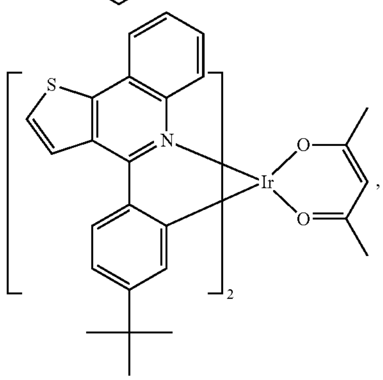
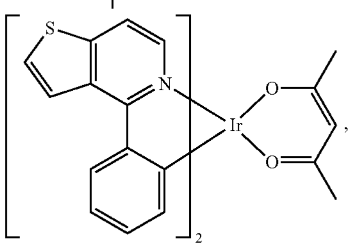
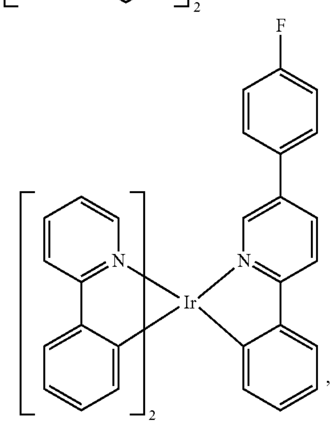
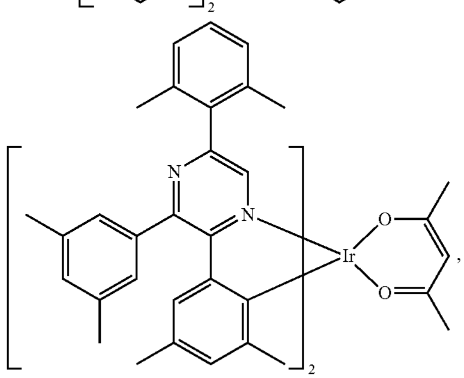
-continued
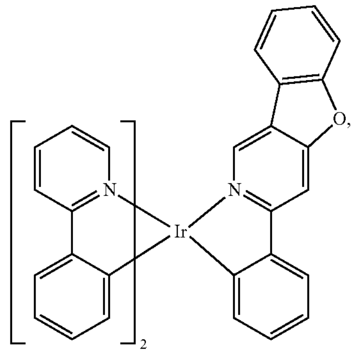
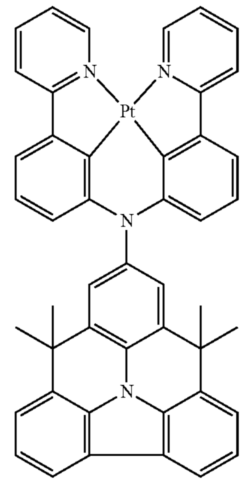
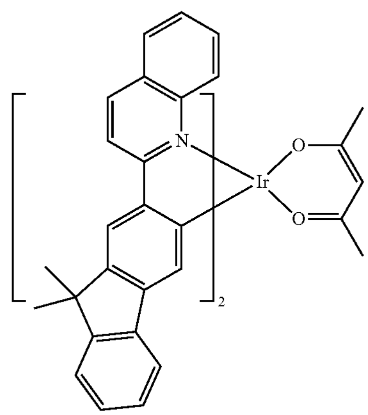
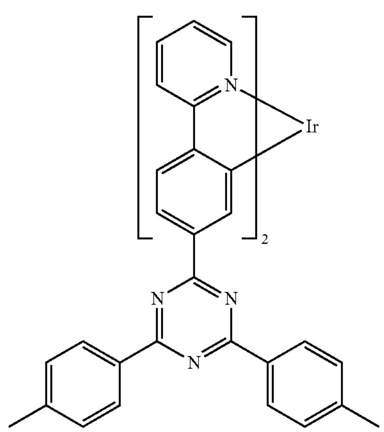

-continued
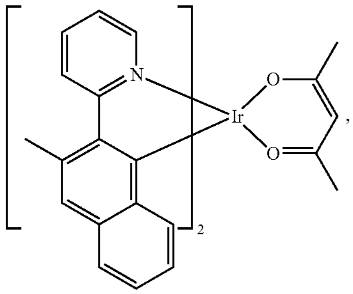
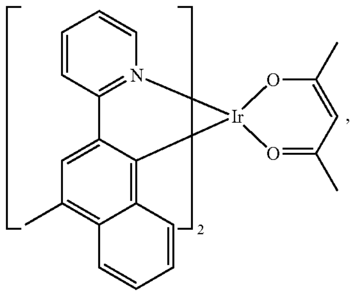
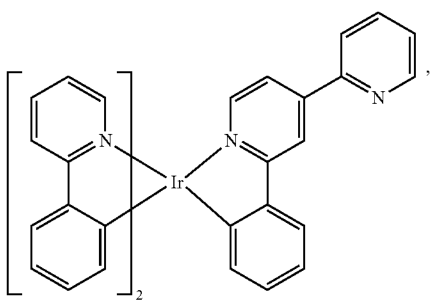
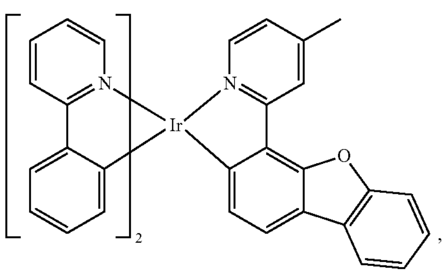
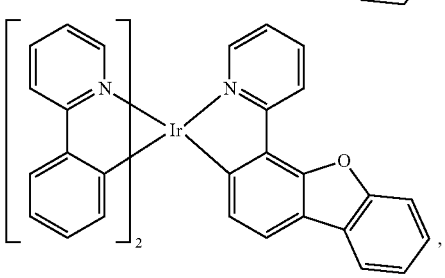
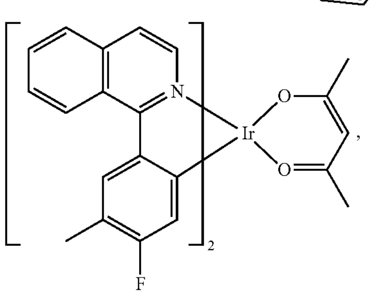
-continued
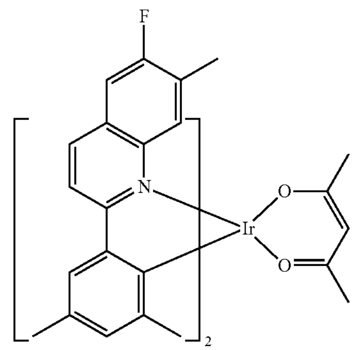
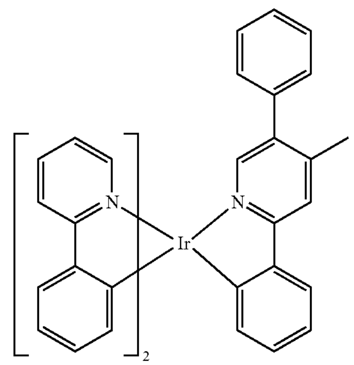
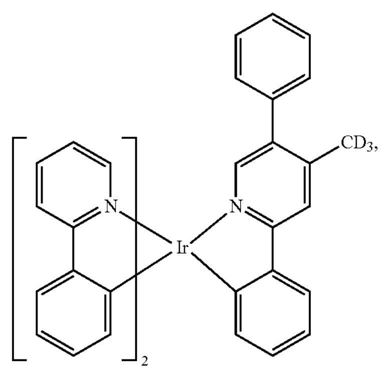
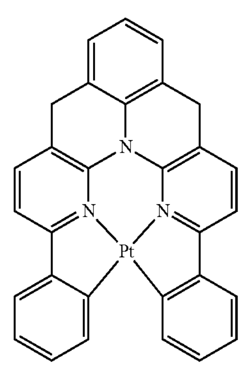

-continued
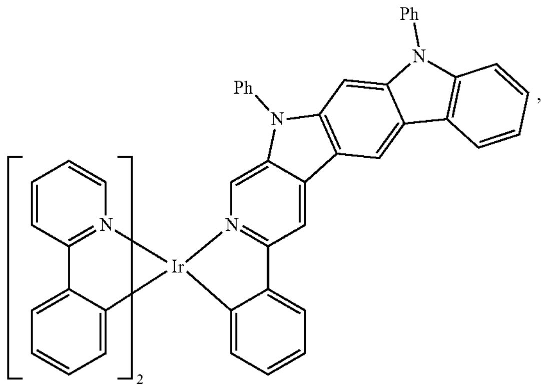
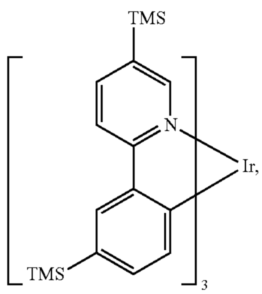
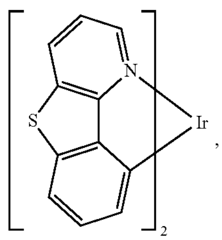
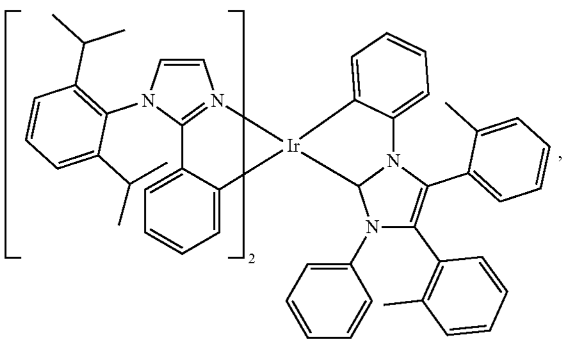
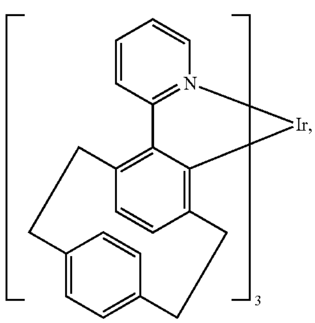
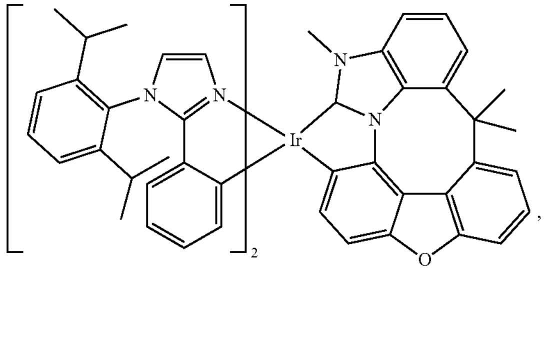
-continued
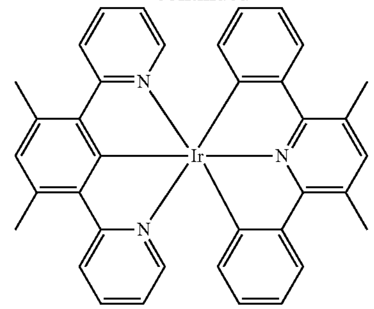
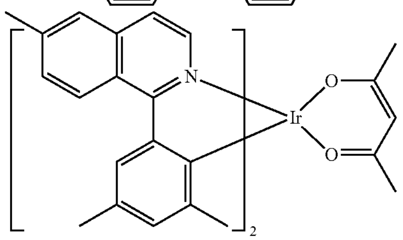
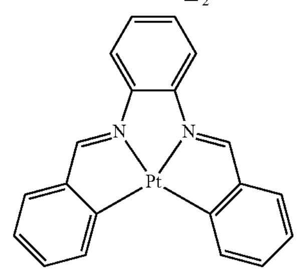
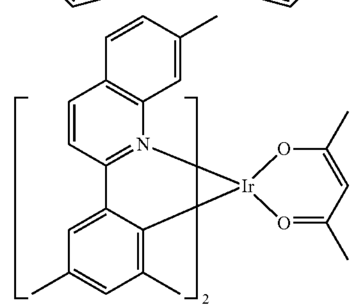
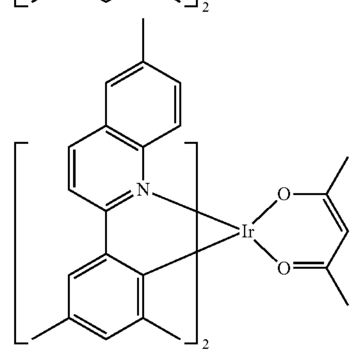
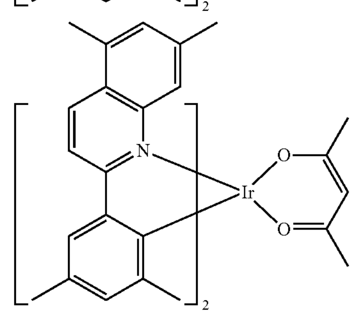

-continued
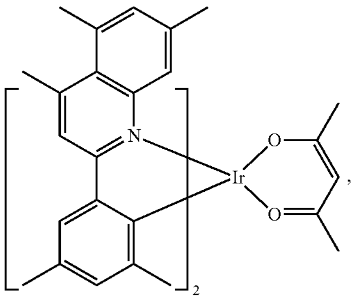
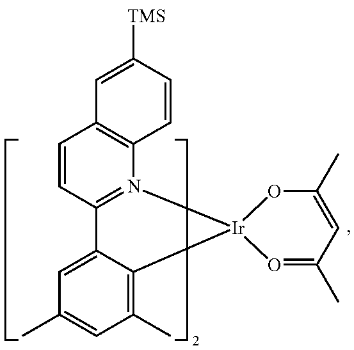
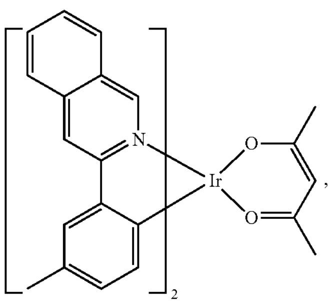
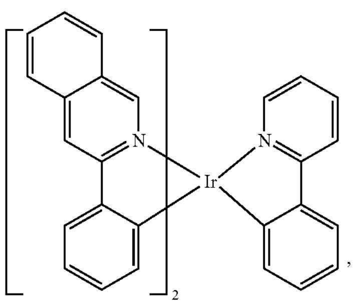
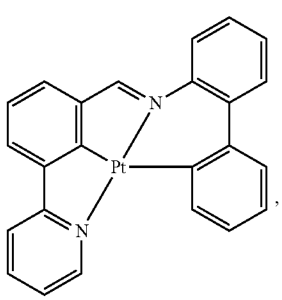
-continued
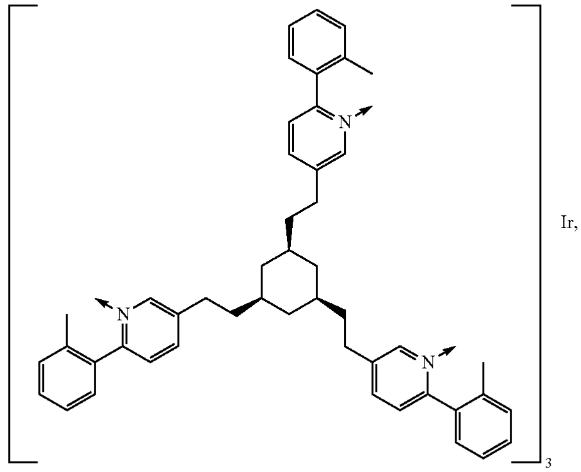
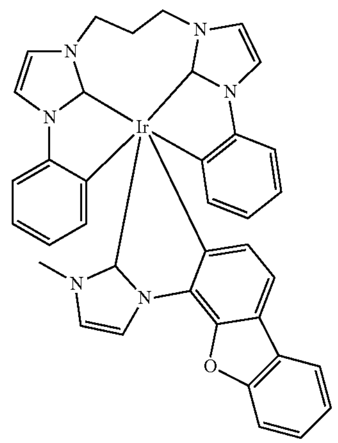
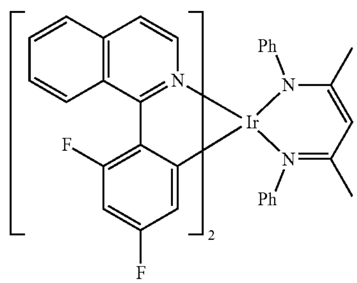
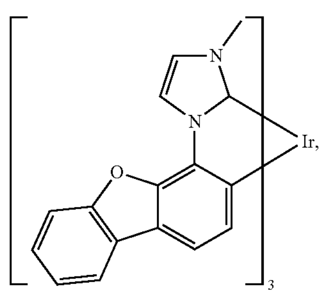

-continued
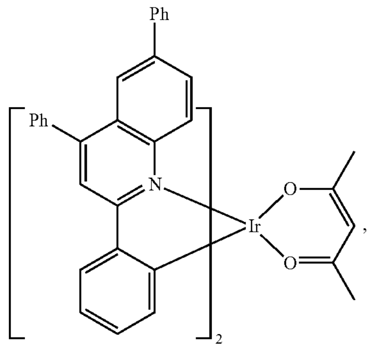
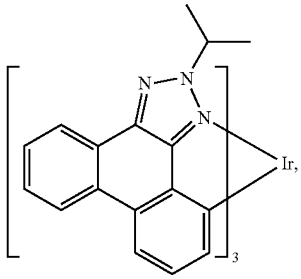
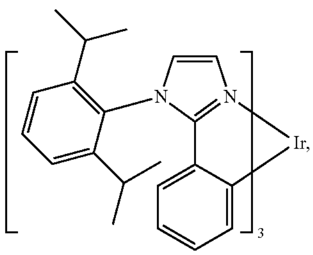
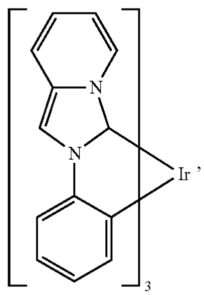
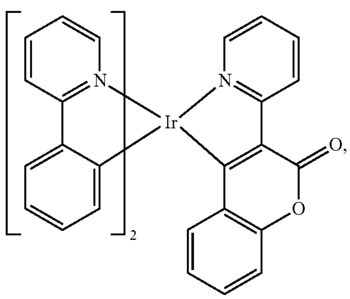
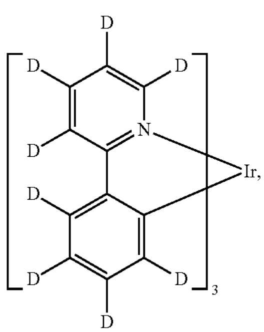
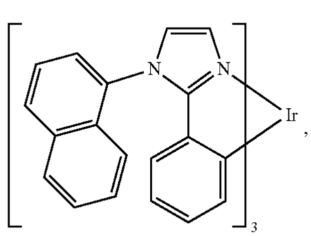
-continued
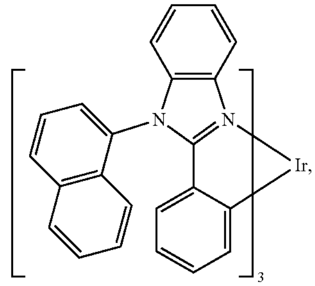
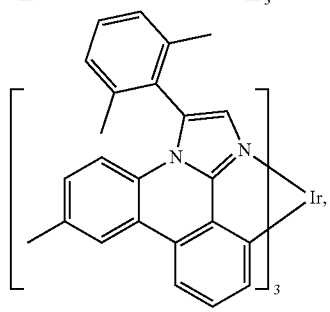
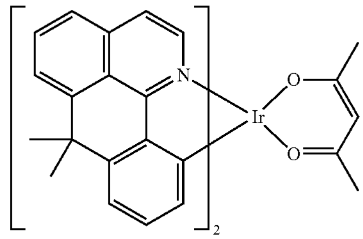
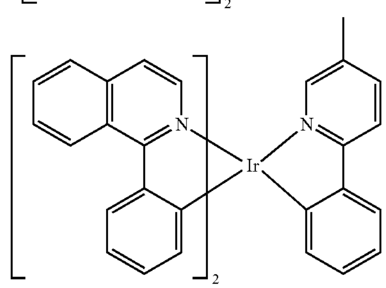
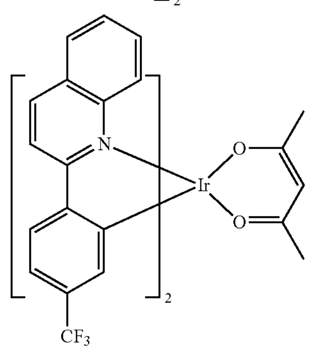
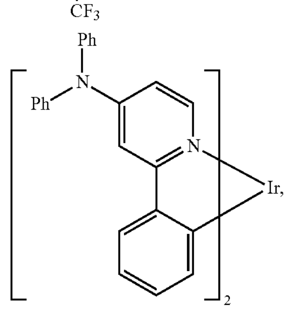
and -continued

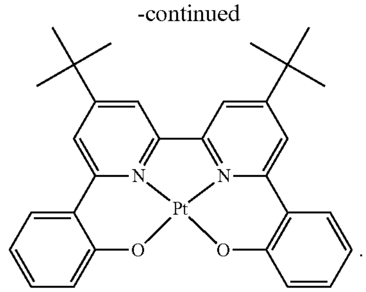

f) HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

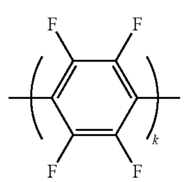

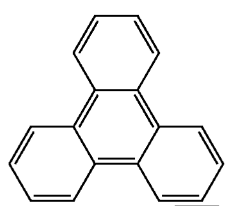

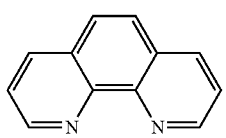

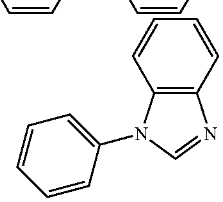

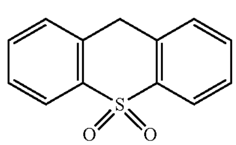

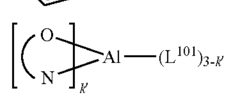

wherein k is an integer from 1 to 20; $L^{101}$ is another ligand, k' is an integer from 1 to 3.

g) ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

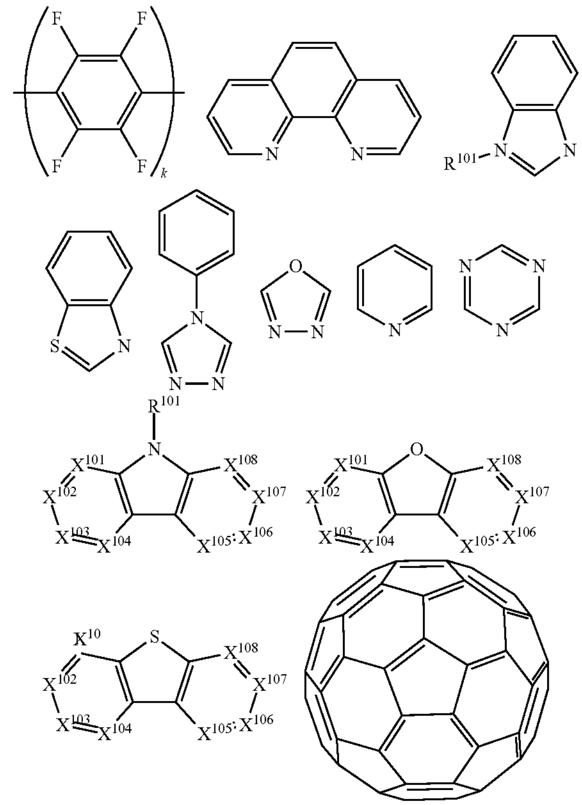

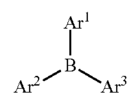

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

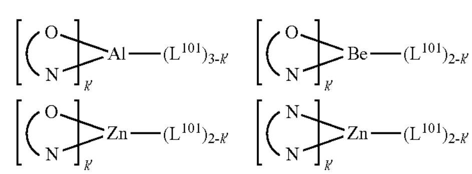

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,
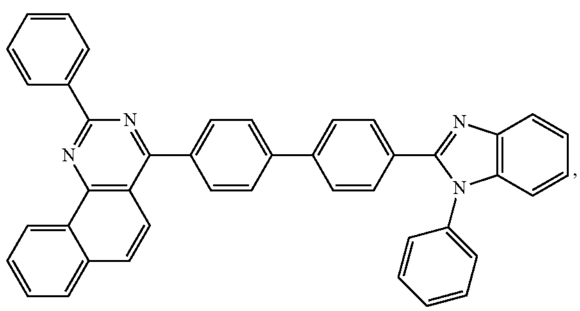
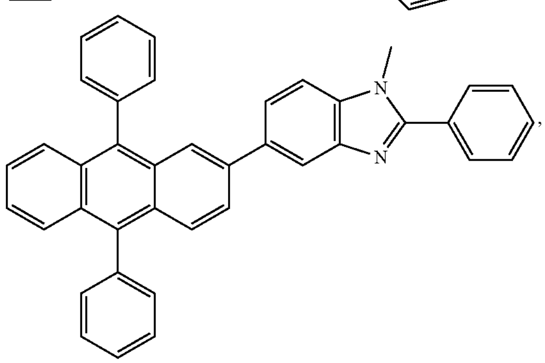
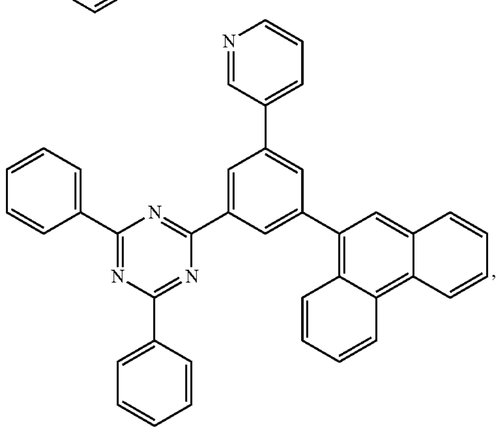
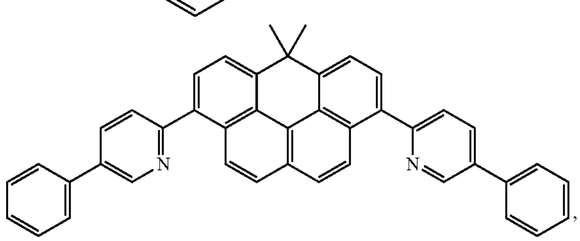
-continued
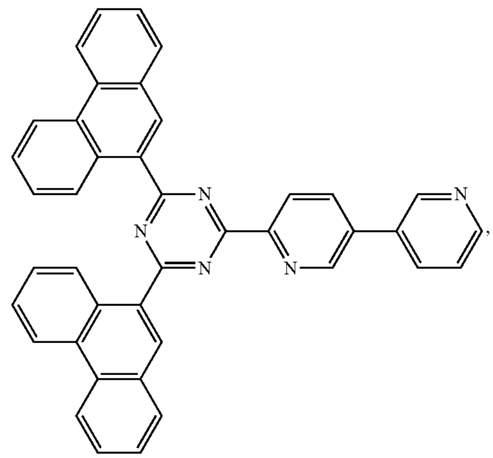
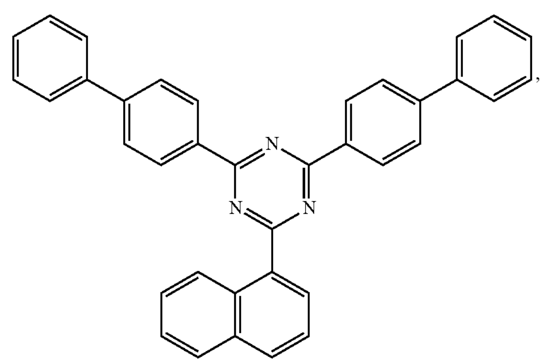
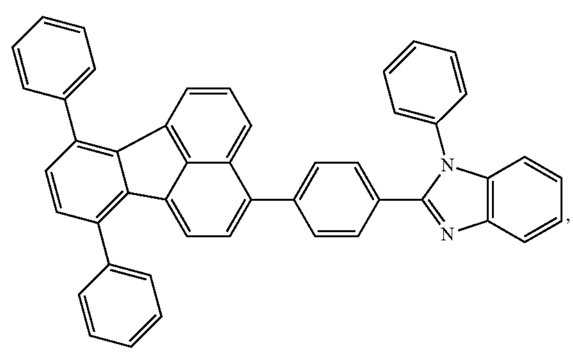
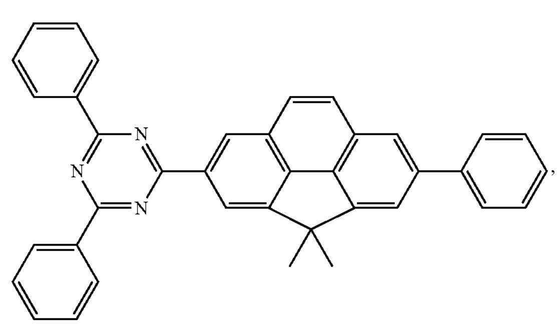

-continued
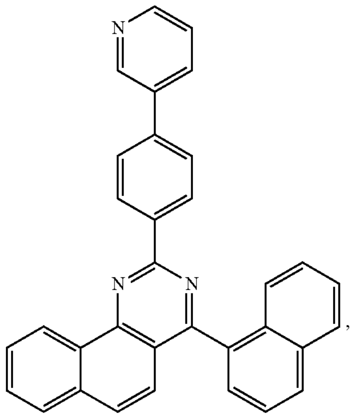
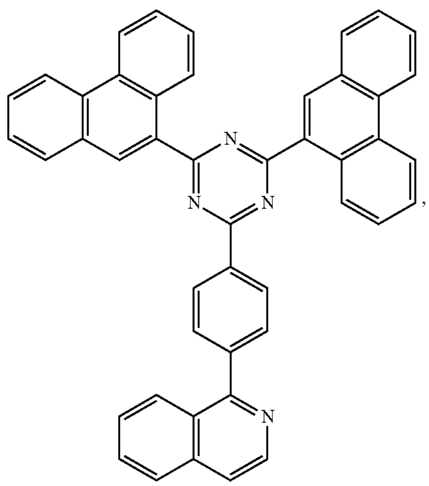
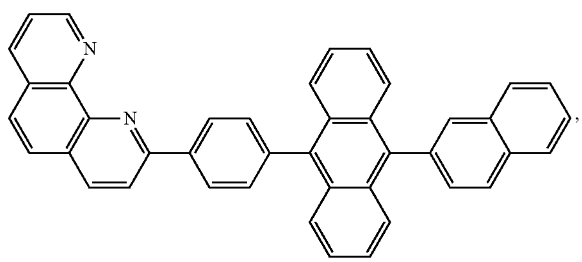
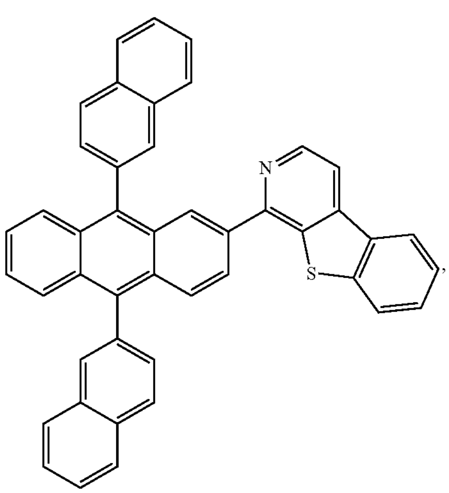
-continued
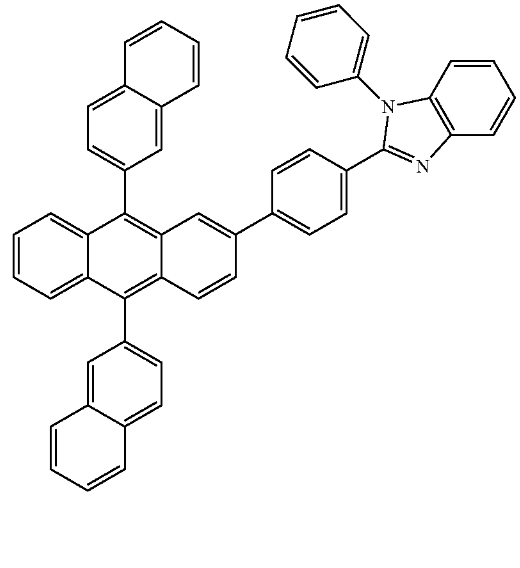
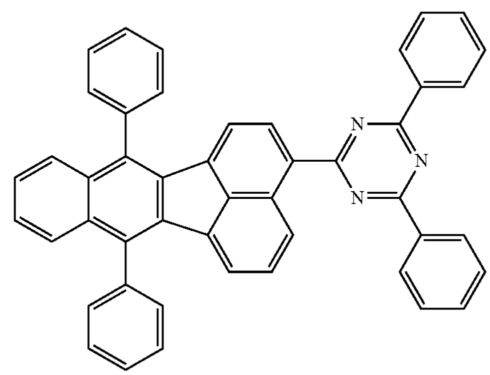
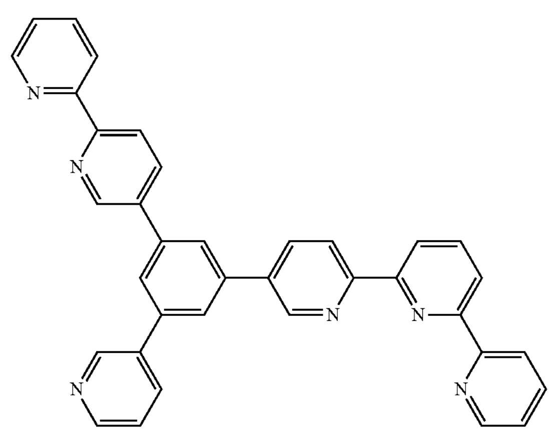

-continued
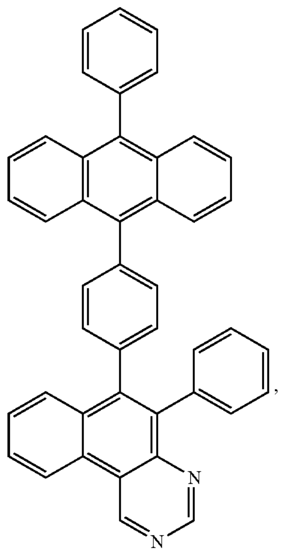
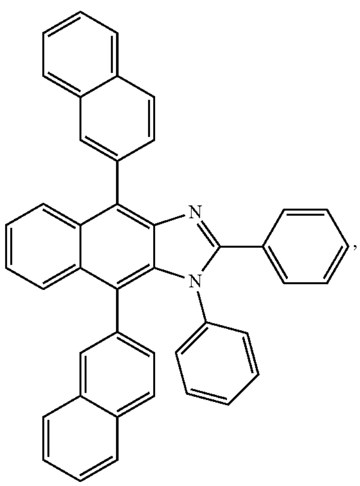
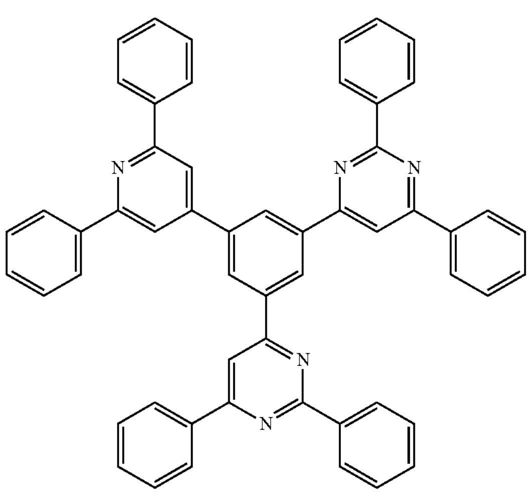
-continued
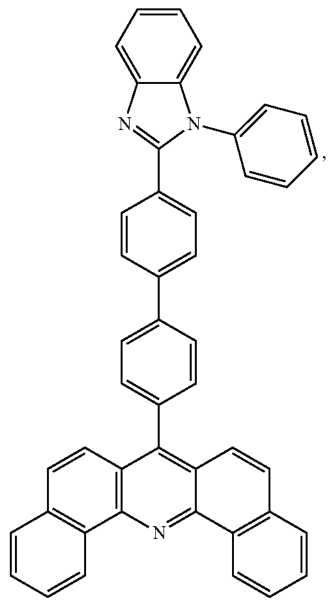
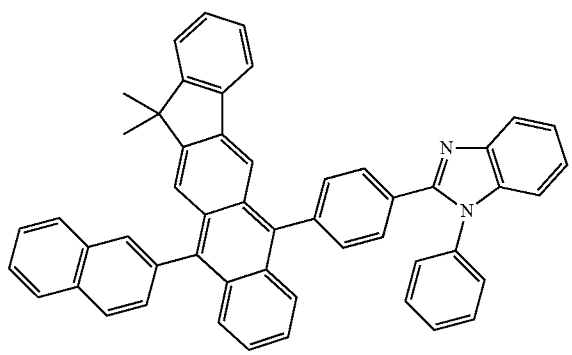
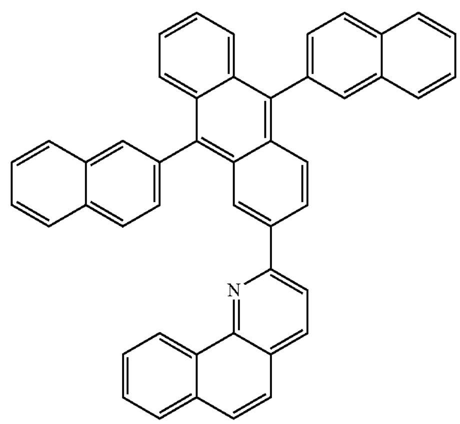
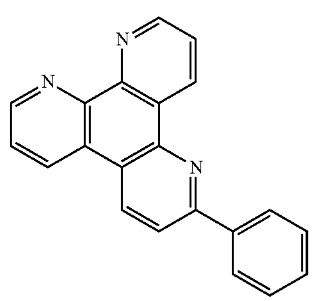

-continued
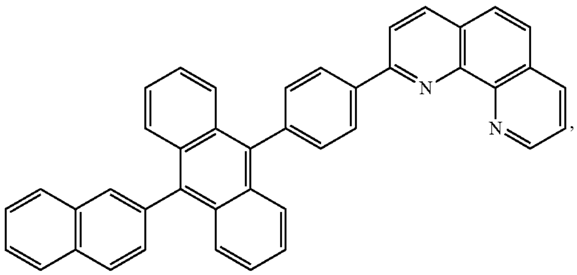
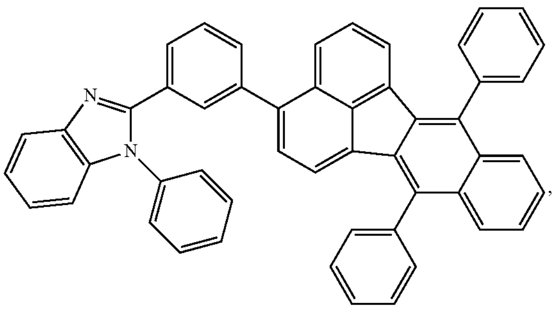
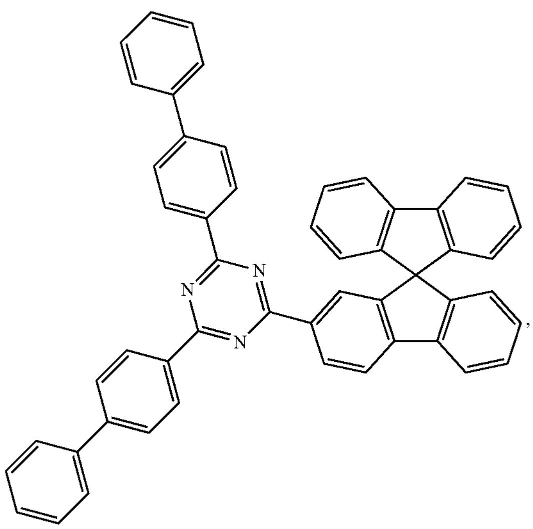
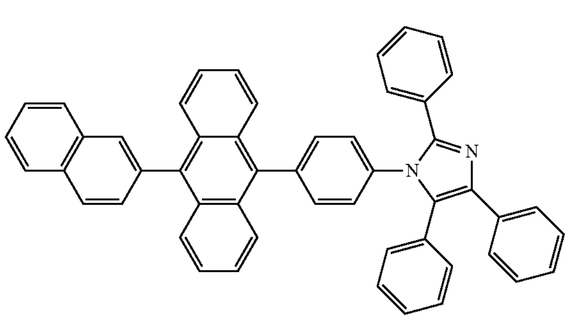
-continued
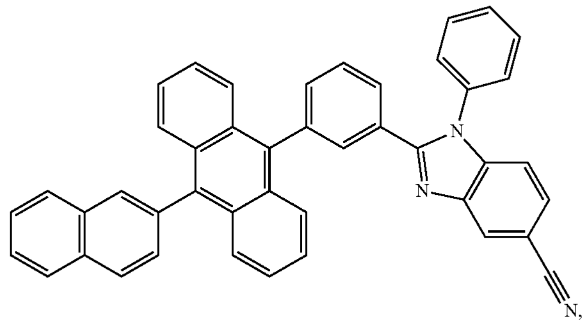
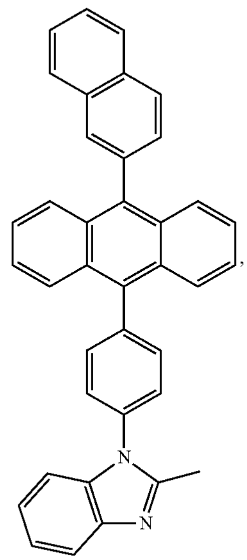
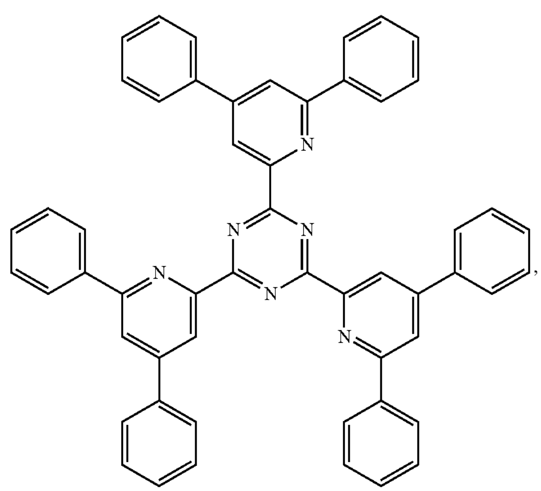

-continued

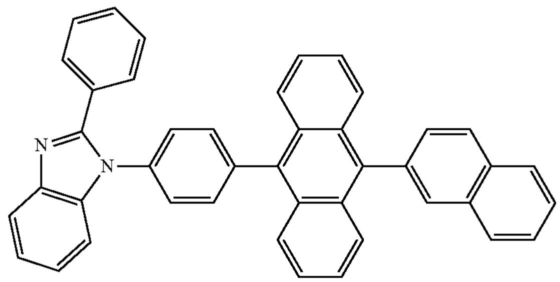

,

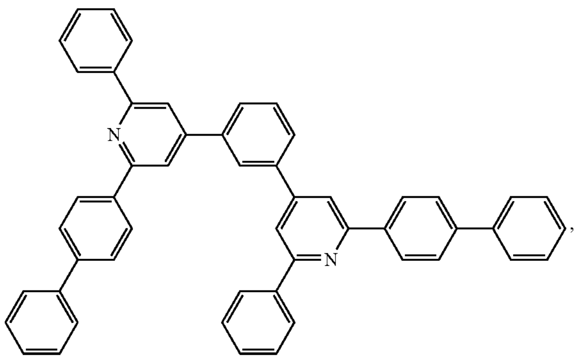

,

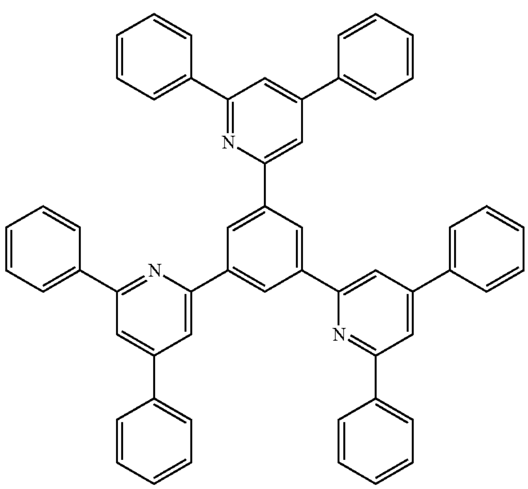

,

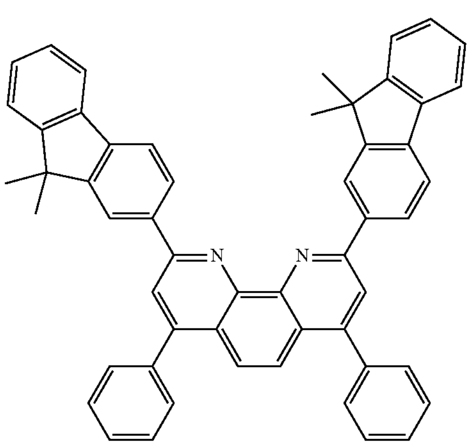

, and

-continued

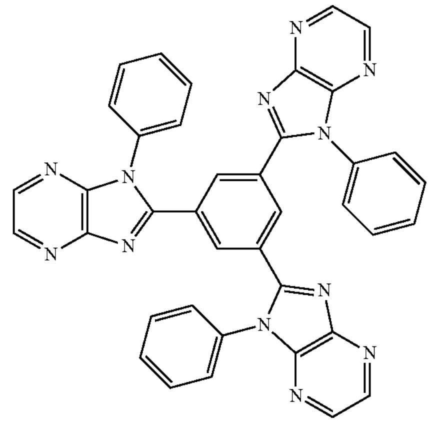

.

h) Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

E. Experimental Section

Synthesis of Compound XIII

Synthesis of 4-(3,5-di-tert-butylphenyl)isoquinoline

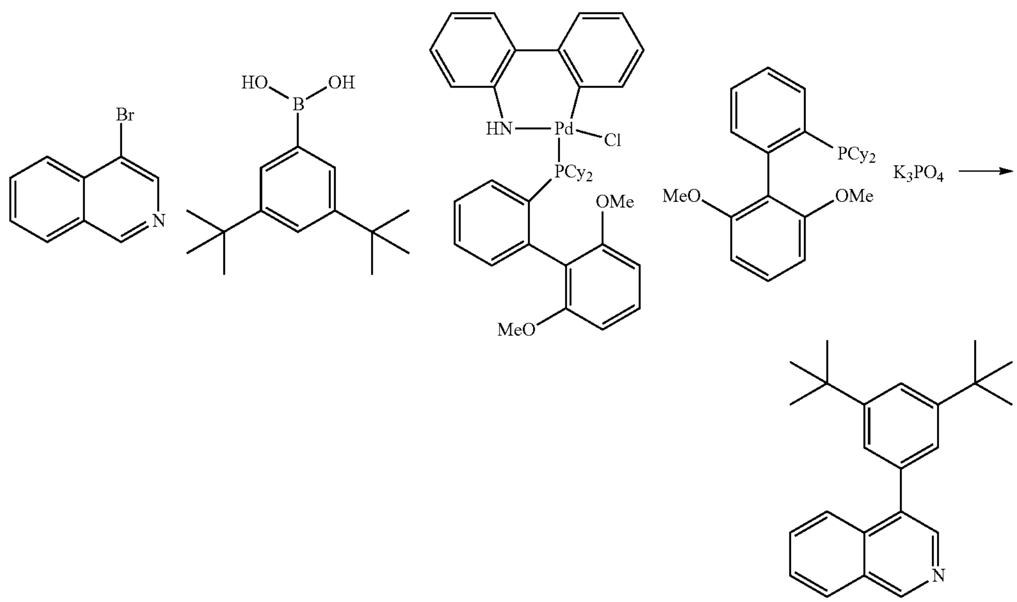

A mixture of 4-bromoisoquinoline (3 g, 14.42 mmol), (3,5-di-tert-butylphenyl)boronic acid (4.05 g, 17.30 mmol), SPhos-Pd-G2 (0.311 g, 0.433 mmol), SPhos (0.178 g, 0.433 mmol), and potassium phosphate (4.59 g, 21.63 mmol) was vacuumed and back-filled with nitrogen several times. Dioxane (54 ml) was added to the reaction mixture and heated at 110° C. for 18 hours. Partitioned between DCM and water and extracted with DCM. Coated on Celite and chromatographed on silica (EA/Hep=½) to afford the product (94% yield).

Synthesis of 4-(3,5-di-tert-butylphenyl)isoquinoline 2-oxide

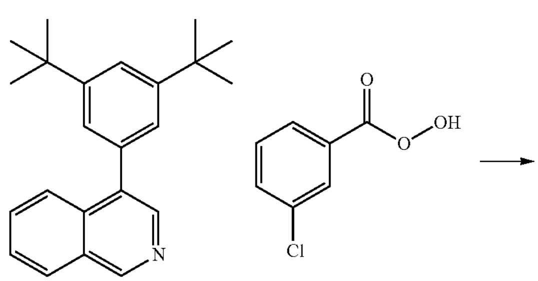

-continued

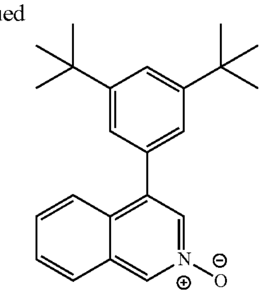

4-(3,5-di-tert-butylphenyl)isoquinoline (4.3 g, 13.54 mmol) was dissolved in Dichloromethane (100 ml) and cooled to 0° C. 3-chlorobenzoperoxoic acid (2.80 g, 16.25 mmol) was added. The reaction mixture in an ice bath was stirred 18 hours at room temperature (RT). Removed DCM and dissolved in ethyl acetate. Chromatographed on silica (EA to EA/MeOH=20/1) to afford the product (91% yield).

Synthesis of 4-(3,5-di-tert-butylphenyl)isoquinolin-1-amine

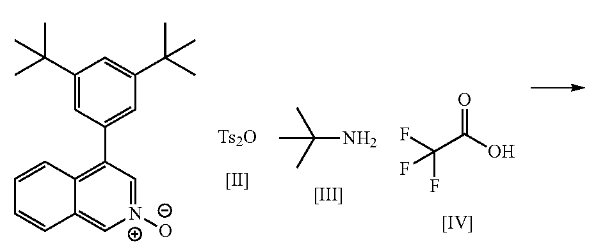

-continued

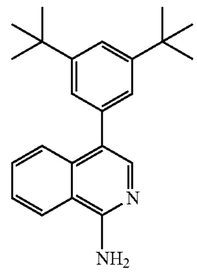

4-(3,5-di-tert-butylphenyl)isoquinoline 2-oxide (4.1 g, 12.29 mmol) was dissolved in Chloroform (60 ml) and cooled to 0° C. 2-methylpropan-2-amine (6.46 ml, 61.5 mmol) and 4-methylbenzenesulfonic anhydride (8.03 g, 24.59 mmol) were added at 0° C. The reaction mixture in an ice bath was stirred for 15 min. Added 2,2,2-trifluoroacetic acid (18.83 ml, 246 mmol) and heated at 70° C. for 3 hours. The reaction mixture was concentrated and partitioned between DCM and $Na_2CO_3$ (sat) and extracted with DCM and brine. Chromatographed on silica (EA) to afford the product (83% yield).

Synthesis of N2,N4,N6-tris(4-(3,5-di-tert-butylphenyl)isoquinolin-1-yl)-1,3,5-triazine-2,4,6-triamine

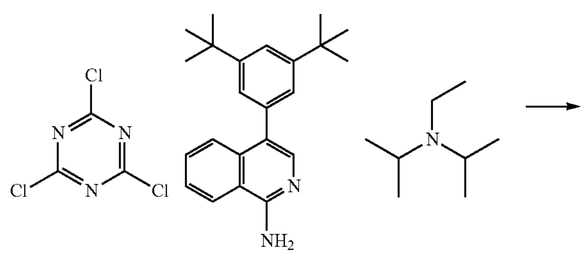

-continued

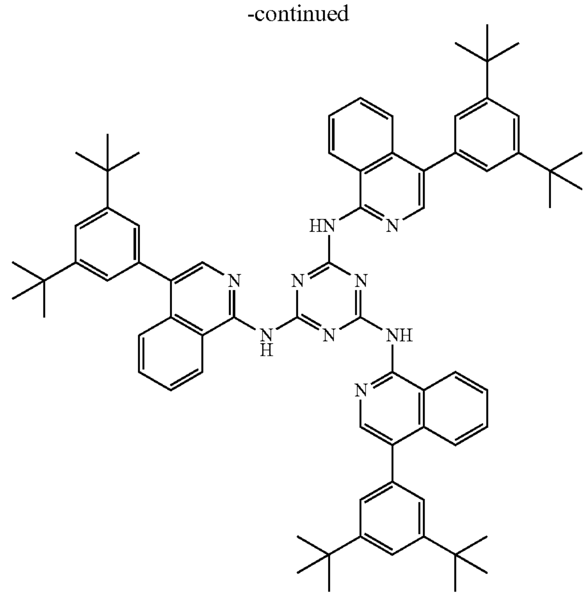

A mixture of 2,4,6-trichloro-1,3,5-triazine (60 mg, 0.325 mmol) and 4-(3,5-di-tert-butylphenyl)isoquinolin-1-amine (335 mg, 1.009 mmol) was vacuumed and back-filled with nitrogen. chlorobenzene (5 ml) and N-ethyl-N-isopropylpropan-2-amine (0.567 ml, 3.25 mmol) were added to the reaction mixture and stirred at RT for 3 min (yellow solution) then refluxed for 18 hours. Evaporated and used directly in the next step without further purification.

Synthesis of Compound XIII

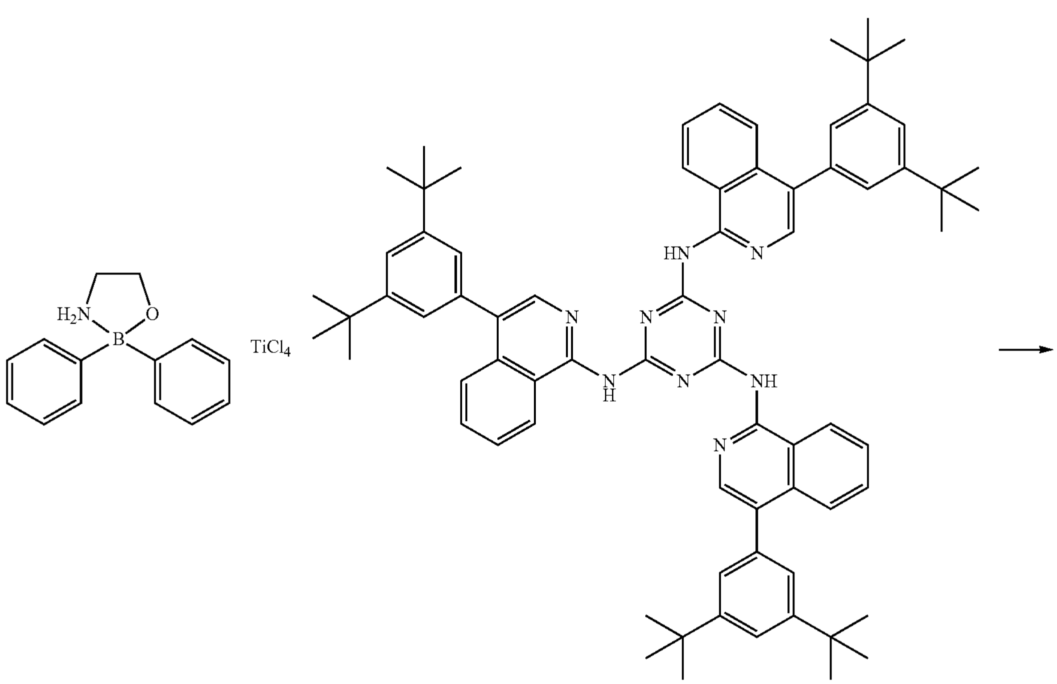

-continued

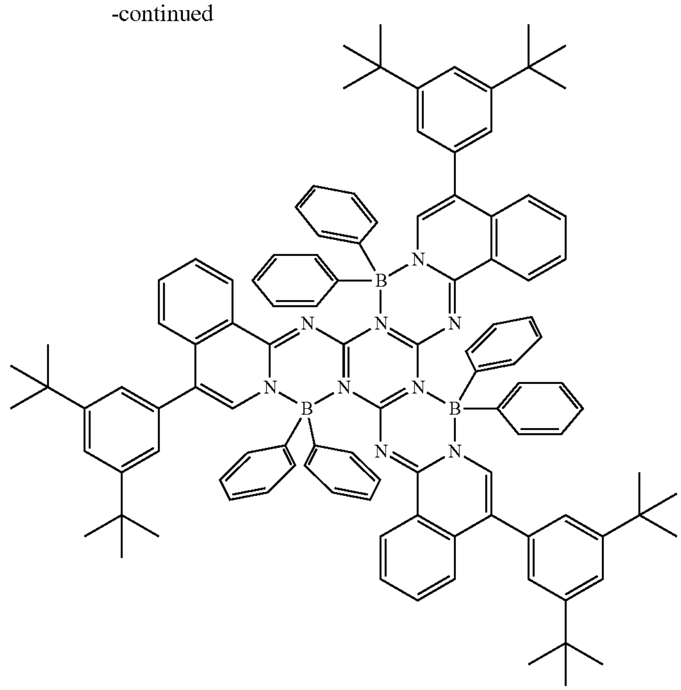

Compound XIII 2,2-diphenyl-1,3,214-oxazaborolidine (235 mg, 1.046 mmol) was vacuum and back-filled with nitrogen. Toluene (10 ml) and titanium(IV) chloride (0.115 ml, 1.046 mmol) were added and stirred at 100° C. for 15 min (yellow precipitation). N2,N4,N6-tris(4-(3,5-di-tert-butylphenyl) isoquinolin-1-yl)-1,3,5-triazine-2,4,6-triamine (340 mg, 0.317 mmol) in Toluene (10 ml) was added to the reaction mixture via a cannula and refluxed for 18 hours. Cooled down and quenched with saturate $NaHCO_3$ (50 mL) and added 100 mL DCM. Stirred the mixture for 10 min and extracted with DCM. The organic extracts were dried with $MgSO_4$ and coated on Celite and chromatographed on silica (DCM/Hep=⅔). The product was triturated in MeOH and dried in the vacuum oven (32% yield). $^1$H NMR (400 MHz, $CD_2Cl_2$): δ 7.67 (d, J=8.0 Hz, 3H), 7.61 (t, J=8.0 Hz, 3H), 7.57-7.52 (m, 4H), 7.46 (s, 3H), 7.39 (d, J=1.6 Hz, 3H), 7.25 (t, J=8.0 Hz, 3H), 7.17-7.12 (m, 21H), 6.95 (d, J=1.6 Hz, 3H), 1.27 (s, 27H).

OLED devices were fabricated using Compound XIII as a blue fluorescent emitter (see Table 1).

Compound 1

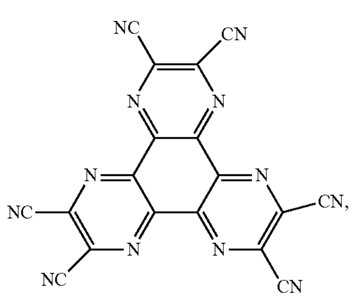

-continued

Compound 2

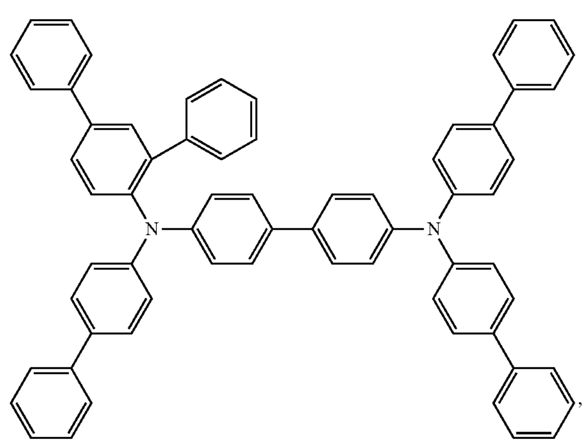

Compound 3

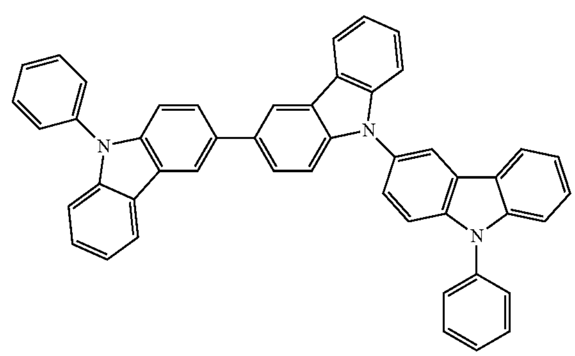

-continued

Compound 4

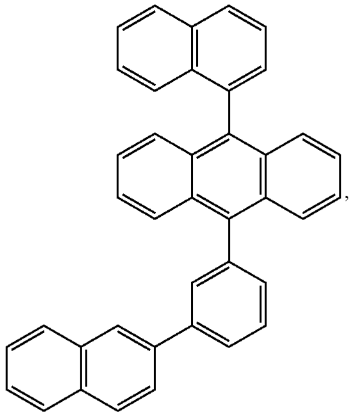

Compound 5

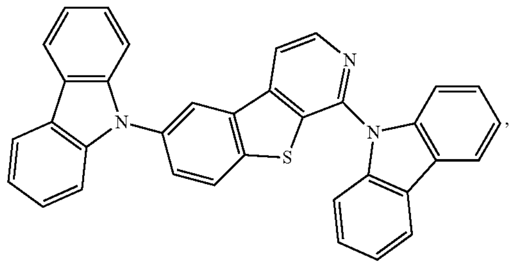

Compound 6

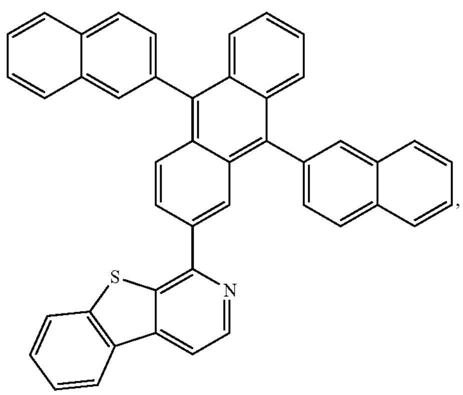

, and

Compound 7

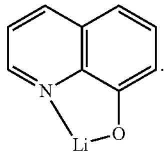

TABLE 1

| Device | Emitter | λmax (nm) | CIE | Voltage (V) | EQE (%) |
|---|---|---|---|---|---|
| Example 1 | Compound XIII | 468 | (0.152, 0.286) | 5.4 | 6.0 |

OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with UV ozone for 5 minutes. The devices in Table 2 were fabricated in high vacuum ($<10^{-6}$ Torr) by thermal evaporation. The anode electrode was 750 Å of indium tin oxide (ITO). The device example had organic layers consisting of, sequentially, from the ITO surface, 100 Å thick Compound 1 (HIL), 250 Å layer of Compound 2 (HTL), 50 Å of Compound 3 (EBL), 300 Å of Compound 4 doped with 3% of the fluorescent emitter (EML), 50 Å of Compound 5 (HBL), 300 Å of Compound 6 doped with 35% of Compound 7 (ETL), 10 Å of Compound 7 (EIL) followed by 1,000 Å of A1 (Cath). All devices were encapsulated with a glass lid sealed with an epoxy resin in a nitrogen glove box (<1 ppm of $H_2O$ and $O_2$) immediately after fabrication with a moisture getter incorporated inside the package. The voltage and EQE are reported at 10 mA/cm$^2$.

The invention claimed is:

1. A compound of Formula I

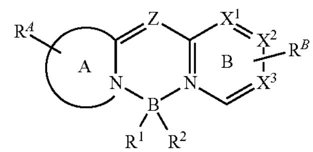

wherein:

Z is CR' or N;

$X^1$-$X^3$ are each independently C or N, with at least one of $X^1$-$X^3$ being N and bonded to boron;

$R^A$ and $R^B$ each represents zero, mono, or up to the maximum allowed number of substitutions to its associate ring;

R', $R^A$, and $R^B$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, borate, and combinations thereof, $R^1$ and $R^2$ are each independently a hydrogen or a substituent selected from the group consisting of deuterium, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, borate, and combinations thereof;

ring A is a 5-membered or 6-membered ring; and two substituents within Formula I can be joined or fused together to form a ring, with a proviso that two adjacent $R^B$ substituents are joined to form a fused heterocyclic ring.

2. The compound of claim 1, wherein R', $R^1$, $R^2$, $R^A$, and $R^B$ are each independently a hydrogen or a substituent selected from the group consisting of deuterium, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, borate, and combinations thereof.

3. The compound of claim 1, wherein ring A is a 6-membered ring.

4. The compound of claim 1, wherein two $R^A$ substituents are joined to form a fused ring to ring A.

5. The compound of claim 1, wherein $X^1$ is N which is bonded with boron to form a boryl or borate group.

6. The compound of claim 5, wherein the boryl or borate group is joined with one $R^B$ substituent to form a ring fused to ring B.

7. The compound of claim 1, wherein $X^3$ is N which is bonded with boron to form a boryl or borate group.

8. The compound of claim 7, wherein the boryl or borate group is joined with one $R^B$ substituent to form a ring fused to ring B.

9. The compound of claim 1, wherein $X^2$ is N which is bonded with boron to form a boryl or borate group.

10. The compound of claim 9, wherein the boryl or borate group is joined with one $R^B$ substituent to form a ring fused to ring B.

11. The compound of claim 1, wherein $R^1$ is an aryl group.

12. The compound of claim 1, wherein the compound comprises a structure selected from the group consisting of:

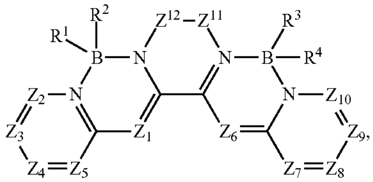

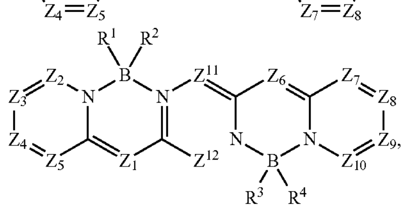

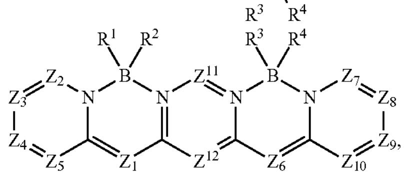

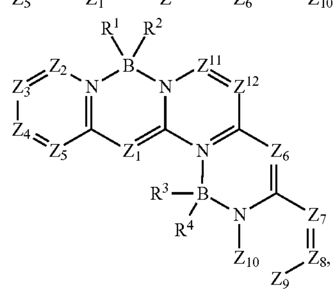

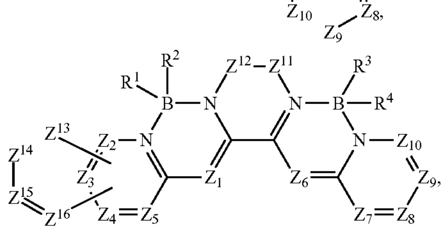

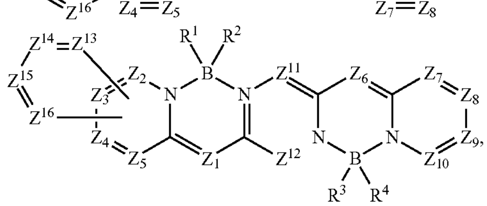

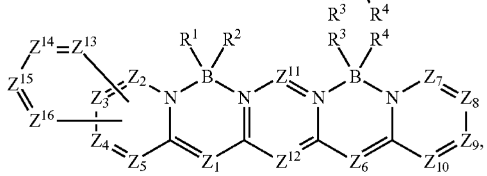

-continued

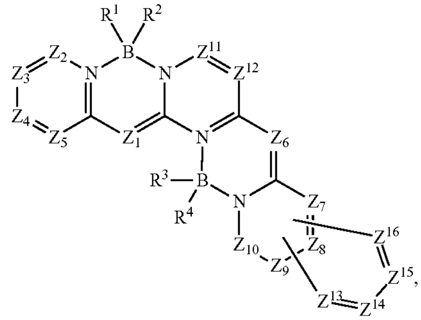

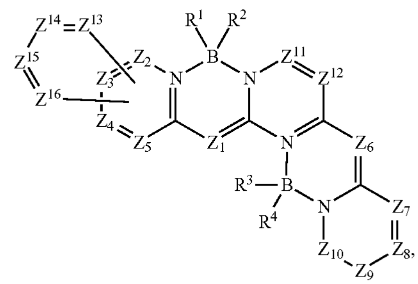

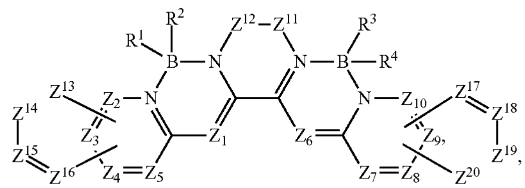

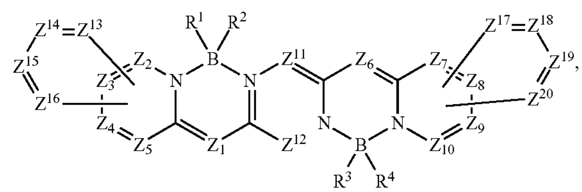

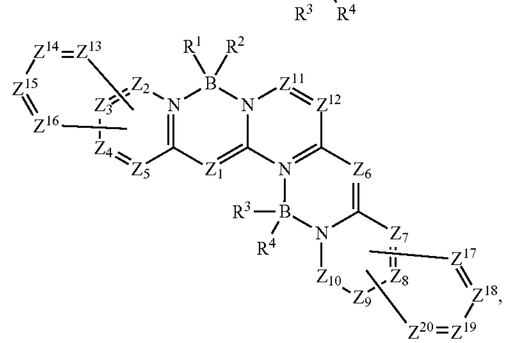

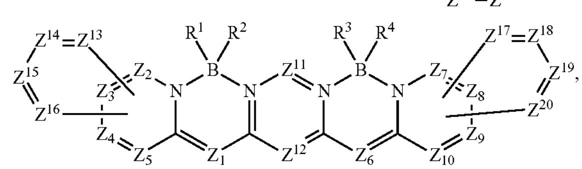

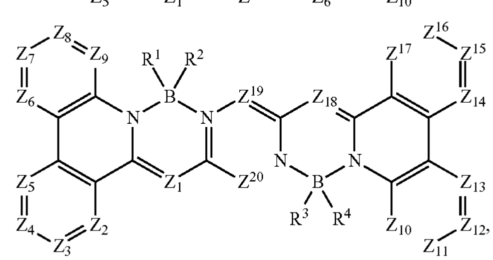

-continued
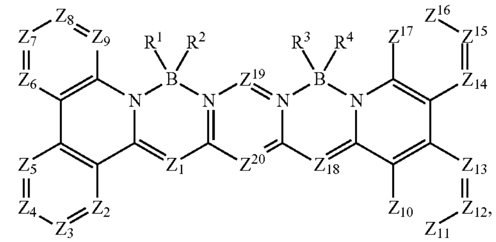
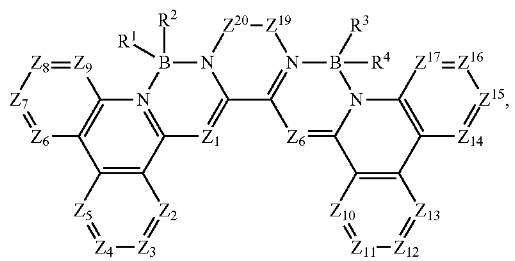
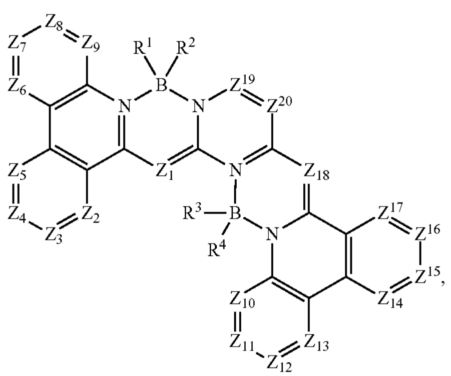
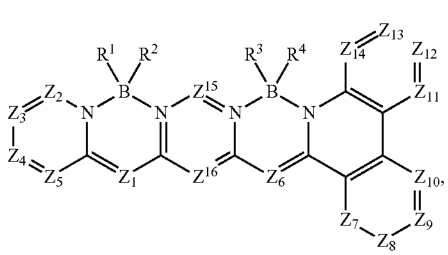
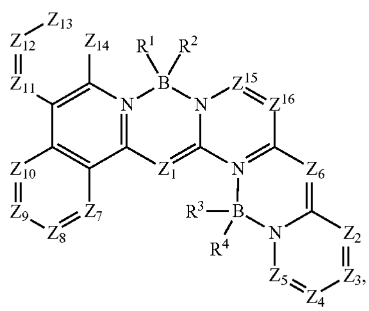
-continued
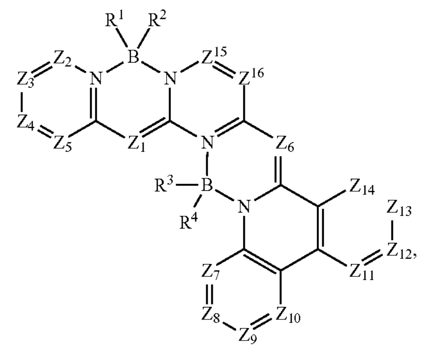
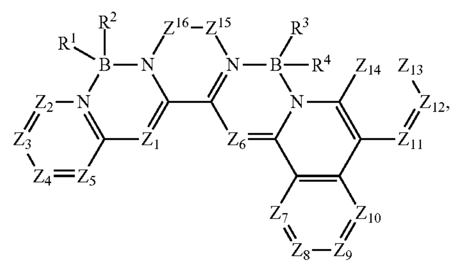
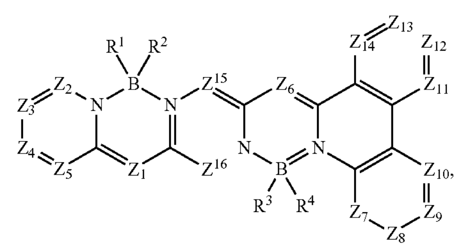
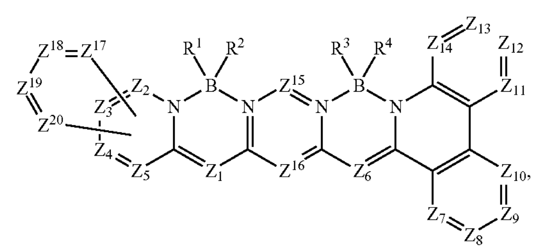
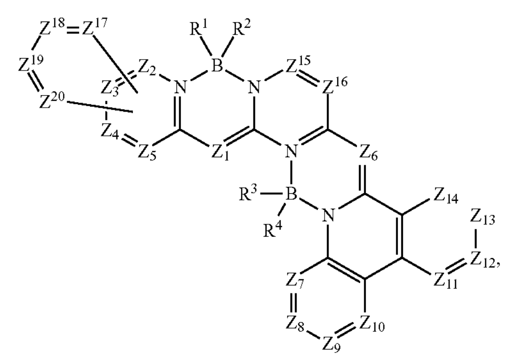

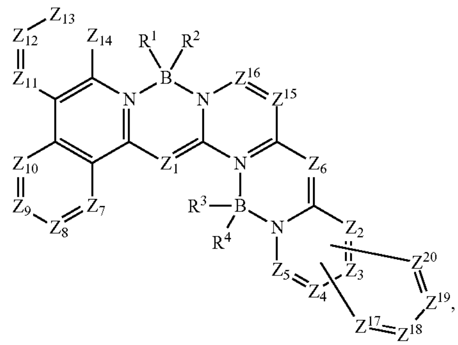
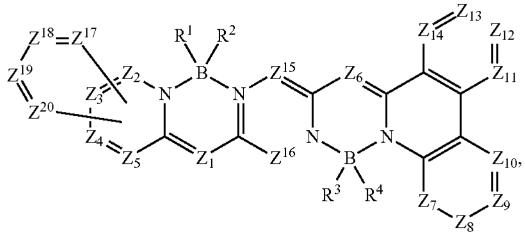
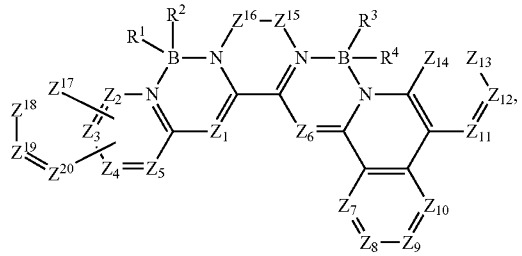
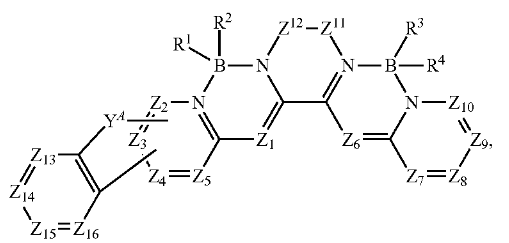
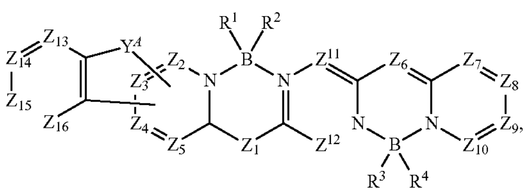
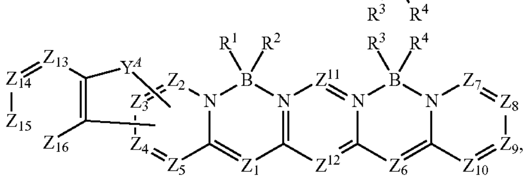
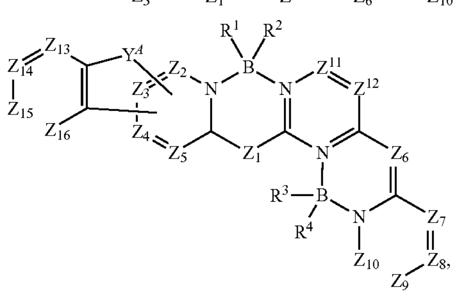
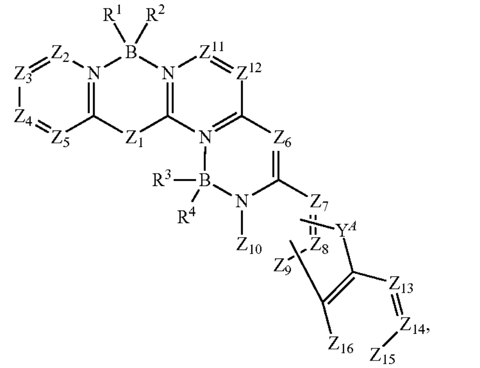
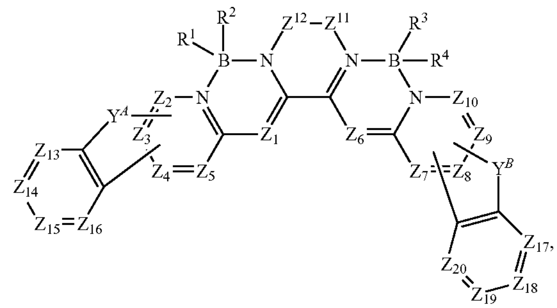
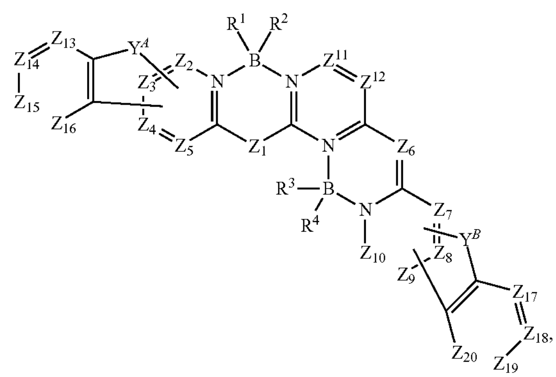
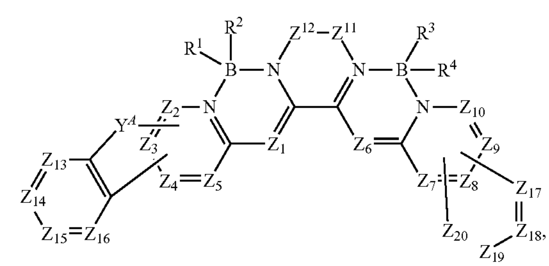
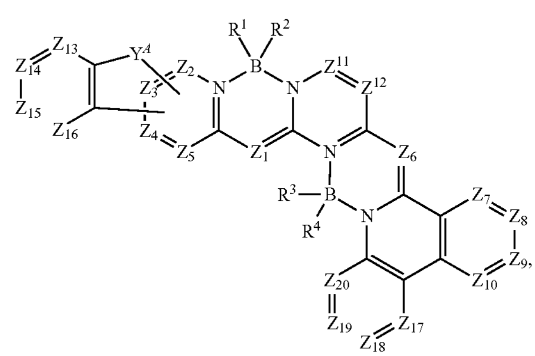

-continued
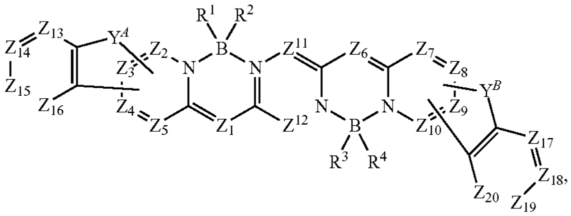
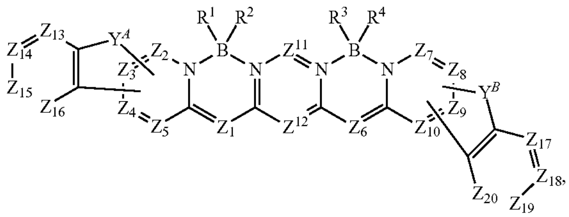
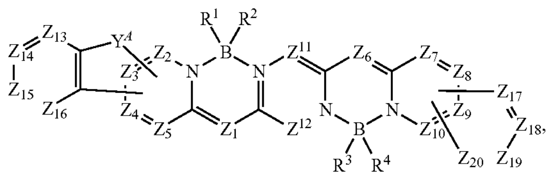
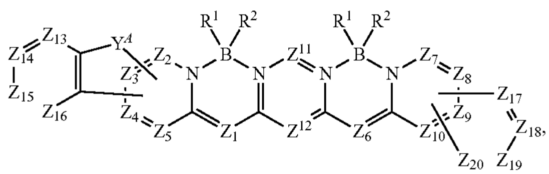
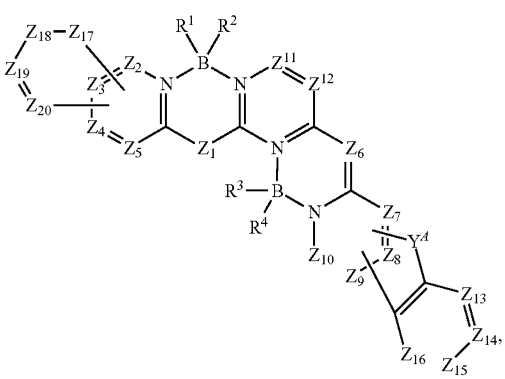
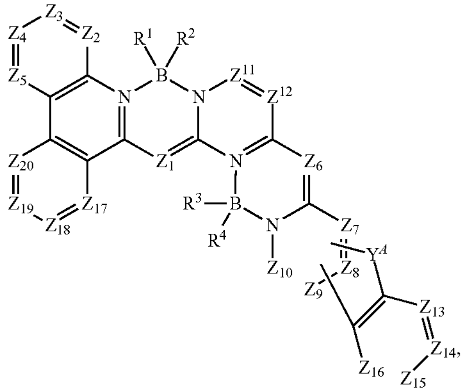
-continued
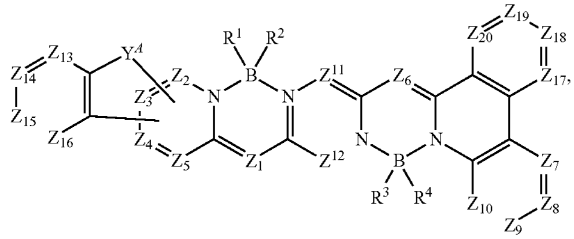
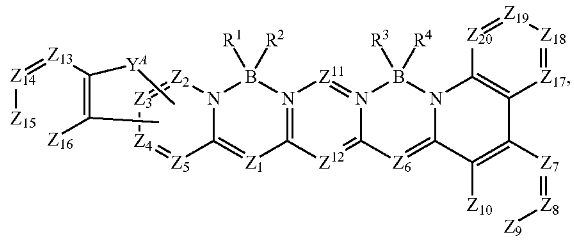
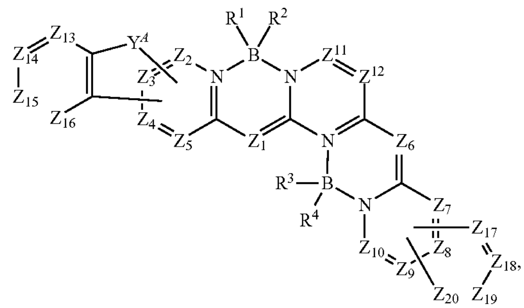
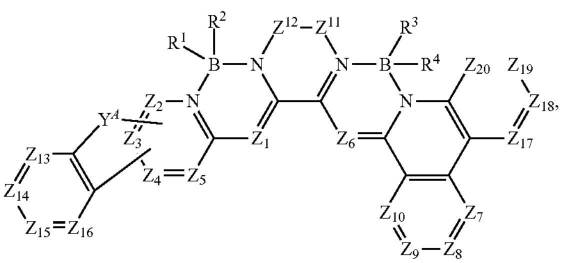
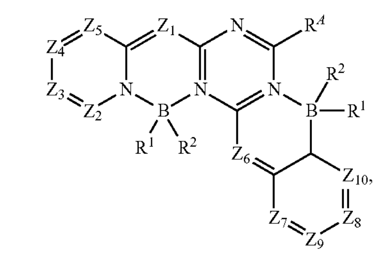
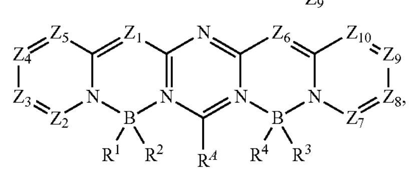
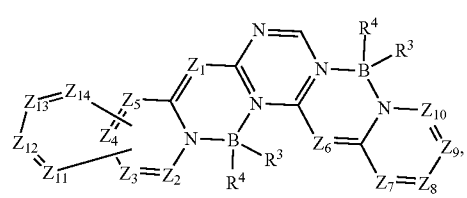

-continued
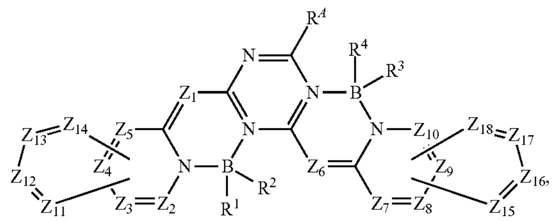
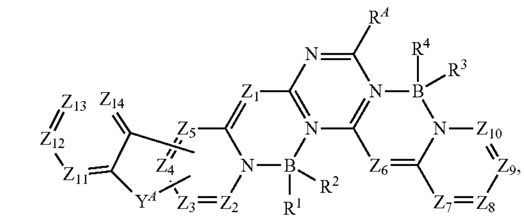
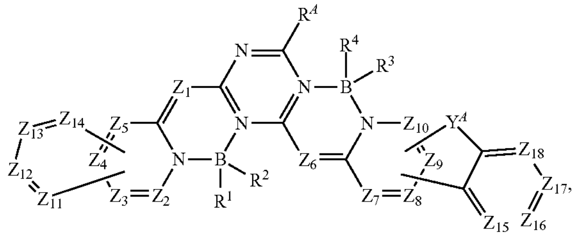
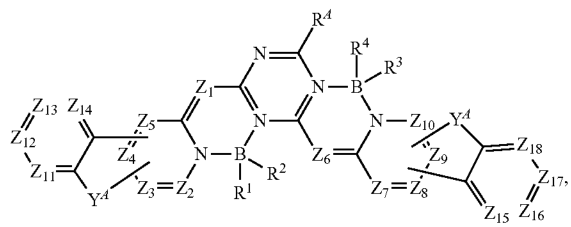
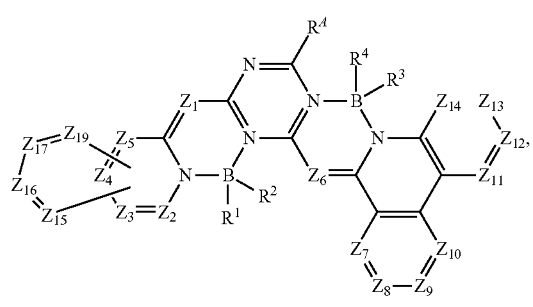
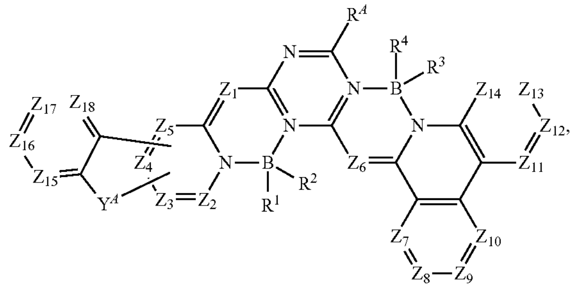
-continued
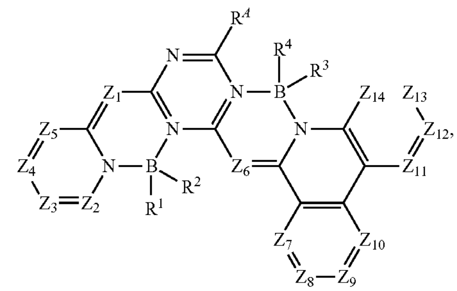
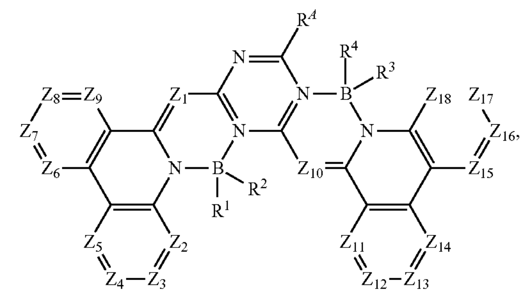
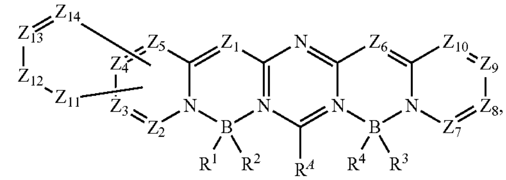
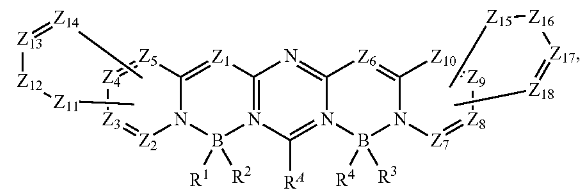
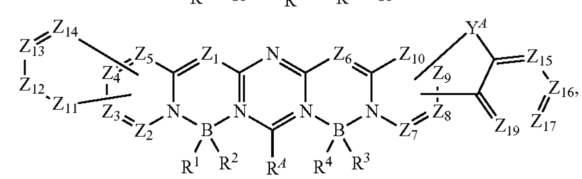
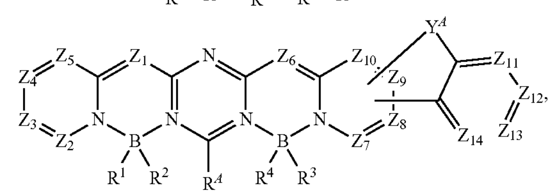
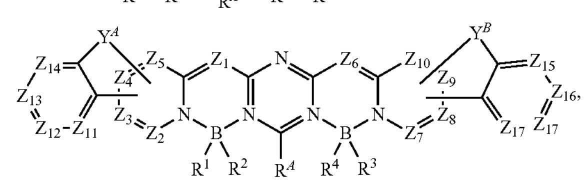
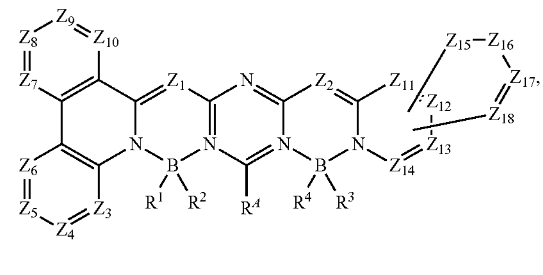

-continued
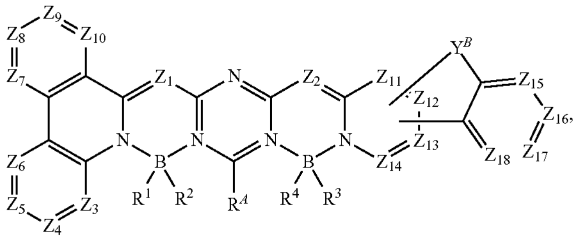
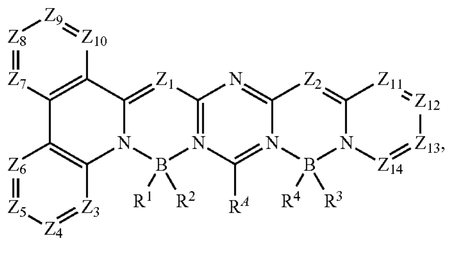
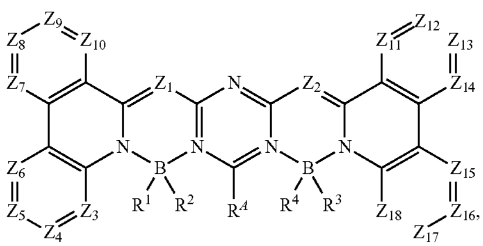
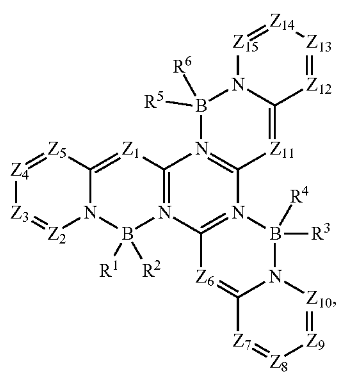
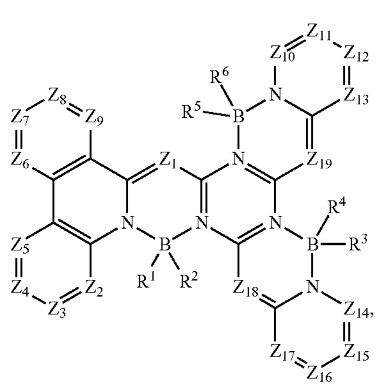
-continued
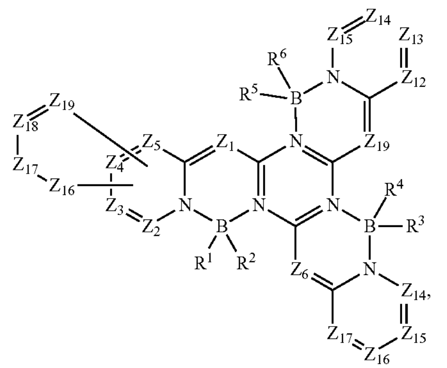
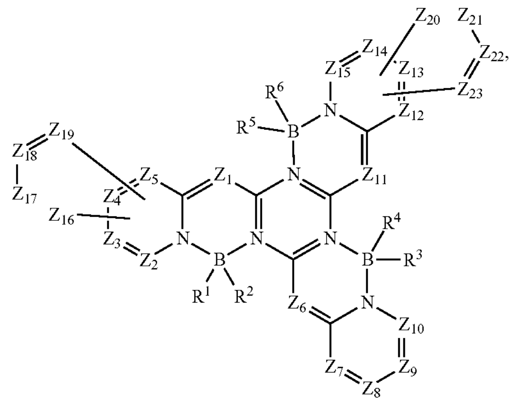
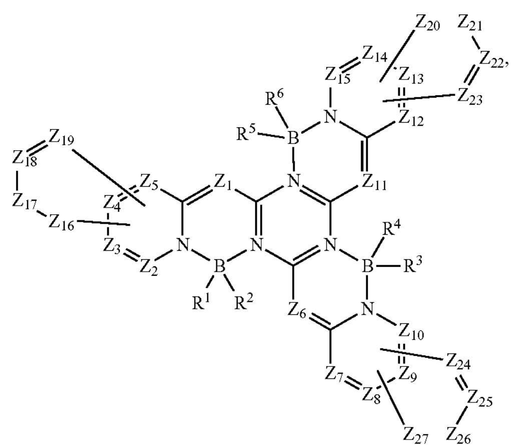
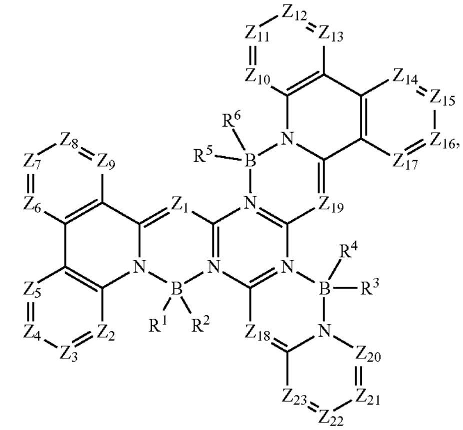

-continued
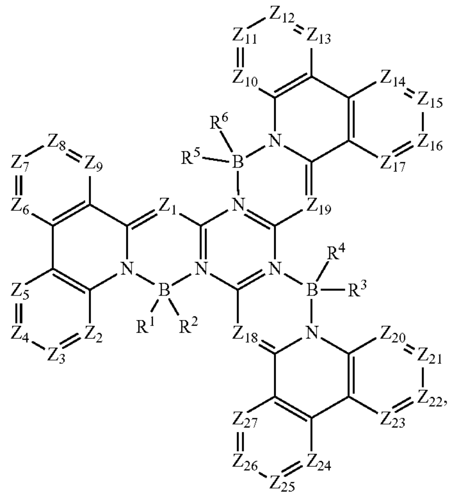
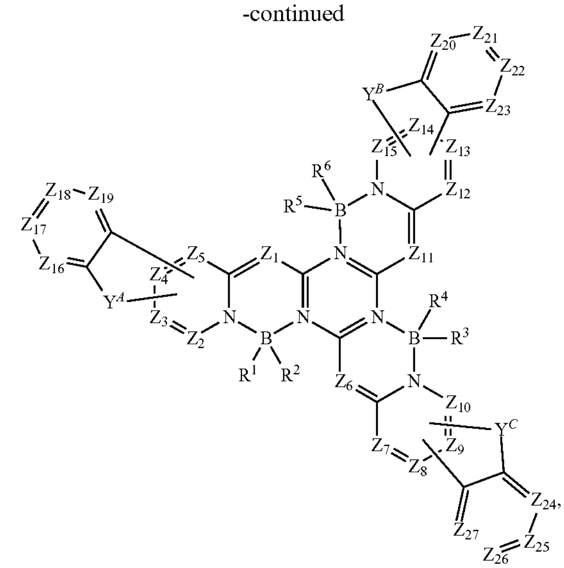
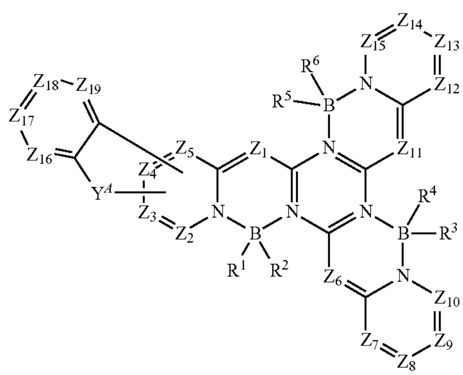
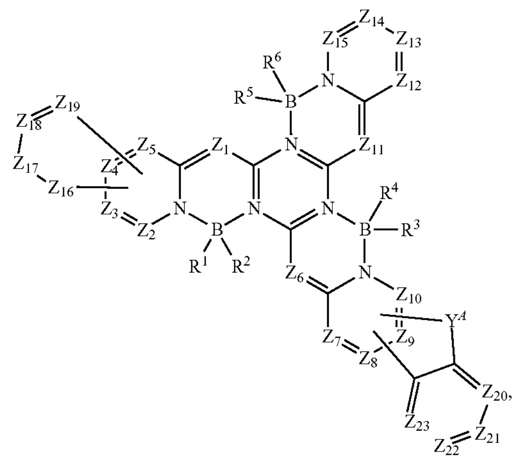
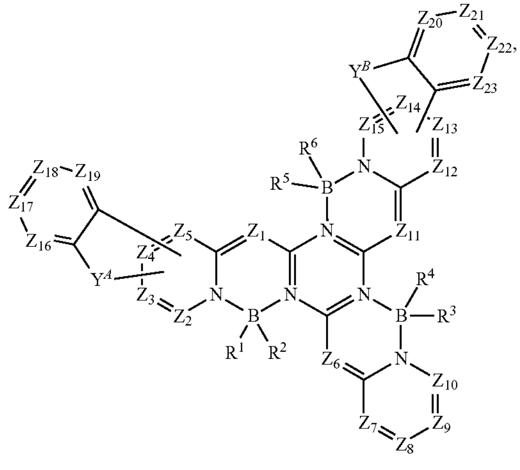
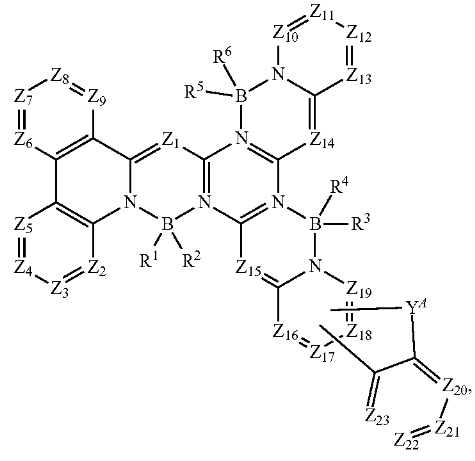

-continued
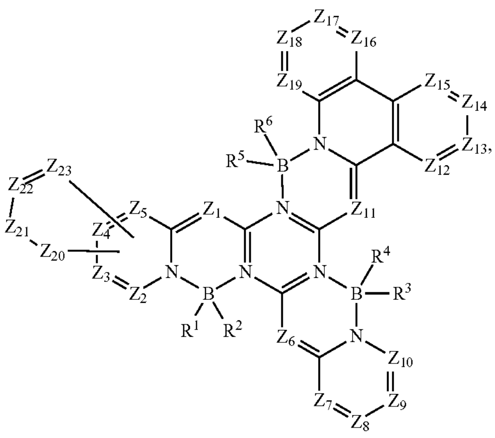
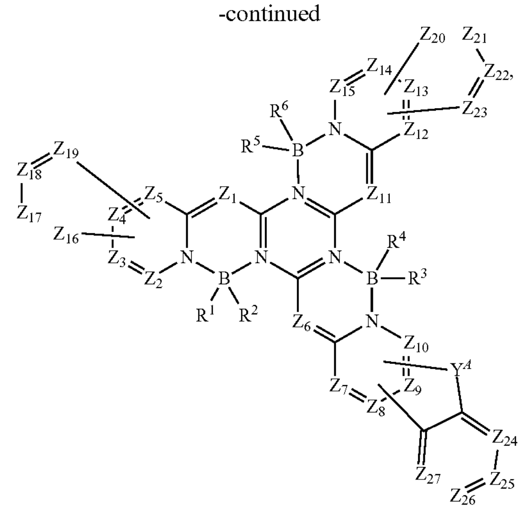
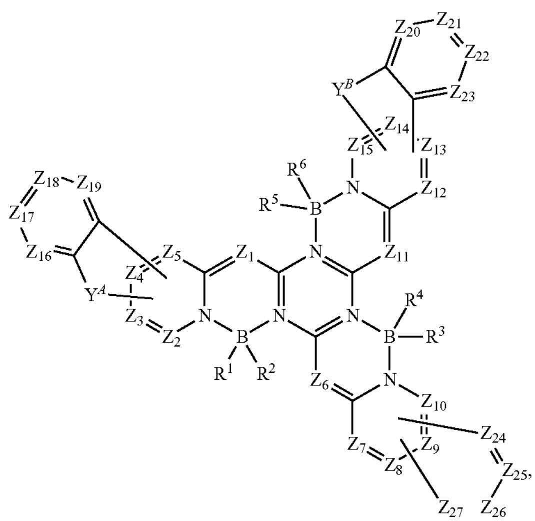
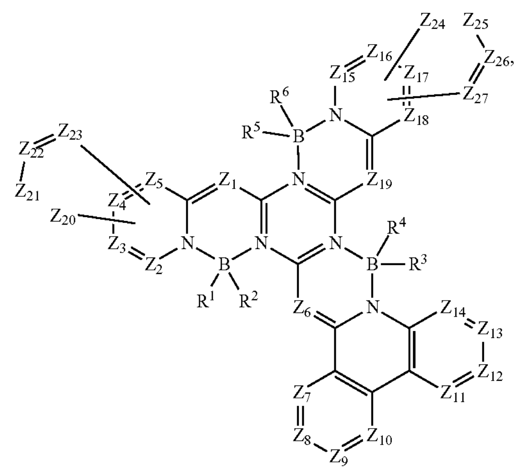
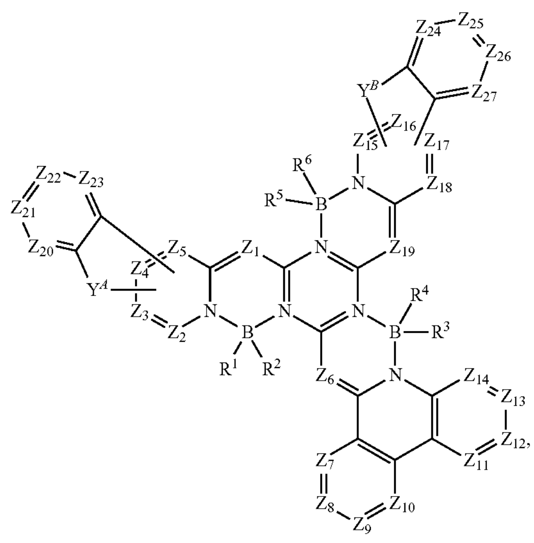
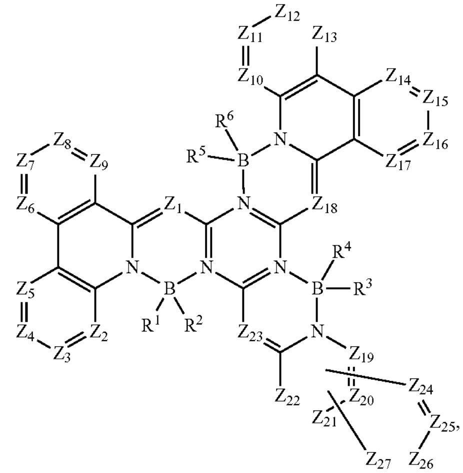
and -continued

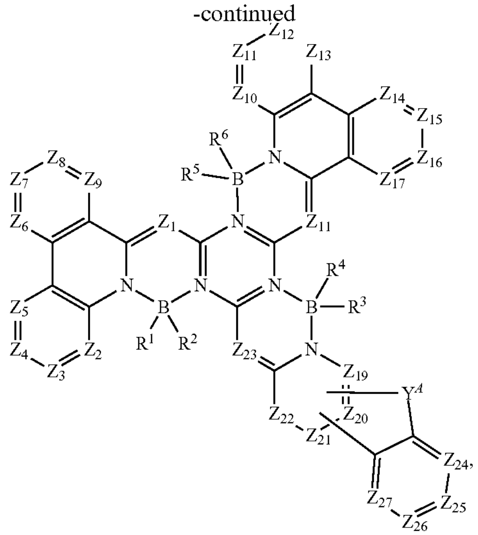

wherein $Z_1$ to $Z_{27}$ are each independently N or CR"; R" and $R^3$ to $R^6$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof and $Y^A$, $Y^B$ and $Y^C$ are each independently $BR_e$, $NR_e$, $PR_e$, O, S, Se, C═O, S═O, $SO_2$, $CR_eR_f$, $SiR_eR_f$, and $GeR_eR_f$; $R_e$ and $R_f$ can be fused or joined to form a ring; and $R_e$ and $R_f$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

13. The compound of claim 1, wherein the compound is selected from the group consisting of:

| Compound name | Structure | *i*, *j*, *k*, *l*, *m*, *n* |
|---|---|---|
| Compound I-[(A*i*)(A*j*)(Y*k*)(R*l*)], wherein Compound I-[(A*l*)(A*l*)(Y*l*)(R*l*)] to Compound I-[(A840)(A840)(Y20)(R60)] having the structure | 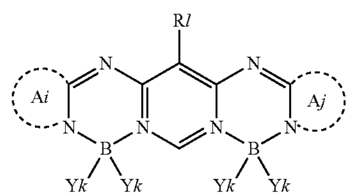 | wherein *i* and *j* are independently an integer from 1 to 840, *k* is an integer from 1 to 20, and *l* is an integer from 1 to 60, |
| Compound II-[(A*i*)(A*j*)(Y*k*)(R*l*)], wherein Compound II-[(A*l*)(A*l*)(Y*l*)(R*l*)] to Compound II-[(A840)(A840)(Y20)(R60)] having the structure | 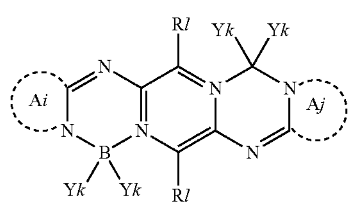 | wherein *i* and *j* are independently an integer from 1 to 840, *k* is an integer from 1 to 20, and *l* is an integer from 1 to 60, |
| Compound III-[(A*i*)(A*j*)(Y*k*)(R*l*)], wherein Compound III-[(A*l*)(A*l*)(Y*l*)(R*l*)] to Compound III-[(A840)(A840)(Y20)(R60)] having the structure | 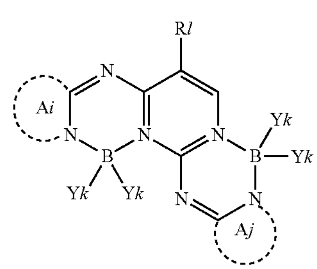 | wherein *i* and *j* are independently an integer from 1 to 840, *k* is an integer from 1 to 20, and *l* is an integer from 1 to 60, |
| Compound IV-[(A*i*)(A*j*)(Y*k*)(R*l*)], wherein Compound IV-[(A*l*)(A*l*)(Y*l*)(R*l*)] to Compound IV-[(A840)(A840)(Y20)(R60)] having the structure | 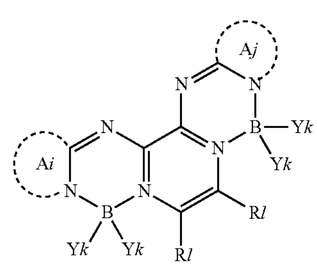 | wherein *i* and *j* are independently an integer from 1 to 840, *k* is an integer from 1 to 20, and *l* is an integer from 1 to 60, |

-continued

| Compound name | Structure | *i*, *j*, *k*, *l*, *m*, *n* |
|---|---|---|
| Compound V-[(A*i*)(A*j*)(Y*k*)(R*l*)], wherein Compound V-[(A*l*)(A*l*)(Y*l*)(R*l*)] to Compound V-[(A840)(A840)(Y20)(R60)] having the structure | 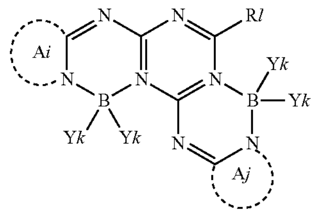 | wherein *i* and *j* are independently an integer from 1 to 840, *k* is an integer from 1 to 20, and *l* is an integer from 1 to 60, |
| Compound VI-[(A*i*)(A*j*)(R*l*)(R*n*)], wherein Compound VI-[(A*l*)(A*l*)(R*l*)(R*l*)] to Compound VI-[(A840)(A840)(R60)(R60)] having the structure | 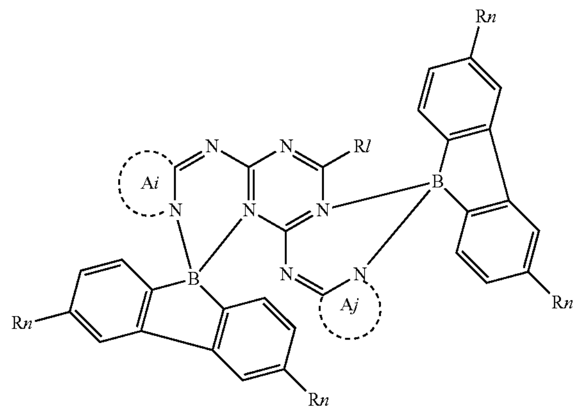 | wherein *i* and *j* are independently an integer from 1 to 840, and *l* and *n* are independently an integer from 1 to 60, |
| Compound VII-[(A*i*)(A*j*)(R*l*)(R*n*)], wherein Compound VII-[(A*l*)(A*l*)(R*l*)(R*l*)] to Compound VII-[(A840)(A840)(R60)(R60)] having the structure | 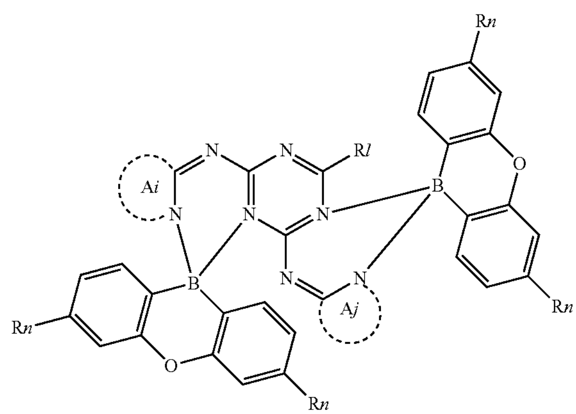 | wherein *i* and *j* are independently an integer from 1 to 840, and *l* and *n* are independently an integer from 1 to 60, |
| Compound VIII-[(A*i*)(A*j*)(R*l*)(R*n*)(R*o*)], wherein Compound VIII-[(A*l*)(A*l*)(R*l*)(R*l*)(R*l*)] to Compound VIII-[(A840)(A840)(R60)(R60)(R60)] having the structure | 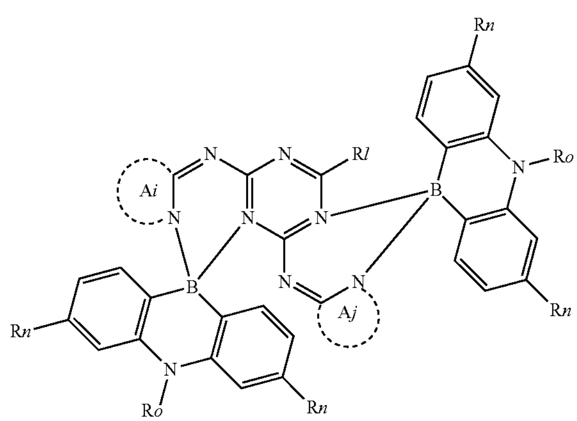 | wherein *i* and *j* are independently an integer from 1 to 840, and *l*, *n*, and *o* are independently an integer from 1 to 60, |
| Compound IX-[(A*i*)(A*j*)(Y*k*)(R*l*)], wherein Compound V-[(A*l*)(A*l*)(Y*l*)(R*l*)] to Compound V-[(A840)(A840)(Y20)(R60)] having the structure | 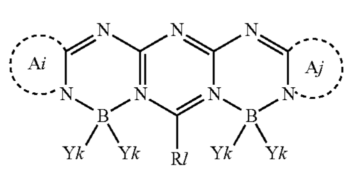 | wherein *i* and *j* are independently an integer from 1 to 840, *k* is an integer from 1 to 20, and *l* is an integer from 1 to 60, |

-continued

| Compound name | Structure | i, j, k, l, m, n |
|---|---|---|
| Compound X-[(A*i*)(A*j*)(R*l*)(R*n*)], wherein Compound X-[(A*l*)(A*l*)(R*l*)(R*l*)] to Compound X-[(A840)(A840)(R60)(R60)] having the structure | 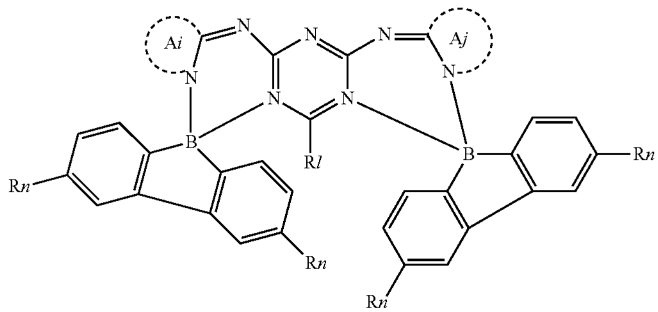 | wherein *i* and *j* are independently an integer from 1 to 840 and *l* and *n* are independently an integer from 1 to 60, |
| Compound XI-[(A*i*)(A*j*)(R*l*)(R*n*)], wherein Compound XI-[(A*l*)(A*l*)(R*l*)(R*l*)] to Compound XI-[(A840)(A840)(R60)(R60)] having the structure | 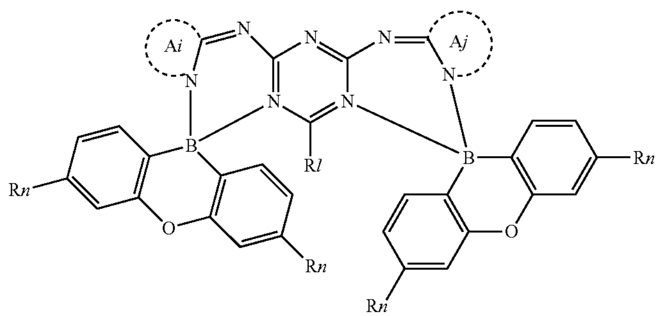 | wherein *i* and *j* are independently an integer from 1 to 840 and *l* and *n* are independently an integer from 1 to 60, |
| Compound XII-[(A*i*)(A*j*)(R*l*)(R*n*)(R*o*)], wherein Compound XII-[(A*l*)(A*l*)(R*l*)(R*l*)(R*l*)] to Compound XII-[(A840)(A840)(R60)(R60)(R60)] having the structure | 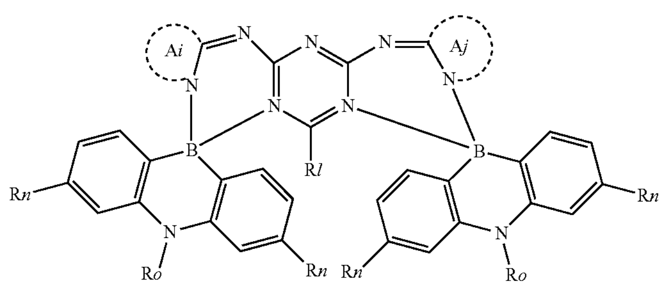 | wherein *i* and *j* are independently an integer from 1 to 840, and *l*, *n*, and *o* are independently an integer from 1 to 60, |
| Compound XIII-[(A*i*)(A*j*)(A*h*)(Y*k*)], wherein Compound XIII-[(A*l*)(A*l*)(A*l*)(Y*l*)] to Compound XIII-[(A840)(A840)(A840)(Y20)] having the structure | 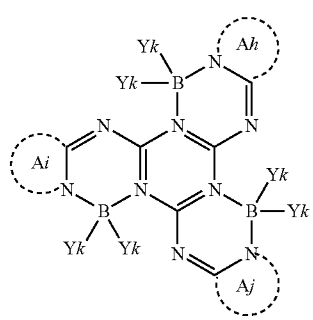 | wherein *i*, *j*, and *h* are independently an integer from 1 to 840, and *k* is an integer from 1 to 20, |

-continued

| Compound name | Structure | i, j, k, l, m, n |
|---|---|---|
| Compound XIV-[(Ai)(Aj)(Ah)(Rl)], wherein Compound XIV-[(A1)(A1)(A1)(R1)] to Compound XIV-[(A840)(A840)(A840)(R60)] having the structure | 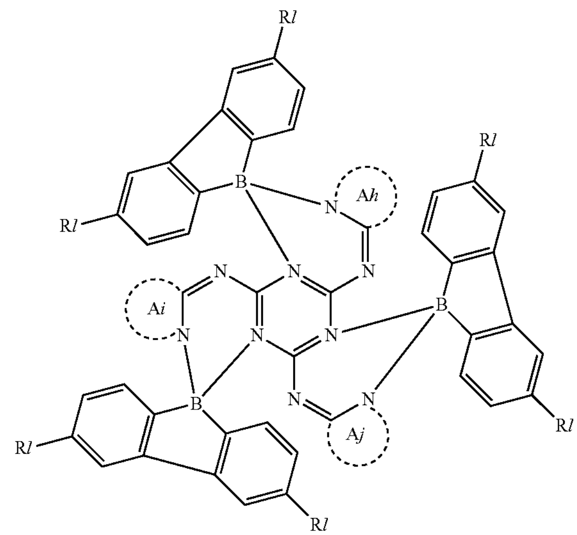 | wherein i, j, and h are independently an integer from 1 to 840, and l is an integer from 1 to 60, |
| Compound XV-[(Ai)(Aj)(Ah)(Rl)], wherein Compound XV-[(A1)(A1)(A1)(R1)] to Compound XV-[(A840)(A840)(A840)(R60)] having the structure | 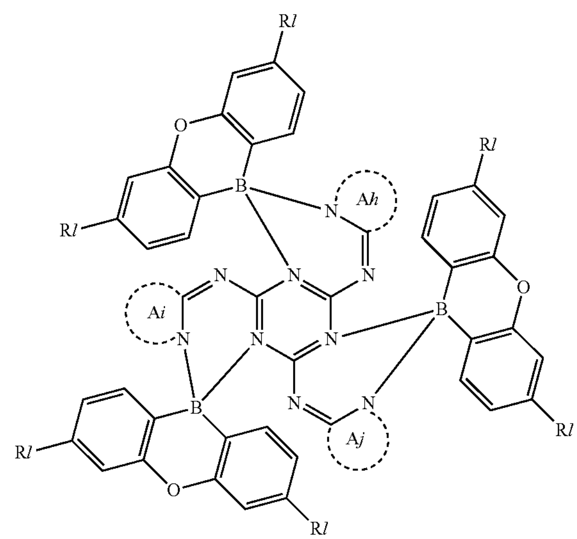 | wherein i, j, and h independently are an integer from 1 to 840, and l is an integer from 1 to 60, |
| Compound XVI-[(Ai)(Aj)(Ah)(Rl)(Rn)], wherein Compound XVI-[(A1)(A1)(A1)(R1)(R1)] to Compound XVI-[(A840)(A840)(A840)(R60)(R60)] having the structure | 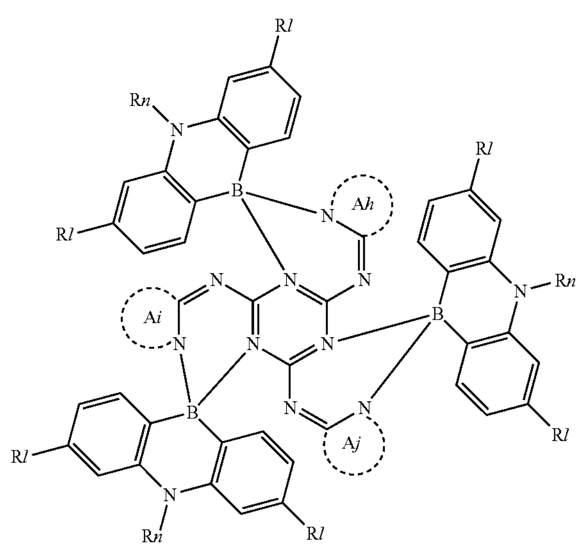 | wherein i, j, and h are independently an integer from 1 to 840, and l and n are independently an integer from 1 to 60, |

-continued

| Compound name | Structure | *i*, *j*, *k*, *l*, *m*, *n* |
|---|---|---|
| Compound XVII-[(A*i*)(A*j*)(R*l*)(R*n*)], wherein Compound XVII-[(A*l*)(A*l*)(R*l*)(R*l*)] to Compound XVII-[(A840)(A840)(R60)(R60)] having the structure | 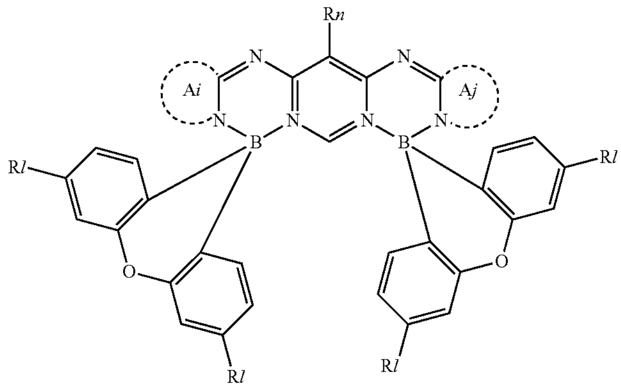 | wherein *i* and *j* are independently an integer from 1 to 840, and *l* and *n* are independently an integer from 1 to 60, |
| Compound XVIII-[(A*i*)(A*j*)(R*l*)(R*n*)], wherein Compound XVIII-[(A*l*)(A*l*)(R*l*)(R*l*)] to Compound XVIII-[(A840)(A840)(R60)(R60)] having the structure | 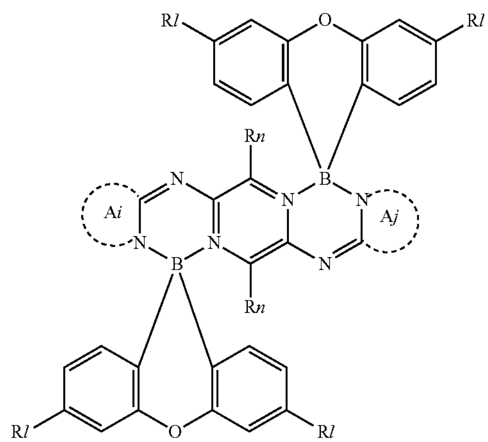 | wherein *i* and *j* are independently an integer from 1 to 840, and *l* and *n* are independently an integer from 1 to 60, |
| Compound XIX-[(A*i*)(A*j*)(R*l*)(R*n*)], wherein Compound XIX-[(A*l*)(A*l*)(R*l*)(R*l*)] to Compound XIX-[(A840)(A840)(R60)(R60)] having the structure | 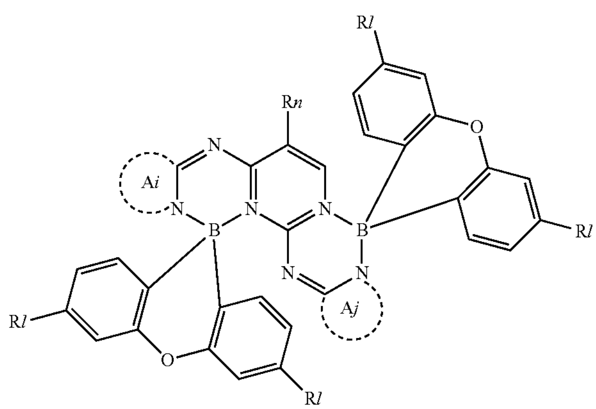 | wherein *i* and *j* are independently an integer from 1 to 840, and *l* and *n* are independently an integer from 1 to 60, |
| Compound XX-[(A*i*)(A*j*)(R*l*)(R*n*)], wherein Compound XX-[(A*l*)(A*l*)(R*l*)(R*l*)] to Compound XX-[(A840)(A840)(R60)(R60)] having the structure | 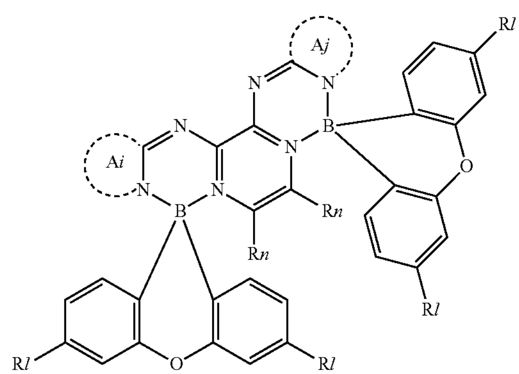 | wherein *i* and *j* are independently an integer from 1 to 840, and *l* and *n* are independently an integer from 1 to 60, |

-continued

| Compound name | Structure | *i*, *j*, *k*, *l*, *m*, *n* |
|---|---|---|
| Compound XXI-[(A*i*)(A*j*)(R*k*)(R*l*)], wherein Compound XXI-[(A*l*)(A*l*)(R*l*)(R*l*)] to Compound XXI-[(A840)(A840)(R60)(R60)] having the structure | 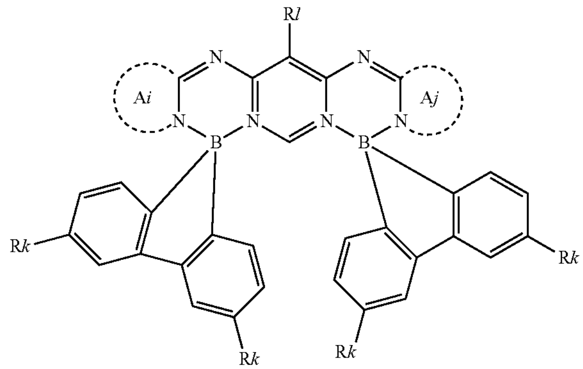 | wherein *i* and *j* are independently an integer from 1 to 840, and *k* and *l* are independently an integer from 1 to 60, |
| Compound XXII-[(A*i*)(A*j*)(R*l*)(R*n*)], wherein Compound XXII-[(A*l*)(A*l*)(R*l*)(R*l*)] to Compound XXII-[(A840)(A840)(R60)(R60)] having the structure | 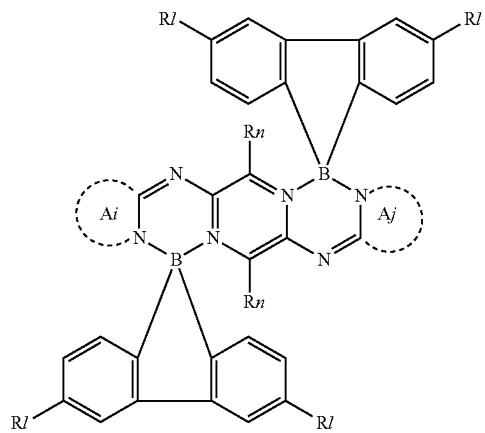 | wherein *i* and *j* are independently an integer from 1 to 840, and *l* and *n* are independently an integer from 1 to 60, |
| Compound XXIII-[(A*i*)(A*j*)(R*l*)(R*n*)], wherein Compound XXIII-[(A*l*)(A*l*)(R*l*)(R*l*)] to Compound XXIII-[(A840)(A840)(R60)(R60)] having the structure | 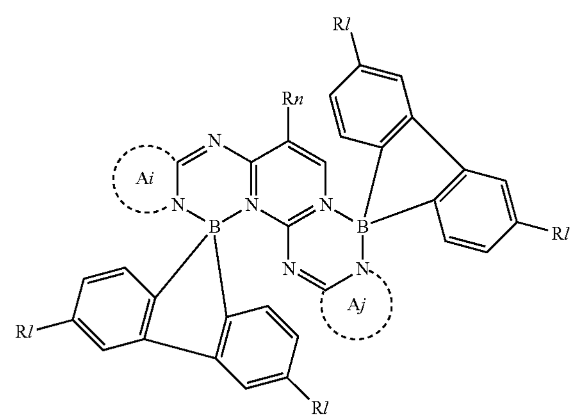 | wherein *i* and *j* are independently an integer from 1 to 840, and *l* and *n* are independently an integer from 1 to 60, |
| Compound XXIV-[(A*i*)(A*j*)(R*l*)(R*n*)], wherein Compound XXIV-[(A*l*)(A*l*)(R*l*)(R*l*)] to Compound XXIV-[(A840)(A840)(R60)(R60)] having the structure | 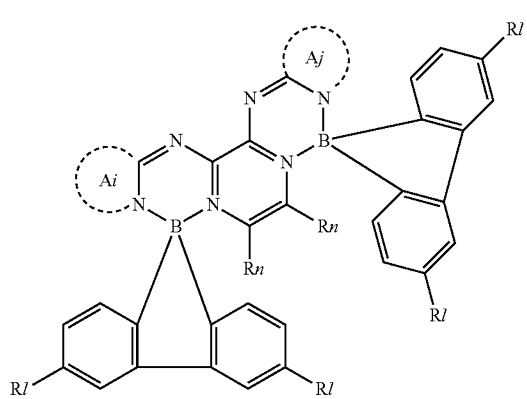 | wherein *i* and *j* are independently an integer from 1 to 840, and *l* and *n* are independently an integer from 1 to 60, |

-continued

| Compound name | Structure | *i*, *j*, *k*, *l*, *m*, *n* |
|---|---|---|
| Compound XXV-[(A*i*)(A*j*)(R*l*)(R*n*)(R*o*)], wherein Compound XXV-[(A*l*)(A*l*)(R*l*)(R*l*)(R*l*)] to Compound XXV-[(A840)(A840)(R60)(R60)(R60)] having the structure | 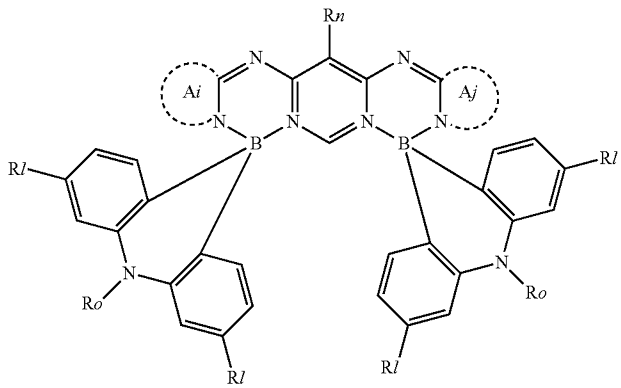 | wherein *i* and *j* are independently an integer from 1 to 840, and *l*, *n*, and *o* are independently an integer from 1 to 60, |
| Compound XXVI-[(A*i*)(A*j*)(R*l*)(R*n*)(R*o*)], wherein Compound XXVI-[(A*l*)(A*l*)(R*l*)(R*l*)(R*l*)] to Compound XXVI-[(A840)(A840)(R60)(R60)(R60)] having the structure | 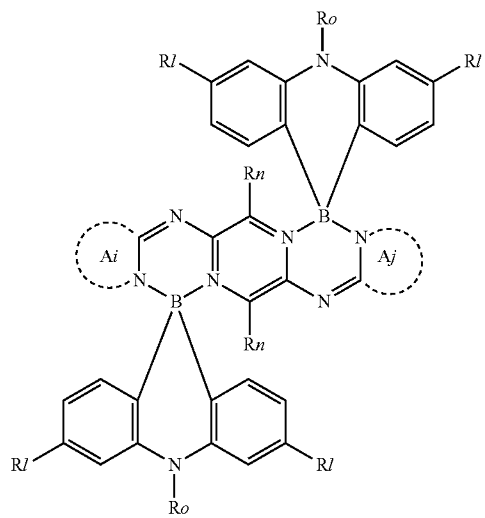 | wherein *i* and *j* are independently an integer from 1 to 840, and *l*, *n*, and *o* are independently an integer from 1 to 60, |
| Compound XXVI-[(A*i*)(A*j*)(R*l*)(R*n*)(R*o*)], wherein Compound XXVI-[(A*l*)(A*l*)(R*l*)(R*l*)(R*l*)] to Compound XXVI-[(A840)(A840)(R60)(R60)(R60)] having the structure | 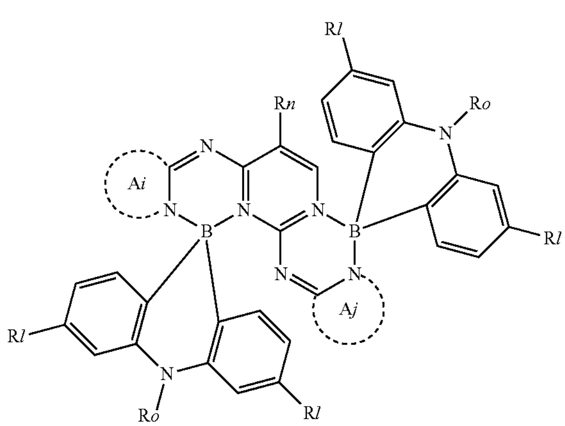 | wherein *i* and *j* are independently an integer from 1 to 840, and *l*, *n*, and *o* are independently an integer from 1 to 60, and |

-continued

| Compound name | Structure | *i*, *j*, *k*, *l*, *m*, *n* |
|---|---|---|
| Compound XXVII-[(A*i*)(A*j*)(R*l*)(R*n*)(R*o*)], wherein Compound XXVII-[(A*l*)(A*l*)(R*l*)(R*l*)(R*l*)] to Compound XXVII-[(A840)(A840)(R60)(R60)(R60)] having the structure | 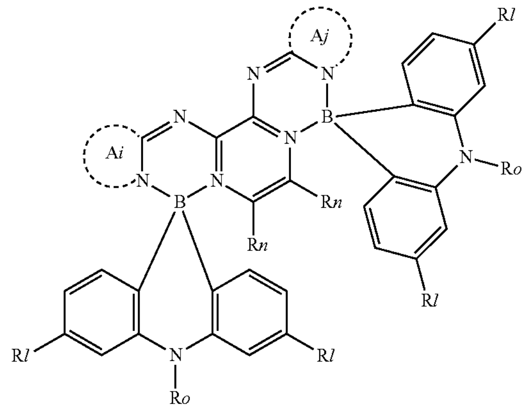 | wherein *i* and *j* are independently an integer from 1 to 840, and *l*, *n*, and *o* are independently an integer from 1 to 60, |

wherein A1 to A840 have the following structures:

| A*i*, A*j*, A*h*, | Structure of A*i*, A*j* and A*h* | R |
|---|---|---|
| wherein when *i*, *j*, and *h* are an integer from 1 to 60, A*i*, A*j*, and A*h* have the structure | 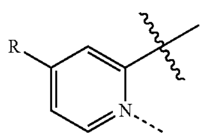 | wherein R = R*x*, wherein *x* is the corresponiding number *i*, *j*, or *h*, and |
| wherein when *i*, *j*, and *h* are an integer from 61 to 120, A*i*, A*j*, and A*h* have the structure | 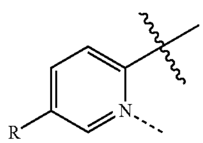 | wherein R = R*x*, wherein *x* is the corresponding number *i* − 60, *j* − 60, or *h* − 60, and |
| wherein when *i*, *j*, and *h* are an integer from 121 to 180, A*i*, A*j*, and A*h* have the structure | 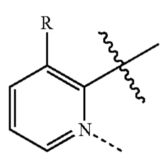 | wherein R = R*x*, wherein *x* is the corresponding number *i* − 120, *j* − 120, or *h* − 120, and |
| wherein when *i*, *j*, and *h* are an integer from 181 to 240, A*i*, A*j*, and A*h* have the structure | 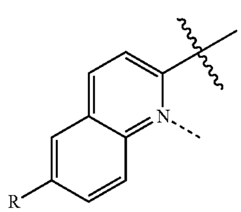 | wherein R = R*x*, wherein *x* is the corresponding number *i* − 180, *j* − 180, or *h* − 180, and |
| wherein when *i*, *j*, and *h* are an integer from 241 to 300, A*i*, A*j*, and A*h* have the structure | 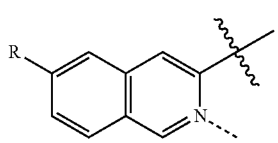 | wherein R = R*x*, wherein *x* is the corresponding number *i* − 240, *j* − 240, or *h* − 240, and |
| wherein when *i*, *j*, and *h* are an integer from 301 to 360, A*i*, A*j*, and A*h* have the structure | 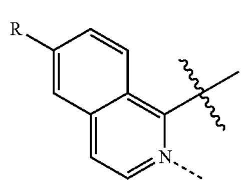 | wherein R = R*x*, wherein *x* is the corresponding number *i* − 300, *j* − 300, or *h* − 300, and |

-continued

| A*i*, A*j*, A*h*, | Structure of A*i*, A*j* and A*h* | R |
|---|---|---|
| wherein when *i*, *j*, and *h* are an integer from 361 to 420, A*i*, A*j*, and A*h* have the structure | 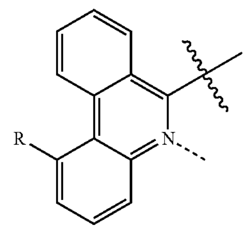 | wherein R = R*x*, wherein *x* is the corresponding number *i* − 360, *j* − 360, or *h* − 360, and |
| wherein when *i*, *j*, and *h* are an integer from 421 to 470, A*i*, A*j*, and A*h* have the structure | 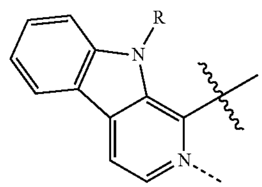 | wherein R = R*x*, wherein *x* is the corresponding number *i* − 420, *j* − 420, or *h* − 420, and |
| wherein when *i*, *j*, and *h* are an integer from 471 to 450, A*i*, A*j*, and A*h* have the structure | 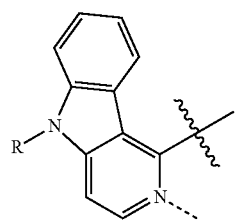 | wherein R = R*x*, wherein *x* is the corresponding number *i* − 470, *j* − 470, or *h* − 470, and |
| wherein when *i*, *j*, and *h* are an integer from 521 to 570, A*i*, A*j*, and A*h* have the structure | 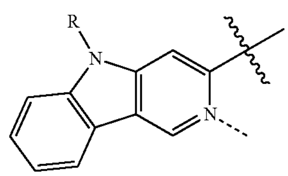 | wherein R = R*x*, wherein *x* is the corresponding number *i* − 520, *j* − 520, or *h* − 520, and |
| wherein when *i*, *j*, and *h* are an integer from 571 to 620, A*i*, A*j*, and A*h* have the structure | 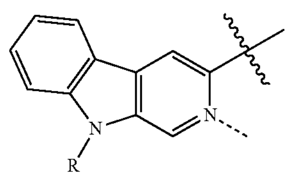 | wherein R = R*x*, wherein *x* is the corresponding number *i* − 570, *j* − 570, or *h* − 570, and |
| wherein when *i*, *j*, and *h* are an integer from 621 to 670, A*i*, A*j*, and A*h* have the structure | 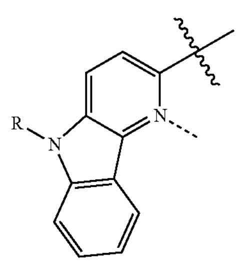 | wherein R = R*x*, wherein *x* is the corresponding number *i* − 620, *j* − 620, or *h* − 620, and |
| wherein when *i*, *j*, and *h* are an integer from 671 to 720, A*i*, A*j*, and A*h* have the structure | 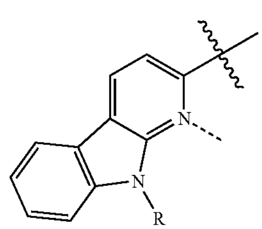 | wherein R = R*x*, wherein *x* is the corresponding number *i* − 670, *j* − 670, or *h* − 670, and |

-continued

| Ai, Aj, Ah, | Structure of Ai, Aj and Ah | R |
|---|---|---|
| wherein when *i*, *j*, and *h* are an integer from 721 to 780, A*i*, A*j*, and A*h* have the structure | 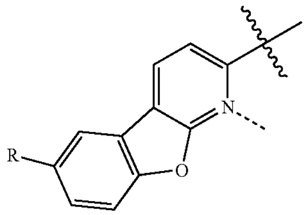 | wherein R = R*x*, wherein *x* is the corresponding number *i* − 720, *j* − 720, or *h* − 720, and |
| wherein when *i*, *j*, and *h* are an integer from 781 to 840, A*i*, A*j*, and A*h* have the structure | 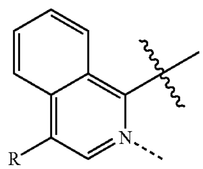 | wherein R = R*x*, wherein *x* is the corresponding number *i* − 780, *j* − 780, or *h* − 780, |

wherein R1 to R60 have the following structures:

R1

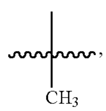

R2

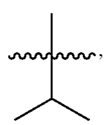

R3

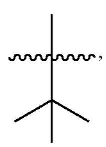

R4

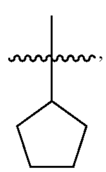

R5

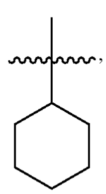

R6

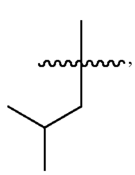

-continued

R7

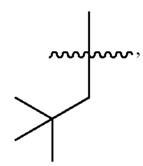

R8

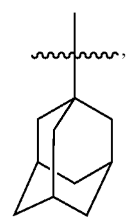

R9

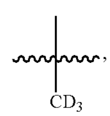

R10

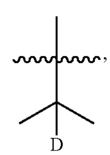

R11

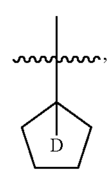

R12

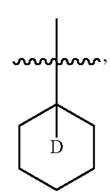

-continued
R13
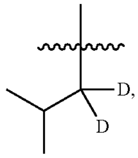
R14
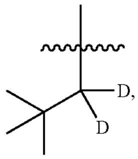
R15
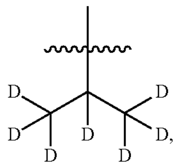
R16
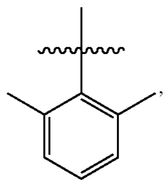
R17
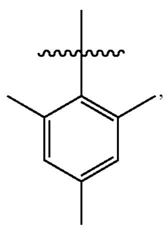
R18
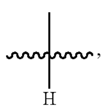
R19
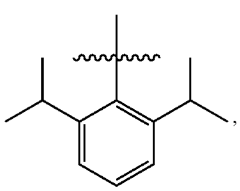
R20
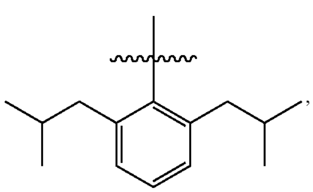
R21
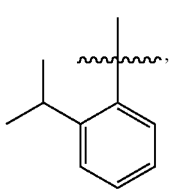
-continued
R22
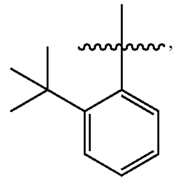
R23
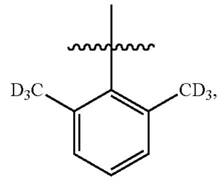
R24
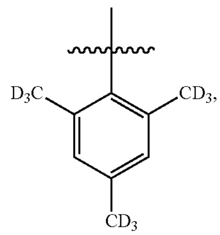
R25
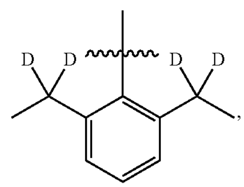
R26
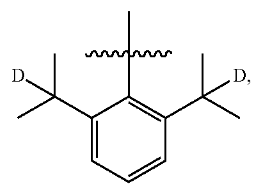
R27
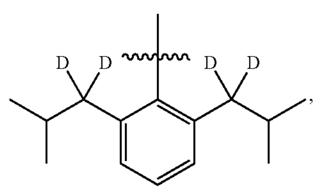
R28
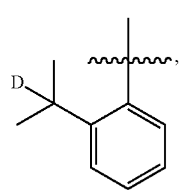
R29
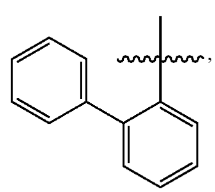

-continued
R30
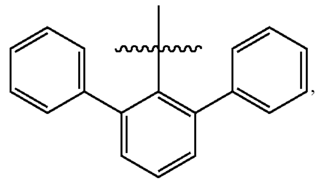
R31
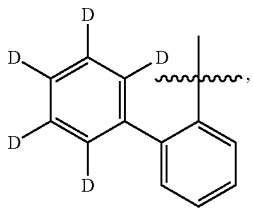
R32
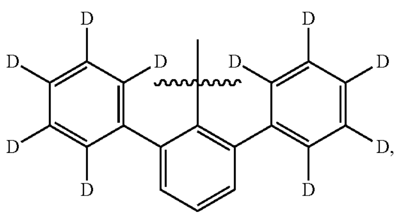
R33
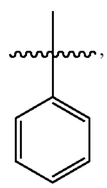
R34
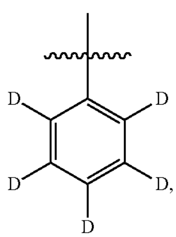
R35
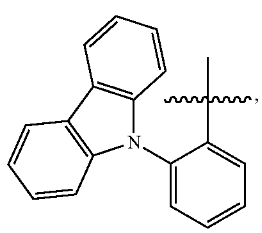
R36
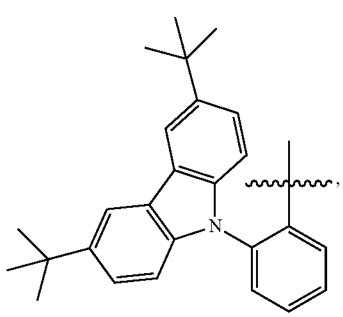
-continued
R37
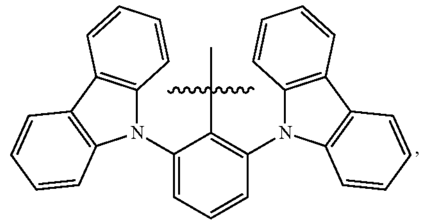
R38
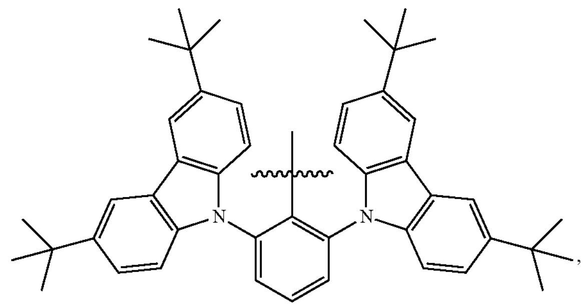
R39
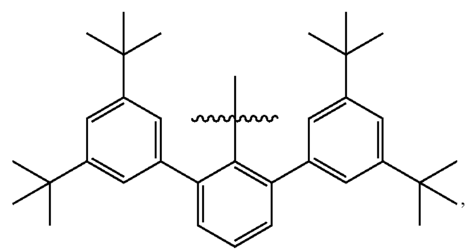
R40
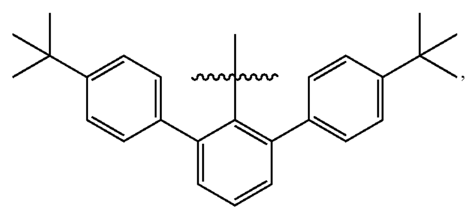
R41
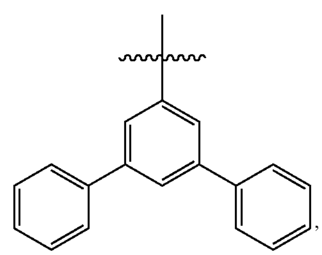
R42
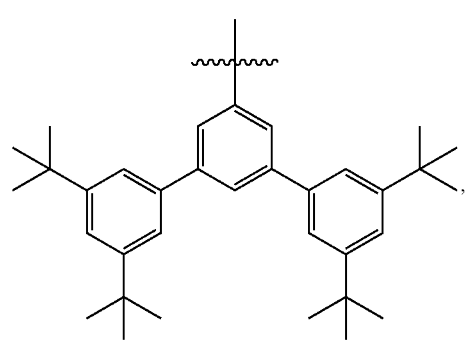

-continued
R43
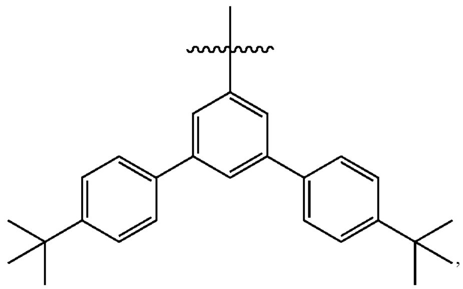
R44
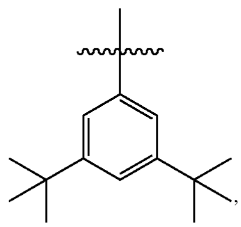
R45
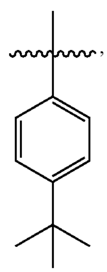
R46
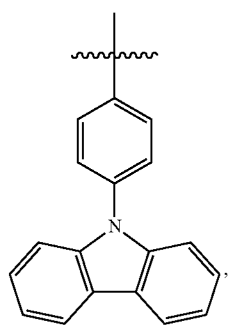
R47
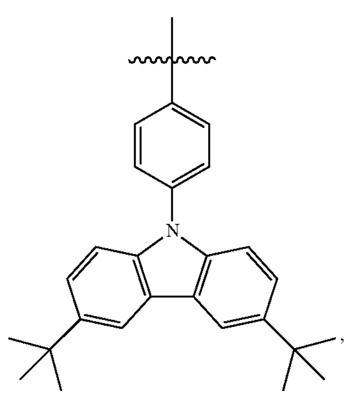
-continued
R48
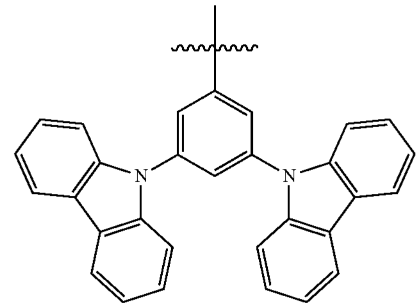
R49
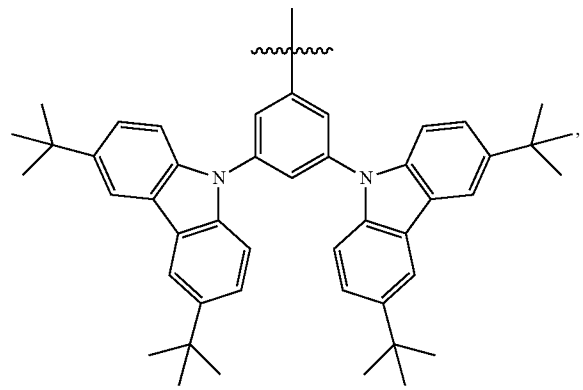
R50
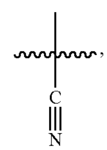
R51
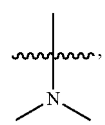
R52
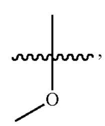
R53
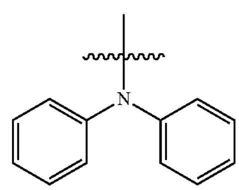
R54
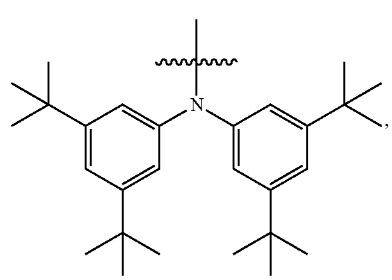

-continued
R55
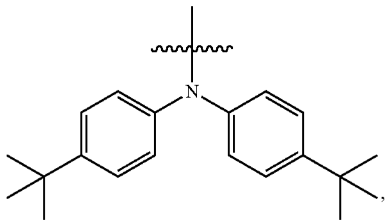
R56
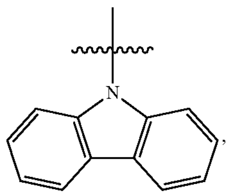
R57
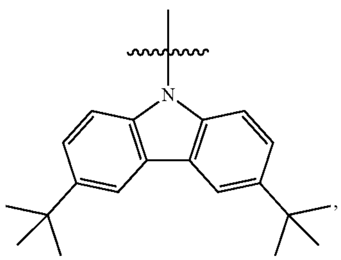
R58
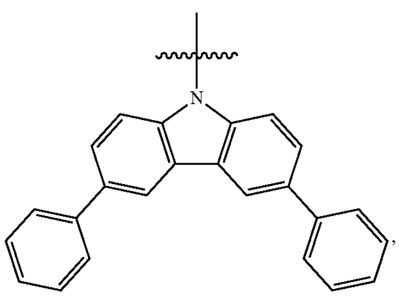
R59
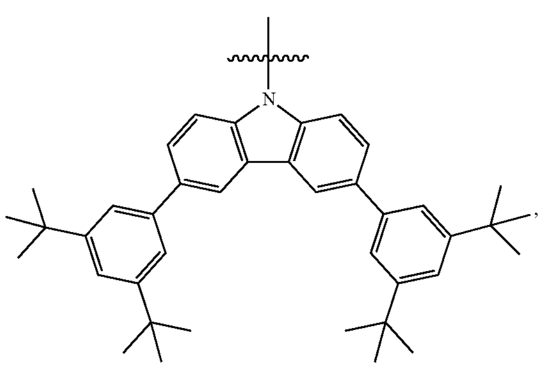
and
-continued
R60
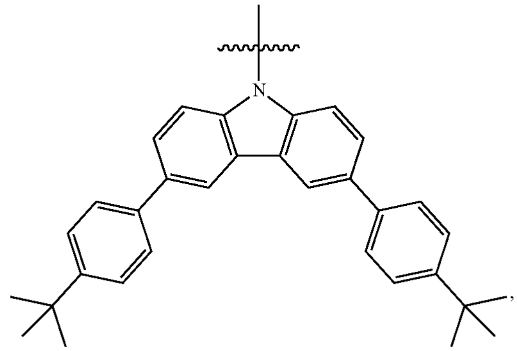
wherein Y1 to Y20 have the following structures:
Y1
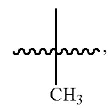
Y2
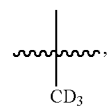
Y3
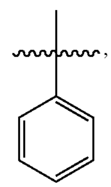
Y4
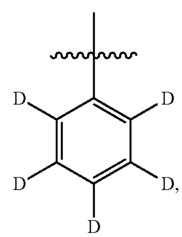
Y5
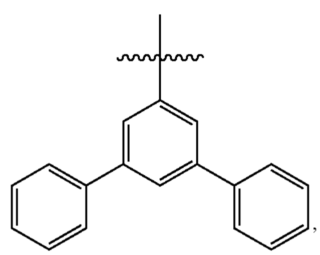
Y6
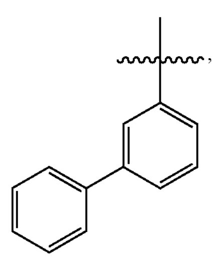

-continued
Y7
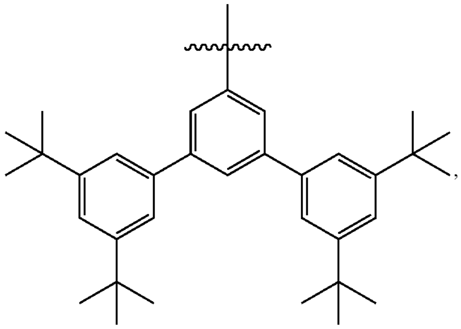
Y8
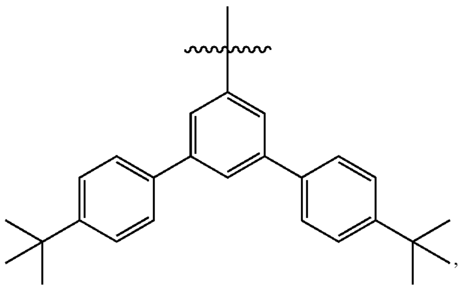
Y9
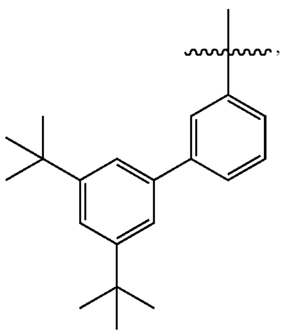
Y10
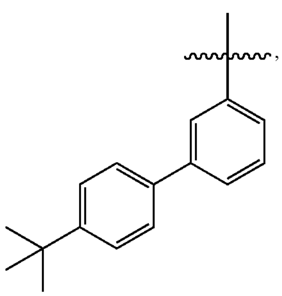
Y11
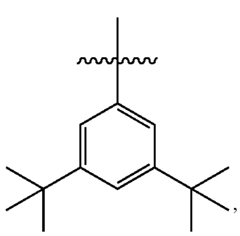
-continued
Y12
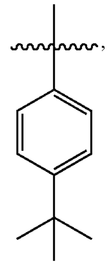
Y13
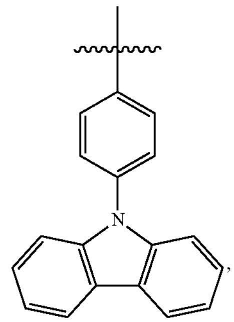
Y14
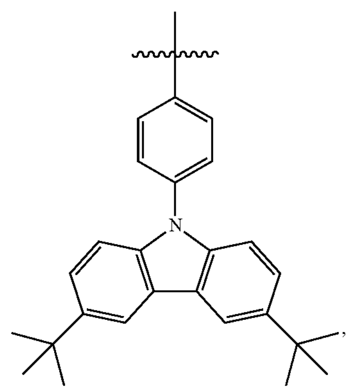
Y15
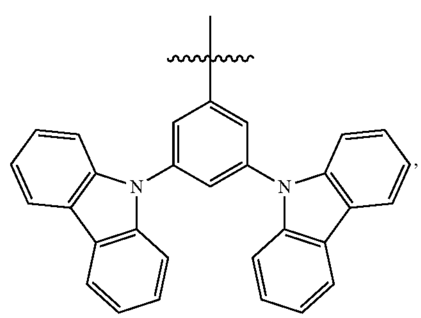

-continued
Y16
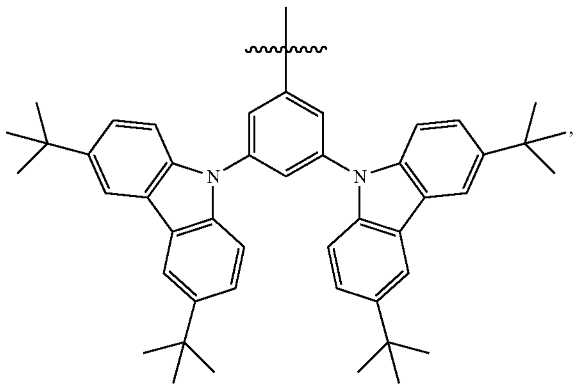
Y17
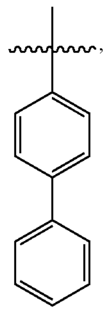
Y18
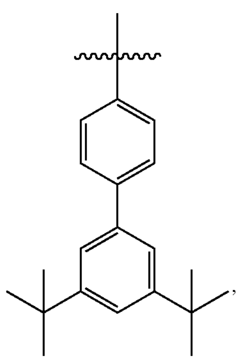
Y19
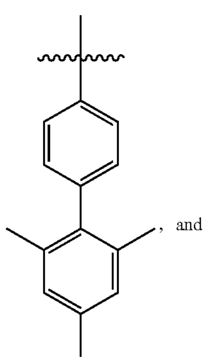
-continued
Y20
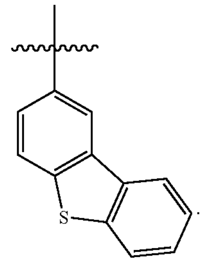
14. The compound of claim 13, wherein the compound is selected from the group consisting of only those compounds having Ai, Aj, and Ah that correspond to A1, A3, A8, A18, A19, A30, A39, A56, A57, A176, A177, A241, A243, A248, A258, A259, A270, A279, A296, A297, A301, A303, A308, A318, A319, A330, A339, A356, or A357.
15. The compound of claim 1, wherein the compound is each independently selected from the group consisting of:
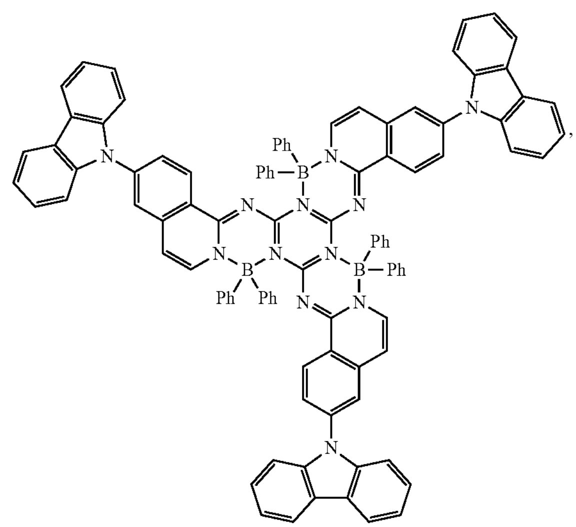
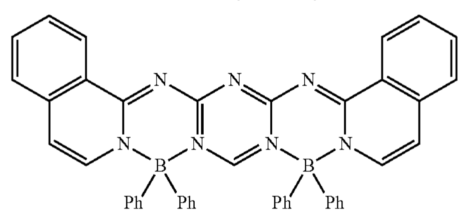
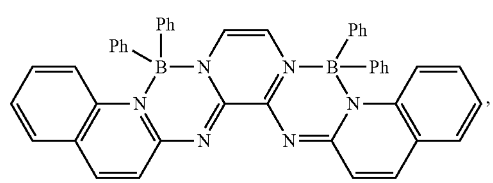
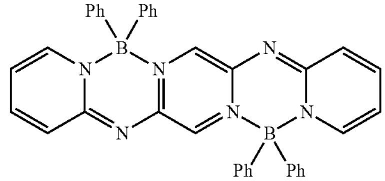

-continued
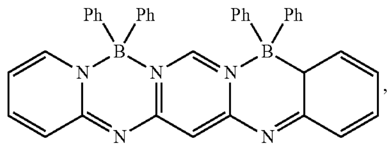
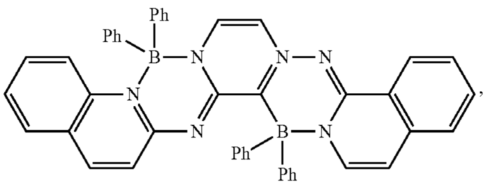
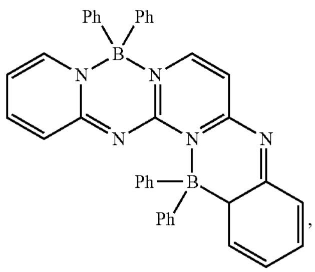
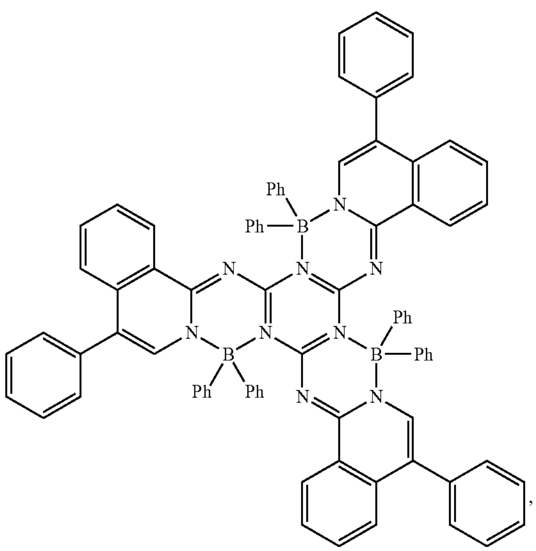
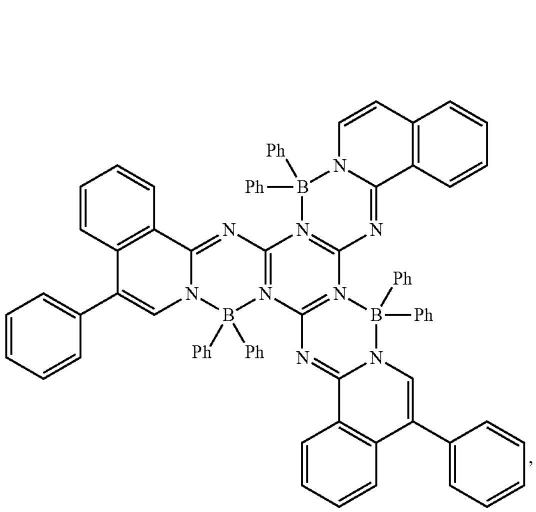
-continued
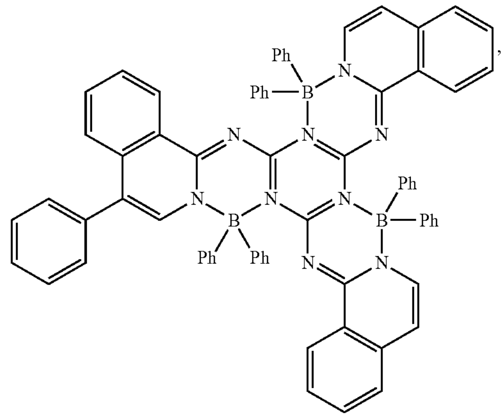
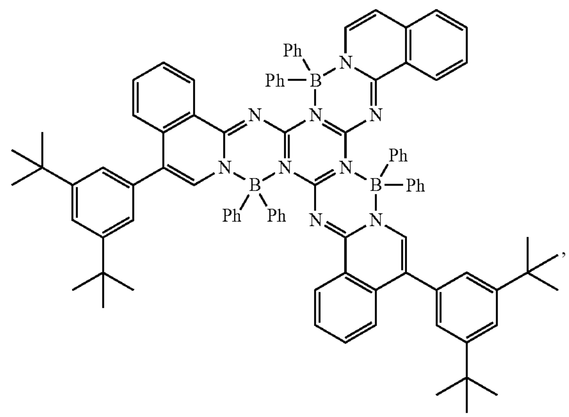
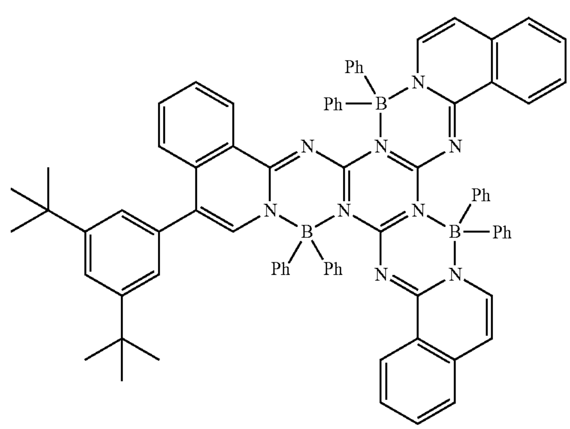

-continued
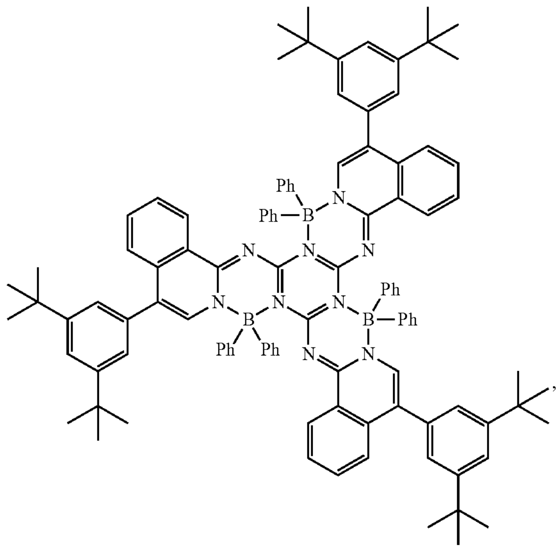
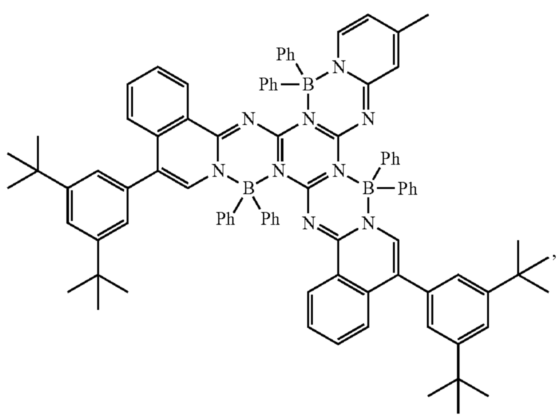
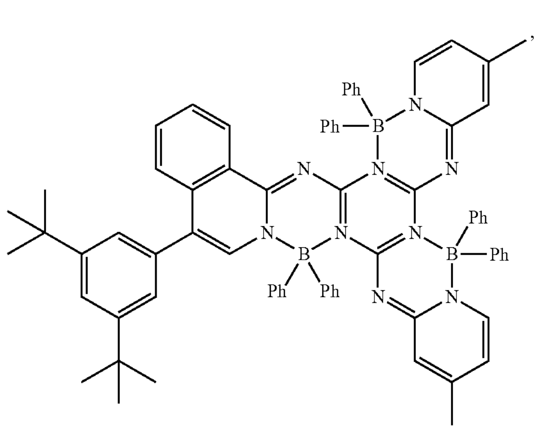
-continued
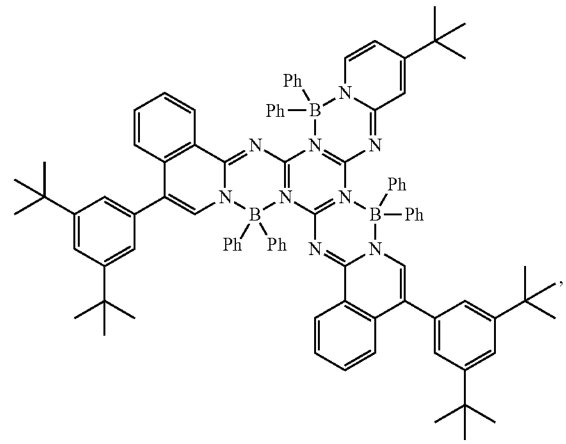
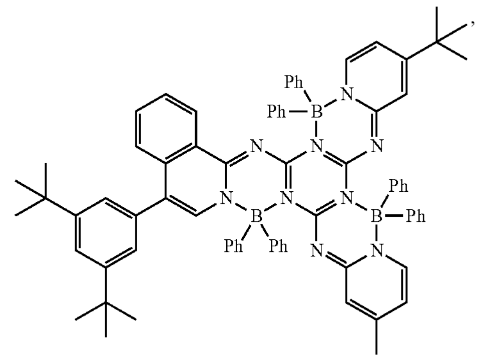
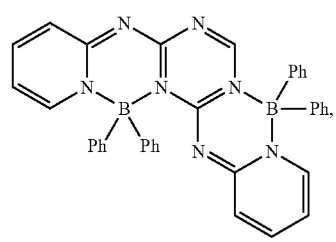
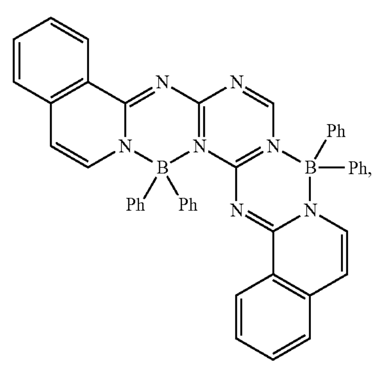
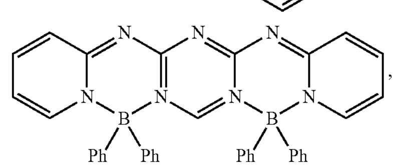

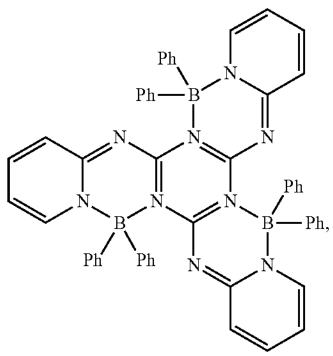
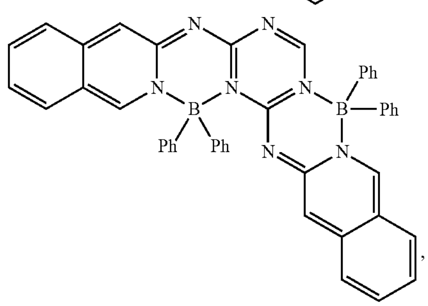
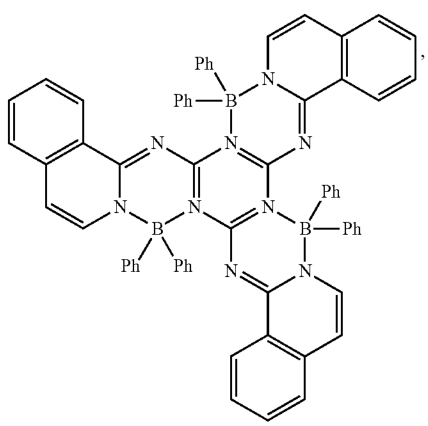
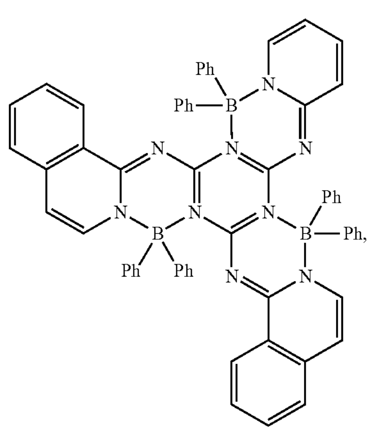
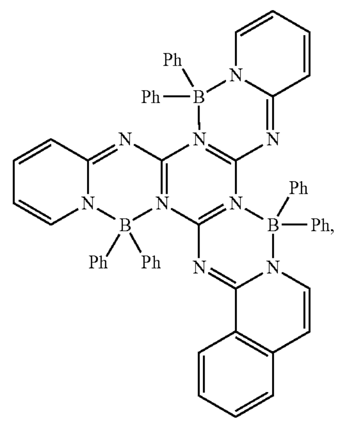
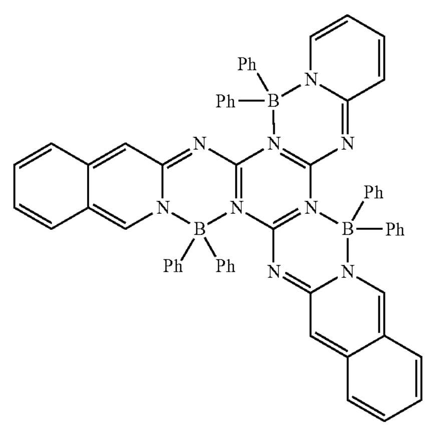
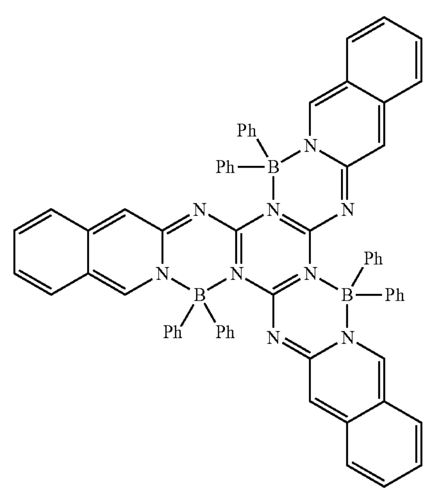

-continued
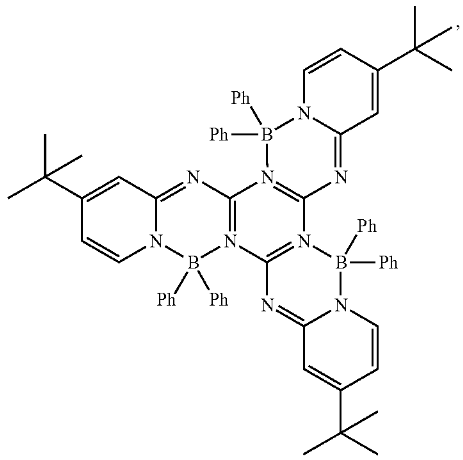
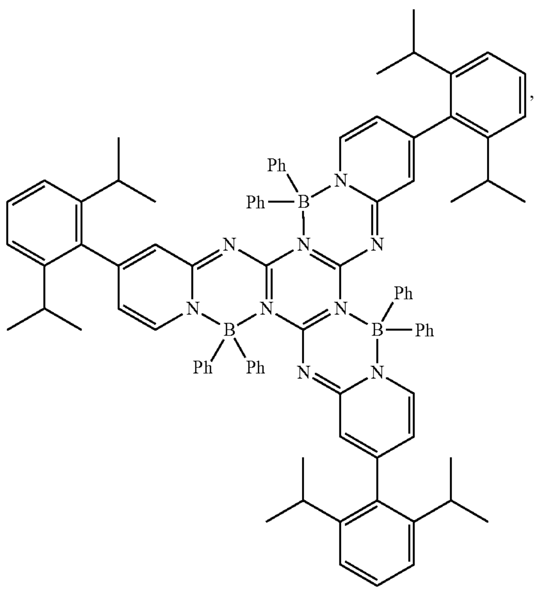
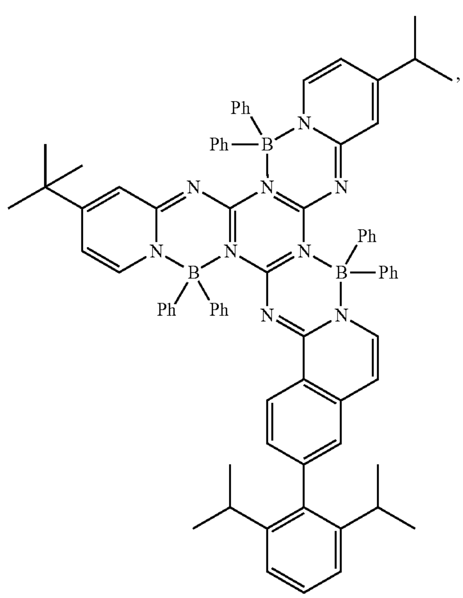
-continued
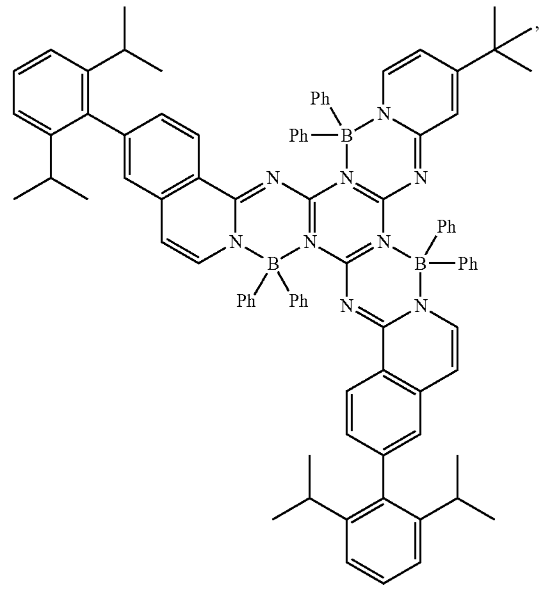
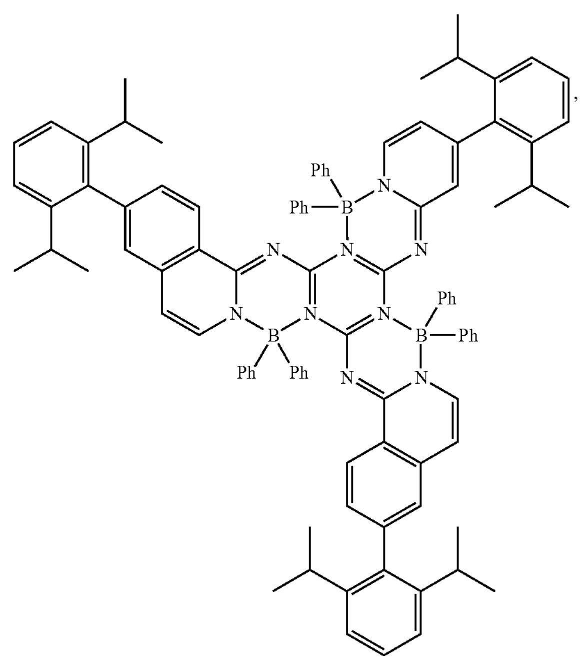

-continued
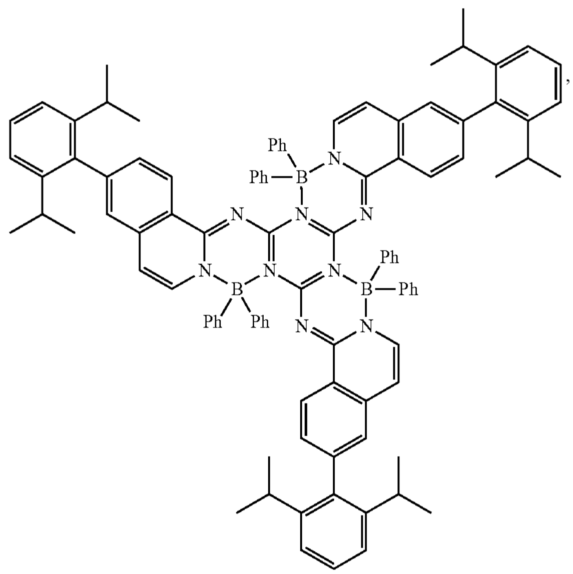
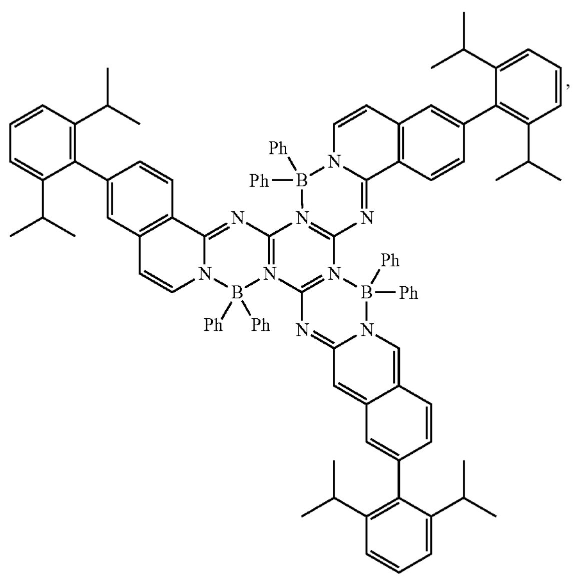
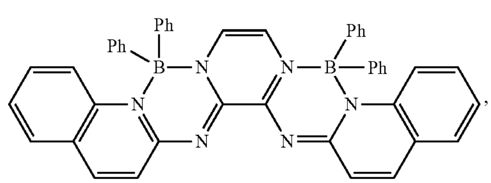
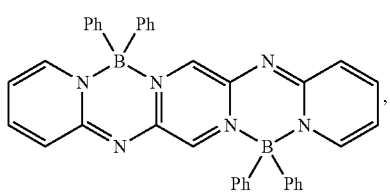
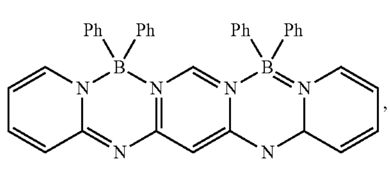
-continued
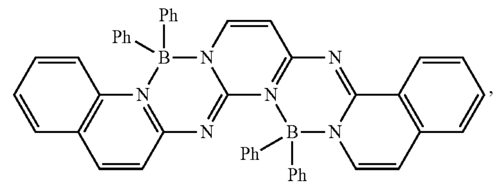
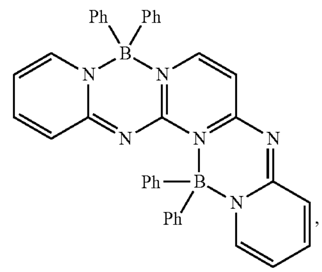
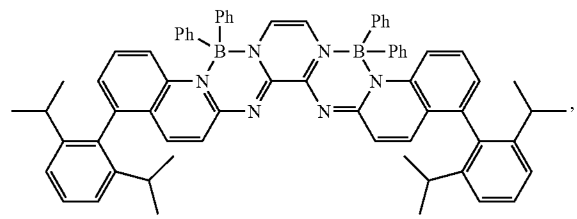
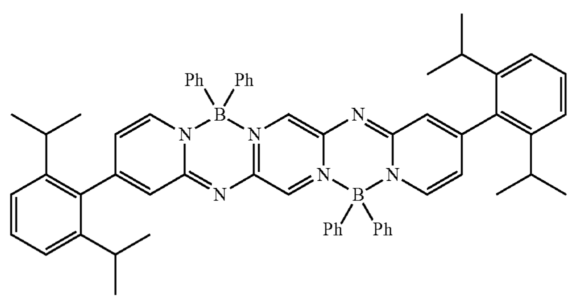
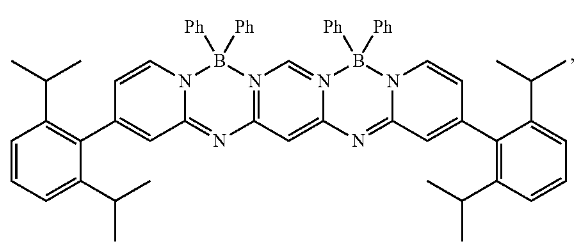
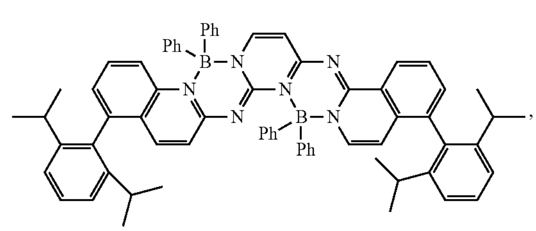
and -continued

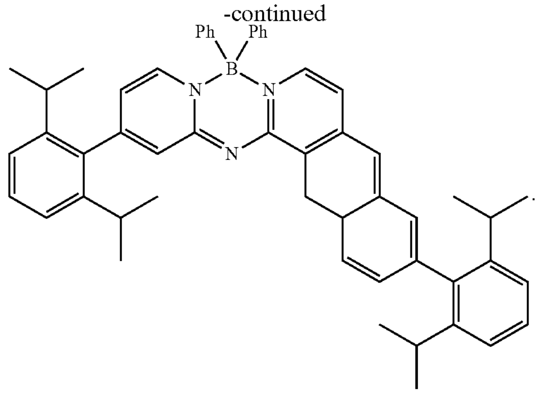

16. A formulation comprising the compound according to claim 1.

17. An organic light emitting device (OLED) comprising:

an anode;

a cathode; and a first organic layer disposed between the anode and the cathode, wherein the first organic layer comprises a compound of Formula I

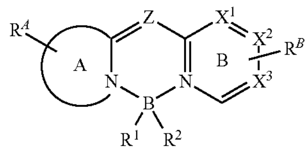

wherein:

Z is CR' or N;

$X^1$-$X^3$ are each independently C or N, with at least one of $X^1$-$X^3$ being N and bonded to boron;

$R^A$ and $R^B$ each represents zero, mono, or up to the maximum allowed number of substitutions to its associate ring;

R', $R^A$, and $R^B$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, borate, and combinations thereof;

$R^1$ and $R^2$ are each independently a hydrogen or a substituent selected from the group consisting of deuterium, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, borate, and combinations thereof;

ring A is a 5-membered or 6-membered ring; and two substituents within Formula I can be joined or fused together to form a ring, with a proviso that two adjacent $R^B$ substituents are joined to form a fused heterocyclic ring.

18. The OLED of claim 17, wherein the compound is a fluorescent emitter, or the first organic layer further comprises a phosphorescent sensitizer, and the compound is a fluorescent acceptor, or the OLED further comprises a second organic layer comprising a phosphorescent sensitizer, and the compound is a fluorescent acceptor.

19. The compound of either claim 17, wherein the phosphorescent sensitizer is a transition metal complex having at least one ligand or part of the ligand if the ligand is more than bidentate selected from the group consisting of:

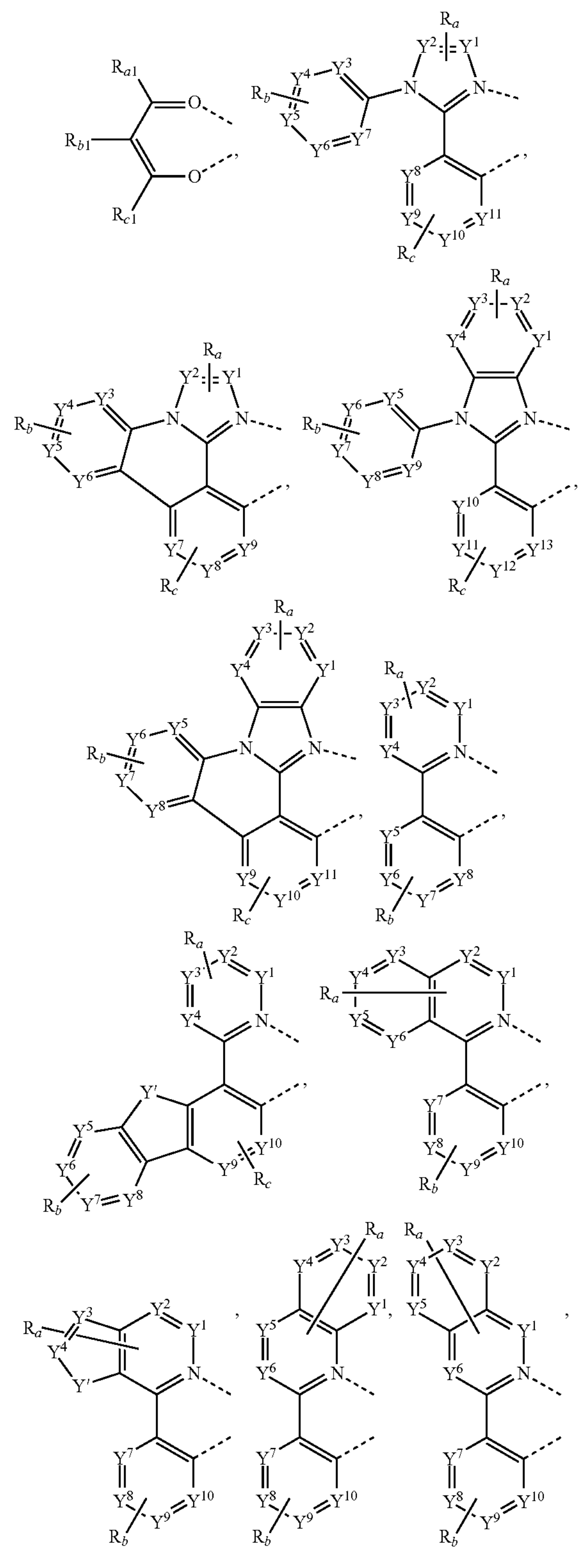

-continued

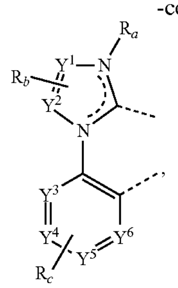

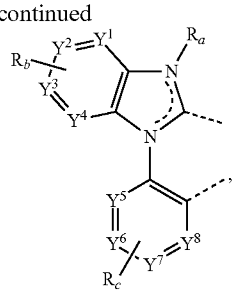

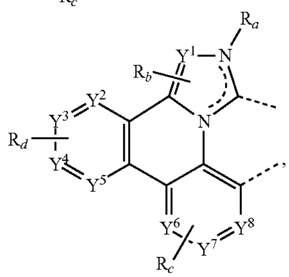

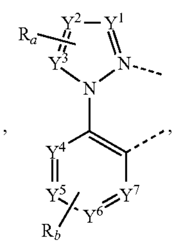

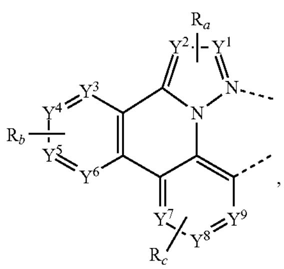

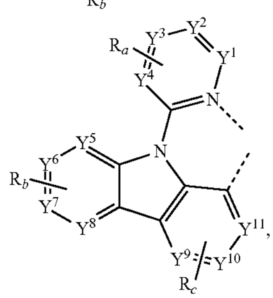

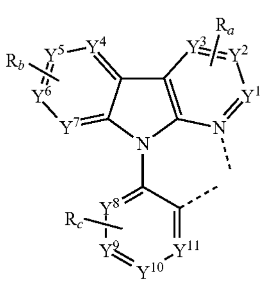

, and

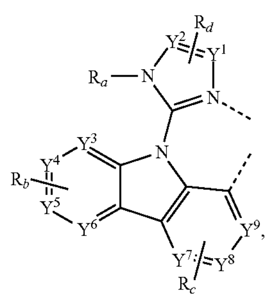

wherein each $Y^1$ to $Y^{13}$ are independently selected from the group consisting of carbon and nitrogen; Y' is selected from the group consisting of $BR_e$, $NR_e$, $PR_e$, O, S, Se, C═O, S═O, $SO_2$, $CR_eR_f$, $SiR_eR_f$, and $GeR_eR_f$; $R_e$ and $R_f$ can be fused or joined to form a ring; each $R_a$, $R_b$, $R_c$, and $R_d$ independently represent from zero, mono, or up to the maximum allowed number of substitutions to its associated ring; $R_{a1}$, $R_{b1}$, $R_{c1}$, $R_a$, $R_b$, $R_c$, $R_d$, $R_e$ and $R_f$ are each independently selected from the group consisting of hydrogen, deuterium, halide, alkyl, cycloalkyl, heteroalkyl, arylalkyl, alkoxy, aryloxy, amino, silyl, boryl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and two adjacent substituents of $R_a$, $R_b$, $R_c$, and $R_d$ can be fused or joined to form a ring or form a multidentate ligand.

20. A consumer product comprising an organic light-emitting device (OLED) comprising:

an anode;

a cathode; and an organic layer disposed between the anode and the cathode, wherein the organic layer comprises a compound of Formulas I

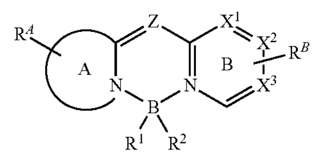

wherein:

Z is CR' or N;

$X^1$-$X^3$ are each independently C or N, with at least one of $X^1$-$X^3$ being N and bonded to boron;

$R^A$ and $R^B$ each represents zero, mono, or up to the maximum allowed number of substitutions to its associate ring;

R', $R^A$, and $R^B$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, borate, and combinations thereof;

$R^1$ and $R^2$ are each independently a hydrogen or a substituent selected from the group consisting of deuterium, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, borate, and combinations thereof;

ring A is a 5-membered or 6-membered ring; and two substituents within Formula I can be joined or fused together to form a ring, with a proviso that two adjacent $R^B$ substituents are joined to form a fused heterocyclic ring.

* * * * *